US012218685B2

(12) United States Patent
Myung et al.

(10) Patent No.: US 12,218,685 B2
(45) Date of Patent: Feb. 4, 2025

(54) APPARATUS AND METHOD FOR CHANNEL ENCODING/DECODING IN COMMUNICATION OR BROADCASTING SYSTEM

(71) Applicant: Samsung Electronics Co., Ltd., Suwon-si (KR)

(72) Inventors: Seho Myung, Seoul (KR); Kyungjoong Kim, Seoul (KR); Seokki Ahn, Suwon-si (KR); Min Jang, Seongnam-si (KR); Hongsil Jeong, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 18/460,244

(22) Filed: Sep. 1, 2023

(65) Prior Publication Data

US 2023/0421177 A1 Dec. 28, 2023

Related U.S. Application Data

(63) Continuation of application No. 17/400,681, filed on Aug. 12, 2021, now Pat. No. 11,750,220, which is a
(Continued)

(30) Foreign Application Priority Data

Dec. 20, 2016 (KR) ........................ 10-2016-0175019
Jan. 6, 2017 (KR) ........................ 10-2017-0002599
(Continued)

(51) Int. Cl.
*H03M 13/11* (2006.01)
*H03M 13/00* (2006.01)

(52) U.S. Cl.
CPC ...... *H03M 13/1148* (2013.01); *H03M 13/116* (2013.01); *H03M 13/616* (2013.01); *H03M 13/6516* (2013.01)

(58) Field of Classification Search
CPC ........... H03M 13/1148; H03M 13/116; H03M 13/616; H03M 13/6516; H03M 13/618;
(Continued)

(56) References Cited

U.S. PATENT DOCUMENTS 7,934,147 B2 4/2011 Lakkis
8,356,227 B2 1/2013 Chung et al.
(Continued)

FOREIGN PATENT DOCUMENTS

CN 1331549 A 1/2002
CN 1642063 A 7/2005
(Continued)

OTHER PUBLICATIONS

"3rd Generation Partnership Project; Technical Specification Group Radio Access Network; NR; Multiplexing and channel coding (Release 15)", 3GPP Standard; Technical Specification; 3GPP TS 38.212, 3rd Generation Partnership Project (3GPP), Mobile Competence Centre; 650, Route Des Lucioles ; F-06921 Sophia-Antipolis Cedex; France, vol. RAN WG1, No. VO.0.1, Aug. 12, 2017 (Aug. 12, 2017).

(Continued)

*Primary Examiner* — Thien Nguyen
(74) *Attorney, Agent, or Firm* — Jefferson IP Law, LLP

(57) ABSTRACT

The present disclosure relates to a pre-5th-Generation (5G) or 5G communication system to be provided for supporting higher data rates Beyond 4th-Generation (4G) communication system such as Long Term Evolution (LTE). An apparatus and a method for channel encoding and decoding in a communication or broadcasting system is provided. Accord-
(Continued)

ing to the present disclosure, the method for channel encoding in a communication or broadcasting system includes determining a block size Z, and performing encoding based on the block size and a parity check matrix corresponding to the block size, in which the block size is included in any one of the plurality of block size groups and the parity check matrix is different for each block size group.

20 Claims, 144 Drawing Sheets

Related U.S. Application Data continuation of application No. 16/685,566, filed on Nov. 15, 2019, now Pat. No. 11,133,825, which is a continuation of application No. 15/848,970, filed on Dec. 20, 2017, now Pat. No. 10,484,010.

(30) Foreign Application Priority Data

| | | |
|---|---|---|
| Jan. 9, 2017 | (KR) | 10-2017-0003152 |
| Feb. 6, 2017 | (KR) | 10-2017-0016435 |
| Mar. 23, 2017 | (KR) | 10-2017-0037186 |
| May 10, 2017 | (KR) | 10-2017-0058349 |
| May 26, 2017 | (KR) | 10-2017-0065647 |
| Jun. 20, 2017 | (KR) | 10-2017-0078170 |
| Jun. 26, 2017 | (KR) | 10-2017-0080783 |

(58) Field of Classification Search

CPC ............ H03M 13/6393; H03M 13/036; H04L 1/1819; H04L 1/0041; H04L 1/0045; H04L 1/0057; H04L 1/0067; H04L 1/0009; H04L 1/0042; H04L 1/0047

See application file for complete search history.

(56) References Cited

U.S. PATENT DOCUMENTS

| | | | |
|---|---|---|---|
| 8,589,754 | B2 | 11/2013 | Yuan et al. |
| 10,484,010 | B2 | 11/2019 | Myung et al. |
| 11,133,825 | B2 | 9/2021 | Myung et al. |
| 2005/0091565 | A1 | 4/2005 | Eroz et al. |
| 2005/0246617 | A1 | 11/2005 | Kyung et al. |
| 2006/0036929 | A1 | 2/2006 | Yoon et al. |
| 2007/0033483 | A1 | 2/2007 | Jeong et al. |
| 2007/0101233 | A1 | 5/2007 | Eroz et al. |
| 2008/0109699 | A1 | 5/2008 | Stolpman |
| 2008/0178065 | A1 | 7/2008 | Khandekar et al. |
| 2009/0063926 | A1 | 3/2009 | Cho et al. |
| 2009/0070652 | A1 | 3/2009 | Myung et al. |
| 2009/0106625 | A1 | 4/2009 | Jun et al. |
| 2009/0158112 | A1 | 6/2009 | Oh et al. |
| 2009/0183047 | A1 | 7/2009 | Lampe et al. |
| 2011/0283159 | A1 | 11/2011 | Yuan et al. |
| 2012/0166914 | A1 | 6/2012 | Khandekar et al. |
| 2012/0173949 | A1 | 7/2012 | Liu et al. |
| 2012/0185746 | A1 | 7/2012 | Oh et al. |
| 2013/0297992 | A1 | 11/2013 | Yamamoto et al. |
| 2014/0223254 | A1 | 8/2014 | Pisek |
| 2014/0372825 | A1 | 12/2014 | Jeong et al. |
| 2015/0121162 | A1 | 4/2015 | Murakami |
| 2015/0280743 | A1 | 10/2015 | Yang et al. |
| 2016/0344412 | A1 | 11/2016 | Jeong et al. |
| 2017/0149528 | A1 | 5/2017 | Kim et al. |
| 2017/0187489 | A1 | 6/2017 | Myung et al. |
| 2018/0175886 | A1 | 6/2018 | Myung et al. |
| 2019/0393978 | A1* | 12/2019 | Zheng .................. H04L 1/1812 |
| 2020/0244287 | A1 | 7/2020 | Xu |

FOREIGN PATENT DOCUMENTS

| | | | |
|---|---|---|---|
| CN | 1947368 | A | 4/2007 |
| CN | 101034892 | A | 9/2007 |
| CN | 101188428 | A | 5/2008 |
| CN | 101553989 | A | 10/2009 |
| CN | 101595644 | A | 12/2009 |
| CN | 101741396 | A | 6/2010 |
| CN | 102638275 | A | 8/2012 |
| CN | 104506200 | A | 4/2015 |
| CN | 105284053 | A | 1/2016 |
| EP | 2 352 231 | A1 | 8/2011 |
| KR | 10-1364160 | B1 | 2/2014 |
| KR | 10-2017-0060574 | A | 6/2017 |
| WO | 2007/047400 | A2 | 4/2007 |

OTHER PUBLICATIONS

European Office Action dated Aug. 10, 2020 issued in European Application No. 17884045.0.

Qualcomm Incorporated, "LDPC rate compatible design overview" 3GPP TSG-RAN WG1 #86bis R1-1610137, Oct. 14, 2016.

Chin-Hung Lin etc, "Low-Power Design of Variable Block-size LDPC Decoder using Nanometer Technology" Proceedings of 2010 IEEE International Symposium on Circuits and Systems, Aug. 3, 2010.

Chinese Office Action dated Jan. 29, 2021, issued in Chinese Application No. 201780079231.8.

Ericsson, R1-1608875, LDPC Code Design for NR, 3GPP TSG RAN WG1 #86bis, Lisbon, Portugal, Oct. 10-14 2016.

Intel Corporation, R1-1610377, Channel coding scheme for EMBB, 3GPP TSG RAN WG1 #86bis, Lisbon, Portugal, Oct. 10-14 2016.

Korean Office Action dated Jul. 23, 2021, issued in Korean Application No. 10-2017-0080783.

Ericsson, "LDPC Code Design for NR", 3GPP Draft; R1-1608875 LDPC Code Design for NR, 3rd Generation-Partnership Project (3GPP), Mobile Competence Centre; 650, Route Des Lucioles, F-06921 Sophia-Antipolis Cedex, France vol. RAN WG1, No. Lisbon, Portugal; Oct. 10-14, 2016, XP051159202, [retrieved on Oct. 1, 2016].

Qualcomm Incorporated, "LDPC rate compatible design overview", 3GPP Draft; R1-1610137 LDPC Rate Compatible Design, 3rd Generation Partnership Project (3GPP), Mobile Competence Centre, 650, Route Des Lucioles, F-06921 Sophia-Antipolis Cedex, France vol. RAN WG1, No. Lisbon. Portugal, Oct. 10-14, 2016, XP051150160, [retrieved on Oct. 9, 2016].

Myung et al., "Lifting Methods for Quasi-Cyclic LDPC Codes", IEEE Communications Letters, IEEE Service Center, Piscataway, NJ, US, vol. 10, No. 6, Jun. 1, 2006, pp. 489-491, XP001546983, ISSN: 1089-7798, DOI: 10.1109/LCOMM.2006.1638625.

European Search Report dated Sep. 18, 2019, issued in European Patent Application No. 17884045.0.

Samsung, "Discussion on Length-Compatible Quasi-Cyclic LDPC Codes", R1-166769, 3GPP TSG RAN WG1 Meeting #86, Gothenburg, Sweden, Aug. 13, 2016.

ZTE et al., "Consideration on LDPC design for NR", R1-1611112, 3GPP TSG RAN WG1 Meeting #87, Reno, USA, Nov. 5, 2016.

Ericsson, "Design of LDPC Codes for NR", R1-1611321, 3GPP TSG RAN WG1 Meeting #87, Reno, USA, Nov. 6, 2016.

International Search Report dated Apr. 27, 2018, issued in International Application No. PCT/KR2017/015144.

Indian Office Action dated Dec. 15, 2021, issued in Indian Application No. 201937024460.

Chinese Office Action with English translation dated Nov. 23, 2023; Chinese Appln. No. 202110732390.1.

Chinese Office Action with English translation dated Oct. 9, 2023; Chinese Appln. No. 202110729706.1.

* cited by examiner $$H_1 = \begin{Bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{Bmatrix}$$

FIG. 17A

| | | |
|---|---|---|
| 17B | 17C | 17D |
| 17E | 17F | 17G |

FIG. 17B

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 1 | 1 | | | | | 1 | | 1 | | | 1 | | 1 | 1 | 1 | 1 | 1 | | | 1 | | 1 | | | 1 | | 1 | | | 1 | 1 |
| 1 | 1 | 1 | | 1 | 1 | | 1 | | | | | 1 | | | 1 | 1 | 1 | | | | | 1 | 1 | 1 | | 1 | 1 | 1 | 1 | | |
| | 1 | 1 | | | | | 1 | | | 1 | 1 | 1 | | | | | 1 | 1 | 1 | 1 | 1 | 1 | | 1 | 1 | | | | 1 | | 1 |
| 1 | 1 | | 1 | | 1 | 1 | | 1 | 1 | 1 | | 1 | 1 | 1 | | | | 1 | 1 | | | | | | 1 | 1 | 1 | 1 | | | |
| 1 | 1 | 1 | 1 | 1 | 1 | 1 | 1 | 1 | 1 | 1 | 1 | | | | 1 | | | | | 1 | 1 | | 1 | | | | | | | 1 | |
| 1 | | | 1 | 1 | | | | | 1 | | | | 1 | 1 | | 1 | | 1 | 1 | | 1 | | 1 | 1 | | 1 | | 1 | 1 | 1 | 1 |

FIG. 17C

| | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|
| 1 | 1 | | | | | | | | | | | | | | | | | | | | | | | | | | | | | |
| | 1 | 1 | | | | | | | | | | | | | | | | | | | | | | | | | | | | |
| 1 | | 1 | 1 | | | | | | | | | | | | | | | | | | | | | | | | | | | |
| | | | 1 | 1 | | | | | | | | | | | | | | | | | | | | | | | | | | |
| | | | | 1 | 1 | | | | | | | | | | | | | | | | | | | | | | | | | |
| 1 | | | | | 1 | | | | | | | | | | | | | | | | | | | | | | | | | |

FIG. 17E

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
|1|1| | | | |1| | | | |1| | | | | | | | | | | | | |1| | | | | | |
| |1| | | | | | | | |1| | | |1|1| |1| |1|1|1| | | | | | | | | | |
|1|1| |1| | | | |1|1| |1| |1| | | | | | | | | | | | | | |1| | | |
|1|1|1| | | | |1| | | | |1| | | | | | | | | | | | | |1| | | | | |
|1|1| |1| | | | | |1| |1| | |1| | | | | | | | | | | | | |1| | | |
|1|1| | |1| |1| |1| | | | | | | | |1| | | | | | | | | |1| | | |1|
|1| |1|1| | | |1| |1|1|1|1| | | | | | | | | | | |1| | | | | | | |
|1|1| | |1| |1| | | | | | |1| |1| | | | | | | | | | | |1| | | | |
| |1| |1| | | | |1| | | | | |1| | |1| | | | | | | | | | | | |1| |
|1| |1| |1| | | | |1|1|1|1| | | | | | | | | | | | | | | | |1| | |
|1|1| |1| |1| | | | | | | | |1| | | | |1| | | | | | | | | | | | |
|1| |1| |1| | |1| | | | | | | | | |1| | | | | |1| | | | | | | | |
| |1| | | | | | |1|1| |1| | |1| | | | | | | |1| |1| | | | | | | |
|1|1| |1|1| | |1| | | | | | | | | |1|1| | | | | | | | | | | | | |
|1|1| | | |1|1| | | | | | | | | |1| | | | | | | | | | | | | | | |
|1|1|1| |1| | | | |1| | | | | | | | | | | | | | | | | |1| | | | |
| |1| | | | | | |1| |1| |1| | |1| | | | | | | | | | | | | | | | |
|1| | | | | | |1| | | | | | | | |1| | | | | |1| | | | |1| | | | |
|1|1| | | | | | | | |1| | | | | | | | | | | | | | | | | | | | |1|
|1| |1| | | | | | | | |1| | |1| | | | | | | | | | | | | | | | | |
|1|1| |1| | | | |1| | | | | | | | | | | | |1| | | | |1| | | | | |
| |1| | | | | | | | |1| |1| | | | |1|1| | | | | | | | | | | | | |
|1|1|1| | | |1| | | | | | | | | | | | | | | | | | | | |1| | | | |
|1|1| | | | | | |1| | | | | |1| | | | | | | | | | | | | | |1| | |
|1|1| | | | |1| | | | |1| | | | | | | | |1| | | | | | | | | |1| |
|1| | |1| | | | | |1| | | | | | | | | | | | | | |1| | | | | | | |
| |1| | | | | |1|1| | | | | | | | |1| | | | | | | | | | | | | | |
| |1| | | | |1| | | | | | | |1| | | | | | | | |1| | | | | | | | |
| |1|1| | | | | | | |1| | | | | | | | | | | | | | |1| | | | | | |
|1| | |1| | | | | |1| | |1| | | | | | | | | | | | | | | | | | | |
|1| | | | | | |1| | | | | | | | | | | | | | | | | | | | |1| | | |
| |1|1| | | | | | | | | | | | | | | | |1| | | | | | | | | | |1| |
|1|1| | | | | | | | | | | |1| | | | | | | | | | | | | |1| | | | |
|1| | | |1| | | | | |1| | | | | | | | | | | | | | | | | | | | |1|
|1|1| | | | | | |1| | | | | | | | | | |1| | | | | | | | | | | | |
|1|1| | | | | | | | |1| | | |1| | | | | | |1| | | | | | | | | | |
| |1|1| | | | | | |1| | | | | | | | | | | | | | | | |1| | | | | |
|1|1| | | | | | | | | | | | | |1|1| | | | | | | | | | | | | | | |
| |1| | | | | | | | | | | | |1| | | | | | | | | | | | |1| | | | |
|1| |1| | | | |1| | | | | | | | | | | | |1| | | | | | | | | | | |
| |1| | | |1| | |1| | | | | | | | | | | | | |1| | | | | | | | | |
|1| | | | | |1| | | | | | | | | | | | | | |1| | | | | | | | | | |
| |1| | | | | | | | | |1| | | | | | |1| | | | | | | | | | |1| | |
|1|1| |1| | | | | | | | | | | | | | | | | | | | | | | | | | | | |
|1| | | | | | | | | | | | | | | | |1|1| | | | | | | | | | | | |1|
| |1| | | | | | | |1| | |1| | | | | | | | | | | | | | | |1| | | |
|1| | | | | | | |1| | | | | | | | | | | | | | |1| | | | | | | | |
|1| | | | | | | | | | | | | | |1| | | | | | |1| | | | | | | | | |
|1| | | |1| | |1| | | | | | | | | | | | | | | | | | | | | | | | |
| |1| | | | |1| | | | | | | | | | | | | | | | | | | | | | | | | |
| |1| | | | | | | | |1| | | | | | | | | | | | | | | | | | | |1| |
|1| | | | | | | | | | | | |1| | | | | | | | | | | | | | | | | | |
| |1| | | | | | | | | | | | | | | |1|1| | | | | | | |1| | | | | |
| |1| | | | | | | | |1| | | | | | | | | |1| | | | | | | | | | | |
| |1| | | | | | | | | | | | | | | | | |1| | | | |1| | | | | | | |
|1| | | | | | | | | | | | | | | | | | | | | | | | | | |1| | | | |
|1| | | | |1| | | | | | |1| | | | | | | | | |1| | | | | | | | | |
|1| | | |1| | | | | | | | | | | | |1| | | | | | | |1| | | | | | |
| |1| | | | | | | | | | | | |1| | | | | | | | | | | | | |1| | | |
| |1| | | | | | | | | | | | | | |1| | | | | | | | | | | | | | |1|

FIG. 17F

| | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|
| | | | | | | 1 | | | | | | | | | | | | | | | | | | | | | | | | |
| 1 | | | | | | | 1 | | | | | | | | | | | | | | | | | | | | | | | |
| | | 1 | | | | | | 1 | | | | | | | | | | | | | | | | | | | | | | |
| | | | | | 1 | | | | 1 | | | | | | | | | | | | | | | | | | | | | |
| | | | | | | | | | | 1 | | | | | | | | | | | | | | | | | | | | |
| | | | | | | | | | | | 1 | | | | | | | | | | | | | | | | | | | |
| | | | | | | | | | | | | 1 | | | | | | | | | | | | | | | | | | |
| | | | | | | | | | | | | | 1 | | | | | | | | | | | | | | | | | |
| | | | | | | | | | | | | | | 1 | | | | | | | | | | | | | | | | |
| | | | | | | | | | | | | | | | 1 | | | | | | | | | | | | | | | |
| | | | | | | | | | | | | | | | | 1 | | | | | | | | | | | | | | |
| | | | | | | | | | | | | | | | | | 1 | | | | | | | | | | | | | |
| | | | | | | | | | | | | | | | | | | 1 | | | | | | | | | | | | |
| | | | | | | | | | | | | | | | | | | | 1 | | | | | | | | | | | |
| | | | | | | | | | | | | | | | | | | | | 1 | | | | | | | | | | |
| | | | 1 | | | | | | | | | | | | | | | | | | 1 | | | | | | | | | |
| | | | | | | | | | | | | | | | | | | | | | | 1 | | | | | | | | |
| | | | | | | | | | | | | | | | | | | | | | | | 1 | | | | | | | |
| 1 | | | | | | | | | | | | | | | | | | | | | | | | 1 | | | | | | |
| | | | | | 1 | | | | | | | | | | | | | | | | | | | | 1 | | | | | |
| | | | | | | | | | | | | | | | | | | | | | | | | | | 1 | | | | |
| | | | | | | | | | | | | | | | | | | | | | | | | | | | 1 | | | |
| | 1 | | | | | | | | | | | | | | | | | | | | | | | | | | | 1 | | |
| | | | | | | | | | | | | | | | | | | | | | | | | | | | | | 1 | |
| | | | | | | | | | | | | | | | | | | | | | | | | | | | | | | 1 |
| | | | | | | | | | | | | | | | | | | | | | | | | | | | | | | |
| | | | | 1 | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | 1 | | | | | | | | | | | | | | | | | | | | | | | | | | | |
| | | 1 | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | 1 | | | | | | | | | | | | | | | | | | | | | | | | | | | | | |
| | | | | 1 | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| 1 | | | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | 1 | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | 1 | | | | | | | | | | | | | | | | | | | | | | | | | | | |
| | | | | | | | | | | | | | | | | | | | | | | | | | | | | | | |
| | 1 | | | | | | | | | | | | | | | | | | | | | | | | | | | | | |
| | | | | 1 | | | | | | | | | | | | | | | | | | | | | | | | | | |
| | 1 | | | | | | | | | | | | | | | | | | | | | | | | | | | | | |
| | | | 1 | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | | | 1 | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | | | | | | | | | | | | | | | | | | | | | | | | | | | | | |
| | | 1 | | | | | | | | | | | | | | | | | | | | | | | | | | | | |

FIG. 17G

| | | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
| | | | | | | | | | | | | | | | | | | | | | | | | | | | | | | | | | | |
|1| | | | | | | | | | | | | | | | | | | | | | | | | | | | | | | | | | |
| |1| | | | | | | | | | | | | | | | | | | | | | | | | | | | | | | | | |
| | |1| | | | | | | | | | | | | | | | | | | | | | | | | | | | | | | | |
| | | |1| | | | | | | | | | | | | | | | | | | | | | | | | | | | | | | |
| | | | |1| | | | | | | | | | | | | | | | | | | | | | | | | | | | | | |
| | | | | |1| | | | | | | | | | | | | | | | | | | | | | | | | | | | | |
| | | | | | |1| | | | | | | | | | | | | | | | | | | | | | | | | | | | |
| | | | | | | |1| | | | | | | | | | | | | | | | | | | | | | | | | | | |
| | | | | | | | |1| | | | | | | | | | | | | | | | | | | | | | | | | | |
| | | | | | | | | |1| | | | | | | | | | | | | | | | | | | | | | | | | |
| | | | | | | | | | |1| | | | | | | | | | | | | | | | | | | | | | | | |
| | | | | | | | | | | |1| | | | | | | | | | | | | | | | | | | | | | | |
| | | | | | | | | | | | |1| | | | | | | | | | | | | | | | | | | | | | |
| | | | | | | | | | | | | |1| | | | | | | | | | | | | | | | | | | | | |
| | | | | | | | | | | | | | |1| | | | | | | | | | | | | | | | | | | | |
| | | | | | | | | | | | | | | |1| | | | | | | | | | | | | | | | | | | |
| | | | | | | | | | | | | | | | |1| | | | | | | | | | | | | | | | | | |
| | | | | | | | | | | | | | | | | |1| | | | | | | | | | | | | | | | | |
| | | | | | | | | | | | | | | | | | |1| | | | | | | | | | | | | | | | |
| | | | | | | | | | | | | | | | | | | |1| | | | | | | | | | | | | | | |
| | | | | | | | | | | | | | | | | | | | |1| | | | | | | | | | | | | | |
| | | | | | | | | | | | | | | | | | | | | |1| | | | | | | | | | | | | |
| | | | | | | | | | | | | | | | | | | | | | |1| | | | | | | | | | | | |
| | | | | | | | | | | | | | | | | | | | | | | |1| | | | | | | | | | | |
| | | | | | | | | | | | | | | | | | | | | | | | |1| | | | | | | | | | |
| | | | | | | | | | | | | | | | | | | | | | | | | |1| | | | | | | | | |
| | | | | | | | | | | | | | | | | | | | | | | | | | |1| | | | | | | | |
| | | | | | | | | | | | | | | | | | | | | | | | | | | |1| | | | | | | |
| | | | | | | | | | | | | | | | | | | | | | | | | | | | |1| | | | | | |
| | | | | | | | | | | | | | | | | | | | | | | | | | | | | |1| | | | | |
| | | | | | | | | | | | | | | | | | | | | | | | | | | | | | |1| | | | |
| | | | | | | | | | | | | | | | | | | | | | | | | | | | | | | |1| | | |
| | | | | | | | | | | | | | | | | | | | | | | | | | | | | | | | |1| | |
| | | | | | | | | | | | | | | | | | | | | | | | | | | | | | | | | |1| |
| | | | | | | | | | | | | | | | | | | | | | | | | | | | | | | | | | |1|

FIG. 18A

| | | |
|---|---|---|
| 18B | 18C | 18D |
| 18E | 18F | 18G |

FIG. 18B

| | | | | | | | |
|---|---|---|---|---|---|---|---|
| 17 | 34 | | | | | 28 | |
| 69 | 40 | 120 | | 115 | 15 | | 66 |
| | 55 | 106 | | | | | 32 |
| 23 | 75 | | 58 | | 2 | 26 | |
| 50 | 103 | 82 | 25 | 54 | 21 | 52 | 71 |
| 38 | | | 36 | 60 | | | |

FIG. 18C

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 1 | 0 | | | | | | | | | | | | | | | | | | | | | | | | | | | | | | | |
| | 0 | 0 | | | | | | | | | | | | | | | | | | | | | | | | | | | | | | |
| 0 | | 0 | 0 | | | | | | | | | | | | | | | | | | | | | | | | | | | | | |
| | | | 0 | 0 | | | | | | | | | | | | | | | | | | | | | | | | | | | | |
| | | | | 0 | 0 | | | | | | | | | | | | | | | | | | | | | | | | | | | |
| 1 | | | | | 0 | | | | | | | | | | | | | | | | | | | | | | | | | | | |

FIG. 18E

| | | | | | | | |
|---|---|---|---|---|---|---|---|
| 60 | 118 | | | | | 114 | |
| | 67 | | | | | | |
| 24 | 107 | | 46 | | | | |
| 109 | 73 | 62 | | | | | 34 |
| 18 | 39 | | 27 | | | | |
| 107 | 52 | | | 88 | | 26 | |
| 21 | | 75 | 1 | | | | 5 |
| 45 | 32 | | | 113 | | 45 | |
| | 77 | | 106 | | | | |
| 38 | | 108 | | 69 | | | |
| 102 | 72 | | 101 | | 84 | | |
| 19 | | 108 | | 122 | | | 37 |
| | 52 | | | | | | |
| 48 | 33 | | 3 | 51 | | | 43 |
| 20 | 102 | | | | 51 | 57 | |
| 120 | 109 | 101 | | 84 | | | |
| | 79 | | | | | | |
| 28 | | | | | | | 27 |
| 30 | 111 | | | | | | |
| 92 | | 120 | | | | | |
| 80 | 116 | | 45 | | | | |
| | 74 | | | | | | |
| 92 | 52 | 122 | | | | 124 | |
| 98 | 38 | | | | | | |
| 81 | 107 | | | | | 42 | |
| 33 | | | 33 | | | | |
| | 40 | | | | | | 118 |
| | 106 | | | | | 40 | |
| | 61 | 120 | | | | | |
| 50 | | | 102 | | | | |
| 91 | | | | | | | 33 |
| | 89 | 56 | | | | | |
| 3 | 6 | | | | | | |
| 21 | | | | 125 | | | |
| 63 | 116 | | | | | | |
| 113 | 91 | | | | | | |
| | 76 | 117 | | | | | |
| 120 | 122 | | | | | | |
| | 20 | | | | | | |
| 120 | | 52 | | | | | 28 |
| | 71 | | | | 23 | | |
| 23 | | | | | | 71 | |
| | 1 | | | | | | |
| 34 | 92 | | 122 | | | | |
| 101 | | | | | | | |
| | 48 | | | | | | |
| 125 | | | | | | | |
| 44 | | | | | | | |
| 110 | | | | 71 | | | 70 |
| | 78 | | | | | 126 | |
| | 79 | | | | | | |
| 14 | | | | | | | |
| | 27 | | | | | | |
| | 23 | | | | | | |
| | 48 | | | | | | |
| 11 | | | | | | | |
| 20 | | | | | 28 | | |
| 42 | | | | 32 | | | |
| | 108 | | | | | | |
| | 120 | | | | | | |

FIG. 18F

|||||||||||||||||||||||||||||||||||
|---|---|---|---|---|---|---|---|---|---|---|---|---|---|---|---|---|---|---|---|---|---|---|---|---|---|---|---|---|---|---|---|---|
|||||||0|||||||||||||||||||||||||||
|27|||||||0||||||||||||||||||||||||||
|||31||||||0|||||||||||||||||||||||||
||||||48||||0||||||||||||||||||||||||
|||||||||||0|||||||||||||||||||||||
||||||||||||0||||||||||||||||||||||
|||||||||||||0|||||||||||||||||||||
||||||||||||||0||||||||||||||||||||
|||||||||||||||0|||||||||||||||||||
||||||||||||||||0||||||||||||||||||
|||||||||||||||||0|||||||||||||||||
||||||||||||||||||0||||||||||||||||
|||||||||||||||||||0|||||||||||||||
||||||||||||||||||||0||||||||||||||
|||||||||||||||||||||0|||||||||||||
||||0||||||||||||||||||0||||||||||||
|||||||||||||||||||||||0|||||||||||
||||||||||||||||||||||||0||||||||||
|11||||||||||||||||||||||||0|||||||||
||||||73||||||||||||||||||||0||||||||
|||||||||||||||||||||||||||0|||||||
||||||||||||||||||||||||||||0||||||
||69|||||||||||||||||||||||||||0|||||
||||||||||||||||||||||||||||||0||||
|||||||||||||||||||||||||||||||0|||
||||||||||||||||||||||||||||||||0||
|||||120||||||||||||||||||||||||||||0|
||||||||||||||||||||||||||||||||||
||||||||||||||||||||||||||||||||||
||||97||||||||||||||||||||||||||||||
|||24|||||||||||||||||||||||||||||||
||||||||||||||||||||||||||||||||||
||||||||||||||||||||||||||||||||||
||||||||||||||||||||||||||||||||||
||39||||||||||||||||||||||||||||||||
|||||81|||||||||||||||||||||||||||||
||||||||||||||||||||||||||||||||||
||||||||||||||||||||||||||||||||||
|21|||||||||||||||||||||||||||||||||
||||||||||||||||||||||||||||||||||
||||||||||||||||||||||||||||||||||
||||||||||||||||||||||||||||||||||
||||||||||||||||||||||||||||||||||
|||66|||||||||||||||||||||||||||||||
||||||||||||||||||||||||||||||||||
||||||||||||||||||||||||||||||||||
||||81||||||||||||||||||||||||||||||
||||||||||||||||||||||||||||||||||
||3||||||||||||||||||||||||||||||||
|||||117|||||||||||||||||||||||||||||
||84||||||||||||||||||||||||||||||||
||||15||||||||||||||||||||||||||||||
||||||||||||||||||||||||||||||||||
||||||||||||||||||||||||||||||||||
||||||||||||||||||||||||||||||||||
||||||35||||||||||||||||||||||||||||
||||||||||||||||||||||||||||||||||
||||||||||||||||||||||||||||||||||
||||||||||||||||||||||||||||||||||
|||13|||||||||||||||||||||||||||||||

FIG. 19A

| | |
|---|---|
| 19B | 19C |
| 19D | 19E |
| 19F | 19G |

FIG. 19B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 245 | | 171 | 76 | 84 | 11 | 223 | 198 | | 53 | | | 214 | | | 196 | | | | 69 | 22 | | 1 | 0 | | | | |
| 129 | 60 | | | 174 | | 101 | | | | 62 | 99 | | 111 | | | 126 | 233 | 89 | 178 | 137 | 78 | | 0 | 0 | | | |
| 30 | 78 | | | 249 | | | 3 | 125 | | 114 | 56 | 154 | 70 | 220 | 181 | 140 | | | 251 | | 90 | 0 | | 0 | 0 | | |
| | 170 | 21 | 65 | | 219 | 251 | | 176 | 76 | 97 | | 239 | 192 | 48 | 242 | | 240 | 70 | | 117 | 172 | | | | 0 | 0 | |
| 162 | 100 | 1 | 20 | | 186 | | 136 | 100 | 169 | | 218 | | | 37 | | 253 | 254 | 127 | | | | 1 | | | | 0 | |
| 216 | 134 | | | | | | | | | | | | | | | | | | | | | 165 | | | | | 0 |

FIG. 19D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 191 | 182 | | | 9 | | | | | | | 90 | | | | | | | | | | 214 | 113 | | | | | |
| | 7 | | | | | | 61 | | | | | | 13 | 152 | | 189 | | 107 | 203 | | | | | | | | |
| 85 | 191 | 61 | 134 | | 26 | | | | 0 | 91 | | | | | | | | | | | | | | | | | |
| 60 | 159 | | | 129 | | | | | | | 177 | 69 | | | 52 | | | | | | | 13 | | | | | |
| 104 | 128 | | | | | | 224 | 59 | | | | | | | | 89 | | | | 110 | 62 | | | | | | |
| 88 | 90 | 131 | | | 4 | | | | | | | | | | | | 157 | | 212 | | | | | | | | |
| 199 | | | | 253 | | 109 | | | 58 | | 253 | | | | | | | | | | | 218 | | | | | |
| | 125 | | | | | | 4 | | | | | | | 83 | | 71 | | | | | 32 | | | | | | |
| 237 | 12 | 29 | 229 | | | | | | | | | | | | | | | | 252 | | | | | 141 | | | |
| 253 | | | | 67 | 155 | | | | 23 | | 79 | | | | | | | | | | | | | | | | |
| 43 | 22 | | | | | | 114 | | | | | | | 104 | | 183 | | | | | | 237 | 21 | | | | |
| | 113 | 156 | | | | | | | | | | | | | | | | 255 | 78 | | | | | | | | |
| 28 | | | | 61 | 221 | | | | | | 226 | | | | | | | | | | | | | | 192 | | |
| 234 | 252 | | | | | | | 181 | 184 | | | | | | | | | | | | 165 | | | | | | |
| 190 | 199 | | | | | | 122 | | | | | | | 193 | | | | | | | | | | | | 238 | |
| | 49 | | 87 | | | | | | | | | | | | | 196 | | | 191 | | | | | | | | |
| 184 | 243 | 193 | | | 115 | | | | | | | | | | 37 | | | | | | | | | | | | |
| 116 | | | | 73 | | | | | 74 | | 114 | | 107 | | | | | | | | | | | | | | |
| | 92 | | | | | | 129 | | | 241 | | | | 138 | | | | | | | | | | | | | |
| 246 | | | | | | | | | | | | 225 | | | | | | | 111 | | | 42 | | | | | |

FIG. 19E

| | | | | | | | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|---|---|---|---|
| 0 | | | | | | | | | | | | | | | | | | | | | | | | | | | | | | | | | | | | | | | |
| | 0 | | | | | | | | | | | | | | | | | | | | | | | | | | | | | | | | | | | | | | |
| | | 0 | | | | | | | | | | | | | | | | | | | | | | | | | | | | | | | | | | | | | |
| | | | 0 | | | | | | | | | | | | | | | | | | | | | | | | | | | | | | | | | | | | |
| | | | | 0 | | | | | | | | | | | | | | | | | | | | | | | | | | | | | | | | | | | |
| | | | | | 0 | | | | | | | | | | | | | | | | | | | | | | | | | | | | | | | | | | |
| | | | | | | 0 | | | | | | | | | | | | | | | | | | | | | | | | | | | | | | | | | |
| | | | | | | | 0 | | | | | | | | | | | | | | | | | | | | | | | | | | | | | | | | |
| | | | | | | | | 0 | | | | | | | | | | | | | | | | | | | | | | | | | | | | | | | |
| | | | | | | | | | 0 | | | | | | | | | | | | | | | | | | | | | | | | | | | | | | |
| | | | | | | | | | | 0 | | | | | | | | | | | | | | | | | | | | | | | | | | | | | |
| | | | | | | | | | | | 0 | | | | | | | | | | | | | | | | | | | | | | | | | | | | |
| | | | | | | | | | | | | 0 | | | | | | | | | | | | | | | | | | | | | | | | | | | |
| | | | | | | | | | | | | | 0 | | | | | | | | | | | | | | | | | | | | | | | | | | |
| | | | | | | | | | | | | | | 0 | | | | | | | | | | | | | | | | | | | | | | | | | |
| | | | | | | | | | | | | | | | 0 | | | | | | | | | | | | | | | | | | | | | | | | |
| | | | | | | | | | | | | | | | | 0 | | | | | | | | | | | | | | | | | | | | | | | |
| | | | | | | | | | | | | | | | | | 0 | | | | | | | | | | | | | | | | | | | | | | |
| | | | | | | | | | | | | | | | | | | 0 | | | | | | | | | | | | | | | | | | | | | |
| | | | | | | | | | | | | | | | | | | | 0 | | | | | | | | | | | | | | | | | | | | |

FIG. 19F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 51 | 213 | | | | | | | | | | | | | | | 88 | | | | 238 | | | | | | | |
| 226 | | | | | | 142 | | | | | 41 | | | | | | 121 | | | | | | | | | | |
| 201 | | 247 | | | | | 147 | | 72 | | | | | | | | | | | | | | | | | | |
| 108 | 229 | | | | | | | | | | | | | 13 | | | | | 153 | | | | | 88 | | | |
| 93 | 128 | | | | | | | | | 237 | | | 221 | | | | | | | | | | | | | | |
| | 187 | | | 180 | | | | | | | | | | | | | | | | | | | | | 74 | | |
| 253 | | | | | 112 | | | | | | | | | | | 74 | 120 | | | | | | | | | | |
| 9 | 154 | | | | | | 35 | | | | | | | | | | | | | | | | 162 | | | | |
| 189 | 239 | | | | | | | 249 | | | | | | | | | | 70 | | | | | | | | | |
| 120 | 212 | | | | | | | | | | 242 | | | | | | | | 110 | | | | | | | 129 | |
| 175 | 90 | | | | | | | | 192 | | | | | | 32 | | | | | | | | | | | | |
| 71 | | | | | 146 | | | | | | | | | | | 51 | | | | | | | 234 | | | | |
| | 253 | | | | | | 10 | | | | | 176 | | | | | | | | | | | | | | | |
| 191 | 197 | | | | | 138 | | | | | | | | | | | | | | | | | | | 160 | | |
| 96 | | | 166 | | | | | | | | | | | 0 | | | | | 5 | | | | | | | | |
| 59 | | | | | | | | | | | 159 | | | | | | | | | | | | | 163 | | | |
| 134 | 27 | | | | | | | | | | | | | | | | | | | 64 | 174 | | | | | | |
| 4 | | | | | | | | | 237 | | | | | | | 200 | | | | | | | | | | 160 | |
| | 132 | | | | | | | | | 98 | | | 200 | | | | | | | | | | | | | | |
| 252 | | | | | 32 | | | 116 | | | | | | | | | | | | | | | | | | | |

FIG. 20A

| | |
|---|---|
| 20B | 20C |
| 20D | 20E |
| 20F | 20G |

FIG. 20B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 281 | | 356 | 117 | 344 | 23 | 287 | 190 | | 74 | | | 290 | | | 208 | | | | 24 | 375 | | 1 | 0 | | | | |
| 238 | 357 | | | 86 | | 14 | | | | 158 | 59 | | 364 | | | 326 | 369 | 56 | 59 | 276 | 30 | | 0 | 0 | | | |
| 180 | 332 | | | 270 | | | 153 | 318 | | 247 | 238 | 27 | 58 | 43 | 289 | 360 | | | 326 | | 26 | 0 | | 0 | 0 | | |
| | 329 | 125 | 44 | | 376 | 307 | | 232 | 28 | 109 | | 86 | 119 | 106 | 305 | | 109 | 22 | | 321 | 4 | | | | 0 | 0 | |
| 87 | 372 | 193 | 101 | | 186 | | 283 | 245 | 135 | | 65 | | | 37 | | 141 | 210 | 100 | | | | 1 | | | | 0 | |
| 148 | 352 | | | | | | | | | | | | | | | | | | | | | 73 | | | | | 0 |

FIG. 20D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 332 | 181 | | | 217 | | | | | | | 131 | | | | | | | | | | 85 | 96 | | | | | |
| | 330 | | | | | | 16 | | | | | | 197 | 225 | | 16 | | 338 | 134 | | | | | | | | |
| 198 | 218 | 65 | 198 | | 162 | | | | 128 | 122 | | | | | | | | | | | | | | | | | |
| 352 | 265 | | | 328 | | | | | | | 128 | 321 | | | 232 | | | | | | | 138 | | | | | |
| 271 | 205 | | | | | | 207 | 34 | | | | | | | | 235 | | | | 383 | 115 | | | | | | |
| 64 | 156 | 227 | | | 313 | | | | | | | | | | | | 45 | | 320 | | | | | | | | |
| 284 | | | | 84 | | 311 | | | 268 | | 22 | | | | | | | | | | | 160 | | | | | |
| | 380 | | | | | | 82 | | | | | | | 310 | | 59 | | | | | 176 | | | | | | |
| 17 | 216 | 286 | 124 | | | | | | | | | | | | | | | | 54 | | | | | 18 | | | |
| 1 | | | | 351 | 278 | | | | 78 | | 38 | | | | | | | | | | | | | | | | |
| 129 | 108 | | | | | | 195 | | | | | | | 325 | | 59 | | | | | | 307 | 127 | | | | |
| | 378 | 84 | | | | | | | | | | | | | | | | 175 | 294 | | | | | | | | |
| 46 | | | | 45 | 133 | | | | | | 358 | | | | | | | | | | | | | | 320 | | |
| 370 | 18 | | | | | | | 1 | 138 | | | | | | | | | | | | 364 | | | | | | |
| 36 | 328 | | | | | | 218 | | | | | | | 99 | | | | | | | | | | | | 174 | |
| | 265 | | 19 | | | | | | | | | | | | | 115 | | | 216 | | | | | | | | |
| 23 | 76 | 288 | | | 172 | | | | | | | | | | 18 | | | | | | | | | | | | |
| 364 | | | | 118 | | | | | 39 | | 117 | | 31 | | | | | | | | | | | | | | |
| | 300 | | | | | | 44 | | | 64 | | | | 245 | | | | | | | | | | | | | |
| 9 | | | | | | | | | | | | 239 | | | | | | | 244 | | | 170 | | | | | |

FIG. 20F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 379 | 25 | | | | | | | | | | | | | | | 243 | | | | 366 | | | | | | | |
| 318 | | | | | | 183 | | | | | 289 | | | | | | 60 | | | | | | | | | | |
| 364 | | 274 | | | | | 314 | | 104 | | | | | | | | | | | | | | | | | | |
| 40 | 375 | | | | | | | | | | | | | 183 | | | | | 304 | | | | | 171 | | | |
| 331 | 68 | | | | | | | | | 365 | | | 215 | | | | | | | | | | | | | | |
| | 253 | | | 233 | | | | | | | | | | | | | | | | | | | | | 134 | | |
| 292 | | | | | 293 | | | | | | | | | | | 214 | 172 | | | | | | | | | | |
| 229 | 172 | | | | | | 347 | | | | | | | | | | | | | | | | 165 | | | | |
| 93 | 375 | | | | | | | 381 | | | | | | | | | | 276 | | | | | | | | | |
| 96 | 116 | | | | | | | | | | 358 | | | | | | | | 34 | | | | | | | 217 | |
| 159 | 52 | | | | | | | | 68 | | | | | | 120 | | | | | | | | | | | | |
| 156 | | | | | 187 | | | | | | | | | | | 367 | | | | | | | 138 | | | | |
| | 310 | | | | | | 170 | | | | | 12 | | | | | | | | | | | | | | | |
| 225 | 139 | | | | | 202 | | | | | | | | | | | | | | | | | | | 149 | | |
| 48 | | | 370 | | | | | | | | | | | 353 | | | | | 314 | | | | | | | | |
| 241 | | | | | | | | | | | 111 | | | | | | | | | | | | | 212 | | | |
| 141 | 280 | | | | | | | | | | | | | | | | | | | 108 | 19 | | | | | | |
| 190 | | | | | | | | | 110 | | | | | | | 32 | | | | | | | | | | 252 | |
| | 283 | | | | | | | | | 250 | | | 371 | | | | | | | | | | | | | | |
| 265 | | | | | 337 | | | 346 | | | | | | | | | | | | | | | | | | | |

FIG. 21A

| | |
|---|---|
| 21B | 21C |
| 21D | 21E |
| 21F | 21G |

FIG. 21B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 34 | | 61 | 217 | 4 | 46 | 140 | 118 | | 87 | | | 196 | | | 2 | | | | 35 | 140 | | 1 | 0 | | | | |
| 143 | 207 | | | 135 | | 54 | | | | 11 | 60 | | 178 | | | 280 | 250 | 57 | 172 | 233 | 245 | | 0 | 0 | | | |
| 31 | 64 | | | 6 | | | 182 | 259 | | 58 | 254 | 264 | 14 | 74 | 65 | 5 | | | 204 | | 303 | 0 | | 0 | 0 | | |
| | 88 | 136 | 129 | | 277 | 79 | | 218 | 88 | 305 | | 79 | 0 | 6 | 86 | | 263 | 85 | | 270 | 234 | | | | 0 | 0 | |
| 141 | 226 | 30 | 185 | | 200 | | 56 | 267 | 203 | | 231 | | | 78 | | 290 | 74 | 312 | | | | 1 | | | | 0 | |
| 78 | 66 | | | | | | | | | | | | | | | | | | | | | 126 | | | | | 0 |

FIG. 21D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 96 | 205 | | | 239 | | | | | | | 65 | | | | | | | | | | 292 | 50 | | | | | |
| | 113 | | | | | | 295 | | | | | | 112 | 274 | | 36 | | 14 | 290 | | | | | | | | |
| 86 | 146 | 103 | 71 | | 202 | | | | 140 | 208 | | | | | | | | | | | | | | | | | |
| 206 | 80 | | | 62 | | | | | | | 234 | 245 | | | 99 | | | | | | | 237 | | | | | |
| 84 | 245 | | | | | | 4 | 123 | | | | | | | | 22 | | | | 303 | 241 | | | | | | |
| 63 | 174 | 264 | | | 6 | | | | | | | | | | | | 294 | | 14 | | | | | | | | |
| 269 | | | | 223 | | 21 | | | 269 | | 29 | | | | | | | | | | | 296 | | | | | |
| | 41 | | | | | | 53 | | | | | | | 40 | | 93 | | | | | 135 | | | | | | |
| 169 | 194 | 45 | 63 | | | | | | | | | | | | | | | | 158 | | | | | 191 | | | |
| 169 | | | | 124 | 79 | | | | 244 | | 168 | | | | | | | | | | | | | | | | |
| 310 | 147 | | | | | | 301 | | | | | | | 195 | | 99 | | | | | | 106 | 150 | | | | |
| | 262 | 237 | | | | | | | | | | | | | | | | 264 | 185 | | | | | | | | |
| 142 | | | | 10 | 99 | | | | | | 285 | | | | | | | | | | | | | | 33 | | |
| 190 | 236 | | | | | | | 165 | 249 | | | | | | | | | | | | 104 | | | | | | |
| 255 | 318 | | | | | | 239 | | | | | | | 48 | | | | | | | | | | | | 145 | |
| | 21 | | 43 | | | | | | | | | | | | | 210 | | | 293 | | | | | | | | |
| 29 | 78 | 196 | | | 82 | | | | | | | | | | 74 | | | | | | | | | | | | |
| 243 | | | | 27 | | | | | 17 | | 269 | | 122 | | | | | | | | | | | | | | |
| | 277 | | | | | | 34 | | | 232 | | | | 137 | | | | | | | | | | | | | |
| 1 | | | | | | | | | | | | 66 | | | | | | | 103 | | | 317 | | | | | |

FIG. 21F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 255 | 150 | | | | | | | | | | | | | | | 311 | | | | 237 | | | | | | | |
| 319 | | | | | | 226 | | | | | 187 | | | | | | 11 | | | | | | | | | | |
| 133 | | 268 | | | | | 179 | | 239 | | | | | | | | | | | | | | | | | | |
| 0 | 282 | | | | | | | | | | | | | 173 | | | | | 19 | | | | | 283 | | | |
| 296 | 239 | | | | | | | | | 19 | | | 112 | | | | | | | | | | | | | | |
| | 161 | | | 189 | | | | | | | | | | | | | | | | | | | | | 199 | | |
| 217 | | | | | 37 | | | | | | | | | | | 83 | 292 | | | | | | | | | | |
| 202 | 263 | | | | | | 40 | | | | | | | | | | | | | | | | 137 | | | | |
| 35 | 36 | | | | | | | 162 | | | | | | | | | | 84 | | | | | | | | | |
| 84 | 107 | | | | | | | | | | 121 | | | | | | | | 260 | | | | | | | 98 | |
| 72 | 149 | | | | | | | | 257 | | | | | | 121 | | | | | | | | | | | | |
| 114 | | | | | 145 | | | | | | | | | | | 310 | | | | | | | 222 | | | | |
| | 201 | | | | | | 147 | | | | | 288 | | | | | | | | | | | | | | | |
| 300 | 211 | | | | | 203 | | | | | | | | | | | | | | | | | | | 58 | | |
| 213 | | | 261 | | | | | | | | | | | 41 | | | | | 120 | | | | | | | | |
| 159 | | | | | | | | | | | 32 | | | | | | | | | | | | | 203 | | | |
| 91 | 107 | | | | | | | | | | | | | | | | | | | 131 | 260 | | | | | | |
| 146 | | | | | | | | | 173 | | | | | | | 86 | | | | | | | | | | 8 | |
| | 14 | | | | | | | | | 260 | | | 294 | | | | | | | | | | | | | | |
| 254 | | | | | 166 | | | 45 | | | | | | | | | | | | | | | | | | | |

FIG. 22A

| | |
|---|---|
| 22B | 22C |
| 22D | 22E |
| 22F | 22G |

FIG. 22B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 46 | | 182 | 14 | 99 | 21 | 212 | 70 | | 99 | | | 29 | | | 192 | | | | 30 | 100 | | 1 | 0 | | | | |
| 118 | 172 | | | 47 | | 12 | | | | 184 | 105 | | 56 | | | 118 | 120 | 77 | 190 | 150 | 54 | | 0 | 0 | | | |
| 200 | 70 | | | 188 | | | 65 | 184 | | 103 | 158 | 17 | 130 | 202 | 93 | 191 | | | 209 | | 28 | 0 | | 0 | 0 | | |
| | 209 | 90 | 133 | | 55 | 89 | | 12 | 33 | 95 | | 4 | 162 | 130 | 25 | | 135 | 149 | | 46 | 37 | | | | 0 | 0 | |
| 98 | 121 | 199 | 164 | | 204 | | 86 | 150 | 69 | | 108 | | | 221 | | 160 | 183 | 153 | | | | 1 | | | | 0 | |
| 217 | 160 | | | | | | | | | | | | | | | | | | | | | 105 | | | | | 0 |

FIG. 22D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 33 | 135 | | | 79 | | | | | | | 198 | | | | | | | | | | 80 | 6 | | | | | |
| | 163 | | | | | | 97 | | | | | | 2 | 209 | | 82 | | 179 | 28 | | | | | | | | |
| 125 | 141 | 157 | 221 | | 30 | | | | 143 | 26 | | | | | | | | | | | | | | | | | |
| 118 | 191 | | | 217 | | | | | | | 57 | 20 | | | 14 | | | | | | | 106 | | | | | |
| 22 | 127 | | | | | | 147 | 81 | | | | | | | | 134 | | | | 112 | 188 | | | | | | |
| 193 | 48 | 170 | | | 195 | | | | | | | | | | | | 101 | | 30 | | | | | | | | |
| 63 | | | | 141 | | 9 | | | 123 | | 189 | | | | | | | | | | | 161 | | | | | |
| | 206 | | | | | | 42 | | | | | | | 223 | | 207 | | | | | 120 | | | | | | |
| 78 | 35 | 74 | 70 | | | | | | | | | | | | | | | | 203 | | | | | 23 | | | |
| 182 | | | | 211 | 136 | | | | 171 | | 20 | | | | | | | | | | | | | | | | |
| 3 | 20 | | | | | | 83 | | | | | | | 8 | | 30 | | | | | | 139 | 126 | | | | |
| | 88 | 208 | | | | | | | | | | | | | | | | 222 | 11 | | | | | | | | |
| 136 | | | | 199 | 26 | | | | | | 0 | | | | | | | | | | | | | | 1 | | |
| 93 | 221 | | | | | | | 32 | 23 | | | | | | | | | | | | 208 | | | | | | |
| 145 | 209 | | | | | | 145 | | | | | | | 123 | | | | | | | | | | | | 109 | |
| | 197 | | 10 | | | | | | | | | | | | | 185 | | | 212 | | | | | | | | |
| 222 | 20 | 219 | | | 110 | | | | | | | | | | 195 | | | | | | | | | | | | |
| 88 | | | | 161 | | | | | 99 | | 15 | | 7 | | | | | | | | | | | | | | |
| | 149 | | | | | | 22 | | | 78 | | | | 76 | | | | | | | | | | | | | |
| 80 | | | | | | | | | | | | 198 | | | | | | | 201 | | | 56 | | | | | |

FIG. 22F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 38 | 190 | | | | | | | | | | | | | | | 83 | | | | 38 | | | | | | | |
| 50 | | | | | | 167 | | | | | 220 | | | | | | 77 | | | | | | | | | | |
| 147 | | 196 | | | | | 133 | | 215 | | | | | | | | | | | | | | | | | | |
| 5 | 89 | | | | | | | | | | | | | 80 | | | | | 222 | | | | | 177 | | | |
| 136 | 37 | | | | | | | | | 145 | | | 165 | | | | | | | | | | | | | | |
| | 47 | | | 127 | | | | | | | | | | | | | | | | | | | | | 168 | | |
| 211 | | | | | 144 | | | | | | | | | | | 51 | 209 | | | | | | | | | | |
| 87 | 144 | | | | | | 202 | | | | | | | | | | | | | | | | 212 | | | | |
| 94 | 81 | | | | | | | 66 | | | | | | | | | | 132 | | | | | | | | | |
| 192 | 222 | | | | | | | | | | 177 | | | | | | | | 88 | | | | | | | 182 | |
| 19 | 111 | | | | | | | | 101 | | | | | | 154 | | | | | | | | | | | | |
| 20 | | | | | 176 | | | | | | | | | | | 193 | | | | | | | 8 | | | | |
| | 157 | | | | | | 42 | | | | | 18 | | | | | | | | | | | | | | | |
| 178 | 29 | | | | | 146 | | | | | | | | | | | | | | | | | | | 152 | | |
| 192 | | | 157 | | | | | | | | | | | 9 | | | | | 36 | | | | | | | | |
| 192 | | | | | | | | | | | 140 | | | | | | | | | | | | | 27 | | | |
| 85 | 38 | | | | | | | | | | | | | | | | | | | 25 | 126 | | | | | | |
| 177 | | | | | | | | | 59 | | | | | | | 6 | | | | | | | | | | 58 | |
| | 189 | | | | | | | | | 95 | | | 85 | | | | | | | | | | | | | | |
| 7 | | | | | 88 | | | 125 | | | | | | | | | | | | | | | | | | | |

FIG. 23A

| | |
|---|---|
| 23B | 23C |
| 23D | 23E |
| 23F | 23G |

FIG. 23B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 66 | | 193 | 282 | 17 | 43 | 67 | 44 | | 80 | | | 143 | | | 162 | | | | 61 | 101 | | 1 | 0 | | | | |
| 194 | 79 | | | 193 | | 214 | | | | 1 | 60 | | 179 | | | 242 | 261 | 120 | 231 | 4 | 203 | | 0 | 0 | | | |
| 278 | 135 | | | 183 | | | 280 | 135 | | 128 | 110 | 228 | 168 | 8 | 189 | 60 | | | 163 | | 101 | 0 | | 0 | 0 | | |
| | 175 | 129 | 5 | | 59 | 0 | | 267 | 17 | 285 | | 125 | 166 | 59 | 208 | | 138 | 81 | | 284 | 166 | | | | 0 | 0 | |
| 54 | 228 | 144 | 173 | | 278 | | 255 | 152 | 195 | | 70 | | | 249 | | 188 | 233 | 75 | | | | 1 | | | | 0 | |
| 82 | 70 | | | | | | | | | | | | | | | | | | | | | 163 | | | | | 0 |

FIG. 23D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 61 | 5 | | | 193 | | | | | | | 158 | | | | | | | | | | 258 | 3 | | | | | |
| | 281 | | | | | | 233 | | | | | | 209 | 79 | | 42 | | 26 | 84 | | | | | | | | |
| 89 | 3 | 64 | 274 | | 170 | | | | 19 | 129 | | | | | | | | | | | | | | | | | |
| 90 | 191 | | | 155 | | | | | | | 145 | 129 | | | 201 | | | | | | | 20 | | | | | |
| 248 | 88 | | | | | | 55 | 229 | | | | | | | | 267 | | | | 86 | 43 | | | | | | |
| 202 | 207 | 284 | | | 97 | | | | | | | | | | | | 234 | | 122 | | | | | | | | |
| 40 | | | | 128 | | 211 | | | 180 | | 225 | | | | | | | | | | | 240 | | | | | |
| | 45 | | | | | | 57 | | | | | | | 13 | | 254 | | | | | 137 | | | | | | |
| 224 | 174 | 62 | 215 | | | | | | | | | | | | | | | | 147 | | | | | 148 | | | |
| 260 | | | | 98 | 26 | | | | 192 | | 266 | | | | | | | | | | | | | | | | |
| 134 | 100 | | | | | | 14 | | | | | | | 37 | | 259 | | | | | | 60 | 100 | | | | |
| | 268 | 31 | | | | | | | | | | | | | | | | 239 | 214 | | | | | | | | |
| 115 | | | | 199 | 243 | | | | | | 282 | | | | | | | | | | | | | | 0 | | |
| 23 | 9 | | | | | | | 16 | 229 | | | | | | | | | | | | 38 | | | | | | |
| 108 | 277 | | | | | | 241 | | | | | | | 244 | | | | | | | | | | | | 271 | |
| | 235 | | 1 | | | | | | | | | | | | | 78 | | | 121 | | | | | | | | |
| 164 | 47 | 195 | | | 273 | | | | | | | | | | 150 | | | | | | | | | | | | |
| 1 | | | | 39 | | | | | 76 | | 232 | | 73 | | | | | | | | | | | | | | |
| | 213 | | | | | | 98 | | | 61 | | | | 131 | | | | | | | | | | | | | |
| 231 | | | | | | | | | | | | 12 | | | | | | | 75 | | | 84 | | | | | |

FIG. 23F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 211 | 229 | | | | | | | | | | | | | | | 90 | | | | 195 | | | | | | | |
| 29 | | | | | | 224 | | | | | 201 | | | | | | 147 | | | | | | | | | | |
| 92 | | 224 | | | | | 40 | | 177 | | | | | | | | | | | | | | | | | | |
| 44 | 57 | | | | | | | | | | | | | 182 | | | | | 36 | | | | | 113 | | | |
| 220 | 271 | | | | | | | | | 284 | | | 172 | | | | | | | | | | | | | | |
| | 131 | | | 160 | | | | | | | | | | | | | | | | | | | | | 254 | | |
| 1 | | | | | 150 | | | | | | | | | | | 258 | 57 | | | | | | | | | | |
| 152 | 73 | | | | | | 214 | | | | | | | | | | | | | | | | 92 | | | | |
| 156 | 188 | | | | | | | 243 | | | | | | | | | | 146 | | | | | | | | | |
| 129 | 269 | | | | | | | | | | 117 | | | | | | | | 46 | | | | | | | 53 | |
| 63 | 180 | | | | | | | | 42 | | | | | | 236 | | | | | | | | | | | | |
| 248 | | | | | 280 | | | | | | | | | | | 234 | | | | | | | 68 | | | | |
| | 172 | | | | | | 193 | | | | | 185 | | | | | | | | | | | | | | | |
| 221 | 225 | | | | | 129 | | | | | | | | | | | | | | | | | | | 28 | | |
| 62 | | | 281 | | | | | | | | | | | 166 | | | | | 238 | | | | | | | | |
| 204 | | | | | | | | | | | 30 | | | | | | | | | | | | | 48 | | | |
| 271 | 227 | | | | | | | | | | | | | | | | | | | 280 | 176 | | | | | | |
| 70 | | | | | | | | | 178 | | | | | | | 70 | | | | | | | | | | 220 | |
| | 257 | | | | | | | | | 8 | | | 155 | | | | | | | | | | | | | | |
| 287 | | | | | 282 | | | 65 | | | | | | | | | | | | | | | | | | | |

FIG. 24A

| | |
|---|---|
| 24B | 24C |
| 24D | 24E |
| 24F | 24G |

FIG. 24B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 157 | | 25 | 137 | 23 | 291 | 253 | 338 | | 20 | | | 136 | | | 351 | | | | 308 | 39 | | 1 | 0 | | | | |
| 203 | 211 | | | 74 | | 74 | | | | 311 | 100 | | 340 | | | 79 | 322 | 343 | 6 | 324 | 152 | | 0 | 0 | | | |
| 284 | 40 | | | 203 | | | 16 | 288 | | 255 | 338 | 196 | 165 | 72 | 102 | 70 | | | 152 | | 7 | 0 | | 0 | 0 | | |
| | 268 | 139 | 8 | | 346 | 112 | | 271 | 61 | 159 | | 209 | 162 | 277 | 317 | | 7 | 351 | | 330 | 107 | | | | 0 | 0 | |
| 314 | 247 | 279 | 177 | | 14 | | 88 | 262 | 85 | | 73 | | | 3 | | 315 | 153 | 290 | | | | 1 | | | | 0 | |
| 308 | 126 | | | | | | | | | | | | | | | | | | | | | 21 | | | | | 0 |

FIG. 24D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 183 | 118 | | | 24 | | | | | | | 4 | | | | | | | | | | 343 | 76 | | | | | |
| | 236 | | | | | | 2 | | | | | | 2 | 275 | | 184 | | 251 | 320 | | | | | | | | |
| 298 | 318 | 126 | 206 | | 185 | | | | 6 | 259 | | | | | | | | | | | | | | | | | |
| 153 | 186 | | | 52 | | | | | | | 244 | 38 | | | 35 | | | | | | | 265 | | | | | |
| 341 | 36 | | | | | | 3 | 241 | | | | | | | | 112 | | | | 351 | 215 | | | | | | |
| 62 | 231 | 95 | | | 85 | | | | | | | | | | | | 171 | | 142 | | | | | | | | |
| 35 | | | | 87 | | 245 | | | 184 | | 17 | | | | | | | | | | | 86 | | | | | |
| | 188 | | | | | | 150 | | | | | | | 215 | | 284 | | | | | 270 | | | | | | |
| 299 | 220 | 325 | 167 | | | | | | | | | | | | | | | | 275 | | | | | 138 | | | |
| 140 | | | | 188 | 178 | | | | 37 | | 350 | | | | | | | | | | | | | | | | |
| 243 | 229 | | | | | | 48 | | | | | | | 297 | | 133 | | | | | | 4 | 330 | | | | |
| | 281 | 333 | | | | | | | | | | | | | | | | 70 | 131 | | | | | | | | |
| 13 | | | | 271 | 174 | | | | | | 260 | | | | | | | | | | | | | | 192 | | |
| 62 | 110 | | | | | | | 38 | 208 | | | | | | | | | | | | 14 | | | | | | |
| 299 | 175 | | | | | | 70 | | | | | | | 224 | | | | | | | | | | | | 33 | |
| | 242 | | 157 | | | | | | | | | | | | | 199 | | | 11 | | | | | | | | |
| 104 | 236 | 40 | | | 72 | | | | | | | | | | 106 | | | | | | | | | | | | |
| 160 | | | | 201 | | | | | 161 | | 245 | | 139 | | | | | | | | | | | | | | |
| | 176 | | | | | | 119 | | | 231 | | | | 178 | | | | | | | | | | | | | |
| 214 | | | | | | | | | | | | 155 | | | | | | | 161 | | | 99 | | | | | |

FIG. 24F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 65 | 57 | | | | | | | | | | | | | | | 29 | | | | 172 | | | | | | | |
| 167 | | | | | | 6 | | | | | 199 | | | | | | 137 | | | | | | | | | | |
| 341 | | 274 | | | | | 181 | | 101 | | | | | | | | | | | | | | | | | | |
| 123 | 178 | | | | | | | | | | | | | 131 | | | | | 111 | | | | | 247 | | | |
| 154 | 284 | | | | | | | | | 343 | | | 271 | | | | | | | | | | | | | | |
| | 15 | | | 344 | | | | | | | | | | | | | | | | | | | | | 123 | | |
| 271 | | | | | 262 | | | | | | | | | | | 16 | 323 | | | | | | | | | | |
| 72 | 151 | | | | | | 301 | | | | | | | | | | | | | | | | 151 | | | | |
| 286 | 310 | | | | | | | 148 | | | | | | | | | | 249 | | | | | | | | | |
| 34 | 15 | | | | | | | | | | 201 | | | | | | | | 245 | | | | | | | 46 | |
| 77 | 249 | | | | | | | | 265 | | | | | | 325 | | | | | | | | | | | | |
| 162 | | | | | 232 | | | | | | | | | | | 192 | | | | | | | 57 | | | | |
| | 0 | | | | | | 182 | | | | | 107 | | | | | | | | | | | | | | | |
| 239 | 53 | | | | | 292 | | | | | | | | | | | | | | | | | | | 138 | | |
| 186 | | | 189 | | | | | | | | | | | 142 | | | | | 183 | | | | | | | | |
| 7 | | | | | | | | | | | 210 | | | | | | | | | | | | | 129 | | | |
| 167 | 23 | | | | | | | | | | | | | | | | | | | 185 | 274 | | | | | | |
| 77 | | | | | | | | | 325 | | | | | | | 192 | | | | | | | | | | 136 | |
| | 274 | | | | | | | | | 309 | | | 97 | | | | | | | | | | | | | | |
| 248 | | | | | 276 | | | 254 | | | | | | | | | | | | | | | | | | | |

FIG. 25A

| | |
|---|---|
| 25B | 25C |
| 25D | 25E |
| 25F | 25G |

FIG. 25B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 152 | | 100 | 114 | 176 | 168 | 48 | 195 | | 89 | | | 188 | | | 202 | | | | 190 | 116 | | 1 | 0 | | | | |
| 123 | 93 | | | 2 | | 207 | | | | 92 | 29 | | 85 | | | 123 | 106 | 9 | 197 | 47 | 173 | | 0 | 0 | | | |
| 153 | 136 | | | 77 | | | 85 | 61 | | 182 | 148 | 184 | 207 | 124 | 83 | 207 | | | 185 | | 25 | 0 | | 0 | 0 | | |
| | 186 | 159 | 16 | | 197 | 35 | | 60 | 175 | 30 | | 76 | 53 | 173 | 58 | | 89 | 7 | | 198 | 192 | | | | 0 | 0 | |
| 196 | 105 | 197 | 25 | | 195 | | 72 | 205 | 68 | | 99 | | | 80 | | 23 | 15 | 23 | | | | 1 | | | | 0 | |
| 70 | 156 | | | | | | | | | | | | | | | | | | | | | 118 | | | | | 0 |

FIG. 25D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 147 | 114 | | | 27 | | | | | | | 205 | | | | | | | | | | 156 | 96 | | | | | |
| | 85 | | | | | | 114 | | | | | | 143 | 137 | | 14 | | 85 | 145 | | | | | | | | |
| 196 | 172 | 155 | 185 | | 60 | | | | 47 | 176 | | | | | | | | | | | | | | | | | |
| 137 | 27 | | | 105 | | | | | | | 18 | 100 | | | 141 | | | | | | | 90 | | | | | |
| 71 | 80 | | | | | | 24 | 185 | | | | | | | | 164 | | | | 195 | 36 | | | | | | |
| 190 | 102 | 164 | | | 187 | | | | | | | | | | | | 32 | | 61 | | | | | | | | |
| 160 | | | | 26 | | 102 | | | 85 | | 24 | | | | | | | | | | | 143 | | | | | |
| | 173 | | | | | | 68 | | | | | | | 20 | | 16 | | | | | 35 | | | | | | |
| 68 | 134 | 124 | 185 | | | | | | | | | | | | | | | | 25 | | | | | 77 | | | |
| 149 | | | | 176 | 156 | | | | 140 | | 33 | | | | | | | | | | | | | | | | |
| 70 | 143 | | | | | | 30 | | | | | | | 197 | | 100 | | | | | | 30 | 31 | | | | |
| | 83 | 48 | | | | | | | | | | | | | | | | 145 | 104 | | | | | | | | |
| 106 | | | | 135 | 185 | | | | | | 170 | | | | | | | | | | | | | | 64 | | |
| 155 | 180 | | | | | | | 143 | 114 | | | | | | | | | | | | 200 | | | | | | |
| 193 | 143 | | | | | | 67 | | | | | | | 28 | | | | | | | | | | | | 123 | |
| | 64 | | 122 | | | | | | | | | | | | | 139 | | | 207 | | | | | | | | |
| 32 | 70 | 194 | | | 138 | | | | | | | | | | 84 | | | | | | | | | | | | |
| 4 | | | | 163 | | | | | 195 | | 169 | | 133 | | | | | | | | | | | | | | |
| | 74 | | | | | | 86 | | | 50 | | | | 71 | | | | | | | | | | | | | |
| 115 | | | | | | | | | | | | 66 | | | | | | | 39 | | | 8 | | | | | |

FIG. 25F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 124 | 195 | | | | | | | | | | | | | | | 86 | | | | 41 | | | | | | | |
| 142 | | | | | | 17 | | | | | 93 | | | | | | 42 | | | | | | | | | | |
| 129 | | 154 | | | | | 13 | | 121 | | | | | | | | | | | | | | | | | | |
| 159 | 60 | | | | | | | | | | | | | 110 | | | | | 115 | | | | | 79 | | | |
| 88 | 184 | | | | | | | | | 127 | | | 36 | | | | | | | | | | | | | | |
| | 51 | | | 178 | | | | | | | | | | | | | | | | | | | | | 60 | | |
| 154 | | | | | 115 | | | | | | | | | | | 157 | 190 | | | | | | | | | | |
| 170 | 105 | | | | | | 149 | | | | | | | | | | | | | | | | 61 | | | | |
| 144 | 181 | | | | | | | 19 | | | | | | | | | | 72 | | | | | | | | | |
| 126 | 126 | | | | | | | | | | 191 | | | | | | | | 10 | | | | | | | 55 | |
| 7 | 135 | | | | | | | | 56 | | | | | | 164 | | | | | | | | | | | | |
| 92 | | | | | 39 | | | | | | | | | | | 121 | | | | | | | 162 | | | | |
| | 183 | | | | | | 124 | | | | | 98 | | | | | | | | | | | | | | | |
| 139 | 137 | | | | | 117 | | | | | | | | | | | | | | | | | | | 171 | | |
| 71 | | | 18 | | | | | | | | | | | 46 | | | | | 86 | | | | | | | | |
| 119 | | | | | | | | | | | 106 | | | | | | | | | | | | | 110 | | | |
| 123 | 85 | | | | | | | | | | | | | | | | | | | 24 | 84 | | | | | | |
| 17 | | | | | | | | | 206 | | | | | | | 165 | | | | | | | | | | 17 | |
| | 132 | | | | | | | | | 59 | | | 172 | | | | | | | | | | | | | | |
| 5 | | | | | 156 | | | 100 | | | | | | | | | | | | | | | | | | | |

FIG. 26A

| | |
|---|---|
| 26B | 26C |
| 26D | 26E |
| 26F | 26G |

FIG. 26B

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 237 | | 234 | 191 | 237 | 25 | 186 | 66 | | 164 | | | 94 | | | 74 | | | | 146 | 134 | | 1 | 0 | | | | |
| 210 | 174 | | | 160 | | 217 | | | | 73 | 233 | | 96 | | | 115 | 202 | 69 | 148 | 115 | 81 | | 0 | 0 | | | |
| 52 | 17 | | | 151 | | | 82 | 81 | | 210 | 32 | 159 | 5 | 210 | 40 | 68 | | | 173 | | 129 | 0 | | 0 | 0 | | |
| | 46 | 83 | 26 | | 96 | 73 | | 1 | 227 | 228 | | 95 | 82 | 159 | 61 | | 96 | 59 | | 157 | 160 | | | | 0 | 0 | |
| 123 | 187 | 33 | 23 | | 35 | | 8 | 147 | 120 | | 57 | | | 122 | | 135 | 0 | 150 | | | | 1 | | | | 0 | |
| 155 | 12 | | | | | | | | | | | | | | | | | | | | | 2 | | | | | 0 |

FIG. 26D

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 30 | 192 | | | 165 | | | | | | | 116 | | | | | | | | | | 205 | 89 | | | | | |
| | 234 | | | | | | 99 | | | | | | 122 | 9 | | 194 | | 153 | 38 | | | | | | | | |
| 151 | 201 | 70 | 126 | | 197 | | | | 140 | 105 | | | | | | | | | | | | | | | | | |
| 84 | 108 | | | 12 | | | | | | | 174 | 8 | | | 151 | | | | | | | 223 | | | | | |
| 20 | 165 | | | | | | 179 | 46 | | | | | | | | 71 | | | | 98 | 81 | | | | | | |
| 9 | 20 | 215 | | | 2 | | | | | | | | | | | | 232 | | 52 | | | | | | | | |
| 47 | | | | 112 | | 74 | | | 20 | | 6 | | | | | | | | | | | 133 | | | | | |
| | 32 | | | | | | 87 | | | | | | | 198 | | 205 | | | | | 97 | | | | | | |
| 199 | 59 | 8 | 236 | | | | | | | | | | | | | | | | 90 | | | | | 88 | | | |
| 18 | | | | 7 | 190 | | | | 76 | | 113 | | | | | | | | | | | | | | | | |
| 5 | 159 | | | | | | 103 | | | | | | | 48 | | 236 | | | | | | 199 | 94 | | | | |
| | 129 | 56 | | | | | | | | | | | | | | | | 95 | 117 | | | | | | | | |
| 67 | | | | 238 | 95 | | | | | | 35 | | | | | | | | | | | | | | 230 | | |
| 45 | 87 | | | | | | | 30 | 137 | | | | | | | | | | | | 27 | | | | | | |
| 7 | 158 | | | | | | 158 | | | | | | | 45 | | | | | | | | | | | | 191 | |
| | 55 | | 180 | | | | | | | | | | | | | 238 | | | 140 | | | | | | | | |
| 71 | 135 | 35 | | | 68 | | | | | | | | | | 131 | | | | | | | | | | | | |
| 219 | | | | 61 | | | | | 184 | | 28 | | 154 | | | | | | | | | | | | | | |
| | 139 | | | | | | 60 | | | 52 | | | | 45 | | | | | | | | | | | | | |
| 8 | | | | | | | | | | | | 79 | | | | | | | 239 | | | 213 | | | | | |

FIG. 26F

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| 116 | 101 | | | | | | | | | | | | | | | 192 | | | | 235 | | | | | | | |
| 60 | | | | | | 32 | | | | | 212 | | | | | | 54 | | | | | | | | | | |
| 159 | | 106 | | | | | 155 | | 149 | | | | | | | | | | | | | | | | | | |
| 58 | 90 | | | | | | | | | | | | | 164 | | | | | 22 | | | | | 232 | | | |
| 25 | 107 | | | | | | | | | 228 | | | 219 | | | | | | | | | | | | | | |
| | 126 | | | 190 | | | | | | | | | | | | | | | | | | | | | 127 | | |
| 197 | | | | | 189 | | | | | | | | | | | 113 | 196 | | | | | | | | | | |
| 75 | 129 | | | | | | 206 | | | | | | | | | | | | | | | | 132 | | | | |
| 195 | 112 | | | | | | | 58 | | | | | | | | | | 209 | | | | | | | | | |
| 112 | 213 | | | | | | | | | | 183 | | | | | | | | 78 | | | | | | | 142 | |
| 61 | 74 | | | | | | | | 89 | | | | | | 47 | | | | | | | | | | | | |
| 146 | | | | | 55 | | | | | | | | | | | 46 | | | | | | | 67 | | | | |
| | 187 | | | | | | 158 | | | | | 174 | | | | | | | | | | | | | | | |
| 89 | 223 | | | | | 78 | | | | | | | | | | | | | | | | | | | 238 | | |
| 44 | | | 167 | | | | | | | | | | | 92 | | | | | 15 | | | | | | | | |
| 10 | | | | | | | | | | | 38 | | | | | | | | | | | | | 86 | | | |
| 159 | 159 | | | | | | | | | | | | | | | | | | | 81 | 72 | | | | | | |
| 197 | | | | | | | | | 230 | | | | | | | 50 | | | | | | | | | | 75 | |
| | 147 | | | | | | | | | 22 | | | 151 | | | | | | | | | | | | | | |
| 185 | | | | | 129 | | | 237 | | | | | | | | | | | | | | | | | | | |

FIG. 26G

| | | | | | | | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|---|---|---|---|
| | | | | | | | | | | | | | | | | | | | |0| | | | | | | | | | | | | | | | | | | |
| | | | | | | | | | | | | | | | | | | | | |0| | | | | | | | | | | | | | | | | | |
| | | | | | | | | | | | | | | | | | | | | | |0| | | | | | | | | | | | | | | | | |
| | | | | | | | | | | | | | | | | | | | | | | |0| | | | | | | | | | | | | | | | |
| | | | | | | | | | | | | | | | | | | | | | | | |0| | | | | | | | | | | | | | | |
| | | | | | | | | | | | | | | | | | | | | | | | | |0| | | | | | | | | | | | | | |
| | | | | | | | | | | | | | | | | | | | | | | | | | |0| | | | | | | | | | | | | |
| | | | | | | | | | | | | | | | | | | | | | | | | | | |0| | | | | | | | | | | | |
| | | | | | | | | | | | | | | | | | | | | | | | | | | | |0| | | | | | | | | | | |
| | | | | | | | | | | | | | | | | | | | | | | | | | | | | |0| | | | | | | | | | |
| | | | | | | | | | | | | | | | | | | | | | | | | | | | | | |0| | | | | | | | | |
| | | | | | | | | | | | | | | | | | | | | | | | | | | | | | | |0| | | | | | | | |
| | | | | | | | | | | | | | | | | | | | | | | | | | | | | | | | |0| | | | | | | |
| | | | | | | | | | | | | | | | | | | | | | | | | | | | | | | | | |0| | | | | | |
| | | | | | | | | | | | | | | | | | | | | | | | | | | | | | | | | | |0| | | | | |
| | | | | | | | | | | | | | | | | | | | | | | | | | | | | | | | | | | |0| | | | |
| | | | | | | | | | | | | | | | | | | | | | | | | | | | | | | | | | | | |0| | | |
| | | | | | | | | | | | | | | | | | | | | | | | | | | | | | | | | | | | | |0| | |
| | | | | | | | | | | | | | | | | | | | | | | | | | | | | | | | | | | | | | |0| |
| | | | | | | | | | | | | | | | | | | | | | | | | | | | | | | | | | | | | | | |0|

FIG. 27A

| | | |
|---|---|---|
| 27B | 27E | 27H |
| 27C | 27F | 27I |
| 27D | 27G | 27J |

FIG. 27B

| | | | | | | | | | | | | | | | | | | | | | | | | | | |
|---|---|---|---|---|---|---|---|---|---|---|---|---|---|---|---|---|---|---|---|---|---|---|---|---|---|---|
| 1 | 1 | 1 | 1 | 0 | 1 | 1 | 0 | 0 | 1 | 1 | 1 | 1 | 1 | 0 | 1 | 1 | 0 | 1 | 1 | 1 | 1 | 1 | 1 | 0 | 0 | 0 |
| 1 | 0 | 1 | 1 | 1 | 1 | 0 | 1 | 1 | 1 | 0 | 1 | 1 | 0 | 1 | 1 | 1 | 1 | 0 | 1 | 0 | 1 | 1 | 1 | 1 | 0 | 0 |
| 1 | 1 | 1 | 0 | 1 | 1 | 1 | 1 | 1 | 1 | 1 | 0 | 0 | 1 | 1 | 1 | 0 | 1 | 1 | 1 | 1 | 0 | 0 | 0 | 1 | 1 | 0 |
| 1 | 1 | 0 | 1 | 1 | 0 | 1 | 1 | 1 | 0 | 1 | 1 | 1 | 1 | 1 | 0 | 1 | 1 | 1 | 0 | 1 | 1 | 1 | 0 | 0 | 1 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |

FIG. 27C

| | | | | | | | | | | | | | | | | | | | | | | | | | | |
|---|---|---|---|---|---|---|---|---|---|---|---|---|---|---|---|---|---|---|---|---|---|---|---|---|---|---|
| 1 | 1 | 0 | 1 | 0 | 0 | 0 | 0 | 0 | 0 | 0 | 0 | 1 | 0 | 0 | 0 | 1 | 0 | 0 | 0 | 0 | 1 | 1 | 0 | 0 | 0 | 0 |
| 1 | 0 | 0 | 0 | 0 | 0 | 1 | 0 | 0 | 0 | 1 | 1 | 0 | 1 | 0 | 0 | 0 | 1 | 1 | 0 | 1 | 0 | 0 | 0 | 0 | 0 | 0 |
| 1 | 1 | 0 | 0 | 1 | 0 | 0 | 1 | 1 | 0 | 0 | 0 | 0 | 0 | 1 | 0 | 0 | 0 | 0 | 0 | 0 | 0 | 0 | 0 | 0 | 0 | 0 |
| 1 | 1 | 0 | 1 | 0 | 0 | 0 | 0 | 0 | 0 | 0 | 0 | 1 | 0 | 0 | 0 | 1 | 0 | 0 | 1 | 0 | 1 | 1 | 0 | 1 | 0 | 0 |
| 1 | 1 | 0 | 0 | 0 | 0 | 0 | 0 | 0 | 0 | 1 | 1 | 0 | 1 | 0 | 0 | 0 | 1 | 1 | 0 | 1 | 0 | 0 | 0 | 0 | 0 | 0 |
| 0 | 1 | 1 | 0 | 1 | 0 | 0 | 1 | 1 | 0 | 0 | 0 | 0 | 0 | 1 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 0 | 1 | 0 | 0 | 0 | 1 | 0 | 0 | 0 | 0 | 1 | 1 | 1 | 0 | 0 | 0 |
| 1 | 1 | 0 | 0 | 0 | 0 | 0 | 0 | 0 | 0 | 1 | 1 | 0 | 1 | 0 | 0 | 0 | 0 | 1 | 0 | 0 | 0 | 0 | 0 | 0 | 0 | 0 |
| 1 | 0 | 0 | 1 | 0 | 0 | 0 | 1 | 0 | 0 | 0 | 0 | 0 | 0 | 0 | 0 | 0 | 0 | 0 | 0 | 1 | 0 | 0 | 1 | 0 | 0 | 0 |
| 1 | 0 | 0 | 0 | 0 | 0 | 0 | 0 | 0 | 0 | 0 | 0 | 1 | 0 | 0 | 1 | 1 | 1 | 0 | 0 | 0 | 1 | 0 | 0 | 0 | 0 | 0 |
| 1 | 1 | 0 | 0 | 0 | 0 | 0 | 0 | 0 | 0 | 1 | 0 | 0 | 1 | 0 | 0 | 0 | 0 | 1 | 0 | 0 | 0 | 0 | 0 | 0 | 1 | 0 |
| 0 | 1 | 0 | 1 | 0 | 0 | 0 | 0 | 0 | 0 | 0 | 1 | 0 | 0 | 0 | 0 | 0 | 0 | 0 | 0 | 1 | 0 | 1 | 0 | 0 | 0 | 0 |
| 1 | 0 | 0 | 0 | 0 | 0 | 0 | 0 | 0 | 0 | 0 | 0 | 0 | 0 | 1 | 0 | 1 | 1 | 0 | 0 | 0 | 1 | 0 | 0 | 0 | 0 | 0 |
| 0 | 1 | 0 | 0 | 0 | 0 | 0 | 0 | 0 | 0 | 0 | 0 | 1 | 1 | 0 | 0 | 0 | 0 | 1 | 1 | 0 | 0 | 0 | 0 | 0 | 0 | 0 |
| 1 | 1 | 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 | 0 | 0 |
| 1 | 0 | 0 | 1 | 0 | 0 | 0 | 0 | 0 | 1 | 0 | 1 | 0 | 0 | 0 | 0 | 0 | 0 | 0 | 0 | 0 | 0 | 1 | 0 | 0 | 0 | 0 |
| 0 | 1 | 0 | 0 | 0 | 1 | 0 | 0 | 0 | 0 | 0 | 0 | 0 | 0 | 0 | 0 | 1 | 0 | 0 | 0 | 1 | 1 | 0 | 0 | 0 | 0 | 0 |
| 1 | 0 | 0 | 0 | 0 | 0 | 0 | 0 | 0 | 0 | 0 | 0 | 1 | 1 | 0 | 0 | 0 | 1 | 0 | 0 | 0 | 0 | 0 | 0 | 0 | 0 | 0 |
| 0 | 1 | 1 | 0 | 0 | 0 | 0 | 0 | 0 | 0 | 1 | 0 | 0 | 0 | 0 | 0 | 0 | 0 | 1 | 0 | 0 | 0 | 0 | 0 | 0 | 0 | 0 |
| 1 | 0 | 0 | 1 | 1 | 0 | 0 | 0 | 0 | 0 | 0 | 1 | 0 | 0 | 0 | 0 | 0 | 0 | 0 | 0 | 0 | 0 | 1 | 0 | 0 | 0 | 0 |

FIG. 27D

| | | | | | | | | | | | | | | | | | | | | | | | | | | |
|---|---|---|---|---|---|---|---|---|---|---|---|---|---|---|---|---|---|---|---|---|---|---|---|---|---|---|
| 0 | 1 | 0 | 0 | 0 | 0 | 1 | 1 | 0 | 0 | 0 | 0 | 0 | 0 | 1 | 0 | 0 | 0 | 0 | 0 | 0 | 0 | 0 | 0 | 0 | 0 | 0 |
| 1 | 0 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 0 | 0 |
| 0 | 1 | 0 | 0 | 0 | 0 | 1 | 0 | 1 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 1 | 0 | 1 | 0 | 0 | 0 | 0 | 0 |
| 0 | 1 | 0 | 0 | 0 | 0 | 0 | 0 | 0 | 0 | 0 | 0 | 0 | 0 | 1 | 0 | 0 | 0 | 1 | 0 | 0 | 0 | 0 | 0 | 0 | 1 | 0 |
| 1 | 0 | 0 | 0 | 0 | 0 | 0 | 0 | 0 | 0 | 1 | 0 | 0 | 1 | 0 | 0 | 0 | 0 | 0 | 0 | 0 | 0 | 0 | 0 | 1 | 0 | 0 |
| 0 | 1 | 0 | 0 | 0 | 0 | 0 | 1 | 0 | 0 | 0 | 0 | 0 | 0 | 0 | 0 | 0 | 0 | 0 | 0 | 0 | 0 | 1 | 0 | 0 | 1 | 0 |
| 1 | 0 | 0 | 0 | 0 | 0 | 0 | 0 | 0 | 0 | 0 | 0 | 1 | 0 | 1 | 0 | 0 | 0 | 0 | 0 | 0 | 0 | 0 | 0 | 1 | 0 | 0 |
| 0 | 1 | 1 | 0 | 0 | 0 | 0 | 0 | 0 | 0 | 0 | 1 | 0 | 0 | 0 | 0 | 0 | 0 | 0 | 0 | 0 | 1 | 0 | 0 | 0 | 0 | 0 |
| 1 | 0 | 0 | 0 | 0 | 0 | 0 | 1 | 0 | 0 | 0 | 0 | 0 | 0 | 0 | 1 | 0 | 1 | 0 | 0 | 0 | 0 | 0 | 0 | 0 | 0 | 0 |
| 0 | 1 | 0 | 0 | 0 | 0 | 1 | 0 | 0 | 0 | 0 | 0 | 1 | 0 | 0 | 0 | 0 | 0 | 0 | 0 | 0 | 0 | 1 | 0 | 0 | 0 | 0 |
| 1 | 0 | 0 | 0 | 0 | 0 | 0 | 0 | 0 | 0 | 0 | 0 | 0 | 0 | 1 | 1 | 0 | 0 | 1 | 0 | 0 | 0 | 0 | 0 | 0 | 0 | 0 |
| 0 | 1 | 0 | 0 | 0 | 0 | 0 | 0 | 0 | 0 | 0 | 0 | 0 | 1 | 0 | 0 | 0 | 0 | 0 | 0 | 0 | 0 | 0 | 1 | 0 | 0 | 0 |
| 1 | 0 | 0 | 0 | 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 |
| 0 | 1 | 0 | 1 | 0 | 0 | 0 | 1 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 0 | 1 | 0 | 0 | 0 | 0 | 0 | 0 | 0 | 0 | 0 |
| 0 | 1 | 0 | 1 | 0 | 0 | 0 | 0 | 0 | 1 | 0 | 0 | 0 | 0 | 0 | 0 | 0 | 0 | 1 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 1 | 0 | 0 |
| 0 | 1 | 0 | 0 | 0 | 0 | 0 | 0 | 0 | 0 | 0 | 0 | 0 | 0 | 0 | 0 | 1 | 0 | 1 | 0 | 0 | 0 | 0 | 0 | 0 | 1 | 0 |
| 1 | 0 | 0 | 0 | 0 | 0 | 0 | 1 | 0 | 1 | 0 | 0 | 0 | 0 | 0 | 0 | 0 | 0 | 0 | 0 | 0 | 0 | 1 | 0 | 0 | 0 | 0 |
| 0 | 1 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 0 |

FIG. 27E

| | | | | | | | | | | | | | | | | | | | |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |

FIG. 27F

| | | | | | | | | | | | | | | | | | | | |
|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 0 | 0 | 0 | 1 |

FIG. 27G

| | | | | | | | | | | | | | | | | | | | |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |

FIG. 27H

| | | | | | | | | | | | | | | | | | | | | |
|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |

FIG. 27I

| | | | | | | | | | | | | | | | | | | | | |
|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 | 0 |

FIG. 27J

| | | | | | | | | | | | | | | | | | | | | |
|---|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 0 | 0 | 0 | 0 | 1 |

FIG. 28A

| | | |
|---|---|---|
| 28B | 28E | 28H |
| 28C | 28F | 28I |
| 28D | 28G | 28J |

FIG. 28B

| | | | | | | | | | | | | | | | | | | | | | | | | | | |
|---|---|---|---|---|---|---|---|---|---|---|---|---|---|---|---|---|---|---|---|---|---|---|---|---|---|---|
| 250 | 69 | 226 | 159 | | 100 | 10 | | | 59 | 229 | 110 | 191 | 9 | | 195 | 23 | | 190 | 35 | 239 | 31 | 1 | 0 | | | |
| 2 | | 239 | 117 | 124 | 71 | | 222 | 104 | 173 | | 220 | 102 | | 109 | 132 | 142 | 155 | | 255 | | 28 | 0 | 0 | 0 | | |
| 106 | 111 | 185 | | 63 | 117 | 93 | 229 | 177 | 95 | 39 | | | 142 | 225 | 225 | | 245 | 205 | 251 | 117 | | | | 0 | 0 | |
| 121 | 89 | | 84 | 20 | | 150 | 131 | 243 | | 136 | 86 | 246 | 219 | 211 | | 240 | 76 | 244 | | 144 | 12 | 1 | | | 0 | |
| 157 | 102 | | | | | | | | | | | | | | | | | | | | | | | | | 0 |

FIG. 28C

| | | | | | | | | | | | | | | | | | | | | | | | | | | |
|---|---|---|---|---|---|---|---|---|---|---|---|---|---|---|---|---|---|---|---|---|---|---|---|---|---|---|
| 205 | 236 | | 194 | | | | | | | | | 231 | | | | 28 | | | | | 123 | 115 | | | | |
| 183 | | | | | | 22 | | | | 28 | 67 | | 244 | | | | 11 | 157 | | 211 | | | | | | |
| 220 | 44 | | | 159 | | | 31 | 167 | | | | | | 104 | | | | | | | | | | | | |
| 112 | 4 | | 7 | | | | | | | | | 211 | | | | 102 | | | 164 | | 109 | 241 | | 90 | | |
| 103 | 182 | | | | | | | | | 109 | 21 | | 142 | | | | 14 | 61 | | 216 | | | | | | |
| | 98 | 149 | | 167 | | | 160 | 49 | | | | | | 58 | | | | | | | | | | | | |
| 77 | 41 | | | | | | | | | | | 83 | | | | 182 | | | | | 78 | 252 | 22 | | | |
| 160 | 42 | | | | | | | | | 21 | 32 | | 234 | | | | | 7 | | | | | | | | |
| 177 | | | 248 | | | | 151 | | | | | | | | | | | | | 185 | | | 62 | | | |
| 206 | | | | | | | | | | | | 55 | | | 206 | 127 | 16 | | | | 229 | | | | | |
| 40 | 96 | | | | | | | | | 65 | | | 63 | | | | | 75 | | | | | | | 179 | |
| | 64 | | 49 | | | | | | | | 49 | | | | | | | | | 51 | | 154 | | | | |
| 7 | | | | | | | | | | | | | | 164 | | 59 | 1 | | | | 144 | | | | | |
| | 42 | | | | | | | | | | | 233 | 8 | | | | | 155 | 147 | | | | | | | |
| 60 | 73 | | | | | | 72 | 127 | | 224 | | | | | | | | | | | | | | | | |
| 151 | | | 186 | | | | | | 217 | | 47 | | | | | | | | | | | 160 | | | | |
| | 249 | | | | 121 | | | | | | | | | | | 109 | | | | 131 | 171 | | | | | |
| 64 | | | | | | | | | | | | 142 | 188 | | | | 158 | | | | | | | | | |
| | 156 | 147 | | | | | | | | 170 | | | | | | | | 152 | | | | | | | | |
| 112 | | | 86 | 236 | | | | | | | 116 | | | | | | | | | | | 222 | | | | |

FIG. 28D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 23 | | | | | 136 | 116 | | | | | | | 182 | | | | | | | | | | | | |
| 195 | | 243 | | 215 | | | | | | | | | | | 61 | | | | | | | | | | | |
| | 25 | | | | | 104 | | 194 | | | | | | | | | | | | | | | | | | |
| 128 | | | | 165 | | | | | | | | | | | | | | | 181 | | 63 | | | | | |
| | 86 | | | | | | | | | | | | | 236 | | | | 84 | | | | | | | 6 | |
| 216 | | | | | | | | | | 73 | | | 120 | | | | | | | | | | | 9 | | |
| | 95 | | | | | | 177 | | | | | | | | | | | | | | | 172 | | | 61 | |
| 221 | | | | | | | | | | | | 112 | | 199 | | | | | | | | | | 121 | | |
| | 2 | 187 | | | | | | | | | 41 | | | | | | | | | | 211 | | | | | |
| 127 | | | | | | | 167 | | | | | | | | 164 | | 159 | | | | | | | | | |
| | 161 | | | | | 197 | | | | | | 207 | | | | | | | | | | 103 | | | | |
| 37 | | | | | | | | | | | | | | 105 | 51 | | | 120 | | | | | | | | |
| | 198 | | | | | | | | | | | | 220 | | | | | | | | | | 122 | | | |
| 169 | | | | | | | | | 204 | 221 | | 239 | | | | | | | | | | | | | | |
| | 136 | | 251 | | | | 79 | | | | | | | | | | | | 138 | | | | | | | |
| 189 | | | | | | | | 61 | | | | | | | | | 19 | | | | | | | | | |
| | 81 | | 185 | | | | | | 28 | | | | | | | | | 97 | | | | | | | | |
| 124 | | | | 42 | | | | | | | | | | | | | | | | | | | | 247 | | |
| | 70 | | | | | | | | | | | | | | | 134 | | 160 | | | | | | | 31 | |
| 192 | | | | | | | 27 | | 199 | | | | | | | | | | | | | 207 | | | | |
| | 156 | | | | | 50 | | | | 226 | | | | | | | | | | | | | | | | |

FIG. 28F

| | | | | | | | | | | | | | | | | | | | |
|---|---|---|---|---|---|---|---|---|---|---|---|---|---|---|---|---|---|---|---|
| 0 | | | | | | | | | | | | | | | | | | | |
| | 0 | | | | | | | | | | | | | | | | | | |
| | | 0 | | | | | | | | | | | | | | | | | |
| | | | 0 | | | | | | | | | | | | | | | | |
| | | | | 0 | | | | | | | | | | | | | | | |
| | | | | | 0 | | | | | | | | | | | | | | |
| | | | | | | 0 | | | | | | | | | | | | | |
| | | | | | | | 0 | | | | | | | | | | | | |
| | | | | | | | | 0 | | | | | | | | | | | |
| | | | | | | | | | 0 | | | | | | | | | | |
| | | | | | | | | | | 0 | | | | | | | | | |
| | | | | | | | | | | | 0 | | | | | | | | |
| | | | | | | | | | | | | 0 | | | | | | | |
| | | | | | | | | | | | | | 0 | | | | | | |
| | | | | | | | | | | | | | | 0 | | | | | |
| | | | | | | | | | | | | | | | 0 | | | | |
| | | | | | | | | | | | | | | | | 0 | | | |
| | | | | | | | | | | | | | | | | | 0 | | |
| | | | | | | | | | | | | | | | | | | 0 | |
| | | | | | | | | | | | | | | | | | | | 0 |

FIG. 28J

| | | | | | | | | | | | | | | | | | | | | |
|---|---|---|---|---|---|---|---|---|---|---|---|---|---|---|---|---|---|---|---|---|
| 0 | | | | | | | | | | | | | | | | | | | | |
| | 0 | | | | | | | | | | | | | | | | | | | |
| | | 0 | | | | | | | | | | | | | | | | | | |
| | | | 0 | | | | | | | | | | | | | | | | | |
| | | | | 0 | | | | | | | | | | | | | | | | |
| | | | | | 0 | | | | | | | | | | | | | | | |
| | | | | | | 0 | | | | | | | | | | | | | | |
| | | | | | | | 0 | | | | | | | | | | | | | |
| | | | | | | | | 0 | | | | | | | | | | | | |
| | | | | | | | | | 0 | | | | | | | | | | | |
| | | | | | | | | | | 0 | | | | | | | | | | |
| | | | | | | | | | | | 0 | | | | | | | | | |
| | | | | | | | | | | | | 0 | | | | | | | | |
| | | | | | | | | | | | | | 0 | | | | | | | |
| | | | | | | | | | | | | | | 0 | | | | | | |
| | | | | | | | | | | | | | | | 0 | | | | | |
| | | | | | | | | | | | | | | | | 0 | | | | |
| | | | | | | | | | | | | | | | | | 0 | | | |
| | | | | | | | | | | | | | | | | | | 0 | | |
| | | | | | | | | | | | | | | | | | | | 0 | |
| | | | | | | | | | | | | | | | | | | | | 0 |

FIG. 29A

| | | |
|---|---|---|
| 29B | 29E | 29H |
| 29C | 29F | 29I |
| 29D | 29G | 29J |

FIG. 29B

| | | | | | | | | | | | | | | | | | | | | | | | | | | |
|---|---|---|---|---|---|---|---|---|---|---|---|---|---|---|---|---|---|---|---|---|---|---|---|---|---|---|
| 205 | 72 | 103 | 204 | | 141 | 157 | | | 170 | 26 | 166 | 48 | 181 | | 10 | 166 | | 64 | 177 | 205 | 36 | 1 | 0 | | | |
| 94 | | 40 | 217 | 158 | 41 | | 139 | 87 | 119 | | 60 | 50 | | 172 | 170 | 173 | 160 | | 89 | | 222 | 0 | 0 | 0 | | |
| 182 | 114 | 77 | | 181 | 46 | 204 | 180 | 109 | 73 | 158 | | | 208 | 1 | 110 | | 59 | 185 | 157 | 13 | | | | 0 | 0 | |
| 47 | 219 | | 199 | 148 | | 66 | 212 | 183 | | 1 | 59 | 110 | 199 | 142 | | 20 | 184 | 83 | | 147 | 23 | 1 | | | 0 | |
| 16 | 206 | | | | | | | | | | | | | | | | | | | | | | | | | 0 |

FIG. 29C

| | | | | | | | | | | | | | | | | | | | | | | | | | | |
|---|---|---|---|---|---|---|---|---|---|---|---|---|---|---|---|---|---|---|---|---|---|---|---|---|---|---|
| 43 | 183 | | 50 | | | | | | | | | 84 | | | | 113 | | | | | 152 | 184 | | | | |
| 39 | | | | | | 210 | | | | 214 | 197 | | 185 | | | | 183 | 192 | | 26 | | | | | | |
| 8 | 3 | | | 80 | | | 215 | 111 | | | | | | 146 | | | | | | | | | | | | |
| 153 | 172 | | 222 | | | | | | | | | 92 | | | | 46 | | | 96 | | 36 | 25 | | 152 | | |
| 204 | 153 | | | | | | | | | 143 | 30 | | 119 | | | | 205 | 24 | | 105 | | | | | | |
| | 39 | 147 | | 44 | | | 145 | 71 | | | | | | 29 | | | | | | | | | | | | |
| 40 | 133 | | | | | | | | | | | 40 | | | | 200 | | | | | 0 | 63 | 81 | | | |
| 131 | 29 | | | | | | | | | 57 | 44 | | 162 | | | | | 181 | | | | | | | | |
| 133 | | | 7 | | | | 101 | | | | | | | | | | | | | 184 | | | 121 | | | |
| 155 | | | | | | | | | | | | 40 | | | 193 | 63 | 6 | | | | 4 | | | | | |
| 10 | 103 | | | | | | | | | 163 | | | 105 | | | | | 186 | | | | | | | 53 | |
| | 35 | | 146 | | | | | | | | 191 | | | | | | | | | 171 | | 212 | | | | |
| 185 | | | | | | | | | | | | | | 86 | | 208 | 126 | | | | 215 | | | | | |
| | 104 | | | | | | | | | | | 201 | 41 | | | | | 124 | 178 | | | | | | | |
| 206 | 41 | | | | | | 156 | 97 | | 82 | | | | | | | | | | | | | | | | |
| 151 | | | 64 | | | | | | 61 | | 158 | | | | | | | | | | | 164 | | | | |
| | 223 | | | | 198 | | | | | | | | | | | 42 | | | | 182 | 16 | | | | | |
| 119 | | | | | | | | | | | | 97 | 193 | | | | 42 | | | | | | | | | |
| | 209 | 24 | | | | | | | | 70 | | | | | | | | 67 | | | | | | | | |
| 176 | | | 29 | 169 | | | | | | | 112 | | | | | | | | | | | 142 | | | | |

FIG. 29D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 45 | | | | | 185 | 84 | | | | | | | 3 | | | | | | | | | | | | |
| 52 | | 160 | | 170 | | | | | | | | | | | 133 | | | | | | | | | | | |
| | 194 | | | | | 33 | | 118 | | | | | | | | | | | | | | | | | | |
| 142 | | | | 13 | | | | | | | | | | | | | | | 64 | | 143 | | | | | |
| | 122 | | | | | | | | | | | | | 147 | | | | 164 | | | | | | | 66 | |
| 60 | | | | | | | | | | 133 | | | 55 | | | | | | | | | | | 89 | | |
| | 122 | | | | | | 131 | | | | | | | | | | | | | | | 174 | | | 167 | |
| 22 | | | | | | | | | | | | 129 | | 183 | | | | | | | | | | 78 | | |
| | 188 | 206 | | | | | | | | | 206 | | | | | | | | | | 54 | | | | | |
| 129 | | | | | | | 188 | | | | | | | | 184 | | 46 | | | | | | | | | |
| | 111 | | | | | 150 | | | | | | 20 | | | | | | | | | | 24 | | | | |
| 181 | | | | | | | | | | | | | | 179 | 27 | | | 128 | | | | | | | | |
| | 57 | | | | | | | | | | | | 130 | | | | | | | | | | 218 | | | |
| 80 | | | | | | | | | 12 | 104 | | 96 | | | | | | | | | | | | | | |
| | 185 | | 159 | | | | 206 | | | | | | | | | | | | 93 | | | | | | | |
| 205 | | | | | | | | 118 | | | | | | | | | 200 | | | | | | | | | |
| | 27 | | 193 | | | | | | 119 | | | | | | | | | 150 | | | | | | | | |
| 96 | | | | 192 | | | | | | | | | | | | | | | | | | | | 65 | | |
| | 138 | | | | | | | | | | | | | | | 1 | | 108 | | | | | | | 58 | |
| 184 | | | | | | | 119 | | 213 | | | | | | | | | | | | | 21 | | | | |
| | 187 | | | | | 37 | | | | 94 | | | | | | | | | | | | | | | | |

FIG. 30A

| | | |
|---|---|---|
| 30B | 30E | 30H |
| 30C | 30F | 30I |
| 30D | 30G | 30J |

FIG. 30B

| | | | | | | | | | | | | | | | | | | | | | | | | | | |
|---|---|---|---|---|---|---|---|---|---|---|---|---|---|---|---|---|---|---|---|---|---|---|---|---|---|---|
| 134 | 50 | 169 | 114 | | 189 | 0 | | | 196 | 45 | 79 | 101 | 109 | | 101 | 163 | | 54 | 166 | 132 | 173 | 1 | 0 | | | |
| 27 | | 190 | 60 | 33 | 155 | | 40 | 25 | 100 | | 60 | 50 | | 100 | 141 | 114 | 199 | | 27 | | 37 | 0 | 0 | 0 | | |
| 128 | 131 | 174 | | 149 | 127 | 99 | 153 | 45 | 185 | 153 | | | 85 | 93 | 144 | | 155 | 24 | 179 | 86 | | | | 0 | 0 | |
| 202 | 48 | | 97 | 115 | | 176 | 63 | 151 | | 107 | 146 | 38 | 34 | 53 | | 9 | 19 | 66 | | 61 | 96 | 1 | | | 0 | |
| 160 | 17 | | | | | | | | | | | | | | | | | | | | | | | | | 0 |

FIG. 30C

| | | | | | | | | | | | | | | | | | | | | | | | | | | |
|---|---|---|---|---|---|---|---|---|---|---|---|---|---|---|---|---|---|---|---|---|---|---|---|---|---|---|
| 205 | 123 | | 71 | | | | | | | | | 56 | | | | 5 | | | | | 155 | 106 | | | | |
| 194 | | | | | | 7 | | | | 128 | 202 | | 14 | | | | 59 | 205 | | 162 | | | | | | |
| 170 | 207 | | | 123 | | | 67 | 166 | | | | | | 168 | | | | | | | | | | | | |
| 200 | 25 | | 165 | | | | | | | | | 188 | | | | 24 | | | 77 | | 99 | 28 | | 32 | | |
| 174 | 145 | | | | | | | | | 76 | 61 | | 145 | | | | 29 | 165 | | 43 | | | | | | |
| | 92 | 199 | | 150 | | | 151 | 163 | | | | | | 93 | | | | | | | | | | | | |
| 95 | 112 | | | | | | | | | | | 132 | | | | 138 | | | | | 152 | 200 | 72 | | | |
| 71 | 75 | | | | | | | | | 107 | 102 | | 27 | | | | | 78 | | | | | | | | |
| 188 | | | 100 | | | | 155 | | | | | | | | | | | | | 131 | | | 198 | | | |
| 15 | | | | | | | | | | | | 100 | | | 198 | 18 | 109 | | | | 119 | | | | | |
| 7 | 1 | | | | | | | | | 109 | | | 184 | | | | | 58 | | | | | | | 193 | |
| | 137 | | 128 | | | | | | | | 30 | | | | | | | | | 121 | | 39 | | | | |
| 103 | | | | | | | | | | | | | | 138 | | 40 | 165 | | | | 16 | | | | | |
| | 57 | | | | | | | | | | | 63 | 17 | | | | | 58 | 184 | | | | | | | |
| 98 | 24 | | | | | | 79 | 62 | | 205 | | | | | | | | | | | | | | | | |
| 125 | | | 111 | | | | | | 118 | | 44 | | | | | | | | | | | 56 | | | | |
| | 126 | | | | 141 | | | | | | | | | | | 96 | | | | 34 | 9 | | | | | |
| 103 | | | | | | | | | | | | 52 | 170 | | | | 47 | | | | | | | | | |
| | 49 | 114 | | | | | | | | 46 | | | | | | | | 126 | | | | | | | | |
| 84 | | | 110 | 158 | | | | | | | 86 | | | | | | | | | | | 87 | | | | |

FIG. 30D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 41 | | | | | 50 | 87 | | | | | | | 115 | | | | | | | | | | | | |
| 190 | | 99 | | 157 | | | | | | | | | | | 6 | | | | | | | | | | | |
| | 129 | | | | | 128 | | 144 | | | | | | | | | | | | | | | | | | |
| 148 | | | | 189 | | | | | | | | | | | | | | | 34 | | 172 | | | | | |
| | 70 | | | | | | | | | | | | | 203 | | | | 25 | | | | | | | 16 | |
| 188 | | | | | | | | | | 7 | | | 104 | | | | | | | | | | | 37 | | |
| | 179 | | | | | | 192 | | | | | | | | | | | | | | | 136 | | | 17 | |
| 99 | | | | | | | | | | | | 1 | | 66 | | | | | | | | | | 8 | | |
| | 179 | 57 | | | | | | | | | 64 | | | | | | | | | | 105 | | | | | |
| 124 | | | | | | | 112 | | | | | | | | 80 | | 71 | | | | | | | | | |
| | 33 | | | | | 167 | | | | | | 109 | | | | | | | | | | 160 | | | | |
| 98 | | | | | | | | | | | | | | 31 | 48 | | | 56 | | | | | | | | |
| | 33 | | | | | | | | | | | | 206 | | | | | | | | | | 120 | | | |
| 84 | | | | | | | | | 125 | 61 | | 81 | | | | | | | | | | | | | | |
| | 204 | | 145 | | | | 83 | | | | | | | | | | | | 46 | | | | | | | |
| 77 | | | | | | | | 35 | | | | | | | | | 198 | | | | | | | | | |
| | 136 | | 128 | | | | | | 71 | | | | | | | | | 41 | | | | | | | | |
| 97 | | | | 89 | | | | | | | | | | | | | | | | | | | | 118 | | |
| | 113 | | | | | | | | | | | | | | | 92 | | 200 | | | | | | | 93 | |
| 31 | | | | | | | 92 | | 190 | | | | | | | | | | | | | 23 | | | | |
| | 113 | | | | | 38 | | | | 111 | | | | | | | | | | | | | | | | |

FIG. 31A

| | | |
|---|---|---|
| 31B | 31E | 31H |
| 31C | 31F | 31I |
| 31D | 31G | 31J |

FIG. 31B

| | | | | | | | | | | | | | | | | | | | | | | | | | | |
|---|---|---|---|---|---|---|---|---|---|---|---|---|---|---|---|---|---|---|---|---|---|---|---|---|---|---|
| 106 | 43 | 185 | 109 | | 230 | 209 | | | 30 | 185 | 143 | 130 | 154 | | 241 | 80 | | 121 | 246 | 235 | 124 | 1 | 0 | | | |
| 77 | | 142 | 7 | 1 | 153 | | 163 | 44 | 212 | | 170 | 141 | | 183 | 170 | 86 | 227 | | 68 | | 56 | 0 | 0 | 0 | | |
| 208 | 95 | 240 | | 174 | 15 | 142 | 7 | 179 | 217 | 161 | | | 36 | 241 | 227 | | 53 | 72 | 130 | 140 | | | | 0 | 0 | |
| 79 | 244 | | 90 | 171 | | 244 | 209 | 183 | | 221 | 86 | 252 | 34 | 108 | | 206 | 250 | 106 | | 131 | 87 | 1 | | | 0 | |
| 66 | 118 | | | | | | | | | | | | | | | | | | | | | | | | | 0 |

FIG. 31C

| | | | | | | | | | | | | | | | | | | | | | | | | | | |
|---|---|---|---|---|---|---|---|---|---|---|---|---|---|---|---|---|---|---|---|---|---|---|---|---|---|---|
| 163 | 14 | | 10 | | | | | | | | | 130 | | | | 239 | | | | | 118 | 152 | | | | |
| 179 | | | | | | 150 | | | | 50 | 5 | | 158 | | | | 196 | 83 | | 234 | | | | | | |
| 119 | 240 | | | 81 | | | 197 | 105 | | | | | | 108 | | | | | | | | | | | | |
| 19 | 29 | | 139 | | | | | | | | | 51 | | | | 114 | | | 219 | | 226 | 181 | | 216 | | |
| 163 | 34 | | | | | | | | | 157 | 162 | | 90 | | | | 211 | 197 | | 141 | | | | | | |
| | 70 | 173 | | 129 | | | 113 | 100 | | | | | | 65 | | | | | | | | | | | | |
| 233 | 159 | | | | | | | | | | | 232 | | | | 59 | | | | | 165 | 192 | 138 | | | |
| 39 | 72 | | | | | | | | | 237 | 113 | | 104 | | | | | 210 | | | | | | | | |
| 170 | | | 161 | | | | 233 | | | | | | | | | | | | | 64 | | | 119 | | | |
| 142 | | | | | | | | | | | | 28 | | | 167 | 5 | 234 | | | | 33 | | | | | |
| 64 | 181 | | | | | | | | | 61 | | | 195 | | | | | 123 | | | | | | | 117 | |
| | 28 | | 85 | | | | | | | | 102 | | | | | | | | | 202 | | 71 | | | | |
| 242 | | | | | | | | | | | | | | 91 | | 28 | 248 | | | | 87 | | | | | |
| | 73 | | | | | | | | | | | 123 | 237 | | | | | 193 | 149 | | | | | | | |
| 18 | 137 | | | | | | 185 | 166 | | 95 | | | | | | | | | | | | | | | | |
| 140 | | | 36 | | | | | | 236 | | 17 | | | | | | | | | | | 43 | | | | |
| | 15 | | | | 69 | | | | | | | | | | | 136 | | | | 161 | 88 | | | | | |
| 63 | | | | | | | | | | | | 196 | 78 | | | | 216 | | | | | | | | | |
| | 69 | 34 | | | | | | | | 142 | | | | | | | | 133 | | | | | | | | |
| 129 | | | 53 | 133 | | | | | | | 170 | | | | | | | | | | | 50 | | | | |

FIG. 31D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 71 | | | | | 139 | 73 | | | | | | | 188 | | | | | | | | | | | | |
| 203 | | 77 | | 189 | | | | | | | | | | | 209 | | | | | | | | | | | |
| | 127 | | | | | 138 | | 42 | | | | | | | | | | | | | | | | | | |
| 220 | | | | 130 | | | | | | | | | | | | | | | 11 | | 229 | | | | | |
| | 63 | | | | | | | | | | | | | 134 | | | | 114 | | | | | | | 84 | |
| 233 | | | | | | | | | | 148 | | | 6 | | | | | | | | | | | 253 | | |
| | 137 | | | | | | 50 | | | | | | | | | | | | | | | 37 | | | 119 | |
| 230 | | | | | | | | | | | | 111 | | 109 | | | | | | | | | | 72 | | |
| | 118 | 2 | | | | | | | | | 226 | | | | | | | | | | 184 | | | | | |
| 156 | | | | | | | 15 | | | | | | | | 81 | | 249 | | | | | | | | | |
| | 43 | | | | | 125 | | | | | | 184 | | | | | | | | | | 70 | | | | |
| 19 | | | | | | | | | | | | | | 129 | 181 | | | 140 | | | | | | | | |
| | 196 | | | | | | | | | | | | 247 | | | | | | | | | | 240 | | | |
| 103 | | | | | | | | | 196 | 195 | | 74 | | | | | | | | | | | | | | |
| | 72 | | 237 | | | | 116 | | | | | | | | | | | | 224 | | | | | | | |
| 107 | | | | | | | | 72 | | | | | | | | | 85 | | | | | | | | | |
| | 196 | | 168 | | | | | | 189 | | | | | | | | | 214 | | | | | | | | |
| 121 | | | | 106 | | | | | | | | | | | | | | | | | | | | 247 | | |
| | 227 | | | | | | | | | | | | | | | 32 | | 8 | | | | | | | 235 | |
| 212 | | | | | | | 208 | | 118 | | | | | | | | | | | | | 143 | | | | |
| | 49 | | | | | 105 | | | | 169 | | | | | | | | | | | | | | | | |

FIG. 32A

| | | |
|---|---|---|
| 32B | 32E | 32H |
| 32C | 32F | 32I |
| 32D | 32G | 32J |

FIG. 32B

| | | | | | | | | | | | | | | | | | | | | | | | | | | |
|---|---|---|---|---|---|---|---|---|---|---|---|---|---|---|---|---|---|---|---|---|---|---|---|---|---|---|
| 121 | 259 | 123 | 181 | | 230 | 315 | | | 199 | 361 | 364 | 329 | 321 | | 26 | 265 | | 185 | 290 | 271 | 43 | 1 | 0 | | | |
| 124 | | 162 | 190 | 360 | 274 | | 357 | 89 | 158 | | 375 | 258 | | 320 | 351 | 330 | 53 | | 48 | | 261 | 0 | 0 | 0 | | |
| 323 | 360 | 179 | | 259 | 6 | 63 | 308 | 4 | 181 | 280 | | | 252 | 2 | 253 | | 163 | 314 | 243 | 110 | | | | 0 | 0 | |
| 170 | 13 | | 11 | 364 | | 209 | 319 | 274 | | 36 | 168 | 33 | 342 | 352 | | 212 | 136 | 96 | | 150 | 286 | 1 | | | 0 | |
| 2 | 106 | | | | | | | | | | | | | | | | | | | | | | | | | 0 |

FIG. 32C

| | | | | | | | | | | | | | | | | | | | | | | | | | | |
|---|---|---|---|---|---|---|---|---|---|---|---|---|---|---|---|---|---|---|---|---|---|---|---|---|---|---|
| 255 | 142 | | 130 | | | | | | | | | 43 | | | | 95 | | | | | 255 | 207 | | | | |
| 227 | | | | | | 301 | | | | 365 | 145 | | 209 | | | | 238 | 156 | | 289 | | | | | | |
| 216 | 312 | | | 16 | | | 226 | 305 | | | | | | 185 | | | | | | | | | | | | |
| 304 | 314 | | 325 | | | | | | | | | 373 | | | | 371 | | | 147 | | 77 | 156 | | 246 | | |
| 165 | 382 | | | | | | | | | 201 | 148 | | 4 | | | | 274 | 248 | | 18 | | | | | | |
| | 105 | 351 | | 65 | | | 25 | 151 | | | | | | 105 | | | | | | | | | | | | |
| 333 | 375 | | | | | | | | | | | 289 | | | | 347 | | | | | 116 | 142 | 172 | | | |
| 76 | 122 | | | | | | | | | 307 | 211 | | 52 | | | | | 273 | | | | | | | | |
| 245 | | | 169 | | | | 325 | | | | | | | | | | | | | 314 | | | 242 | | | |
| 183 | | | | | | | | | | | | 59 | | | 354 | 255 | 37 | | | | 87 | | | | | |
| 188 | 157 | | | | | | | | | 27 | | | 289 | | | | | 340 | | | | | | | 70 | |
| | 79 | | 314 | | | | | | | | 5 | | | | | | | | | 184 | | 279 | | | | |
| 74 | | | | | | | | | | | | | | 104 | | 169 | 226 | | | | 20 | | | | | |
| | 133 | | | | | | | | | | | 197 | 99 | | | | | 367 | 309 | | | | | | | |
| 307 | 241 | | | | | | 135 | 49 | | 67 | | | | | | | | | | | | | | | | |
| 352 | | | 46 | | | | | | 143 | | 267 | | | | | | | | | | | 247 | | | | |
| | 238 | | | | 322 | | | | | | | | | | | 63 | | | | 187 | 46 | | | | | |
| 222 | | | | | | | | | | | | 1 | 196 | | | | 42 | | | | | | | | | |
| | 5 | 18 | | | | | | | | 77 | | | | | | | | 190 | | | | | | | | |
| 266 | | | 305 | 373 | | | | | | | 99 | | | | | | | | | | | 44 | | | | |

FIG. 32D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 226 | | | | | 95 | 201 | | | | | | | 122 | | | | | | | | | | | | |
| 275 | | 151 | | 308 | | | | | | | | | | | 264 | | | | | | | | | | | |
| | 41 | | | | | 160 | | 343 | | | | | | | | | | | | | | | | | | |
| 182 | | | | 110 | | | | | | | | | | | | | | | 341 | | 9 | | | | | |
| | 132 | | | | | | | | | | | | | 207 | | | | 305 | | | | | | | 312 | |
| 301 | | | | | | | | | | 183 | | | 12 | | | | | | | | | | | 292 | | |
| | 177 | | | | | | 329 | | | | | | | | | | | | | | | 378 | | | 316 | |
| 29 | | | | | | | | | | | | 379 | | 223 | | | | | | | | | | 230 | | |
| | 376 | 45 | | | | | | | | | 71 | | | | | | | | | | 151 | | | | | |
| 14 | | | | | | | 119 | | | | | | | | 236 | | 24 | | | | | | | | | |
| | 82 | | | | | 195 | | | | | | 24 | | | | | | | | | | 300 | | | | |
| 124 | | | | | | | | | | | | | | 329 | 145 | | | 54 | | | | | | | | |
| | 109 | | | | | | | | | | | | 366 | | | | | | | | | | 151 | | | |
| 63 | | | | | | | | | 144 | 110 | | 342 | | | | | | | | | | | | | | |
| | 52 | | 182 | | | | 198 | | | | | | | | | | | | 344 | | | | | | | |
| 76 | | | | | | | | 338 | | | | | | | | | 298 | | | | | | | | | |
| | 325 | | 334 | | | | | | 57 | | | | | | | | | 47 | | | | | | | | |
| 77 | | | | 339 | | | | | | | | | | | | | | | | | | | | 225 | | |
| | 90 | | | | | | | | | | | | | | | 8 | | 203 | | | | | | | 274 | |
| 38 | | | | | | | 365 | | 302 | | | | | | | | | | | | | 369 | | | | |
| | 88 | | | | | 30 | | | | 161 | | | | | | | | | | | | | | | | |

FIG. 33A

| | | |
|---|---|---|
| 33B | 33E | 33H |
| 33C | 33F | 33I |
| 33D | 33G | 33J |

FIG. 33B

| | | | | | | | | | | | | | | | | | | | | | | | | | | |
|---|---|---|---|---|---|---|---|---|---|---|---|---|---|---|---|---|---|---|---|---|---|---|---|---|---|---|
| 90 | 222 | 46 | 240 | | 158 | 264 | | | 202 | 13 | 295 | 20 | 164 | | 158 | 12 | | 95 | 73 | 292 | 176 | 1 | 0 | | | |
| 298 | | 164 | 289 | 305 | 150 | | 189 | 211 | 266 | | 6 | 313 | | 236 | 99 | 234 | 189 | | 298 | | 239 | 0 | 0 | 0 | | |
| 145 | 200 | 253 | | 238 | 242 | 195 | 148 | 19 | 221 | 143 | | | 33 | 181 | 280 | | 43 | 198 | 181 | 242 | | | | 0 | 0 | |
| 301 | 84 | | 31 | 131 | | 187 | 133 | 226 | | 314 | 264 | 30 | 239 | 158 | | 304 | 102 | 134 | | 305 | 233 | 1 | | | 0 | |
| 257 | 27 | | | | | | | | | | | | | | | | | | | | | | | | | 0 |

FIG. 33C

| | | | | | | | | | | | | | | | | | | | | | | | | | | |
|---|---|---|---|---|---|---|---|---|---|---|---|---|---|---|---|---|---|---|---|---|---|---|---|---|---|---|
| 12 | 316 | | 151 | | | | | | | | | 3 | | | | 5 | | | | | 88 | 5 | | | | |
| 181 | | | | | | 105 | | | | 28 | 235 | | 216 | | | | 97 | 50 | | 171 | | | | | | |
| 143 | 189 | | | 203 | | | 303 | 247 | | | | | | 301 | | | | | | | | | | | | |
| 233 | 302 | | 15 | | | | | | | | | 129 | | | | 70 | | | 231 | | 268 | 62 | | 7 | | |
| 51 | 202 | | | | | | | | | 315 | 144 | | 276 | | | | 111 | 152 | | 287 | | | | | | |
| | 286 | 96 | | 236 | | | 264 | 39 | | | | | | 275 | | | | | | | | | | | | |
| 259 | 70 | | | | | | | | | | | 103 | | | | 203 | | | | | 49 | 31 | 124 | | | |
| 21 | 58 | | | | | | | | | 62 | 262 | | 1 | | | | | 223 | | | | | | | | |
| 154 | | | 222 | | | | 133 | | | | | | | | | | | | | 46 | | | 151 | | | |
| 188 | | | | | | | | | | | | 65 | | | 298 | 285 | 294 | | | | 94 | | | | | |
| 6 | 121 | | | | | | | | | 211 | | | 96 | | | | | 123 | | | | | | | 222 | |
| | 168 | | 173 | | | | | | | | 105 | | | | | | | | | 30 | | 318 | | | | |
| 108 | | | | | | | | | | | | | | 192 | | 176 | 15 | | | | 136 | | | | | |
| | 65 | | | | | | | | | | | 135 | 20 | | | | | 314 | 219 | | | | | | | |
| 117 | 289 | | | | | | 215 | 114 | | 15 | | | | | | | | | | | | | | | | |
| 64 | | | 7 | | | | | | 171 | | 258 | | | | | | | | | | | 269 | | | | |
| | 208 | | | | 156 | | | | | | | | | | | 236 | | | | 89 | 282 | | | | | |
| 175 | | | | | | | | | | | | 160 | 246 | | | | 88 | | | | | | | | | |
| | 229 | 195 | | | | | | | | 243 | | | | | | | | 247 | | | | | | | | |
| 86 | | | 220 | 78 | | | | | | | 96 | | | | | | | | | | | 256 | | | | |

FIG. 33D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 131 | | | | | 211 | 270 | | | | | | | 270 | | | | | | | | | | | | |
| 248 | | 239 | | 206 | | | | | | | | | | | 255 | | | | | | | | | | | |
| | 126 | | | | | 185 | | 23 | | | | | | | | | | | | | | | | | | |
| 120 | | | | 154 | | | | | | | | | | | | | | | 221 | | 225 | | | | | |
| | 177 | | | | | | | | | | | | | 162 | | | | 185 | | | | | | | 52 | |
| 258 | | | | | | | | | | 167 | | | 91 | | | | | | | | | | | 11 | | |
| | 25 | | | | | | 109 | | | | | | | | | | | | | | | 106 | | | 52 | |
| 10 | | | | | | | | | | | | 135 | | 245 | | | | | | | | | | 298 | | |
| | 31 | 139 | | | | | | | | | 29 | | | | | | | | | | 256 | | | | | |
| 289 | | | | | | | 74 | | | | | | | | 142 | | 24 | | | | | | | | | |
| | 296 | | | | | 274 | | | | | | 92 | | | | | | | | | | 249 | | | | |
| 305 | | | | | | | | | | | | | | 166 | 301 | | | 7 | | | | | | | | |
| | 137 | | | | | | | | | | | | 37 | | | | | | | | | | 240 | | | |
| 248 | | | | | | | | | 182 | 80 | | 122 | | | | | | | | | | | | | | |
| | 42 | | 135 | | | | 124 | | | | | | | | | | | | 22 | | | | | | | |
| 261 | | | | | | | | 180 | | | | | | | | | 13 | | | | | | | | | |
| | 155 | | 36 | | | | | | 232 | | | | | | | | | 194 | | | | | | | | |
| 126 | | | | 317 | | | | | | | | | | | | | | | | | | | | 195 | | |
| | 313 | | | | | | | | | | | | | | | 278 | | 85 | | | | | | | 205 | |
| 93 | | | | | | | 2 | | 216 | | | | | | | | | | | | | 232 | | | | |
| | 247 | | | | | 124 | | | | 68 | | | | | | | | | | | | | | | | |

FIG. 34A

| | | |
|---|---|---|
| 34B | 34E | 34H |
| 34C | 34F | 34I |
| 34D | 34G | 34J |

FIG. 34B

| | | | | | | | | | | | | | | | | | | | | | | | | | | |
|---|---|---|---|---|---|---|---|---|---|---|---|---|---|---|---|---|---|---|---|---|---|---|---|---|---|---|
| 196 | 155 | 155 | 13 | | 98 | 150 | | | 217 | 28 | 119 | 197 | 178 | | 168 | 205 | | 120 | 151 | 199 | 205 | 1 | 0 | | | |
| 150 | | 21 | 184 | 153 | 171 | | 126 | 184 | 190 | | 87 | 65 | | 114 | 16 | 139 | 157 | | 87 | | 14 | 0 | 0 | 0 | | |
| 146 | 131 | 122 | | 75 | 63 | 50 | 136 | 29 | 20 | 54 | | | 104 | 39 | 131 | | 81 | 150 | 70 | 140 | | | | 0 | 0 | |
| 17 | 87 | | 120 | 15 | | 135 | 97 | 90 | | 136 | 78 | 62 | 56 | 164 | | 48 | 29 | 63 | | 205 | 101 | 1 | | | 0 | |
| 14 | 149 | | | | | | | | | | | | | | | | | | | | | | | | | 0 |

FIG. 34C

| | | | | | | | | | | | | | | | | | | | | | | | | | | |
|---|---|---|---|---|---|---|---|---|---|---|---|---|---|---|---|---|---|---|---|---|---|---|---|---|---|---|
| 110 | 164 | | 131 | | | | | | | | | 176 | | | | 61 | | | | | 118 | 191 | | | | |
| 119 | | | | | | 201 | | | | 88 | 97 | | 109 | | | | 99 | 198 | | 52 | | | | | | |
| 204 | 47 | | | 142 | | | 174 | 60 | | | | | | 48 | | | | | | | | | | | | |
| 216 | 26 | | 47 | | | | | | | | | 102 | | | | 212 | | | 93 | | 194 | 190 | | 32 | | |
| 161 | 98 | | | | | | | | | 200 | 26 | | 195 | | | | 162 | 22 | | 102 | | | | | | |
| | 179 | 215 | | 121 | | | 88 | 64 | | | | | | 77 | | | | | | | | | | | | |
| 204 | 97 | | | | | | | | | | | 56 | | | | 28 | | | | | 37 | 181 | 88 | | | |
| 66 | 113 | | | | | | | | | 89 | 50 | | 199 | | | | | 127 | | | | | | | | |
| 72 | | | 215 | | | | 135 | | | | | | | | | | | | | 26 | | | 126 | | | |
| 165 | | | | | | | | | | | | 74 | | | 141 | 160 | 50 | | | | 100 | | | | | |
| 186 | 120 | | | | | | | | | 70 | | | 87 | | | | | 17 | | | | | | | 153 | |
| | 62 | | 137 | | | | | | | | 90 | | | | | | | | | 111 | | 194 | | | | |
| 30 | | | | | | | | | | | | | | 61 | | 35 | 141 | | | | 63 | | | | | |
| | 166 | | | | | | | | | | | 113 | 65 | | | | | 211 | 222 | | | | | | | |
| 223 | 209 | | | | | | 54 | 90 | | 86 | | | | | | | | | | | | | | | | |
| 87 | | | 15 | | | | | | 109 | | 84 | | | | | | | | | | | 197 | | | | |
| | 31 | | | | 116 | | | | | | | | | | | 3 | | | | 65 | 192 | | | | | |
| 28 | | | | | | | | | | | | 210 | 24 | | | | 150 | | | | | | | | | |
| | 176 | 101 | | | | | | | | 160 | | | | | | | | 180 | | | | | | | | |
| 23 | | | 219 | 210 | | | | | | | 43 | | | | | | | | | | | 120 | | | | |

FIG. 34D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 9 | | | | | 131 | 89 | | | | | | | 89 | | | | | | | | | | | | |
| 212 | | 36 | | 170 | | | | | | | | | | | 95 | | | | | | | | | | | |
| | 163 | | | | | 184 | | 85 | | | | | | | | | | | | | | | | | | |
| 159 | | | | 49 | | | | | | | | | | | | | | | 0 | | 158 | | | | | |
| | 155 | | | | | | | | | | | | | 9 | | | | 3 | | | | | | | 92 | |
| 55 | | | | | | | | | | 72 | | | 60 | | | | | | | | | | | 36 | | |
| | 213 | | | | | | 7 | | | | | | | | | | | | | | | 8 | | | 170 | |
| 198 | | | | | | | | | | | | 45 | | 73 | | | | | | | | | | 187 | | |
| | 64 | 140 | | | | | | | | | 119 | | | | | | | | | | 75 | | | | | |
| 91 | | | | | | | 58 | | | | | | | | 122 | | 0 | | | | | | | | | |
| | 44 | | | | | 147 | | | | | | 72 | | | | | | | | | | 79 | | | | |
| 182 | | | | | | | | | | | | | | 104 | 162 | | | 197 | | | | | | | | |
| | 24 | | | | | | | | | | | | 122 | | | | | | | | | | 150 | | | |
| 75 | | | | | | | | | 32 | 84 | | 163 | | | | | | | | | | | | | | |
| | 102 | | 150 | | | | 147 | | | | | | | | | | | | 163 | | | | | | | |
| 43 | | | | | | | | 174 | | | | | | | | | 206 | | | | | | | | | |
| | 39 | | 18 | | | | | | 39 | | | | | | | | | 206 | | | | | | | | |
| 117 | | | | 90 | | | | | | | | | | | | | | | | | | | | 39 | | |
| | 194 | | | | | | | | | | | | | | | 140 | | 46 | | | | | | | 206 | |
| 72 | | | | | | | 68 | | 96 | | | | | | | | | | | | | 197 | | | | |
| | 118 | | | | | 157 | | | | 73 | | | | | | | | | | | | | | | | |

FIG. 35A

| | | |
|---|---|---|
| 35B | 35E | 35H |
| 35C | 35F | 35I |
| 35D | 35G | 35J |

FIG. 35B

| | | | | | | | | | | | | | | | | | | | | | | | | | | |
|---|---|---|---|---|---|---|---|---|---|---|---|---|---|---|---|---|---|---|---|---|---|---|---|---|---|---|
| 107 | 112 | 215 | 11 | | 73 | 73 | | | 193 | 124 | 183 | 161 | 123 | | 283 | 200 | | 179 | 83 | 286 | 39 | 1 | 0 | | | |
| 4 | | 237 | 176 | 270 | 9 | | 162 | 102 | 153 | | 231 | 174 | | 281 | 110 | 265 | 213 | | 233 | | 286 | 0 | 0 | 0 | | |
| 39 | 193 | 269 | | 203 | 287 | 256 | 70 | 87 | 240 | 191 | | | 202 | 31 | 153 | | 66 | 24 | 221 | 14 | | | | 0 | 0 | |
| 53 | 70 | | 40 | 138 | | 14 | 21 | 264 | | 143 | 242 | 3 | 179 | 236 | | 113 | 64 | 205 | | 224 | 110 | 1 | | | 0 | |
| 97 | 58 | | | | | | | | | | | | | | | | | | | | | | | | | 0 |

FIG. 35C

| | | | | | | | | | | | | | | | | | | | | | | | | | | |
|---|---|---|---|---|---|---|---|---|---|---|---|---|---|---|---|---|---|---|---|---|---|---|---|---|---|---|
| 204 | 155 | | 103 | | | | | | | | | 104 | | | | 276 | | | | | 271 | 141 | | | | |
| 245 | | | | | | 14 | | | | 151 | 140 | | 36 | | | | 215 | 17 | | 210 | | | | | | |
| 168 | 51 | | | 156 | | | 266 | 88 | | | | | | 183 | | | | | | | | | | | | |
| 215 | 119 | | 59 | | | | | | | | | 87 | | | | 285 | | | 113 | | 247 | 219 | | 188 | | |
| 155 | 150 | | | | | | | | | 186 | 36 | | 164 | | | | 177 | 182 | | 148 | | | | | | |
| | 56 | 145 | | 202 | | | 75 | 171 | | | | | | 196 | | | | | | | | | | | | |
| 94 | 255 | | | | | | | | | | | 95 | | | | 190 | | | | | 150 | 260 | 153 | | | |
| 147 | 1 | | | | | | | | | 55 | 135 | | 136 | | | | | 202 | | | | | | | | |
| 146 | | | 202 | | | | 143 | | | | | | | | | | | | | 185 | | | 54 | | | |
| 34 | | | | | | | | | | | | 287 | | | 89 | 264 | 244 | | | | 181 | | | | | |
| 63 | 242 | | | | | | | | | 31 | | | 229 | | | | | 190 | | | | | | | 115 | |
| | 188 | | 49 | | | | | | | | 100 | | | | | | | | | 277 | | 272 | | | | |
| 185 | | | | | | | | | | | | | | 165 | | 16 | 96 | | | | 150 | | | | | |
| | 166 | | | | | | | | | | | 49 | 159 | | | | | 65 | 35 | | | | | | | |
| 15 | 112 | | | | | | 161 | 228 | | 214 | | | | | | | | | | | | | | | | |
| 9 | | | 82 | | | | | | 276 | | 263 | | | | | | | | | | | 236 | | | | |
| | 43 | | | | 140 | | | | | | | | | | | 185 | | | | 108 | 260 | | | | | |
| 70 | | | | | | | | | | | | 282 | 54 | | | | 178 | | | | | | | | | |
| | 254 | 187 | | | | | | | | 193 | | | | | | | | 276 | | | | | | | | |
| 36 | | | 206 | 208 | | | | | | | 188 | | | | | | | | | | | 169 | | | | |

FIG. 35D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 254 | | | | | 273 | 21 | | | | | | | 195 | | | | | | | | | | | | |
| 278 | | 149 | | 161 | | | | | | | | | | | 236 | | | | | | | | | | | |
| | 69 | | | | | 262 | | 127 | | | | | | | | | | | | | | | | | | |
| 31 | | | | 74 | | | | | | | | | | | | | | | 138 | | 159 | | | | | |
| | 26 | | | | | | | | | | | | | 62 | | | | 167 | | | | | | | 284 | |
| 247 | | | | | | | | | | 210 | | | 2 | | | | | | | | | | | 254 | | |
| | 55 | | | | | | 122 | | | | | | | | | | | | | | | 119 | | | 85 | |
| 144 | | | | | | | | | | | | 97 | | 119 | | | | | | | | | | 164 | | |
| | 218 | 211 | | | | | | | | | 2 | | | | | | | | | | 192 | | | | | |
| 207 | | | | | | | 135 | | | | | | | | 286 | | 249 | | | | | | | | | |
| | 32 | | | | | 49 | | | | | | 165 | | | | | | | | | | 233 | | | | |
| 40 | | | | | | | | | | | | | | 124 | 73 | | | 83 | | | | | | | | |
| | 154 | | | | | | | | | | | | 260 | | | | | | | | | | 9 | | | |
| 185 | | | | | | | | | 255 | 31 | | 247 | | | | | | | | | | | | | | |
| | 77 | | 285 | | | | 181 | | | | | | | | | | | | 199 | | | | | | | |
| 240 | | | | | | | | 247 | | | | | | | | | 99 | | | | | | | | | |
| | 221 | | 163 | | | | | | 220 | | | | | | | | | 190 | | | | | | | | |
| 210 | | | | 186 | | | | | | | | | | | | | | | | | | | | 20 | | |
| | 64 | | | | | | | | | | | | | | | 212 | | 246 | | | | | | | 190 | |
| 111 | | | | | | | 245 | | 283 | | | | | | | | | | | | | 250 | | | | |
| | 197 | | | | | 100 | | | | 14 | | | | | | | | | | | | | | | | |

FIG. 36A

| | | |
|---|---|---|
| 36B | 36E | 36H |
| 36C | 36F | 36I |
| 36D | 36G | 36J |

FIG. 36B

| | | | | | | | | | | | | | | | | | | | | | | | | | | |
|---|---|---|---|---|---|---|---|---|---|---|---|---|---|---|---|---|---|---|---|---|---|---|---|---|---|---|
| 167 | 346 | 148 | 5 | | 300 | 188 | | | 81 | 243 | 53 | 11 | 94 | | 309 | 92 | | 16 | 31 | 237 | 67 | 1 | 0 | | | |
| 131 | | 138 | 89 | 270 | 320 | | 39 | 273 | 109 | | 234 | 116 | | 259 | 27 | 313 | 92 | | 18 | | 224 | 0 | 0 | 0 | | |
| 289 | 53 | 150 | | 161 | 336 | 250 | 97 | 258 | 328 | 241 | | | 133 | 115 | 300 | | 32 | 114 | 130 | 328 | | | | 0 | 0 | |
| 197 | 201 | | 202 | 237 | | 1 | 221 | 237 | | 19 | 26 | 106 | 10 | 277 | | 340 | 149 | 329 | | 305 | 174 | 1 | | | 0 | |
| 212 | 2 | | | | | | | | | | | | | | | | | | | | | | | | | 0 |

FIG. 36C

| | | | | | | | | | | | | | | | | | | | | | | | | | | |
|---|---|---|---|---|---|---|---|---|---|---|---|---|---|---|---|---|---|---|---|---|---|---|---|---|---|---|
| 74 | 288 | | 332 | | | | | | | | | 216 | | | | 128 | | | | | 290 | 165 | | | | |
| 93 | | | | | | 87 | | | | 326 | 300 | | 236 | | | | 328 | 35 | | 329 | | | | | | |
| 184 | 61 | | | 248 | | | 157 | 101 | | | | | | 140 | | | | | | | | | | | | |
| 169 | 341 | | 65 | | | | | | | | | 296 | | | | 140 | | | 339 | | 164 | 124 | | 59 | | |
| 247 | 233 | | | | | | | | | 212 | 319 | | 138 | | | | 231 | 177 | | 335 | | | | | | |
| | 170 | 194 | | 233 | | | 316 | 246 | | | | | | 107 | | | | | | | | | | | | |
| 220 | 79 | | | | | | | | | | | 276 | | | | 325 | | | | | 264 | 298 | 212 | | | |
| 89 | 328 | | | | | | | | | 37 | 114 | | 295 | | | | | 348 | | | | | | | | |
| 18 | | | 268 | | | | 110 | | | | | | | | | | | | | 178 | | | 94 | | | |
| 309 | | | | | | | | | | | | 133 | | | 203 | 77 | 14 | | | | 204 | | | | | |
| 133 | 125 | | | | | | | | | 99 | | | 334 | | | | | 314 | | | | | | | 26 | |
| | 119 | | 266 | | | | | | | | 267 | | | | | | | | | 152 | | 115 | | | | |
| 80 | | | | | | | | | | | | | | 282 | | 157 | 197 | | | | 249 | | | | | |
| | 81 | | | | | | | | | | | 351 | 91 | | | | | 98 | 342 | | | | | | | |
| 267 | 323 | | | | | | 333 | 317 | | 142 | | | | | | | | | | | | | | | | |
| 54 | | | 75 | | | | | | 42 | | 342 | | | | | | | | | | | 324 | | | | |
| | 244 | | | | 160 | | | | | | | | | | | 258 | | | | 216 | 206 | | | | | |
| 100 | | | | | | | | | | | | 163 | 185 | | | | 345 | | | | | | | | | |
| | 203 | 163 | | | | | | | | 293 | | | | | | | | 253 | | | | | | | | |
| 220 | | | 348 | 159 | | | | | | | 334 | | | | | | | | | | | 161 | | | | |

FIG. 36D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 132 | | | | | 169 | 99 | | | | | | | 28 | | | | | | | | | | | | |
| 104 | | 225 | | 30 | | | | | | | | | | | 241 | | | | | | | | | | | |
| | 162 | | | | | 291 | | 232 | | | | | | | | | | | | | | | | | | |
| 261 | | | | 206 | | | | | | | | | | | | | | | 264 | | 310 | | | | | |
| | 48 | | | | | | | | | | | | | 20 | | | | 187 | | | | | | | 296 | |
| 69 | | | | | | | | | | 136 | | | 146 | | | | | | | | | | | 59 | | |
| | 28 | | | | | | 309 | | | | | | | | | | | | | | | 269 | | | 273 | |
| 254 | | | | | | | | | | | | 344 | | 255 | | | | | | | | | | 182 | | |
| | 77 | 173 | | | | | | | | | 293 | | | | | | | | | | 132 | | | | | |
| 217 | | | | | | | 294 | | | | | | | | 246 | | 107 | | | | | | | | | |
| | 77 | | | | | 148 | | | | | | 238 | | | | | | | | | | 311 | | | | |
| 132 | | | | | | | | | | | | | | 305 | 206 | | | 60 | | | | | | | | |
| | 245 | | | | | | | | | | | | 351 | | | | | | | | | | 313 | | | |
| 188 | | | | | | | | | 221 | 212 | | 235 | | | | | | | | | | | | | | |
| | 235 | | 100 | | | | 334 | | | | | | | | | | | | 256 | | | | | | | |
| 250 | | | | | | | | 33 | | | | | | | | | 97 | | | | | | | | | |
| | 221 | | 32 | | | | | | 128 | | | | | | | | | 320 | | | | | | | | |
| 174 | | | | 140 | | | | | | | | | | | | | | | | | | | | 346 | | |
| | 237 | | | | | | | | | | | | | | | 318 | | 148 | | | | | | | 109 | |
| 334 | | | | | | | 14 | | 313 | | | | | | | | | | | | | 20 | | | | |
| | 315 | | | | | 230 | | | | 319 | | | | | | | | | | | | | | | | |

FIG. 37A

| | | |
|---|---|---|
| 37B | 37E | 37H |
| 37C | 37F | 37I |
| 37D | 37G | 37J |

FIG. 37B

| | | | | | | | | | | | | | | | | | | | | | | | | | | |
|---|---|---|---|---|---|---|---|---|---|---|---|---|---|---|---|---|---|---|---|---|---|---|---|---|---|---|
| 135 | 227 | 126 | 134 | | 84 | 83 | | | 53 | 225 | 205 | 128 | 75 | | 135 | 217 | | 220 | 90 | 105 | 137 | 1 | 0 | | | |
| 96 | | 236 | 136 | 221 | 128 | | 92 | 172 | 56 | | 11 | 189 | | 95 | 85 | 153 | 87 | | 163 | | 216 | 0 | 0 | 0 | | |
| 189 | 4 | 225 | | 151 | 236 | 117 | 179 | 92 | 24 | 68 | | | 6 | 101 | 33 | | 96 | 125 | 67 | 230 | | | | 0 | 0 | |
| 128 | 23 | | 162 | 220 | | 43 | 186 | 96 | | 1 | 216 | 22 | 24 | 167 | | 200 | 32 | 235 | | 172 | 219 | 1 | | | 0 | |
| 64 | 211 | | | | | | | | | | | | | | | | | | | | | | | | | 0 |

FIG. 37C

| | | | | | | | | | | | | | | | | | | | | | | | | | | |
|---|---|---|---|---|---|---|---|---|---|---|---|---|---|---|---|---|---|---|---|---|---|---|---|---|---|---|
| 2 | 171 | | 47 | | | | | | | | | 143 | | | | 210 | | | | | 180 | 180 | | | | |
| 199 | | | | | | 22 | | | | 23 | 100 | | 92 | | | | 207 | 52 | | 13 | | | | | | |
| 77 | 146 | | | 209 | | | 32 | 166 | | | | | | 18 | | | | | | | | | | | | |
| 181 | 105 | | 141 | | | | | | | | | 223 | | | | 177 | | | 145 | | 199 | 153 | | 38 | | |
| 169 | 12 | | | | | | | | | 206 | 221 | | 17 | | | | 212 | 92 | | 205 | | | | | | |
| | 116 | 151 | | 70 | | | 230 | 115 | | | | | | 84 | | | | | | | | | | | | |
| 45 | 115 | | | | | | | | | | | 134 | | | | 1 | | | | | 152 | 165 | 107 | | | |
| 186 | 215 | | | | | | | | | 124 | 180 | | 98 | | | | | 80 | | | | | | | | |
| 220 | | | 185 | | | | 154 | | | | | | | | | | | | | 178 | | | 150 | | | |
| 124 | | | | | | | | | | | | 144 | | | 182 | 95 | 72 | | | | 76 | | | | | |
| 39 | 138 | | | | | | | | | 220 | | | 173 | | | | | 142 | | | | | | | 49 | |
| | 78 | | 152 | | | | | | | | 84 | | | | | | | | | 5 | | 205 | | | | |
| 183 | | | | | | | | | | | | | | 112 | | 106 | 219 | | | | 129 | | | | | |
| | 183 | | | | | | | | | | | 215 | 180 | | | | | 143 | 14 | | | | | | | |
| 179 | 108 | | | | | | 159 | 138 | | 196 | | | | | | | | | | | | | | | | |
| 77 | | | 187 | | | | | | 203 | | 167 | | | | | | | | | | | 130 | | | | |
| | 197 | | | | 122 | | | | | | | | | | | 215 | | | | 65 | 216 | | | | | |
| 25 | | | | | | | | | | | | 47 | 126 | | | | 178 | | | | | | | | | |
| | 185 | 127 | | | | | | | | 117 | | | | | | | | 199 | | | | | | | | |
| 32 | | | 178 | 2 | | | | | | | 156 | | | | | | | | | | | 58 | | | | |

FIG. 37D

| | | | | | | | | | | | | | | | | | | | | | | | | | | |
|---|---|---|---|---|---|---|---|---|---|---|---|---|---|---|---|---|---|---|---|---|---|---|---|---|---|---|
| | 27 | | | | | 141 | 11 | | | | | | | 181 | | | | | | | | | | | | |
| 163 | | 131 | | 169 | | | | | | | | | | | 98 | | | | | | | | | | | |
| | 165 | | | | | 232 | | 9 | | | | | | | | | | | | | | | | | | |
| 32 | | | | 43 | | | | | | | | | | | | | | | 200 | | 205 | | | | | |
| | 232 | | | | | | | | | | | | | 32 | | | | 118 | | | | | | | 103 | |
| 170 | | | | | | | | | | 199 | | | 26 | | | | | | | | | | | 105 | | |
| | 73 | | | | | | 149 | | | | | | | | | | | | | | | 175 | | | 108 | |
| 103 | | | | | | | | | | | | 110 | | 151 | | | | | | | | | | 211 | | |
| | 199 | 132 | | | | | | | | | 172 | | | | | | | | | | 65 | | | | | |
| 161 | | | | | | | 237 | | | | | | | | 142 | | 180 | | | | | | | | | |
| | 231 | | | | | 174 | | | | | | 145 | | | | | | | | | | 100 | | | | |
| 11 | | | | | | | | | | | | | | 207 | 42 | | | 100 | | | | | | | | |
| | 59 | | | | | | | | | | | | 204 | | | | | | | | | | 161 | | | |
| 121 | | | | | | | | | 90 | 26 | | 140 | | | | | | | | | | | | | | |
| | 115 | | 188 | | | | 168 | | | | | | | | | | | | 52 | | | | | | | |
| 4 | | | | | | | | 103 | | | | | | | | | 30 | | | | | | | | | |
| | 53 | | 189 | | | | | | 215 | | | | | | | | | 24 | | | | | | | | |
| 222 | | | | 170 | | | | | | | | | | | | | | | | | | | | 71 | | |
| | 22 | | | | | | | | | | | | | | | 127 | | 49 | | | | | | | 125 | |
| 191 | | | | | | | 211 | | 187 | | | | | | | | | | | | | 148 | | | | |
| | 177 | | | | | 114 | | | | 93 | | | | | | | | | | | | | | | | |

APPARATUS AND METHOD FOR CHANNEL ENCODING/DECODING IN COMMUNICATION OR BROADCASTING SYSTEM

CROSS-REFERENCE TO RELATED APPLICATION(S)

This application is a continuation application of prior application Ser. No. 17/400,681, filed on Aug. 12, 2021, which has issued as U.S. Pat. No. 11,750,220, on Sep. 5, 2023, which is a continuation application of prior application Ser. No. 16/685,566, filed on Nov. 15, 2019, which has issued as U.S. Pat. No. 11,133,825, on Sep. 28, 2021, which is a continuation application of prior application Ser. No. 15/848,970, filed on Dec. 20, 2017, which has issued as U.S. Pat. No. 10,484,010 on Nov. 19, 2019, which claimed the benefit priority under 35 U.S.C. § 119(a) of a Korean patent application number 10-2016-0175019 filed on Dec. 20, 2016 in the Korean Intellectual Property Office, and of a Korean patent application 10-2017-0002599, filed on Jan. 6, 2017 in the Korean Intellectual Property Office, and of a Korean patent application 10-2017-0003152 filed on Jan. 9, 2017 in the Korean Intellectual Property Office, and of a Korean patent application 10-2017-0016435, filed on Feb. 6, 2017 in the Korean Intellectual Property Office, and of a Korean patent application 10-2017-0037186 filed on Mar. 23, 2017 in the Korean Intellectual Property Office, and of a Korean patent application number 10-2017-0058349 filed on May 10, 2017 in the Korean Intellectual Property Office, and of a Korean patent application number 10-2017-0065647 filed on May 26, 2017 in the Korean Intellectual Property Office, and of a Korean patent application number 10-2017-0078170 filed on Jun. 20, 2017 in the Korean Intellectual Property Office, and of a Korean patent application number 10-2017-0080783, filed on Jun. 26, 2017 in the Korean Intellectual Property Office, the disclosures of each of which are incorporated by reference herein in their entirety.

TECHNICAL FIELD

The present disclosure relates to an apparatus and a method for channel encoding and decoding in a communication or broadcasting system.

BACKGROUND

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mm Wave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed. In a communication or broadcasting system, link performance may remarkably deteriorate due to various types of noises, a fading phenomenon, and inter-symbol interference (ISI) of a channel. Therefore, to implement high-speed digital communication or broadcasting systems requiring high data throughput and reliability like next-generation mobile communications, digital broadcasting, and portable Internet, there is a need to develop technologies to overcome the noises, the fading, and the inter-symbol interference. As part of studies to overcome the noises, etc., a study on an error-correcting code which is a method for increasing reliability of communications by efficiently recovering distorted information has been actively conducted recently.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and an apparatus for low density parity-check (LDPC) encoding/decoding capable of supporting various input lengths and code rates.

Another aspect of the present disclosure is to provide a method and an apparatus for LDPC encoding/decoding capable of supporting various codeword lengths from a designed parity-check matrix.

Aspects of the present disclosure are not limited to the above-mentioned aspects. That is, other aspects that are not mentioned may be obviously understood by those skilled in the art to which the present disclosure pertains from the following description.

In accordance with an aspect of the present disclosure, a method for channel encoding in a communication or broadcasting system is provided. The method includes determining a block size of a parity-check matrix, determining a sequence for generating the parity-check matrix, determining a section including the determined block size, determining a representative value corresponding to the determined section, and transforming the sequence by applying the sequence a predefined operation to the sequence using the representative value.

In accordance with another aspect of the present disclosure, a method for channel encoding in a communication or broadcasting system is provided. The method includes determining a block size of a parity-check matrix, determining a sequence for generating the parity-check matrix, determining an integer value based on the predetermined block size according to the predetermined method, and transforming the sequence by applying the sequence a predefined operation to the sequence using the integer value.

According to the present disclosure, it is possible to support the LDPC code for the variable length and the variable rate.

The effects that may be achieved by the embodiments of the present disclosure are not limited to the above-mentioned aspects. That is, other effects that are not mentioned may be obviously understood by those skilled in the art to which the present disclosure pertains from the following description.

In accordance with another aspect of the present disclosure, a method for channel encoding in a communication or broadcasting system is provided. The method includes determining a block size Z, and performing encoding based on the block size and a parity-check matrix corresponding to the block size, in which the block size is included in any one of the plurality of block size groups and the parity-check matrix is different for each block size group.

In accordance with another aspect of the present disclosure, a method for channel decoding in a communication or broadcasting system is provided. The method includes determining a block size Z, and performing decoding based on the block size and a parity-check matrix corresponding to the block size, in which the block size is included in any one of the plurality of block size groups and the parity-check matrix is different for each block size group.

In accordance with another aspect of the present disclosure, an apparatus for channel encoding in a communication or broadcasting system is provided. The apparatus includes a transceiver, and a controller configured to determine a block size Z, and perform encoding based on the block size and a parity-check matrix corresponding to the block size, in which the block size is included in any one of the plurality of block size groups and the parity-check matrix is different for each block size group.

In accordance with another aspect of the present disclosure, an apparatus for channel decoding in a communication or broadcasting system is provided. The apparatus includes a transceiver, and a controller configured to determine a block size Z, and perform decoding based on the block size and a parity-check matrix corresponding to the block size, in which the block size is included in any one of the plurality of block size groups and the parity-check matrix is different for each block size group.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 17A, 17B, 17C, 17D, 17E, 17F and 17G are diagrams illustrating a base matrix of an LDPC code according to an embodiment of the present disclosure;

FIGS. 18A, 18B, 18C, 18D, 18E, 18F and 18G are diagrams illustrating an example of an LDPC code exponent matrix having a part of the base matrix of FIG. 17A as a base matrix according to an embodiment of the present disclosure;

FIGS. 19A, 19B, 19C, 19D, 19E, 19F and 19G are diagrams illustrating an LDPC code exponent matrix according to an embodiment of the present disclosure;

FIGS. 20A, 20B, 20C, 20D, 20E, 20F and 20G are diagrams illustrating an LDPC code exponent matrix according to an embodiment of the present disclosure;

FIGS. 21A, 21B, 21C, 21D, 21E, 21F and 21G are diagrams illustrating an LDPC code exponent matrix according to an embodiment of the present disclosure;

FIGS. 22A, 22B, 22C, 22D, 22E, 22F and 22G are diagrams illustrating an LDPC code exponent matrix according to an embodiment of the present disclosure;

FIGS. 23A, 23B, 23C, 23D, 23E, 23F and 23G are diagrams illustrating an LDPC code exponent matrix according to an embodiment of the present disclosure;

FIGS. 24A, 24B, 24C, 24D, 24E, 24F and 24G are diagrams illustrating an LDPC code exponent matrix according to an embodiment of the present disclosure;

FIGS. 25A, 25B, 25C, 25D, 25E, 25F and 25G are diagrams illustrating an LDPC code exponent matrix according to an embodiment of the present disclosure;

FIGS. 26A, 26B, 26C, 26D, 26E, 26F and 26G are diagrams illustrating an LDPC code exponent matrix according to an embodiment of the present disclosure;

FIGS. 27A, 27B, 27C, 27D, 27E, 27F, 27G, 27H, 27I and 27J are diagrams illustrating an LDPC code base matrix according to an embodiment of the present disclosure;

FIGS. 28A, 28B, 28C, 28D, 28E, 28F, 28G, 28H, 28I and 28J are diagrams illustrating an LDPC code exponent matrix according to an embodiment of the present disclosure;

FIGS. 29A, 29B, 29C and 29D are diagrams illustrating an LDPC code exponent matrix according to an embodiment of the present disclosure;

FIGS. 30A, 30B, 30C and 30D are diagrams illustrating an LDPC code exponent matrix according to an embodiment of the present disclosure;

FIGS. 31A, 31B, 31C and 31D are diagrams illustrating an LDPC code exponent matrix according to an embodiment of the present disclosure;

FIGS. 32A, 32B, 32C and 32D are diagrams illustrating an LDPC code exponent matrix according to an embodiment of the present disclosure;

FIGS. 33A, 33B, 33C and 33D are diagrams illustrating an LDPC code exponent matrix according to an embodiment of the present disclosure;

FIGS. 34A, 34B, 34C and 34D are diagrams illustrating an LDPC code index matrix according to an embodiment of the present disclosure;

FIGS. 35A, 35B, 35C and 35D are diagrams illustrating an LDPC code exponent matrix according to an embodiment of the present disclosure;

FIGS. 36A, 36B, 36C and 36D are diagrams illustrating an LDPC code exponent matrix according to an embodiment of the present disclosure; and FIGS. 37A, 37B, 37C and 37D are diagrams illustrating an LDPC code exponent matrix according to an embodiment of the present disclosure;

Throughout the drawings, like reference numerals will be understood to refer to like parts, components, and structures.

DETAILED DESCRIPTION

Figure 1:
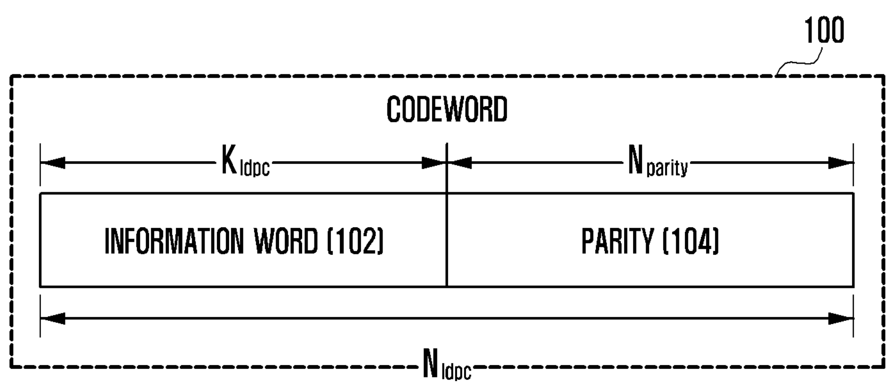
FIG. 1 is a structure diagram of a systematic low density parity-check (LDPC) codeword according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Various advantages and features of the present disclosure and methods accomplishing the same will become apparent from the following detailed description of embodiments with reference to the accompanying drawings. However, the present disclosure is not limited to the embodiments disclosed herein but will be implemented in various forms. The embodiments have made disclosure of the present disclosure complete and are provided so that those skilled in the art can easily understand the scope of the present disclosure. Therefore, the present disclosure will be defined by the scope of the appended claims. Like reference numerals throughout the description denote like elements.

Low density parity-check (LDPC) codes that are first introduced by Gallager in the 1960s remain forgotten for a very long time due to complexity that may hardly be implemented at the technology level at that time. However, as performance of turbo codes proposed by Berrou, Glavieux, and Thitimajshima in 1993 approaches Shannon's channel capacity, many studies on channel encoding based on iterative decoding and a graph thereof by performing many different interpretations on performance and characteristics of the turbo codes have been conducted. As a result, if as the LDPC code in the late 1990s is studied again, the LDPC code is decoded by applying sum-product algorithm based iterative decoding to the LDPC code on a tanner graph corresponding to the LDPC code, it was found that the performance of the LDPC code also approaches the Shannon's channel capacity.

The LDPC code may be generally defined as a parity-check matrix and represented using a bipartite graph commonly called the tanner graph.

FIG. 1 is a structure diagram of a systematic LDPC codeword according to an embodiment of the present disclosure.

Hereinafter, systematic LDPC codewords will be described with reference to FIG. 1.

The LDPC codes are LDPC encoded by receiving an information word 102 consisting of $K_{ldpe}$ bits or symbols to generate a codeword 100 consisting of $N_{ldpc}$ bits or symbols. Hereinafter, for convenience of explanation, it is assumed that the codeword 100 consisting of $N_{ldpc}$ bits is generated by receiving the information word 102 including $K_{ldpe}$ bits. That is, when the information word $l=[i_0, i_1, i_2, \ldots i_{k_{ldpc}-1}]$102 which consists of $K_{ldpc}$ input bits is LDPC encoded, the codeword $c=[c_0, c_1, c_2, \ldots c_{N_{ldpc}-1}]$ 100 is generated. That is, the information word and the codeword are a bit string consisting of a plurality of bits and the information word bit and the codeword bit means each bit configuring the information word and the codeword. Generally, when the codeword includes the information world like $C=[c_0, c_1, c_2, \ldots c_{N_{ldpc}-1}]=[i_0, i_1, i_2, \ldots i_{K_{ldpc}-1}, p_0, p_1, p_2, \ldots p_{N_{ldpc}-K_{ldpc}-1}]$, the codeword is called a systematic code. Here, $P=p_0, p_1, p_2, \ldots, p_{N_{ldpc}-K_{lppc}-1}]$ is a parity bit 104 and the number $N_{parity}$ of parity bits may be represented by $N_{parity}=N_{ldpc}-K_{ldpc}$.

The LDPC code is a kind of linear block codes and includes a process of determining a codeword satisfying conditions of the following Equation 1.

Equation 1

$$H \cdot c^T = \left[h_1 h_2 h_3 \ldots h_{N_{ldpc}-1}\right] \cdot c^T = \sum_{i=0}^{N_{ldpc}} c_i \cdot h_i = 0$$

In the above Equation 1, $c=C_0, C_1, C_2, \ldots, C_{N_{ldpc}-1}]$.

In the above Equation 1, H represents the parity-check matrix, C represents the codeword, ci represents an i-th codeword bit, and Nldpc represents an LDPC codeword length. In the above Equation 1, hi represents an i-th column of the parity-check matrix H.

The parity-check matrix H consists of the Nldpc columns that are equal to the number of LDPC codeword bits. The above Equation 1 represents that since a sum of a product of the i-th column hi and the i-th codeword bit ci of the parity-check matrix becomes "0", the i-th column hi has a relationship with the i-th codeword bit ci.

A graph representation method of the LDPC code will be described with reference to FIG. 2.

Figure 2:
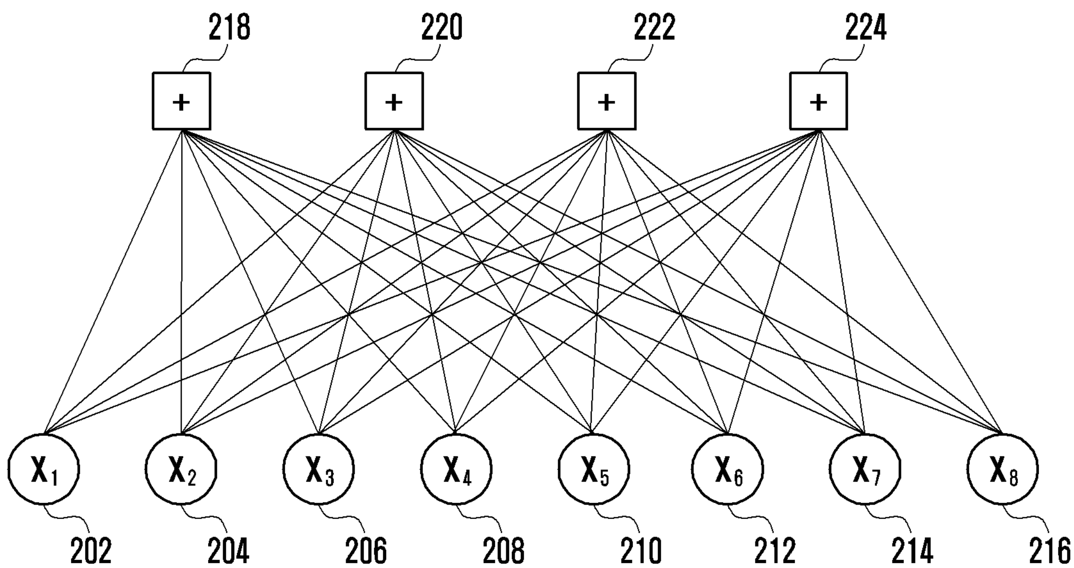
FIG. 2 is a diagram illustrating a graph representation method of an LDPC code according to an embodiment of the present disclosure.

FIG. 2 is a tanner graph illustrating an example of a parity-check matrix H1 of the LDPC code consisting of 4 rows and 8 columns according to an embodiment of the present disclosure. Referring to FIG. 2, since the parity-check matrix Hi has 8 columns, a codeword of which the length is 8 is generated, a code generated by the H1 represents the LDPC code, and each column corresponds to encoded 8 bits.

Referring to FIG. 2, the tanner graph of the LDPC code encoded and decoded based on the parity-check matrix Hi consists of 8 variable nodes, that is, x1(202), x2(204), x3(206), x4(208), x5(210), x6(212), x7(214), and x8(216) and 8 check nodes 218, 220, 222, and 224. Here, an i-th column and a j-th column of the parity-check matrix H1 of the LDPC code each correspond to a variable node xi and a j-th check node. Further, a value of 1 at a point where the j-th column and the j-th row of the parity-check matrix HI of the LDPC code intersect each other, that a value other than 0 means that an edge connecting between the variable node xi and the j-th check node is present on the tanner graph as illustrated in FIG. 2.

A degree of the variable node and the check node on the tanner graph of the LDPC code means the number of edges connected to each node, which is equal to the number of entries other than 0 in the column or the row corresponding to the corresponding node in the parity-check matrix of the LDPC code. For example, in FIG. 2, degrees of the variable nodes x1(202), x2(204), x3(206), x4(208), x5(210), x6(212), x7(214), and x8(216) each become 4, 3, 3, 3, 2, 2, 2, and 2 in order and degrees of the check nodes 218, 220, 222, and 224 each become 6, 5, 5, and 5 in order. Further, the number of entries other than 0 in each column of the parity-check matrix H1 of FIG. 2 corresponding to the variable node of FIG. 2 corresponds to the above-mentioned degrees 4, 3, 3, 3, 2, 2, 2, and 2 in order and the number of entries other than 0 in each row of the parity-check matrix Hi of FIG. 2 corresponding to the check nodes of FIG. 2 corresponds to the above-mentioned degrees 6, 5, 5, and 5 in order.

The LDPC code may be decoded using the iterative encoding algorithm based on the sum-product algorithm on the bipartite graph illustrated in FIG. 2. Here, the sum-product algorithm is a kind of message passing algorithms. The message passing algorithm represents an algorithm of exchanging message using an edge on the bipartite graph and calculating an output message using the messages input to variable node or the check node and updating the calculated output message.

Herein, a value of an i-th encoding bit may be determined based on a message of an i-th variable node. The value of the i-th encoding bit may be applied with both of a hard decision and a soft decision. Therefore, the performance of the i-th bit ci of the LDPC codeword corresponds to the performance of the i-th variable node of the tanner graph, which may be determined depending on positions and the number of 1's of the i-th column of the parity-check matrix. In other words, the performance of Nldpc codeword bits of the codeword may rely on the positions and the number of 1's of the parity-check matrix, which means that the performance of the LDPC code is greatly affected by the parity-check matrix. Therefore, to design the LDPC code having excellent performance, a method for designing a good parity-check matrix is required.

To easily implement the parity-check matrix used in a communication or broadcasting system, generally, a quasi-cycle LDPC code (QC-LDPC code) using the parity-check matrix of a quasi-cyclic form is mainly used.

The QC-LDPC code has the parity-check matrix consisting of a 0-matrix (zero matrix) having a small square matrix form or circulant permutation matrices. At this time, the permutation matrix means a matrix in which all elements of a square matrix are 0 or 1 and each row or column includes only one 1. Further, the circulant permutation matrix means a matrix in which each element of an identity matrix is circularly shifted.

Hereinafter, the QC-LDPC code will be described in detail.

First of all, the circulant permutation matrix $P=(P_{i,j})$ having a size of L×L is defined by the following Equation 2. Here, $P_{i,j}$ means entries of an i-th row and a j-th column in the matrix P (here, 0≤i, j<L).

$$P_{i,j} = \begin{cases} 1 & \text{if } i+1 \equiv j \bmod L \\ 0 & \text{otherwise} \end{cases}. \qquad \text{Equation 2}$$

For the permutation matrix P defined as described above, it can be appreciated that $P^i$ (0≤i<L) is the circulant permutation matrices in the form in which each entry of an identify matrix having the size of L×L is circularly shifted in a right direction i times.

The parity-check matrix H of the simplest QC-LDPC code may be expressed by the following Equation 3.

$$H = \begin{bmatrix} P^{a_{11}} & P^{a_{12}} & \dots & P^{a_{1n}} \\ P^{a_{21}} & P^{a_{22}} & \dots & P^{a_{2n}} \\ \vdots & \vdots & \ddots & \vdots \\ P^{a_{m1}} & P^{a_{m2}} & \dots & P^{a_{mn}} \end{bmatrix}. \qquad \text{Equation 3}$$

If is defined as the 0-matrix having the size of L×L, each exponent $a_{i,j}$ of the circulant permutation matrices or the 0-matrix in the above Equation 3 has one of {−1, 0, 1, 2, . . . , L−1}values. Further, it can be appreciated that the parity-check matrix H of the above Equation 3 has n column blocks and m row blocks and therefore has a size of mL×nL.

If the parity-check matrix of the above Equation 3 has a full rank, it is apparent that the size of the information word bit of the QC-LDPC code corresponding to the parity-check matrix is (n−m)L. For convenience, (n−m) column blocks corresponding to the information bit are called the information column block, and ma column blocks corresponding to the rest parity bits are called the parity column block.

Generally, a binary matrix having a size of m×n obtained by replacing each of the circulant permutation matrices and the 0-matrix in the parity-check matrix of the above Equation 3 with 1 and 0, respectively, is called a mother matrix or a base matrix M(H) of the parity-check matrix H and an integer matrix having a size of m×n obtained like the following Equation 4 by selecting only exponents of each of the a size of m×n or the 0-matrix is called an exponent matrix E(H) of the parity-check matrix H.

$$E(H)=\begin{bmatrix} a_{11} & a_{12} & \dots & a_{1n} \\ a_{21} & a_{22} & \dots & a_{2n} \\ \vdots & \vdots & \ddots & \vdots \\ a_{m1} & a_{m2} & \dots & a_{mn} \end{bmatrix} \quad \text{Equation 4}$$

As a result, one integer included in the exponent matrix corresponds to the circulant permutation matrix in the parity-check matrix, and therefore, the exponent matrix may be represented by sequences consisting of integers for convenience. (The sequence is also called an LDPC sequence or an LDPC code sequence to be distinguished from another sequence). In general, the parity-check matrix may be represented by a sequence having algebraically the same characteristics as well as an exponent matrix. In the present disclosure, for convenience, the parity-check matrix is represented by a sequence indicating the location of 1 within the exponent matrix or the parity-check matrix, but a sequence notation that may identify a location of 1 or 0 included in the parity-check matrix is various and therefore is not limited to the notation in the present specification. Therefore, there are various sequence forms showing algebraically the same effect.

In addition, even the transmitting/receiving apparatus on the device may directly generate the parity-check matrix to perform the LDPC encoding and decoding, but, according to the feature of the implementation, the LDPC encoding and decoding may also be performed using the exponent matrix or the sequence having the algebraically same effect as the parity-check matrix. Accordingly, although the present disclosure describes the encoding and decoding using the parity-check matrix for convenience, it is to be noted that the encoding and decoding can be implemented by various methods which can obtain the same effect as the parity-check matrix on the actual device.

For reference, the algebraically same effect means that two or more different representations can be explained or transformed to be perfectly identical to each other logically or mathematically.

For convenience, the embodiment of the present disclosure describes that the circulant permutation matrix corresponding to one block is only one, but the same disclosure may be applied even to the case in which several circulant permutation matrices are included in one block. For example, when the sum of two circulant permutation matrices $P^{a_{ij}^{(1)}}$, $P^{a_{ij}^{(2)}}$ is included in one i-th row block and a j-th column block as shown in the following Equation 5, the exponent matrix can be expressed by the following Equation 6. Referring to the following Equation 6, it can be seen that two integers correspond to the i-th row and the j-th column corresponding to the row block and the column block including the sum of the plurality of circulant permutation matrices.

$$H=\begin{bmatrix} \ddots & \square & \square & \iddots \\ \square & P^{a_{ij}^{(1)}}+P^{a_{ij}^{(2)}} & \square & \square \\ \square & & \square & \square \\ \iddots & \square & \square & \ddots \end{bmatrix} \quad \text{Equation 5}$$

$$E(H)=\begin{bmatrix} \ddots & \square & \square & \iddots \\ \square & \left(a_{ij}^{(1)}, a_{ij}^{(2)}\right) & \square & \square \\ \square & & \square & \square \\ \iddots & \square & \square & \ddots \end{bmatrix} \quad \text{Equation 6}$$

According to the above embodiment, generally, in the QC-LDPC code, a plurality of circulant permutation matrices may correspond to one row block and column block in the parity-check matrix, but the present disclosure describes that one circular permutation matrix corresponds to one block for the sake of convenience. However, the gist of the present disclosure is not limited thereto. For reference, a matrix having a size of L×L in which a plurality of circulant permutation matrices overlap in one row block and column block is called a circulant matrix or a circulant.

Meanwhile, the mother matrix or the base matrix for the parity-check matrix and the exponent matrix of the above Equations 5 and 6 means a binary matrix obtained by replacing each circulant permutation matrix and the 0-matrix into 1 and 0, respectively, similar to the definition used in the Equation 3. Here, the sum of the plurality of circulant permutation matrices (i.e., circulant matrix) included in one block is also replaced into 1.

Since the performance of the LDPC code is determined according to the parity-check matrix, there is a need to design the parity-check matrix for the LDPC code having excellent performance. Further, the method for LDPC encoding and decoding capable of supporting various input lengths and code rates is required.

Lifting means a method which is used not only for efficiently designing the QC-LDPC code but also for generating the parity-check matrices having various lengths from a given exponent matrix or generating the LDPC codeword. That is, the lifting means a method which is applied to efficiently design a very large parity-check matrix by setting an L-value determining the size of the circulant permutation matrix or the 0-matrix from the given small mother matrix according to a specific rule, or generates parity-check matrices having various lengths or generates the LDPC codeword or generates the LDPC codeword by applying an appropriate L value to the given exponent matrix or the sequence corresponding thereto.

The existing lifting method and the feature of the QC-LDPC code designed by the lifting are briefly described with reference to the document, S. Myung, K. Yang, and Y. Kim, "Lifting Methods for Quasi-Cyclic LDPC Codes," IEEE Communications Letters. vol. 10, pp. 489-491, June 2006 (hereinafter Myung2006).

First, when an LDPC code C0 is given, S QC-LDPC codes to be designed by the lifting method are set to be C1, . . . ,CS and values corresponding to sizes of row blocks and column blocks of the parity-check matrices of each QC-LDPC code are set to be Lk. Here, C0 corresponds to the smallest LDPC code having the mother matrix of C1, . . . ,CS codes as the parity-check matrix and the L0 value corresponding to the size of the row block and the column block is 1. Further, for convenience, a parity-check matrix Hk of each code Ck has an exponent matrix $E(H_k)=(e_{i,j}^{(k)})$ having a size of m×n and each exponent $e_{i,j}^{(k)}$ is selected as one of the {−1, 0, 1, 2, . . . , Lk−1}values.

The existing lifting method includes operations such as C0->Cl-> . . . ->CS and has the feature satisfying conditions such as L(k+1)=q(k+1)Lk (here, q(k+1) is a positive integer, k=0, 1, . . . ,S-1). Further, if only a parity-check matrix HS of CS is stored by the feature of the lifting process, all of the QC-LDPC codes C0, C1, . . . ,CS may be expressed by the following Equation 7 according to the lifting method.

$$E(H_k)\equiv\left\lfloor \frac{L_k}{L_s}E(H_s)\right\rfloor \quad \text{Equation 7}$$

-continued or $$E(H_k) \equiv E(H_s) \bmod L_k \quad \text{Equation 8}$$

In this manner, not only a method of designing QC-LDPC codes C1, . . . ,CS or the like greater than C0 but also a method of generating small codes Ci (i=k–1, k–2, . . . , 1, 0) by an appropriate method such as shown in the above Equation 7 or 8 from the large code Ck is called lifting.

According to the lifting method of the above Equation 7 or 8, Lk values corresponding to the sizes of the row blocks or the column blocks of the parity-check matrices of each QC-LDPC code Ck have a multiple relationship with each other, and thus the exponent matrix is also selected by the specific scheme. As described above, the existing lifting method helps facilitate a design of the QC-LDPC code having improved error floor characteristics by making algebraic or graphical characteristics of each parity-check matrix designed by the lifting good.

However, there is a problem in that each of the Lk values has the multiple relationship with each other and therefore the lengths of each code are greatly limited. For example, it is assumed that a minimum lifting method such as L (k+1)=2*Lk is applied to each Lk value. In this case, the size of the parity-check matrix of each QC-LDPC code may have $2^k m \times 2^k n$. That is, when the lifting is applied in 10 operations (S=10), the size of the parity-check matrix may generate a total of 10 sizes, which means that the QC-LDPC codes having 10 kinds of lengths may be supported.

For this reason, the existing lifting method has slightly unfavorable characteristics in designing the QC-LDPC code supporting various lengths. However, the communication systems generally used require length compatibility of a very high level in consideration of various types of data transmission. For this reason, there is a problem in that the LDPC encoding technique based on the existing lifting method is hardly applied to the mobile communication system.

In order to overcome such a problem, the lifting method considered in the present disclosure will be described in detail as follows.

First, the S LDPC codes to be designed by the lifting method are set to be C1, . . . ,CS, and a value corresponding to a size of one row block and column block in the parity-check matrix of each LDPC code CZ is set to be Z (Z=1, . . . ,S). (Hereinafter, for convenience, which is named a block size) In addition, the parity-check matrix Hz of each code CZ has an exponent matrix $$E(H_z)=(e_{i,j}^{(z)})$$

of size of m×n. Each of the exponents $e_{i,j}^{(Z)}$ is selected as one of {−1, 0, 1, 2, . . . , Z−1}values. For convenience, in the present disclosure, the exponent representing the 0-matrix is represented as −1 but may be changed to other values according to the convenience of the system.

Therefore, an exponent matrix of the LDPC code CS having the largest parity-check matrix is defined as $$E(H_s)=(e_{i,j}^{(S)}).$$

The general lifting method may be expressed by the following Equation 9 to obtain $$E(H_z)=(e_{i,j}^{(Z)}).$$

$$E(H_z)=\left(e_{ij}^{(z)}\right),\quad e_{ij}^{(z)}=\begin{cases} e_{ij}^{(s)}, & e_{ij}^{(s)}\le 0 \\ f\left(e_{ij}^{(s)},Z\right), & e_{ij}^{(s)}>0 \end{cases}. \quad \text{Equation 9}$$

or $$E(H_z)=\left(e_{ij}^{(z)}\right),\quad e_{ij}^{(z)}=\begin{cases} e_{ij}^{(s)}, & e_{ij}^{(s)}< 0 \\ f\left(e_{ij}^{(s)},Z\right), & e_{ij}^{(s)}\ge 0 \end{cases}.$$

In above Equation 9, the lifting function $f(x, Z)$ is an integer function defined by integers x and Z. That is, the lifting function $f(x, Z)$ is a function which is determined by the size value of the circulant matrix configuring the exponent matrix (or sequence corresponding thereto) for the parity-check matrix of the given QC-LDPC code and the parity-check matrix of the QC-LDPC code. Therefore, briefly summarizing the process of operating the lifting method used in the present disclosure, each exponents are transformed by the Z value determined based on the integers corresponding to each exponent from the exponent matrix given to define the LDPC code and the size Z×Z of the circulant matrix and the LDPC encoding or decoding is performed based on each transformed exponent.

Since the lifting method is applied to the exponent matrix having the size of m×n, the parity-check matrix or the corresponding exponent matrix can be obtained for all cases where the codeword length is n×Z (Z=1, 2, . . . ). In addition, if the parity-check matrix has the full rank, it is apparent that all the cases where the size of the information word bit of the QC-LDPC code corresponding to the parity-check matrix is (n−m) Z (Z=1, 2, . . . ) can be supported. Therefore, it can be seen that the lifting method is a suitable method for the QC-LDPC encoding/decoding that supports very various information word lengths and codeword lengths.

However, according to the document, S. Myung, K. Yang, and J. Kim, "Quasi-Cyclic LDPC Codes for Fast Encoding," IEEE Transactions on Information Theory. vol. 51, No. 8, pp. 2894-2901, Aug. 2005 (hereinafter Myung2005). The cycle characteristics of the QC-LDPC code are determined according to the mother matrix and the exponent matrix for the parity-check matrix. Since the lifting method of the above Equation 9 changes the exponent matrix for very various Z values from one exponent matrix, it is difficult to control the cycle characteristics of the parity-check matrix.

In other words, when the exponent matrix for all Z values is transformed from the given exponent matrix $$E(H_s)=(e_{ij}^{(S)}),$$

it is very difficult to satisfy the conditions described in the above reference document [Myung2005] so that the cycle characteristics are always good. Therefore, according to the present disclosure, by limiting the Z value according to the range of the Z value to be supported, the code design and the lifting method which deteriorates flexibility of the codeword length and the information word length but can instead improve the code performance are suggested.

First of all, it is assumed that a plurality of Z values may be divided into A sets (or groups) Zi(i=1, 2, . . . , A) as shown in the following Equation 10.

$$Z_i=\{Z|Z=X_i+k\cdot D_i, k=0,1, \ldots ,Y_i\}\ i=1,2, \ldots ,A \quad \text{Equation 10}$$

As the detailed example of the above Equation 10, the block size Z=1, 2, 3, . . . , 15, 16, 17, 18, . . . , 31, 32, 34, 36, 38, . . . , 60, 62, 64, 68, 72, 76, . . . , 120, 124, 128, 136, 144, 152, . . . , 240, 248, and 256 are divided into 5 (=A) sets or groups as shown in the following Equation 11.

$$Z1=\{1,2, \ldots ,15\}, Z2=\{16,17, \ldots ,31\}, Z3=\{32,34, 36, \ldots ,60,62\}, Z4=\{64,68,72, \ldots ,120,124\}, Z5=\{128,136,144, \ldots ,240,248\} \quad \text{Equation 11}$$

Representing the above Equation 11 by the method similar to the above Equation 10 is as shown in the following Equation 12.

$$Z_i=\{Z|Z=X_i+k\cdot D_i, k=0,1 \ldots ,Y_i\}, i=1,2, \ldots ,A.\ A=5.\ X_1=1. X_2=16, X_3=32, X_4=64, X_5=128.\ Y_1=15, Y_2=Y_3=Y_4=Y_5=16.\ D_1=D_2=1, D_3=2, D_4=4, D_5=8. \quad \text{Equation 12}$$

The above Equations 10 to 12 are only one method of the representations and may be represented by various methods, and therefore are not necessarily limited thereto.

Describing the above Equations 10 to 12, the block size Z to be supported is first divided into the plurality of sets or groups. For convenience, in the present disclosure, the group of the block size is divided according to the range of the value of the block size and the increasing value of the block size, but it is apparent that the block size may be divided by various methods. For example, there may be various methods, such as dividing block sizes having a certain multiple or divisor relation into groups or dividing the remainders of certain fixed numbers into the same block sizes.

Di, which means a width at which the block size values are increased in each group Zi, is a value that determines granularity for the block size group. For example, according to the above Equations 11 to 12, the number of block sizes and the number of block sizes which are included in Z1 and Z2 are different from each other as 16 to 15, but have a feature increasing by one. In this manner, if the Di values are equal to each other, the granularity is represented as being equal. Referring to Z2 and Z3, the number of block sizes is the same as 16, but are different from each other as D2=1 and D3=2. In this case, the granularities are different from each other, and the D2 is represented as having granularity than that of the D3. That is, the smaller the Di value, the larger the granularity. Generally, the smaller the Di value, the finer the granularity is.

The significance of the decision on the granularity in the design of the QC-LDPC code will be described in more detail.

It is assumed that the mother matrix or the base matrix is defined to generate the parity-check matrix required for the LDPC encoding, and the size of the mother matrix or the base matrix is m×n. In addition, for convenience, if the parity-check matrix has the full rank, the number of information bits and the number of codeword bits each are (n−m) Z and nZ as described above. Therefore, according to the above Equations 10 to 12, if Z ∈ Zi, then the number of information words and the number of codeword bits are expressed by $$(n-m)(X_i+k\cdot D_i)$$

and $$n(X_i+k\cdot D_i)_{(k=0,1, \ldots )}.$$

As a result, it may be seen that the number of information bits and the number of codeword bits are each increased by intervals of (n−m) Di and nDi, with (n m) Xi and nXi being a minimum value. That is, the increase in the information word length or the codeword length is determined by the Di when the mother matrix or the base matrix is determined.

If all Di values are 1, the number of information bits and the number of codeword bits are each increased by intervals of (n−m) and n, so it may be seen that the granularity is considerably large. If the granularity is considerably large, it is possible to maximize and support the flexibility the length in applying the QC-LDPC encoding. (In the case of the LDPC code, the length flexibility can be supported by the conventional shortening and puncturing techniques. However, detailed description thereof will be omitted because it is out of the gist of the present disclosure.)

However, if the granularity is large, the length flexibility is improved, but there are some problems.

First of all, generally, a well-designed LDPC code and other linear block codes improve minimum distance characteristics or the cycle characteristics on the Tanner graph as the length is increased. If a coding gain is represented based on a signal-to-noise ratio (SNR) in units of dB, the coding gain is also improved approximately at a constant rate when the code length is generally increased at a predetermined rate. (However, if the codeword length is gradually increased, the encoding performance is close to Shannon Limit, so the improvement in the encoding performance is limited and the effect is decreased bit by bit) More specifically, for example, for the same code rate, the coding gain also has a similar characteristic if the coding gain when the coding length is increased from 500 to 1000 is the same as the increase rate of the codeword like the case of increasing from 4000 to 8000. On the other hand, if the coding gain when the codeword length increases from 500 to 1000 is the same as the increase length of the codeword like the case of increasing from 4000 to 4500, the difference in the coding gain is larger compared to the case in which the rate is the same. (Generally, in the latter case, the effect of improving the coding gain is usually small.) As described above, it can be seen that the improvement in the coding gain is closely related to the increase rate of the codeword length.

Therefore, as shown in the above Equations 10 to 12, if all D_i values are set to be 1, since the number of information bits and the number of codeword bits are each increased by (n−m) and n, the length flexibility has a great advantage but is more complicated when considering the hardware implementation. In addition, as the codeword length is increased, the performance improvement effect is gradually decreased due to the increase in the codeword length, and therefore setting the Di value by appropriately considering the performance improvement effect compared to the hardware implementation complexity required in the system may be important in the design in the good system.

Therefore, if the performance improvement effect required when the performance improvement effect when the codeword or information word length is increased in the system is equal to or higher than a predetermined level, the Di value may be set to be a value other than 1 according to the range of the Z value. For example, as shown in the above Equation 11 to 12, when the minimum block size value Z=128 at Z5, the information word length and the codeword length are 128 (n−m) and 128n. If the granularity is set to be high and thus Z=129 is included in the Z5, the increase rate in the length becomes a maximum of 129/128 when it is considered the information word length and the codeword length are 129 (n−m) and 129n, such that the increase rate of the information word and the codeword for the Z1 is much smaller than a minimum value 15/14 (corresponding to the case of Z=14, 15). Therefore, it may be easy to consider that the coding gain effect according to the increase of the codeword length is very small. Therefore, if the Z value is relatively large, it is more efficient to approximately adjust and use the Di value to obtain the coding gain required by the system.

In the above Equations 10 to 12, for convenience, only the case in which the Di value is defined in one set of block sizes to have the predetermined granularity is described, but the present disclosure is not limited thereto. If the increase length of the block size is not constant, among the differences in the block sizes included in one set, a value having a minimum absolute value, or an average value or a median or the like for a difference between two neighboring elements may be represented as the granularity of the set. In other words, if one set of the block sizes is given as {64, 68, 76, 84, 100}, for convenience, the granularity may be defined as 4 which is the smallest difference between the two elements, or as 9 which is an average value of 4 8, 8, or 16, or 8 which is the difference in two neighboring elements, or as 8 which is a median.

The length flexibility is improved when the granularity is high, like setting all the Di values to be 1, whereas there may be a difficulty in designing a good QC-LDPC code.

In general, a system using LDPC encoding has a disadvantage in that the complexity of the implementation is increased if there are a lot of parity-check matrices independent of each other. Therefore, like the lifting method, a plurality of parity-check matrices are designed to perform the LDPC encoding using the method corresponding to one exponent matrix or LDPC sequence However, referring to the following document, S. Myung, K. Yang, and J. Kim, "Quasi-Cyclic LDPC Codes for Fast Encoding," IEEE Transactions on Information Theory. vol. 51, No. 8, pp. 2894-2901, Aug. 2005 (hereinafter Myung 2005). Generally, the QC-LDPC encoding has the cycle characteristics on a special Tanner graph according to the mother matrix (or base matrix) and the exponent matrix of the parity-check matrix and the block size. If the parity-check matrix for various block sizes is supported from one exponent matrix or LDPC sequence, it is very difficult to maintain the good cycle characteristics for all the block sizes. This is because the more kinds of block sizes, the more difficult it becomes.

The cycle characteristics of the QC-LDPC code will be briefly described with reference to the above reference document [Myung2005]. First, it is assumed that the number of circulant permutation matrices forming 4-cycle on the mother matrix as shown in the following Equation 13 is four. Here, it is assumed that the size of the circulant permutation matrix is Z×Z.

$$\begin{bmatrix} P^{a_1} & \dots & P^{a_2} \\ \vdots & \ddots & \vdots \\ P^{a_4} & \dots & P^{a_3} \end{bmatrix} \qquad \text{Equation 13}$$

According to the reference document [Myung2005], when the minimum positive integer r satisfying the following expression 14 is present, there exists a cycle having a length of 4r on the Tanner graph of the parity-check matrix corresponding to the above Equation 13.

$$r\cdot(a_1-a_2+a_3-a_4)\equiv 0 \pmod{Z} \qquad \text{Equation 14}$$

Figure 3A:
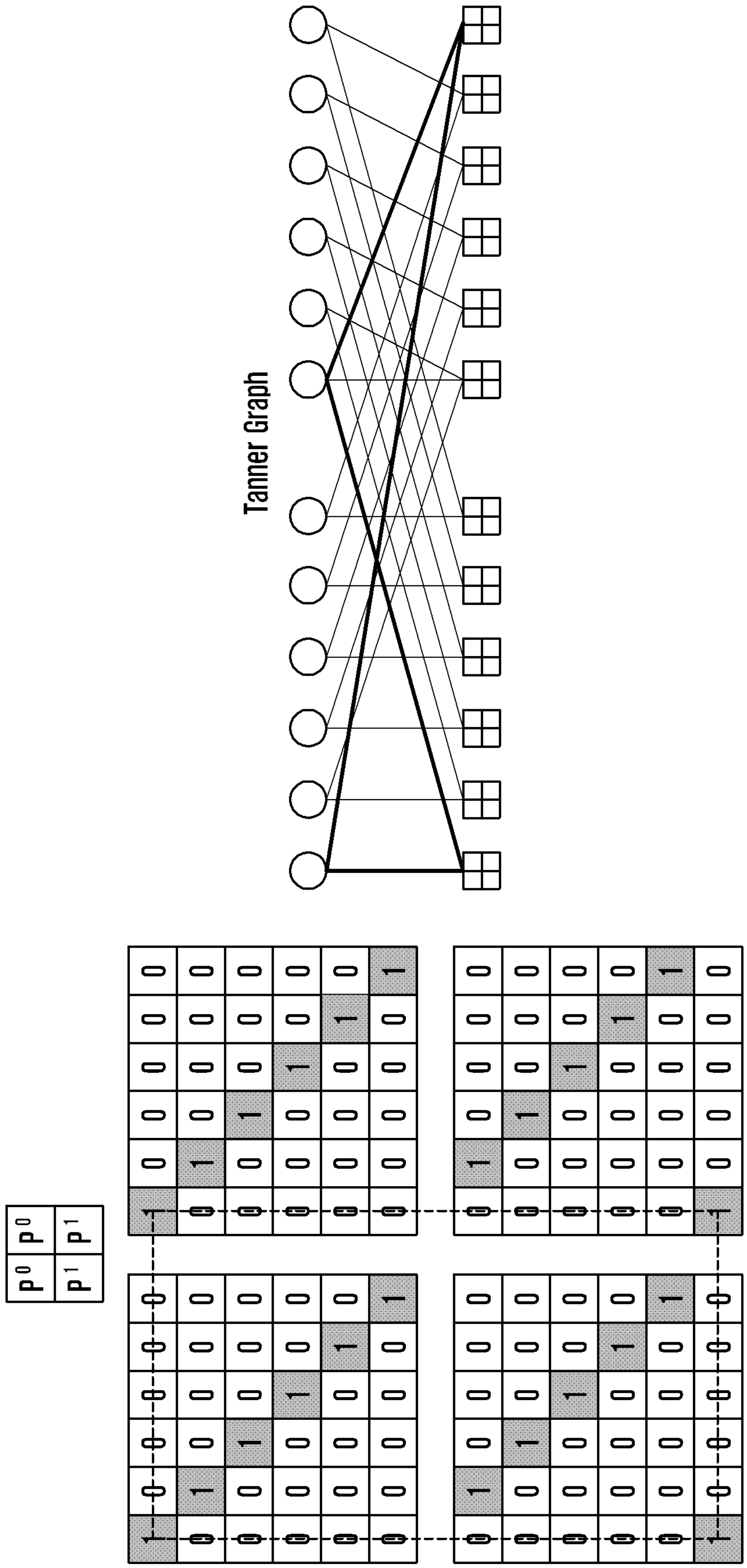
FIGS. 3A and 3B are diagrams for explaining cycle characteristics of a quasi-cycle LDPC (QC-LDPC) code according to an embodiment of the present disclosure.
Figure 3B:
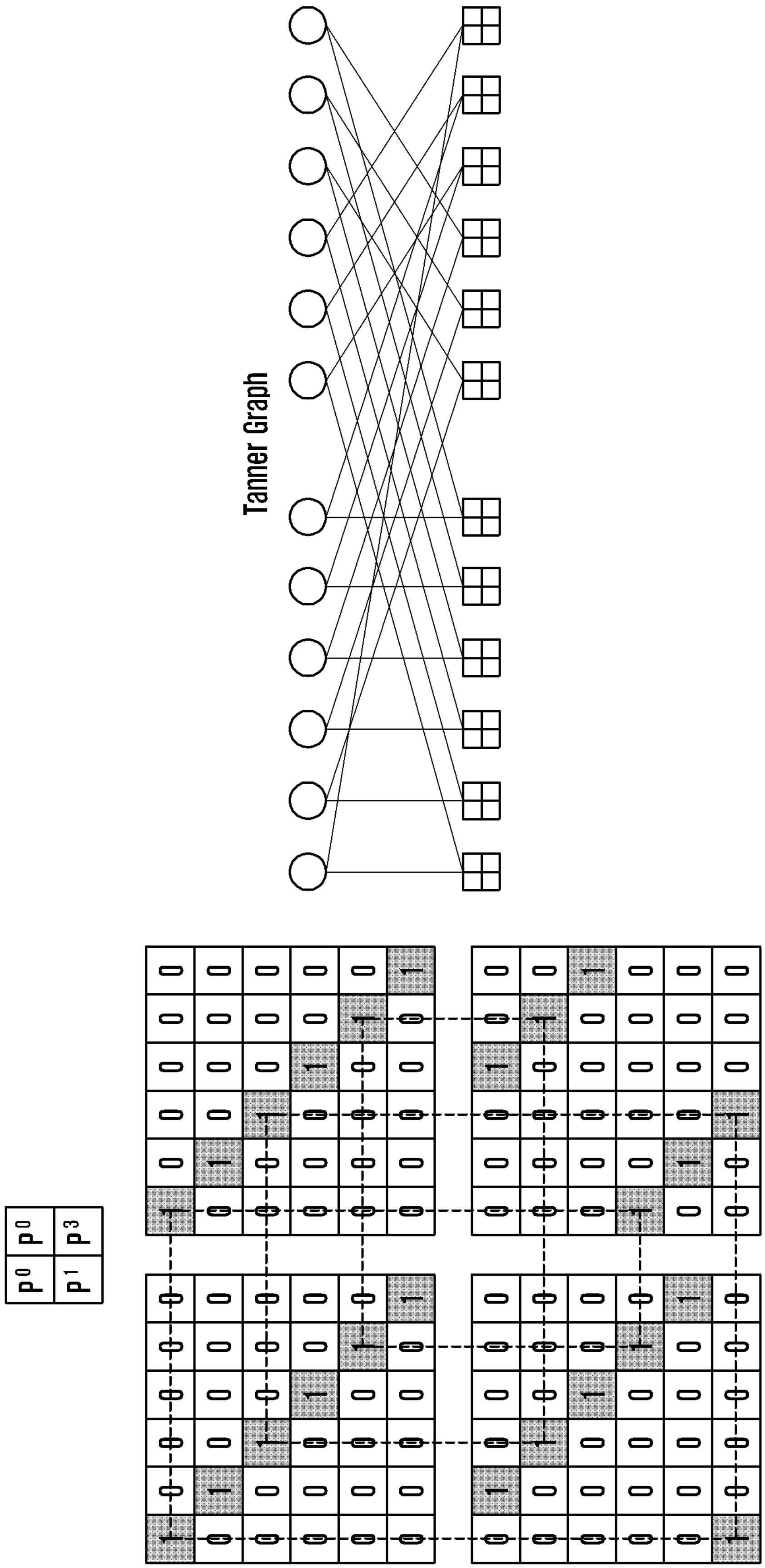

FIGS. 3A and 3B are diagrams for explaining cycle characteristics of a QC-LDPC code according to an embodiment of the present disclosure.

Referring to FIG. 3A, since a1−a2+a3−a4=0 in the case of Z=6, a1=a2=0, a3=a4=1, it can be easily seen that the 4-cycle is derived on the Tanner graph. Referring to FIG. 3B, since $$r\cdot(a_1-a_2-a_3-a_4)\equiv 3\cdot 2\equiv 0 \pmod{6}$$

in the case of Z=6, a1=a2=0, a3=3, a4=1, it can be easily seen that a 12-cycle is derived.

As described above, the QC-LDPC code has the cycle characteristic on the special Tanner graph according to the mother matrix (or base matrix) and the exponent matrix of the parity-check matrix and the block size. When the parity-check matrix for various block sizes is supported from one exponent matrix or LDPC sequence, as shown in the above Equations 13 and 14, even when the exponent matrix is fixed, the calculated value is changed by a modulo Z operation in the above Equation 14, and thus the cycle characteristics may be changed. Therefore, it is obvious that the more the kinds of block sizes are, the more likely the cycle characteristics will become worse.

Therefore, as in the examples of Equations (10) to (12), it is easy to design codes by adjusting the number of block sizes to be supported by appropriately setting the granularity in the set of the specific block sizes.

As described above, the lifting method proposed by the present disclosure proposes a method of dividing into a plurality of block size groups having granularity set appropriately. In the detailed embodiment, at least two groups of the plurality of groups have different particle sizes. In another embodiment, there may be at least two block size groups satisfying the feature that the maximum value of the increase rate for neighboring block sizes included in one block size group is greater than or equal to the minimum value of the increase rate for neighboring block sizes included in another block size group. In another embodiment, the features of the granularity and the increase rate of the block size may be simultaneously satisfied.

Figure 4:
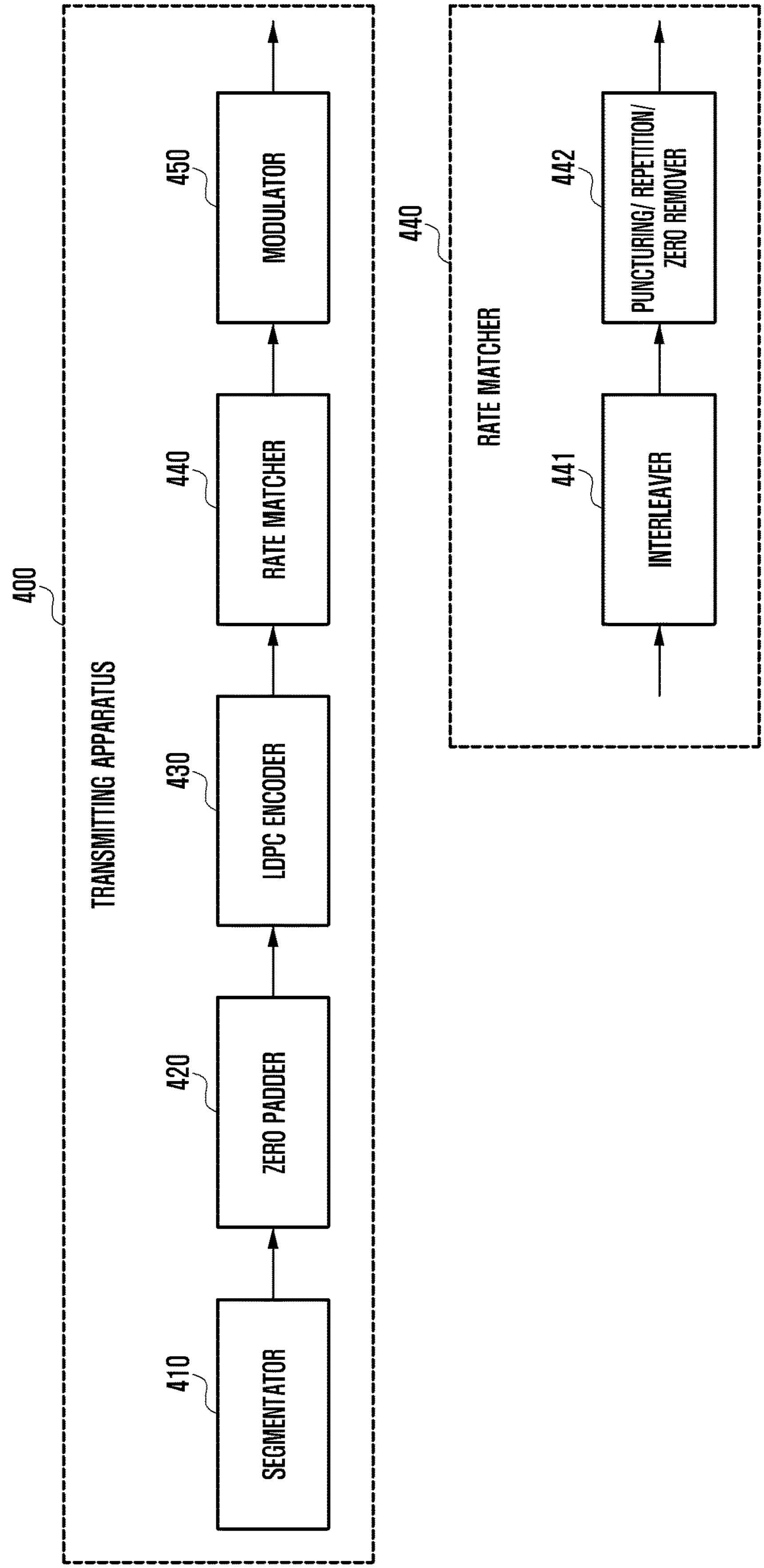
FIG. 4 is a block configuration diagram of a transmitting apparatus according to an embodiment of the present disclosure.

FIG. 4 is a block configuration diagram of a transmitting apparatus according to an embodiment of the present disclosure.

Referring to FIG. 4, a transmitting apparatus 400 may include a segmentator 410, a zero padder 420, an LDPC encoder 430, a rate matcher 440, a modulator 450 or the like to process variable length input bits. The rate matcher 440 may include an interleaver 441 and a puncturing/repetition/zero remover 442, or the like.

Here, the components illustrated in FIG. 4 are components for performing encoding and modulation on the variable length input bits, which is only one example. In some cases, some of the components illustrated in FIG. 4 may be omitted or changed and other components may also be added.

On the other hand, the transmitting apparatus 400 may transmit the necessary parameters (for example, input bit length, modulation and code rate (ModCod), parameters for zero padding (or shortening), code rate/codeword length of LDPC code, parameter for interleaving, parameter for repetition, puncturing or the like, modulation scheme and the like), perform encoding the parameters based on the determined parameters, and transmits the encoded parameters to the receiving apparatus 500.

Since the number of input bits is variable, when the number of input bits is greater than the preset value, the input bit may be segmented to have a length that is equal to or less than the preset value. Further, each of the segmented blocks may correspond to one LDPC coded block. However, when the number of input bits is equal to or smaller than the preset value, the input bit is not segmented. The input bits may correspond to one LDPC coded block.

Meanwhile, the transmitting apparatus 400 may previously store various parameters used for encoding, interleaving, and modulation. Here, the parameters used for the encoding may be information on the code rate of the LDPC code, the codeword length, and the parity-check matrix. Further, the parameters used for the interleaving may be the information on the interleaving rule and the parameters for the modulation may be the information on the modulation scheme. Further, the information on the puncturing may be a puncturing length. Further, the information on the repetition may be a repetition length. The information on the parity-check matrix may store the exponent value of the circulant matrix when the parity matrix proposed in the present disclosure is used.

In this case, each component configuring the transmitting apparatus 400 may perform the operations using the parameters.

Meanwhile, although not illustrated, in some cases, the transmitting apparatus 400 may further include a controller (not illustrated) for controlling the operation of the transmitting apparatus 400. Therefore, the operation of the transmitting apparatus as described above and the operation of the transmitting apparatus described in the present disclosure may be controlled by the controller, and the controller of the present disclosure may be defined as a circuit or application specific integration circuit or at least one processor.

Figure 5:
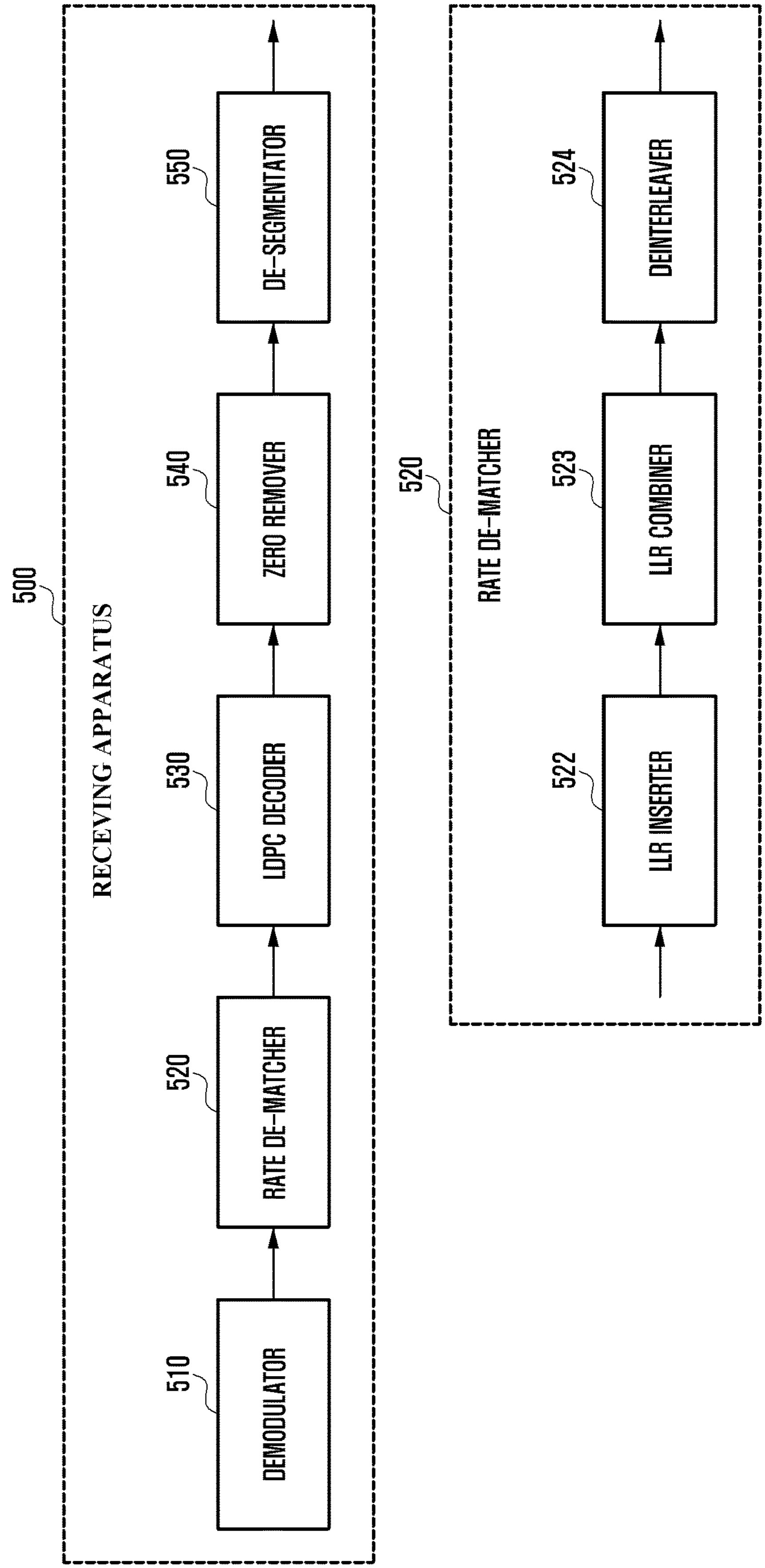
FIG. 5 is a block configuration diagram of a receiving apparatus according to an embodiment of the present disclosure.

FIG. 5 is a block configuration diagram of a receiving apparatus according to an embodiment of the present disclosure.

Referring to FIG. 5, the receiving apparatus 500 may include a demodulator 510, a rate de-matcher 520, an LDPC decoder 530, a zero remover 540, a de-segmentator 550 and the like to process variable length information. The rate de-matcher 520 may include a log likelihood ratio (LLR) inserter 522, an LLR combiner 523, a deinterleaver 524 and the like.

Here, the components illustrated in FIG. 5 are components performing the functions corresponding to components illustrated in FIG. 5, which is only an example and in some cases, some of the components may be omitted and changed and other components may also be added.

The parity-check matrix in the present disclosure may be determined using a memory, or may be given in advance in a transmitting apparatus or a receiving apparatus, or may be generated directly in a transmitting apparatus or a receiving apparatus. In addition, the transmitting apparatus may store or generate a sequence, an exponent matrix or the like corresponding to the parity-check matrix, and apply the generated sequence or exponent matrix to the encoding. Similarly, even the receiving apparatus may store or generate a sequence, an exponent matrix or the like corresponding to the parity-check matrix, and apply the generated sequence or exponent matrix to the encoding.

Hereinafter, the detailed description of the operation of the receiver will be described with reference to FIG. 5.

The demodulator 510 demodulates the signal received from the transmitting apparatus 400.

In detail, the demodulator 510 is a component corresponding to the modulator 450 of the transmitting apparatus 400 of FIG. 4 and may demodulate the signal received from the transmitting apparatus 400 and generate values corresponding to the bits transmitted from the transmitting apparatus 400.

For this purpose, the receiving apparatus 500 may prestore the information on the modulation scheme modulating the signal according to a mode in the transmitting apparatus 400. Therefore, the demodulator 510 may demodulate the signal received from the transmitting apparatus 400 according to the mode to generate the values corresponding to the LDPC codeword bits.

Meanwhile, the values corresponding to the bits transmitted from the transmitting apparatus 400 may be an LLR value.

In detail, the LLR value may be represented by a value obtained by applying Log to a ratio of the probability that the bit transmitted from the transmitting apparatus 400 is 0 and the probability that the bit transmitted from the transmitting apparatus 400 is 1. Alternatively, the LLR value may be the bit value itself and the LLR value may be a representative value determined depending on a section to which the probability that the bit transmitted from the transmitting apparatus 400 is 0 and the probability that the bit transmitted from the transmitting apparatus 400 is 1 belongs.

The demodulator 510 includes the process of performing multiplexing (not illustrated) on an LLR value. In detail, the demodulator 510 is a component corresponding to a bit demultiplexer (not illustrated) of the transmitting apparatus 400 and may perform the operation corresponding to the bit demultiplexer (not illustrated).

For this purpose, the receiving apparatus 500 may prestore the information on the parameters used for the transmitting apparatus 400 to perform the demultiplexing and the block interleaving. Therefore, the multiplexer (not illustrated) may reversely perform the operations of the demultiplexing and the block interleaving performed by the bit demultiplexer (not illustrated) on the LLR value corresponding to the cell word to multiplex the LLR value corresponding to the cell word in a bit unit.

The rate de-matcher 520 may insert the LLR value into the LLR value output from the demodulator 510. In this case, the rate de-matcher 520 may insert previously promised LLR values between the LLR values output from the demodulator 510.

In detail, the rate de-matcher 520 is a component corresponding to the rate matcher 440 of the transmitting apparatus 400 and may perform operations corresponding to the interleaver 441 and the zero removing and puncturing/repetition/zero remover 442.

First of all, the rate de-matcher 520 performs deinterleaving to correspond to the interleaver 441 of the transmitter. The output values of the deinterleaver 524 may allow the LLR inserter 522 to insert the LLR values corresponding to the zero bits into the location where the zero bits in the LDPC codeword are padded. In this case, the LLR values corresponding to the padded zero bits, that is, the shortened zero bits may be $\infty$ or $-\infty$. However, $\infty$ or $-\infty$ are a theoretical value but may actually be a maximum value or a minimum value of the LLR value used in the receiving apparatus 500.

For this purpose, the receiving apparatus 500 may prestore the information on the parameters used for the transmitting apparatus 400 to pad the zero bits. Therefore, the rate de-matcher 520 may determine the locations where the zero bits in the LDPC codeword are padded and insert the LLR values corresponding to the shortened zero bits into the corresponding locations.

Further, the LLR inserter 522 of the rate de-matcher 520 may insert the LLR values corresponding to the punctured bits into the locations of the punctured bits in the LDPC codeword. In this case, the LLR values corresponding to the punctured bits may be 0.

For this purpose, the receiving apparatus 500 may prestore the information on the parameters used for the transmitting apparatus 400 to perform the puncturing. Therefore, the LLR inserter 522 may insert the LLR value corresponding thereto into the locations where the LDPC parity bits are punctured.

The LLR combiner 523 may combine, that is, sum the LLR values output from the LLR inserter 522 and the demultiplexer 510. In detail, the LLR combiner 523 is a component corresponding to the puncturing/repetition/zero remover 442 of the transmitting apparatus 400 and may perform the operation corresponding to the repeater 442. First of all, the LLR combiner 523 may combine the LLR values corresponding to the repeated bits with other LLR values. Here, the other LLR values may be bits which are a basis of the generation of the repeated bits by the transmitting apparatus 400, that is, the LLR values for the LDPC parity bits selected as the repeated object.

That is, as described above, the transmitting apparatus 400 selects bits from the LDPC parity bits and repeats the selected bits between the LDPC information bits and the LDPC parity bits and transmits the repeated bits to the receiving apparatus 500.

As a result, the LLR values for the LDPC parity bits may consist of the LLR values for the repeated LDPC parity bits and the LLR values for the non-repeated LDPC parity bits, that is, the LDPC parity bits generated by the encoding. Therefore, the LLR combiner 523 may combine the LLR values with the same LDPC parity bits.

For this purpose, the receiving apparatus 500 may prestore the information on the parameters used for the transmitting apparatus 400 to perform the repetition. Therefore, the LLR combiner 523 may determine the LLR values for the repeated LDPC parity bits and combine the determined LLR values with the LLR values for the LDPC parity bits that are a basis of the repetition.

Further, the LLR combiner 523 may combine LLR values corresponding to retransmitted or incremental redundancy (IR) bits with other LLR values. Here, the other LLR values may be the LLR values for the bits selected to generate the LDPC codeword bits which are a basis of the generation of the retransmitted or IR bits in the transmitting apparatus 400.

That is, as described above, when NACK is generated for the HARQ, the transmitting apparatus 400 may transmit some or all of the codeword bits to the receiving apparatus 500.

Therefore, the LLR combiner 523 may combine the LLR values for the bits received through the retransmission or the IR with the LLR values for the LDPC codeword bits received through the previous frame.

For this purpose, the receiving apparatus 500 may prestore the information on the parameters used for the transmitting apparatus 400 to generate the retransmitted or IR bits. As a result, the LLR combiner 523 may determine the LLR values for the number of retransmitted or IR bits and combine the determined LLR values with the LLR values for the LDPC parity bits that are a basis of the generation of the retransmitted bits.

The deinterleaver 524 may deinterleaving the LLR value output from the LLR combiner 523.

In detail, the deinterleaver 524 is a component corresponding to the interleaver 441 of the transmitting apparatus 400 and may perform the operation corresponding to the interleaver 441.

For this purpose, the receiving apparatus 500 may prestore the information on the parameters used for the transmitting apparatus 400 to perform the interleaving. As a result, the deinterleaver 524 may reversely perform the interleaving operation performed by the interleaver 441 on the LLR values corresponding to the LDPC codeword bits to deinterleave the LLR values corresponding to the LDPC codeword bits.

The LDPC decoder 530 may perform the LDPC decoding based on the LLR value output from the rate de-matcher 520.

In detail, the LDPC decoder 530 is components corresponding to the LDPC encoder 430 of the transmitting apparatus 400 and may perform the operation corresponding to the LDPC encoder 430.

For this purpose, the receiving apparatus 500 may prestore information on parameters used for the transmitting apparatus 400 to perform the LDPC encoding according to the mode. As a result, the LDPC decoder 530 may perform the LDPC decoding based on the LLR value output from the rate de-matcher 520 according to the mode.

For example, the LDPC decoder 530 may perform the LDPC decoding based on the LLR valued output from the rate de-matcher 520 based on the iterative decoding scheme based on a sum-product algorithm and output the bits error-corrected depending on the LDPC decoding.

The zero remover 540 may remove the zero bits from bits output from the LDPC decoder 530.

In detail, the zero remover 540 is a component corresponding to the zero padder 420 of the transmitting apparatus 400 and may perform the operation corresponding to the zero padder 420.

For this purpose, the receiving apparatus 500 may prestore the information on the parameters used for the transmitting apparatus 400 to pad the zero bits. As a result, the zero remover 540 may remove the zero bits padded by the zero padder 420 from the bits output from the LDPC decoder 530.

The de-segmentator 550 is a component corresponding to the segmentator 410 of the transmitting apparatus 400 and may perform the operation corresponding to the segmentator 410.

For this purpose, the receiving apparatus 500 may prestore the information on the parameters used for the transmitting apparatus 400 to perform the segmentation. As a result, the de-segmentator 550 may combine the bits output from the zero remover 540, that is, the segments for the variable length input bits to recover the bits before the segmentation.

Meanwhile, although not illustrated, in some cases, the transmitting apparatus 400 may further include a controller (not illustrated) for controlling the operation of the transmitting apparatus 400. Therefore, the operation of the transmitting apparatus as described above and the operation of the receiving apparatus described in the present disclosure may be controlled by the controller, and the controller of the present disclosure may be defined as a circuit or application specific integration circuit or at least one processor.

Meanwhile, the LDPC code may be decoded using an iterative decoding algorithm based on a sum-product algorithm on the bipartite graph illustrated in FIG. 2 and the sum-product algorithm is a kind of message passing algorithm.

Hereinafter, the message passing operation generally used at the time of the LDPC decoding will be described with reference to FIGS. 6A and 6B.

Figure 6A:
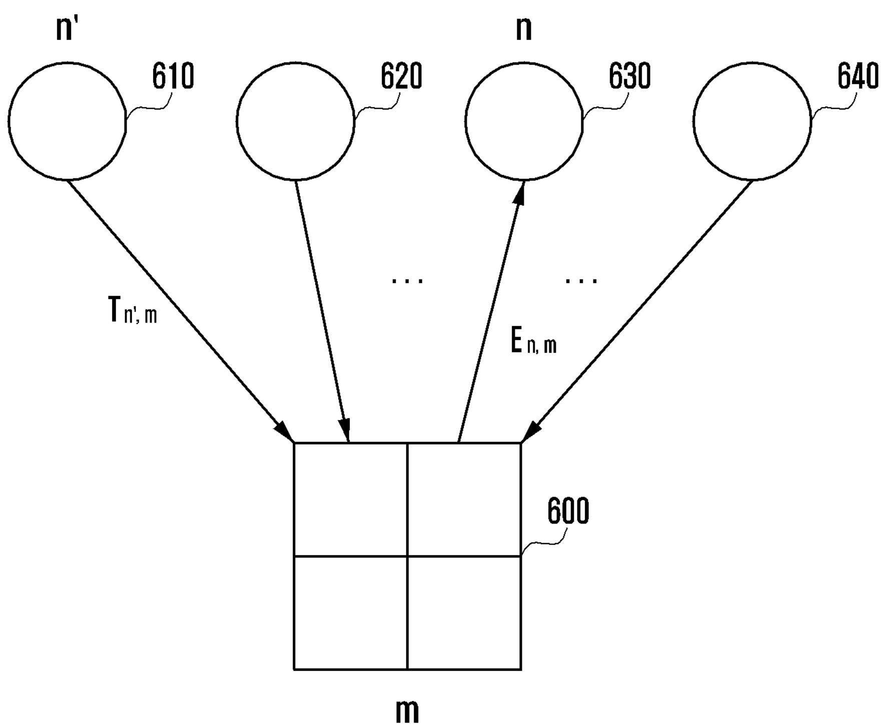
FIGS. 6A and 6B are message structure diagrams illustrating message passing operations performed at any check node and variable node for LDPC decoding according to an embodiment of the present disclosure.
Figure 6B:
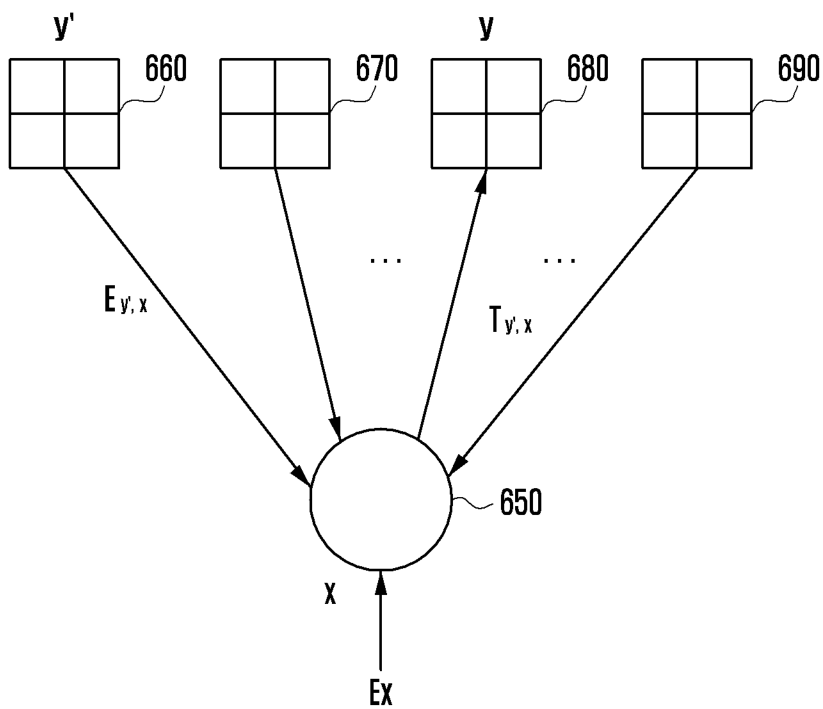

FIGS. 6A and 6B illustrate message passing operations performed at any check node and variable node for LDPC decoding according to an embodiment of the present disclosure.

FIG. 6A illustrates a check node m 600 and a plurality of variable nodes 610, 620, 630, and 640 connected to the check node m 600. Further, $T_{n',m}$ that is illustrated represents a massage passing from a variable node n' 610 to the check node m 600 and $E_{n,m}$ represents a message passing from the check node m 600 to the variable node n 630. Here, a set of all the variable nodes connected to the check node m 600 is defined as N(m) and a set other than the variable node n 630 from the N(m) is defined as N(m)/n.

In this case, a message update rule based on the sum-product algorithm may be expressed by the following Equation 15.

$$|E_{n,m}| = \Phi\left[\sum_{n' \in N(m)\backslash n} \Phi(|T_{n',m}|)\right] \quad \text{Equation 15}$$

$$\text{Sign}(E_{n,m}) = \prod_{n' \in N(m)\backslash n} \text{sign}(T_{n',m})$$

In the above Equation 15, Sign ($E_{n,m}$) represents a sign of $E_{n,m}$ and $|E_{n,m}|$ represents a magnitude of message $E_{n,m}$. Meanwhile, a function Φ(x) may be expressed by the following Equation 16.

$$\Phi(x) = -\log\left(\tanh\left(\frac{x}{2}\right)\right) \quad \text{Equation 16}$$

Meanwhile, FIG. 6B illustrates a variable node x 650 and a plurality of check nodes 660, 670, 680, and 690 connected to the variable node x 650. Further, $E_y$', x that is illustrated represents a massage passing from a check node y' 660 to the variable node x 650 and $T_y$, x represents a message passing from the variable node x 650 to the check node y 680. Here, a set of all the check nodes connected to the variable node x 650 is defined as M(x) and a set other than the check node y 680 from the M(x) is defined as M(x)/y. In this case, the message update rule based on the sum-product algorithm may be expressed by the following Equation 17.

$$T_{y,x} = E_x + \sum_{y' \in M(x)\backslash y} E_{y',x} \quad \text{Equation 17}$$

In the above Equation 17, $E_x$ represents an initial message value of the variable node x.

Further, upon determining a bit value of the node x, it may be expressed by the following Equation 18.

$$P_x = E_x + \sum_{y' \in M(x)} E'_y, x \quad \text{Equation 18}$$

In this case, the encoding bit corresponding to the node x may be decided based on a $P_x$ value.

The method illustrated in FIGS. 6A and 6B is the general decoding method and therefore the detailed description thereof will be no longer described. However, in addition to the method described in FIGS. 6A and 6B, other methods for determining a passing message value at a variable node and a check node may also be applied, and the detailed description thereof refers to "Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, Feb. 2001, pp. 498-519)".

Figure 7:
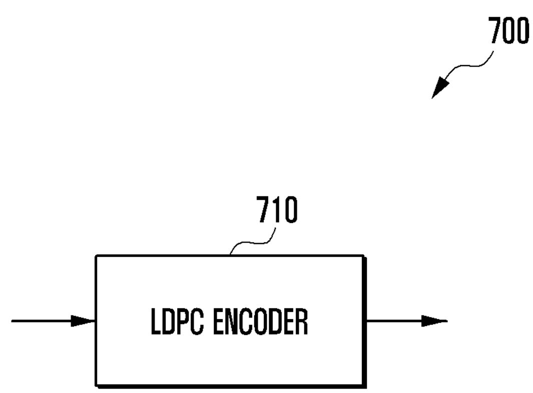
FIG. 7 is a block diagram for explaining a detailed configuration of an LDPC encoder according to an embodiment of the present disclosure.

FIG. 7 is a block diagram for explaining a detailed configuration of an LDPC encoder according to an embodiment of the present disclosure.

$K_{lpdc}$ bits may form $K_{ldpc}$ LDPC information word bits $I=(i_0,i_1, \ldots,)$ for the LDPC encoder 700. The LDPC encoder 700 may systematically perform the LDPC encoding on the $K_{ldpc}$ LDPC information word bits to generate the LDPC codeword $\Lambda=(c_0,c_1, \ldots, c_{Nldpc-1})=(i_0,i_1, \ldots, i_{Kldpc-1}, p_0,p_1, \ldots, p_{Nldpc}-K_{ldpc-1})$ consisting of the Nldpc bits.

As described in the above Equation 1, the generation process includes the process of determining a codeword so that the product of the LDPC codeword by the parity-check matrix is a zero vector.

Referring to FIG. 7, the encoding apparatus 700 includes an LDPC encoder 710. The LDPC encoder 710 may perform the LDPC encoding on the input bits based on the parity-check matrix or the exponent matrix or the sequence corresponding thereto to generate the LDPC codeword. In this case, the LDPC encoder 710 may use the parity-check matrix differently defined depending on the code rate (that is, code rate of the LDPC code) to perform the LDPC encoding.

Meanwhile, the encoding apparatus 700 may further include a memory (not illustrated) for pre-storing the information on the code rate of the LDPC code, the codeword length, and the parity-check matrix and the LDPC encoder 710 may use the information to perform the LDPC encoding. The information on the parity-check matrix may store the information on the exponent value of the circulant matrix when the parity matrix proposed in the present disclosure is used.

Figure 8:
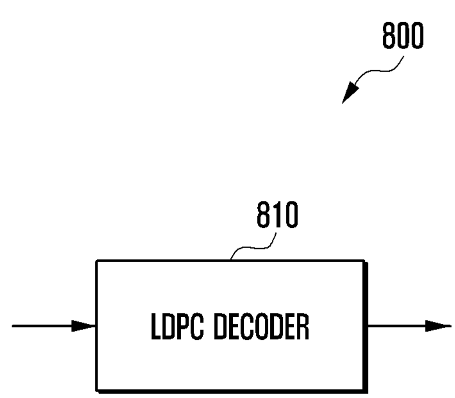
FIG. 8 is a block diagram illustrating a configuration of an encoding apparatus according to an embodiment of the present disclosure.

FIG. 8 is a block diagram illustrating a configuration of an encoding apparatus according to an embodiment of the present disclosure.

Referring to FIG. 8, a decoding apparatus 800 may include an LDPC decoder 810.

The LDPC decoder 810 performs the LDPC decoding on the LDPC codeword based on the parity-check matrix or the exponent matrix or sequence corresponding thereto.

For example, the LDPC decoder 810 may pass the LLR value corresponding to the LDPC codeword bits using the iterative decoding algorithm to perform the LDPC decoding, thereby generating the information word bits.

Here, the LLR value is channel values corresponding to the LDPC codeword bits and may be represented by various methods.

For example, the LLR value may be represented by a value obtained by applying Log to a ratio of the probability that the bit transmitted from the transmitting side through the channel is 0 and the probability that the bit transmitted from the transmitting side through the channel is 1. Further, the LLR value may be the bit value itself determined depending on the soft decision and the LLR value may be a representative value determined depending on a section to which the probability that the bit transmitted from the transmitting side is 0 or 1 belongs.

In this case, as illustrated in FIG. 7, the transmitting side may use the LDPC encoder 710 to generate the LDPC codeword.

In this case, the LDPC decoder 810 may use the parity-check matrix differently defined depending on the code rate (that is, code rate of the LDPC code) to perform the LDPC decoding.

Figure 9:
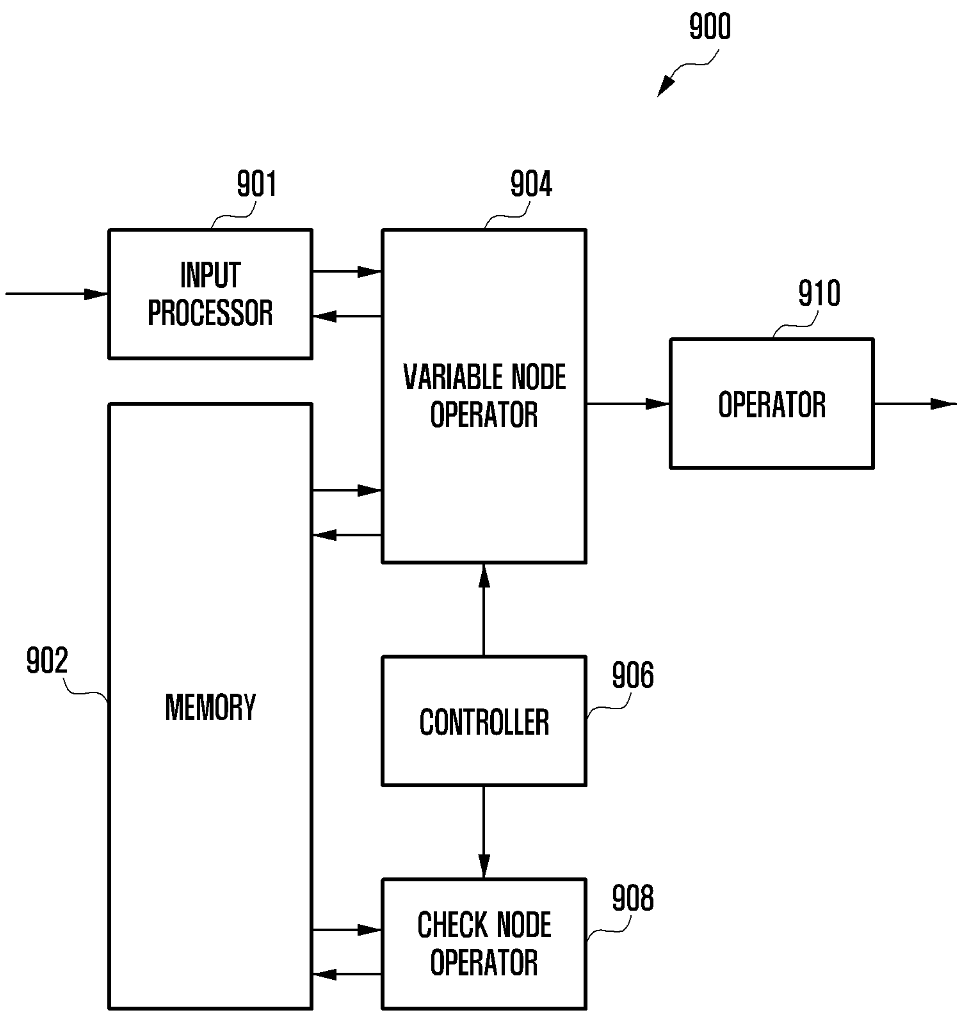
FIG. 9 is a structure diagram of an LDPC decoder according to an embodiment of the present disclosure.

FIG. 9 illustrates a structure diagram of an LDPC decoder according to an embodiment of the present disclosure.

Meanwhile, as described above, the LDPC decoder 810 may use the iterative decoding algorithm to perform the LDPC decoding. In this case, the LDPC decoder 810 may configured to have the structure as illustrated in FIG. 9.

However, the iterative decoding algorithm is already known and therefore the detailed configuration illustrated in FIG. 9 is only an example.

Referring to FIG. 9, a decoding apparatus 900 includes an input processor 901, a memory 902, a variable node operator 904, a controller 906, a check node operator 908, an output processor 910, and the like.

The input processor 901 stores the input value. In detail, the input processor 901 may store the LLR value of the signal received through a radio channel.

The controller 906 determines the block size (that is, codeword length) of the signal received through the radio channel, the number of values input to the variable node operator 904 and address values in the memory 902 based on the parity-check matrix corresponding to the code rate, the number of values input to the check node operator 908 and the address values in the memory 902, or the like.

The memory 902 stores the input data and the output data of the variable node operator 904 and the check node operator 908.

The variable node operator 904 receives data from the memory 902 depending on the information on the addresses of input data and the information on the number of input data that are received from the controller 906 to perform the variable node operation. Next, the variable node operator 904 stores the results of the variable node operation based on the information on the addresses of output data and the information on the number of output data, which are received from the controller 1106, in the memory 902 Further, the variable node operator 904 inputs the results of the variable node operation based on the data received from the input processor 901 and the memory 902 to the output processor 910. Here, the variable node operation is already described with reference to FIGS. 6A and 6B.

The check node operator 908 receives the data from the memory 902 based on the information on the addresses of the input data and the information on the number of input data that are received from the controller 906, thereby performing the check node operation. Next, the check node operator 908 stores the results of the variable node operation based on the information on the addresses of output data and the information on the number of output data, which are received from the controller 906, in the memory 902 Here, the check node operation is already described with reference to FIGS. 6A and 613.

The output processor 910 performs the soft decision on whether the information word bits of the transmitting side are 0 or 1 based on the data received from the variable node operator 904 and then outputs the results of the soft decision, such that the output value of the output processor 910 is finally the decoded value. In this case, in FIGS. 6A and 6B, the soft decision may be performed based on a summed value of all the message values (initial message value and all the message values input from the check node) input to one variable node.

Meanwhile, the decoding apparatus 900 may further include a memory (not illustrated) for pre-storing the information on the code rate of the LDPC code, the codeword length, and the parity-check matrix and the LDPC decoder 910 may use the information to perform the LDPC encoding. However, this is only an example, and the corresponding information may also be provided from the transmitting apparatus.

Figure 10:
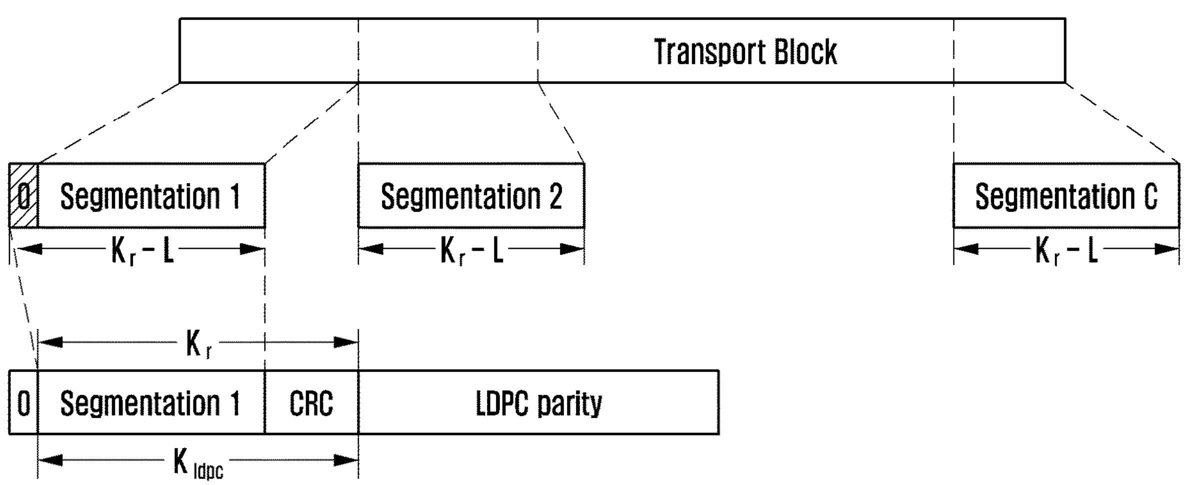
FIG. 10 is a diagram of a transport block structure according to an embodiment of the present disclosure.

FIG. 10 is a diagram of a transport block structure according to an embodiment of the present disclosure.

Referring to FIG. 10, <Null>bits may be added so that the segmented lengths are the same.

In addition, the <Null>bits may be added to match the information lengths of the LDPC code.

In the foregoing, a method of applying various block sizes based on the QC-LDPC code has been described in the communication and broadcasting system supporting LDPC codes of various lengths.

In order to support various block sizes, we proposed a method of dividing block sizes, in which granularity is set appropriately, into a plurality of block size groups considering the performance improvement, the length flexibility or the like. By setting the appropriate granularity according to the block size group, it is advantageous to design the parity-check matrix of the LDPC code or the exponent matrix or the sequence corresponding thereto, but also achieve the appropriate performance improvement and the length flexibility.

Next, a method for further improving the coding performance in the proposed method is proposed.

If the sequence is suitably transformed and used for all block sizes from one LDPC exponent matrix or sequence or the like as the lifting method described in the above Equations 7 to 9, since only one sequence is required to be implemented upon the system implementation, many advantages can be obtained. However, as described in the above Equations 13 and 14, it is very difficult to design the LDPC code having good performance for all block sizes as the number of kinds of block sizes to be supported increases.

Therefore, the method which can be easily applied to solve this problem is to use the plurality of LDPC sequences. For example, describing the examples of the above Equation 11 and 12, the LDPC encoding and decoding may be performed using different LDPC parity-check matrices (or exponent matrices or sequences) for the block size groups $Z_1$, $Z_2$, $Z_3$, $Z_4$, and $Z_5$. In addition, the block size groups $Z_1$ and $Z_2$ may use one LDPC parity-check matrix (or exponent matrix or sequence), $Z_3$ and $Z_4$ may use another LDPC parity-check matrix (or exponent matrix or sequence), and $Z_5$ may use the LDPC encoding and decoding using another LDPC parity-check matrix (or exponent matrix or sequence).

In the case of performing the LDPC encoding and decoding from a plurality of LDPC exponent matrices or sequences as described above, since the number of block sizes to be supported is greatly reduced compared with the case where all block sizes are supported from one LDPC exponent matrix or sequence, it is easy to design the exponent matrix or sequence of the LDPC code having good coding performance.

The exponent matrix or sequence of LDPC codes may be appropriately designed for each block size group to perform the LDPC encoding and decoding on all block sizes included in the block size group from one sequence. In this way, when designing the exponent matrices or sequences of the LDPC codes for each block size group, since the number of block sizes corresponding to one exponent matrix is limited to elements in the group, it is easier to design codes, thereby deigning the LDPC code having better coding performance.

As the number of parity-check matrices or exponent matrices or sequence of LDPC code increases, the coding performance may be improved, but the implementation complexity may be increased. Therefore, the LDPC code should be designed by appropriately determining the number of block size groups and the number of parity-check matrices of the LDPC code or the number of exponent matrices or LDPC sequences corresponding thereto according to the conditions required in the system design.

In the present disclosure, a method of lowering implementation complexity when the number of exponent matrices or sequences of an LDPC code is two or more is proposed as follows.

The present proposes a method for designing a plurality of exponent matrices or sequences on a given one base matrix. That is, the number of base matrices is one, and the exponent matrix, the sequence or the like of the LDPC code is obtained on the base matrix, and the lifting is applied according to the block size included in each block size group from the exponent matrix or the sequence, thereby performing the LDPC encoding and decoding of the variable length.

In other words, base matrices of the parity-check matrix corresponding to the exponent matrices or the sequences of the plurality of different LDPC codes are the same.

In this way, the elements or numbers configuring the exponent matrix or the LDPC sequence of the LDPC code may have different values, but the locations of the corresponding elements or numbers exactly coincide with each other. As described above, the exponent matrices or the LDPC sequences each refer to the exponent of the circulant permutation matrix, that is, a kind of circulant permutation values of bits. Therefore, by setting the locations of the elements or the numbers of the exponent matrices or the LDPC sequences to be the same, it is easy to grasp the locations of the bits corresponding to the circulant permutation matrix.

Another embodiment of the present disclosure is a method for lowering implementation complexity in a system for performing LDPC encoding and decoding so that exponent matrices or sequences correspond to each of the block size groups one by one. When the number of block size groups and the number of exponent matrices or sequences of the LDPC code are the same, all of the plurality of exponent matrices or sequences correspond to the same base matrix. That is, the number of base matrices is one, and the exponent matrix, the sequence or the like of the LDPC code is obtained on the base matrix, and the lifting is applied according to the block size included in each block size group from the exponent matrix or the sequence, thereby performing the LDPC encoding and decoding of the variable length.

The lifting method for each block size group may be the same or different. For example, when an exponent matrix given to a p-th group is $E_p=(e_{i,j}^{(p)})$ and an exponent matrix corresponding to a Z value included in the group is $E_p(Z)=(e_{i,j}(Z))$, it may be expressed by the following Equation 19.

$$Z \in Z_p,$$

$$e_{i,j}(Z) = \begin{cases} e_{i,j}^{(p)} & e_{i,j}^{(p)} < 0 \\ f_p\left(e_{i,j}^{(p)}, Z\right) & e_{i,j}^{(p)} \geq 0 \end{cases}$$

or $$e_{i,j}(Z) = \begin{cases} e_{i,j}^{(p)} & e_{i,j}^{(p)} \leq 0 \\ f_p\left(e_{i,j}^{(p)}, Z\right) & e_{i,j}^{(p)} > 0 \end{cases}$$

Equation 19

$F_p(x, Z)$ may be set differently for each block size group as shown in the above Equation 19, and may be set to be the same for some or all thereof. As the transformation function, a function in which an x value is transformed by applying modulo or flooring according to Z like $f_p(x, Z)=x \pmod Z$ or $f_p(X, Z)=\lfloor xZ/Z' \rfloor$ may be used and merely, fp(x,Z)=x may be used regardless of the Z value. The latter case is the case in which the sequence defined for each group is used as it is without special transformation process. In addition, there may be various methods in which in f, $(x, Z)=\lfloor xZ/Z' \rfloor$, Z' may be selected as an appropriate value according to the requirement of the system, determined as a maximum value among values that the Z may have, or determined as a maximum value among values that the Z may have within a p-th block size group, and the like.

As a result, in the embodiment of the present disclosure, when the plurality of block size groups are defined and the LDPC exponent matrix or the sequence is determined for each block size group, determining the group corresponding to the determined block size is determined, determining the LDPC exponent matrix or the sequence corresponding to the group, and performing the LDPC encoding and decoding, the structure of the base matrix corresponding to the LDPC exponent matrix or the sequence is the same. Here, the LDPC exponent matrices or the sequences may be different for each block size group, and some thereof may be the same or different but at least two or more thereof may be different.

According to another embodiment of the present disclosure, when a plurality of block size groups are defined and the LDPC exponent matrix or the sequence is defined for each block size group, in determining the group corresponding to the determined block size, determining the LDPC exponent matrix or the sequence corresponding to the group, and then performing the LDPC encoding and decoding, the structure of the base matrix corresponding to the LDPC exponent matrix or the sequence is the same and at least one of the LDPC exponent matrices or the sequence 3s corresponding to the block size groups is transformed according to the Z value determined before the LDPC encoding is performed. Here, the LDPC exponent matrices or the sequences may be different for each block size group, and some thereof may be the same or different but at least two or more thereof may be different.

In another embodiment of the present disclosure, the case in which the block size Z=1, 2, 3, . . . , 14, 15, 16, 18, 20, . . . , 28, 30, 32, 36, 40, . . . , 52, 56, 60, 64, 72, 80, . . . , 112, 120, 128, 144, 160, . . . , 240, and 256 are supported will be described.

First of all, this is divided into six groups as shown in the following Equation 20.

$$Z_1=\{1,2,3, \ldots ,7\}, Z_2=\{8,9,10, \ldots ,15\}, Z_3=\{16,18, 20, \ldots ,30\}, Z_4=\{32,36,40, \ldots ,60\}, Z_5=\{64, 72,80, \ldots ,120\}, Z_6=\{128,144,160, \ldots ,240, 256\} \quad \text{Equation 20}$$

Representing the above Equation 20 by the method similar to the above Equation 10 is as shown in the following Equation 21.

$$Z_i=\{Z|Z=X_i+k\cdot D_i, k=0,1, \ldots ,Y_i\}, i=1,2, \ldots ,A\ A=6\ X_1=1, X_2=8, X_3=16, X_4\ 32, X_5=64, X_6=128.\ Y_1=7, Y_2=Y_3=Y_4=Y_5=8, Y_6=-9.\ D_1=D_2=1, D_3=2, D_4=4, D_5=8, D_6=16. \quad \text{Equation 21}$$

Referring to the block size group shown in the above Equations 20 and 21, since the maximum value of the increase rate of neighboring block sizes among the block sizes included in $Z_5$ is 72/64=1.125 and the minimum value of the increase rate for neighboring block sizes among the block size included in $Z_4$ is 60/56 to 1.071, it can be seen that the former value is greater than the latter value. Likewise, since the maximum value of the increase rate of neighboring block sizes among the block sizes included in $Z_6$ is 144/128=1.125, and the minimum value of the increase rate of neighboring block sizes among the block sizes included in $Z_5$ is 120/112 to 1.071, it can be seen that the former value is greater than the latter value.

As described above, if the granularity is set well so that the maximum value of the increase rate of neighboring block sizes included in one block size group among at least two block size groups is greater than or equal to the minimum value of the increase ratio of neighboring block sizes included in another block size group, the appropriate encoding gain can be obtained. When the block size groups are set so that the maximum value of the increase rate of neighboring block sizes included in a specific block size group is always smaller than the minimum value of the increase rate of neighboring block sizes included in another block size group, the flexibility of the information word or codeword length may be increased, but the efficiency of the system is lowered because the coding gain is smaller than the increase in the codeword length.

It is assumed that the exponent matrix given to the p-th group Z, is defined as $$E_p=(e_{i,j}^{(p)})$$

as in the above Equation 19, and the exponent matrix corresponding to the Z value included in the group is defined as $$E_p(Z)=(e_{i,j}(Z))$$

At this time, the LDPC exponent matrix or the sequence transformed by applying the lifting function as in the following Equation 22 may be used.

$$i)Z \in Z_1,\ f_1(e_{i,j}^{(1)},Z)-e_{i,j}^{(1)}(\bmod 2^{\lfloor log2Z \rfloor})\ ii)p=2,3,4,5,6,\ Z \in Z_p,\ f_p(e_{ij}^{(p)},Z)=e_{i,j}^{(p)} \qquad \text{Equation 22}$$

In some cases, the appropriate transformation may be applied to the LDPC exponent matrix and the sequence according to the block size.

The transformation of the sequence as shown in i) of the above Equation 22 may also be generated as a new group by separately storing each transformed sequence according to the block size. For example, in the above example, when Z=1 and Z=2 and 3, Z=4, 5, 6, and 7 are defined as separate block size groups, and the exponent matrix transformed in the case of Z=1, the exponent matrix transformed in the case of Z=2 and 3, and the exponent matrix transformed in the case of Z=4, 5, 6, and 7 may be separately stored and used. In this case, there is a disadvantage in that the number of block size groups and the number of exponent matrices to be stored may be increased matrices increases. In this case, to reduce the complexity, the method and apparatus for LDPC encoding and decoding based on the LDPC exponent matrix and the sequence can be implemented more simply by applying the appropriate lifting function according to the block size group as shown in the above Equation 22.

The techniques such as the shortening or the puncturing may be applied to the parity-check matrix that can be obtained from the exponent matrix to support more various code rates. A flowchart of an embodiment of an exponent matrix-based LDPC encoding and decoding process is shown in FIGS. 11 and 12.

Figure 11:
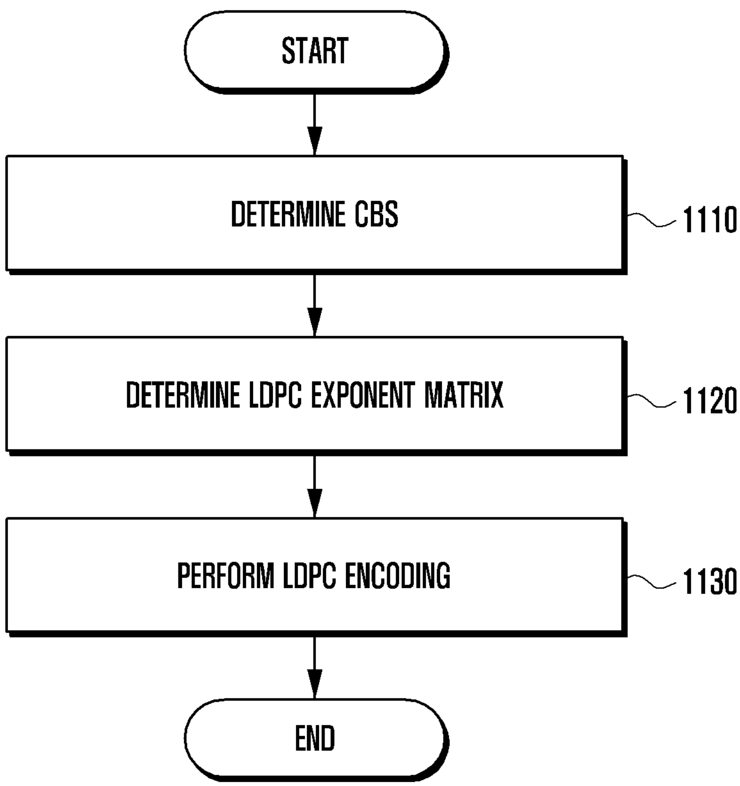
FIG. 11 is a flowchart of an LDPC encoding process according to an embodiment of the present disclosure.
Figure 12:
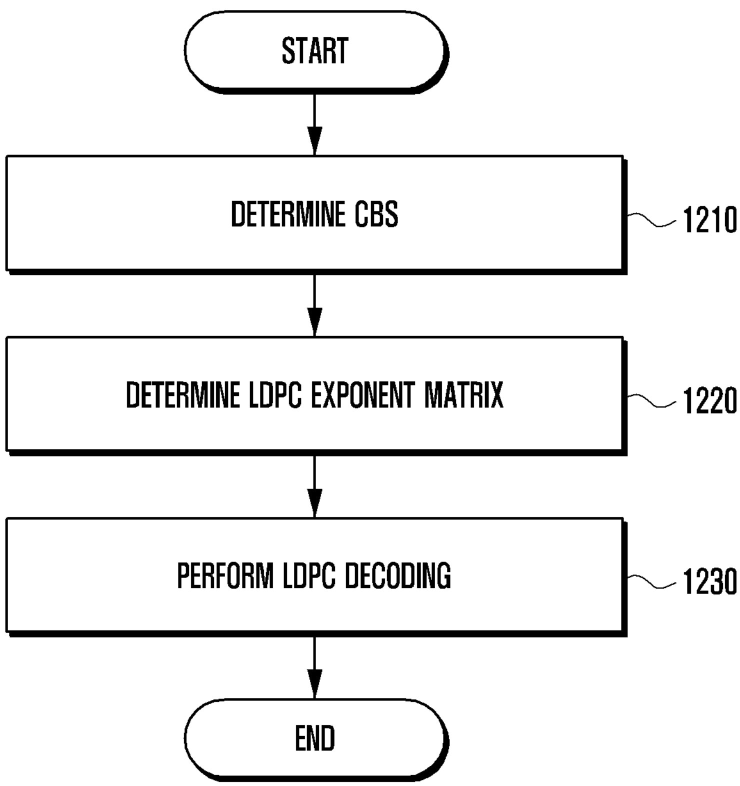
FIG. 12 is an exemplified diagram of the flowchart of the LDPC encoding process according to an embodiment of the present disclosure.

FIG. 11 is a flowchart of an LDPC encoding process according to an embodiment of the present disclosure.

First of all, the information word length is determined as in operation 1110 of FIG. 11. In the present disclosure, the information word length is sometimes represented by a code block size (CBS) in some cases.

Next, the LDPC exponent matrix or the sequence matched to the determined CBS is determined as in operation 1120.

The LDPC encoding is performed in operation 1130 based on the exponent matrix or the sequence. As the detailed example, it is assumed that the CBS is determined to be 1280 in operation 1110. If the information word corresponds to 32 columns in the exponent matrix, Z=1280/32=40, so that the block size Z=40 is included in $Z_4$. Therefore, in operation 1120, the exponent matrix or the sequence corresponding to the block size included in $Z_4$={32, 36, 40, . . . , 60} of the above Equation 20 is determined, and the LDPC encoding may be performed using the exponent matrix or the sequence in operation 1130.

The LDPC decoding process may be similarly as illustrated in FIG. 12.

FIG. 12 is an exemplified diagram of the flowchart of the LDPC encoding process according to an embodiment of the present disclosure.

Referring to FIG. 12, if the CBS is determined as 1280 in operation 1210, the exponent matrix or the sequence corresponding to the block size included in Z4={32, 36, 40, . . . , 60} of the above Equation 20 is determined in operation 1220, and the LDPC decoding may be performed using the exponent matrix or the sequence in operation 1230.

Figure 13:
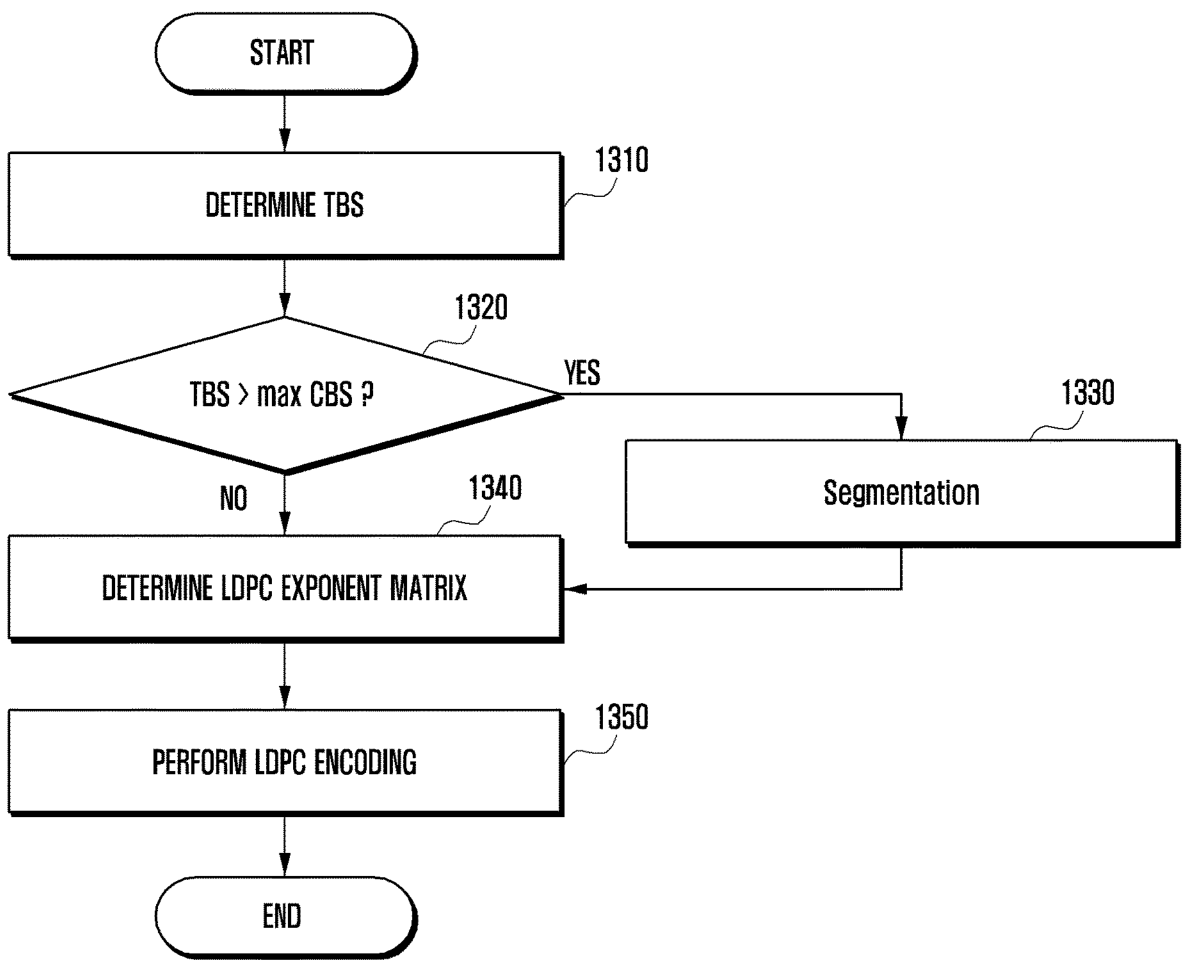
FIG. 13 is another exemplified diagram of the flowchart of the LDPC encoding process according to an embodiment of the present disclosure.
Figure 14:
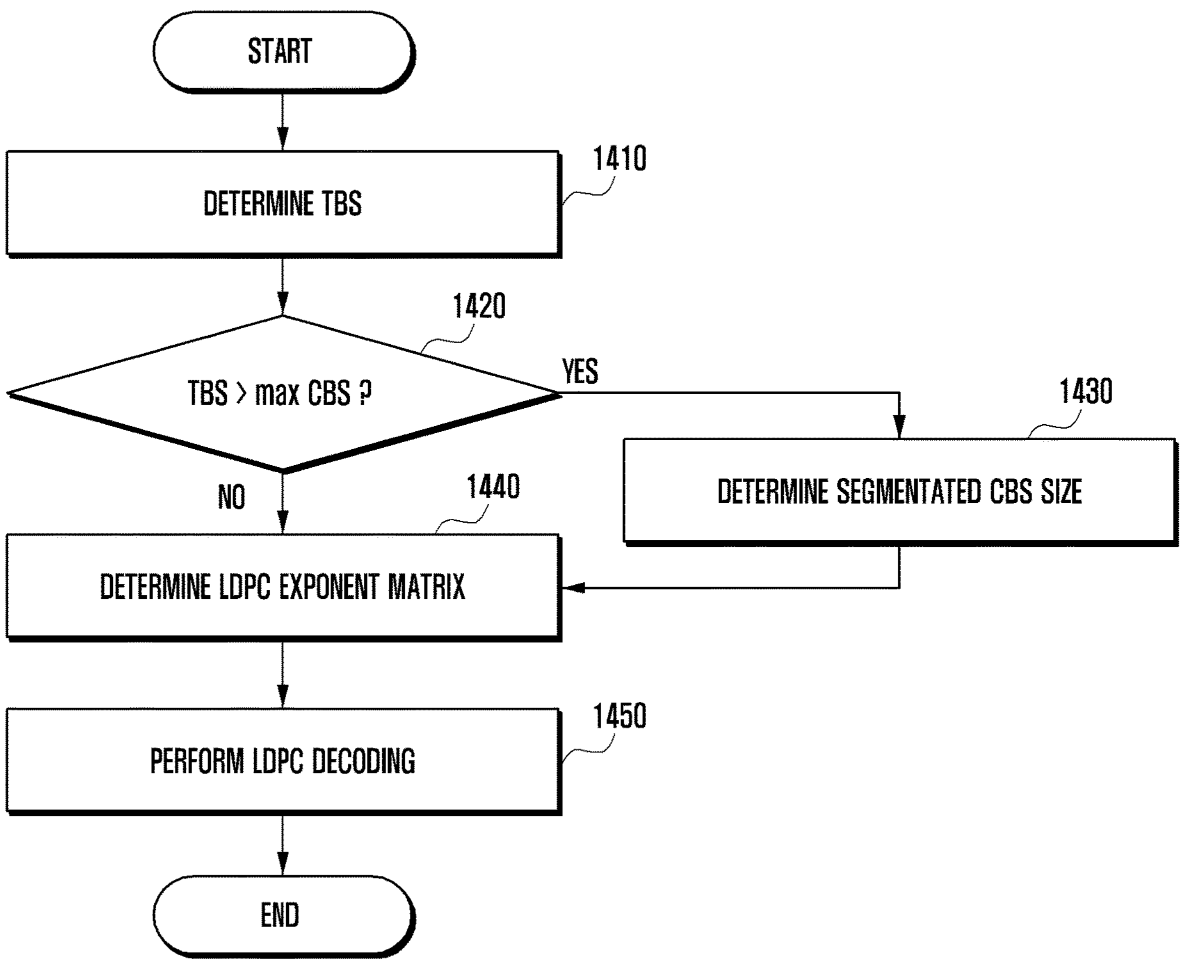
FIG. 14 is another exemplified diagram of the flowchart of the LDPC encoding process according to an embodiment of the present disclosure.

A flowchart of another embodiment of the LDPC encoding and decoding process is illustrated in FIGS. 13 and 14.

FIG. 13 is another exemplified diagram of the flowchart of the LDPC encoding process according to an embodiment of the present disclosure.

First of all, the size of the transport block size TBS to be transmitted is determined as in operation 1310 of FIG. 13. If the maximum information word length that can be applied at a time in the channel code given in the system is defined as a maximum CBS, when the size of the TBS is greater than the max CBS, the transport block needs to segmentated into the plurality of information word blocks (or code blocks) to perform the encoding. In FIG. 13, after it is determined in operation 1320 whether the TBS is greater than or equal to the max CBS, if the TBS is greater than the max CBS, the transport block is segmented to determine a new CBS in operation 1330, and if the TBS is smaller than or equal to the max CBS, the segmentation operation is omitted. After the TBS is determined as the CBS, in operation 1340, the LDPC exponent matrix or the sequence is appropriately determined according to the TBS or CBS value. Next, in operation 1350, the LDPC encoding is performed based on the determined exponent matrix or sequence.

As the detailed example, it is assumed that the TBS is determined to be 9216 in operation 1310, and the given max CBS=8192 in the system. Apparently, since it is determined in operation 1320 that the TBS is greater than the max CBS, in operation 1330, two information word blocks (or code blocks) having CBS=4608 are obtained by appropriately applying the segmentation. If the information word corresponds to 32 columns in the exponent matrix, Z=4608/32=144, so that the block size Z=144 is included in $Z_6$. Therefore, in operation 1340, the exponent matrix or the sequence corresponding to the block size included in $Z_6$={128, 144, 160, . . . , 240, 256} of the above Equation 20 is determined, and the LDPC encoding may be performed using the determined exponent matrix or sequence in operation 1350.

FIG. 14 is another exemplified diagram of the flowchart of the LDPC encoding process according to an embodiment of the present disclosure.

The LDPC decoding process may be similarly as illustrated in FIG. 14. If the TBS is determined to be 9216 in operation 1410, it is determined in operation 1420 that the TBS is greater than the max CBS and thus the size of CBS 4608 to which the segmentation is applied is determined to be 4608 in operation 1430. If it is determined in operation 1420 that the TBS is smaller than or equal to the max CBS, the TBS is determined to be the same as the CBS. From this, in operation 1440, the exponent matrix or the sequence of the LDPC code is determined, and in operation 1450, the determined exponent matrix or sequence is used to perform the LDPC encoding.

Figure 15:
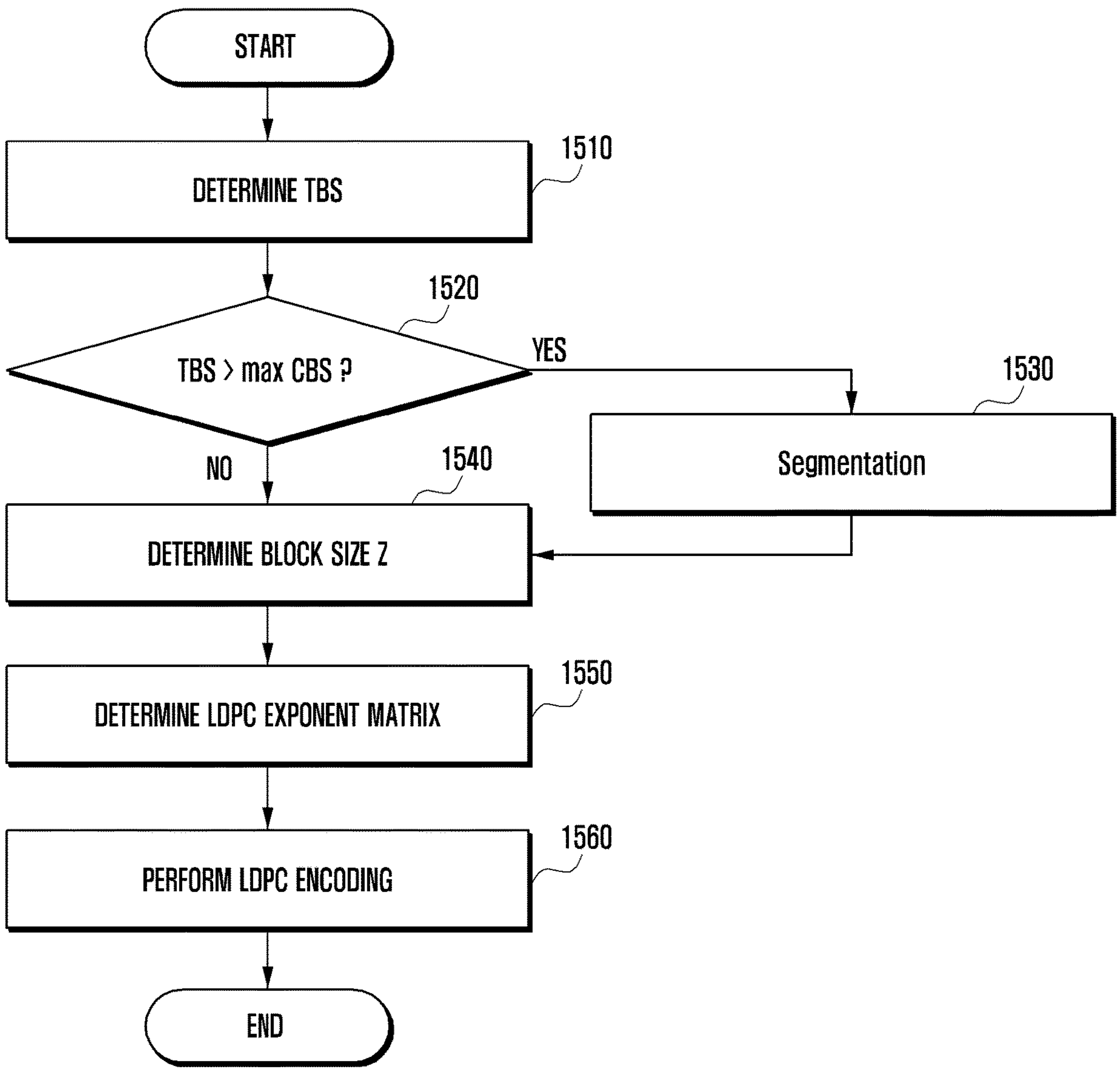
FIG. 15 is another exemplified diagram of the flowchart of the LDPC encoding process according to the embodiment of a present disclosure.
Figure 16:
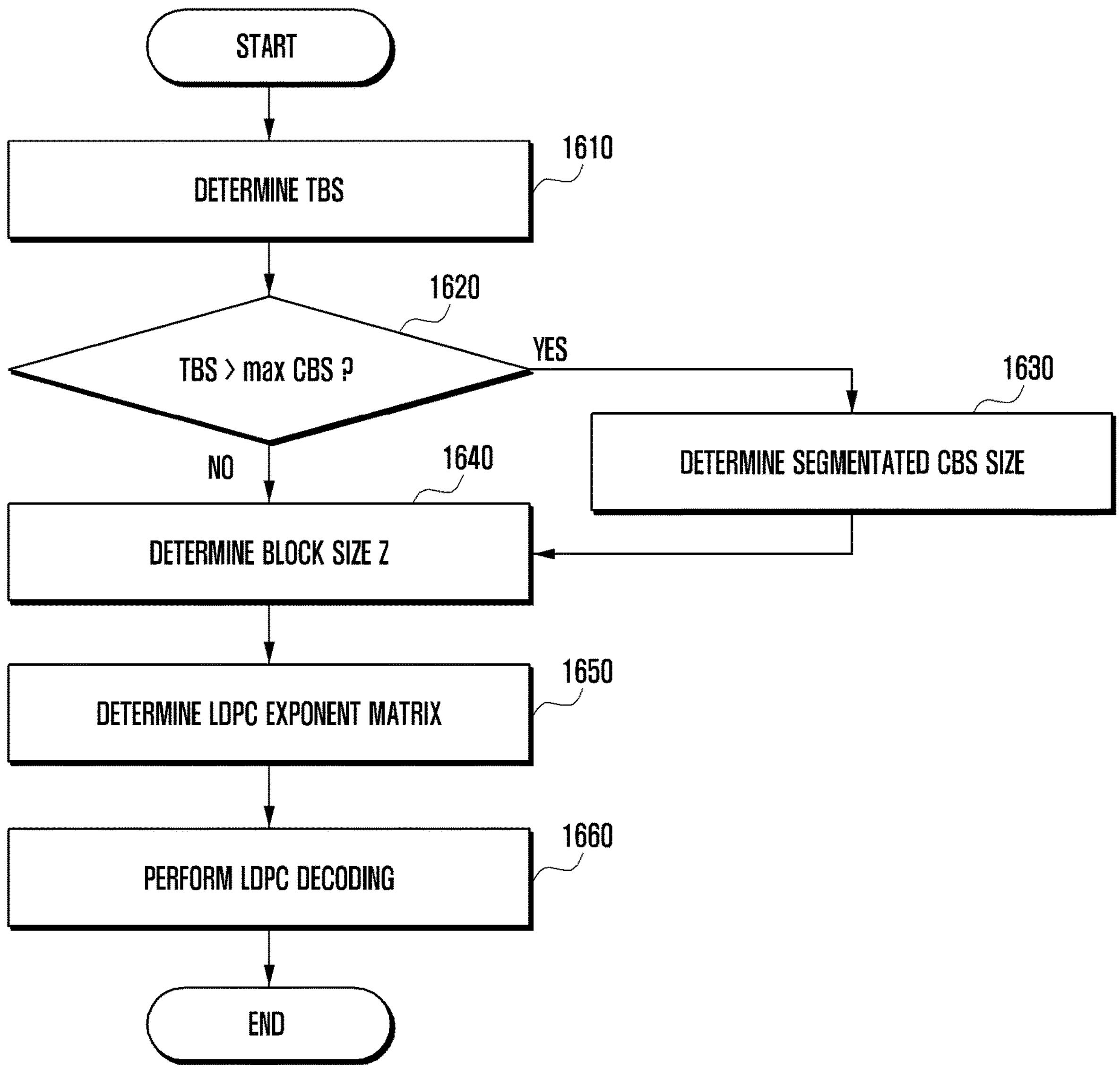
FIG. 16 is another exemplified diagram of the flowchart of the LDPC encoding process according to an embodiment of the present disclosure.

A flowchart of an embodiment of an exponent matrix-based LDPC encoding and decoding process is shown in FIGS. 15 and 16.

FIG. 15 is another exemplified diagram of the flowchart of the LDPC encoding process according to an embodiment of the present disclosure.

Figure 22C:
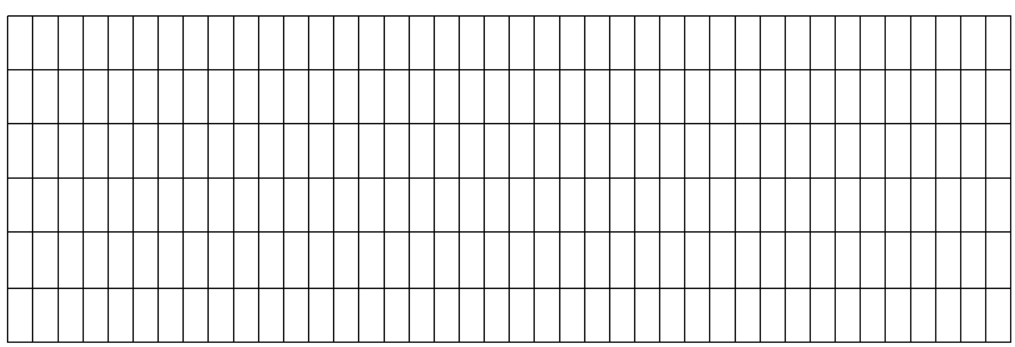
Figure 22E:
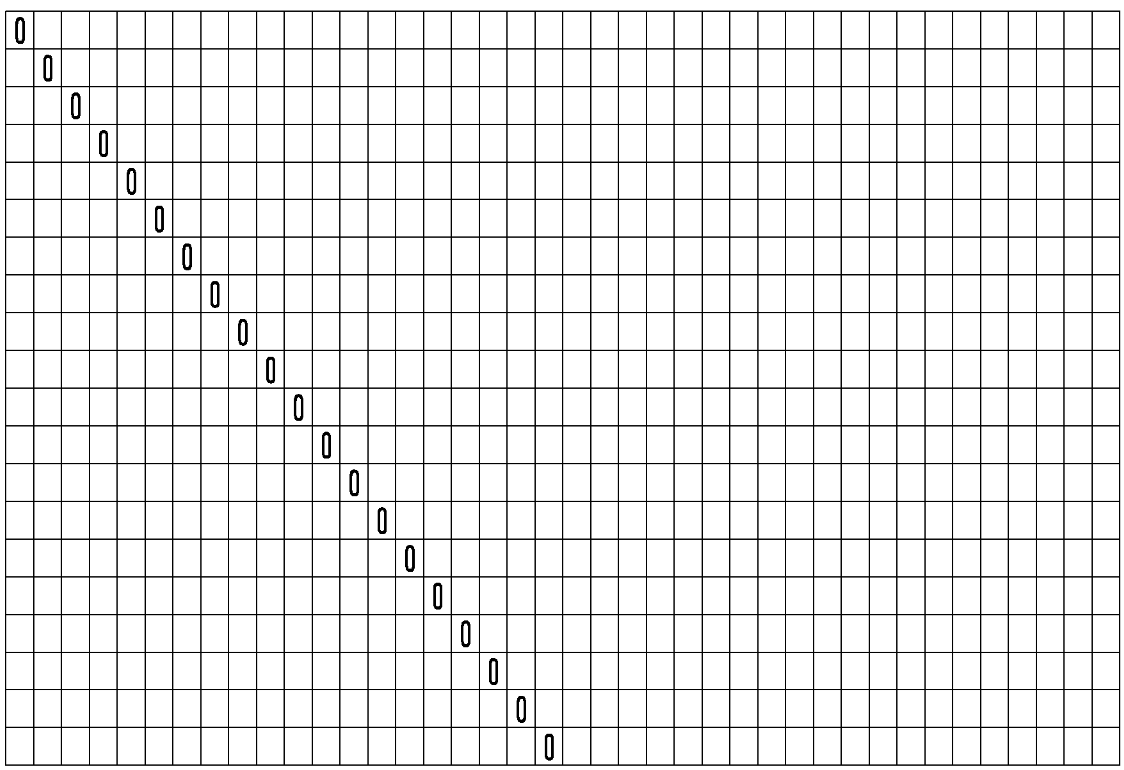
Figure 22G:
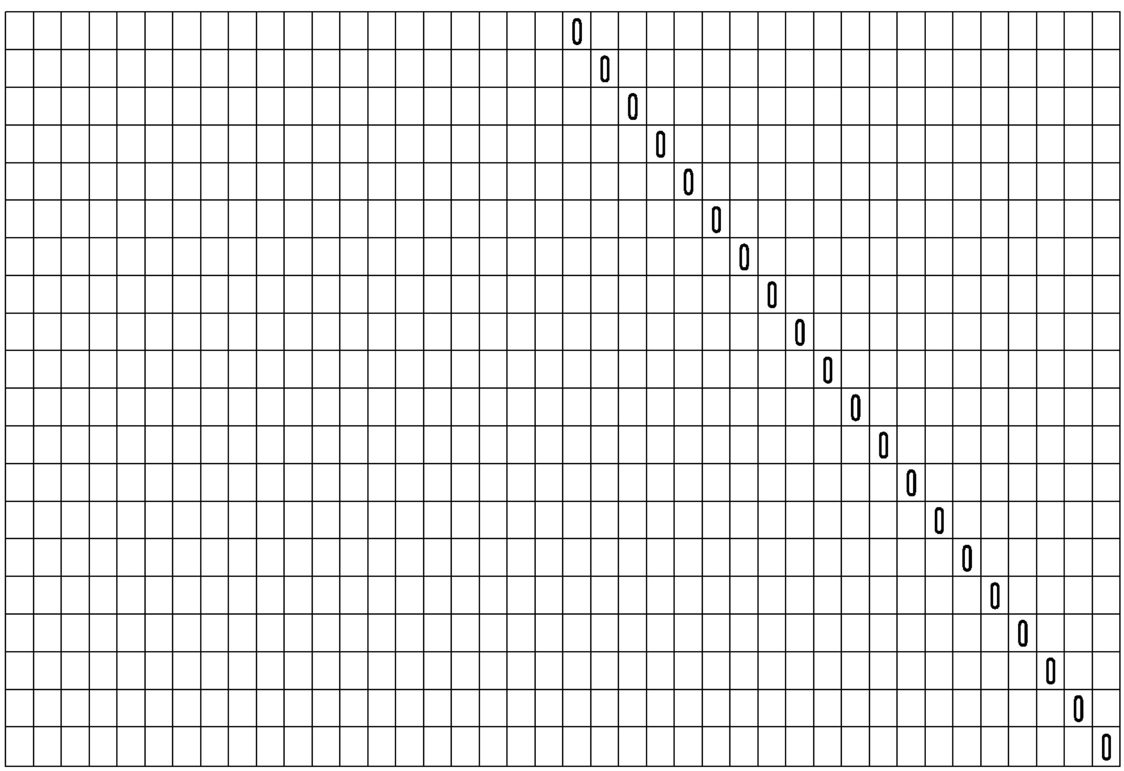
Figure 23C:
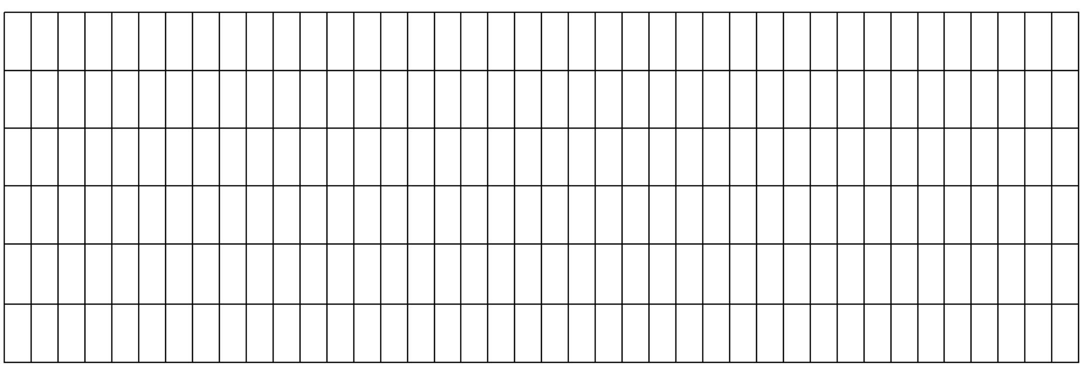
Figure 23E:
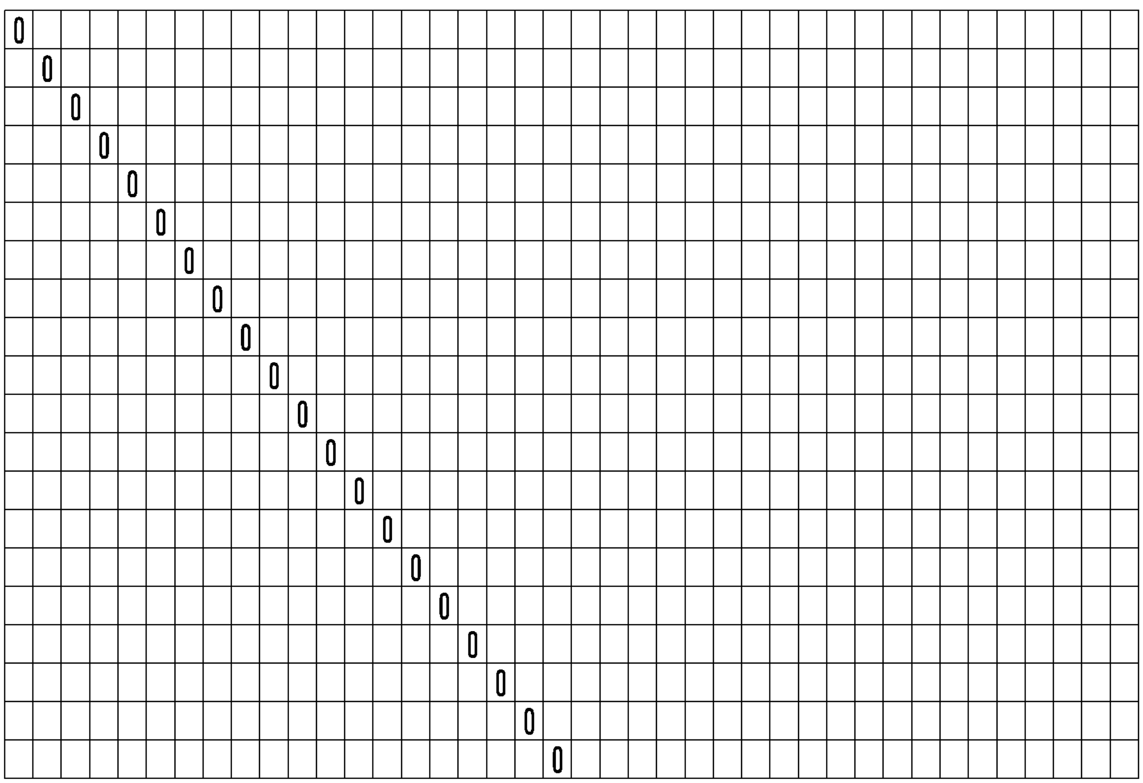
Figure 23G:
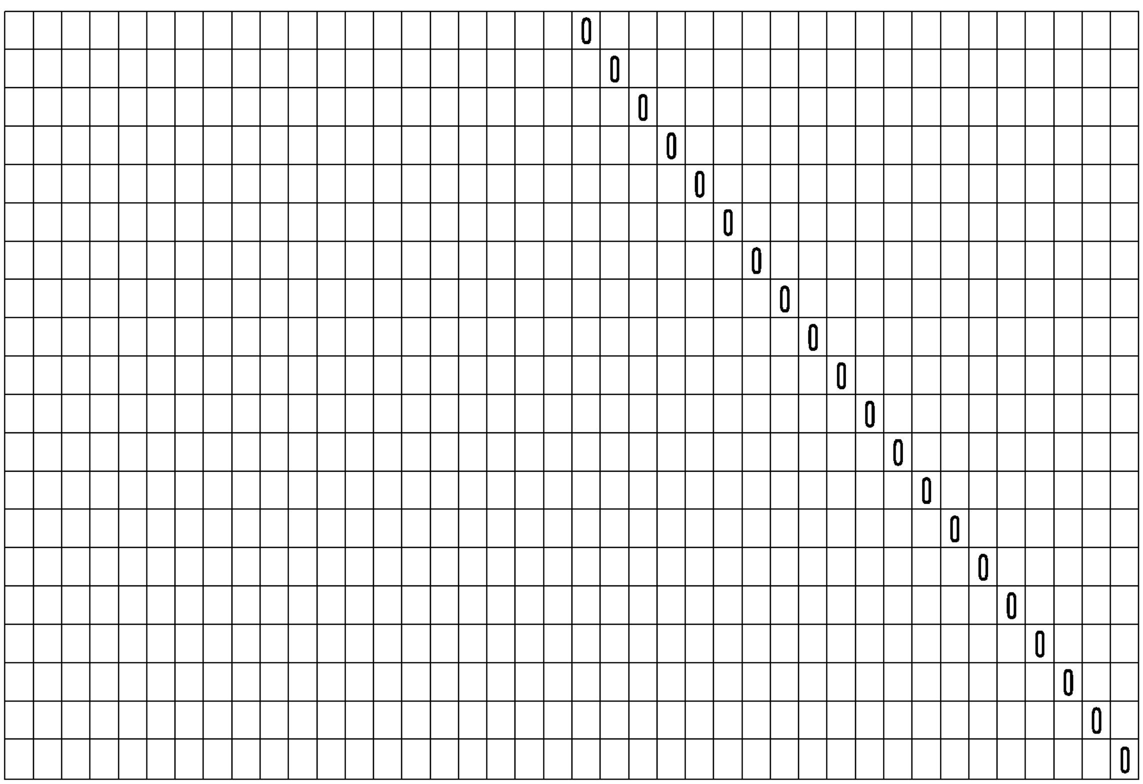
Figure 24C:
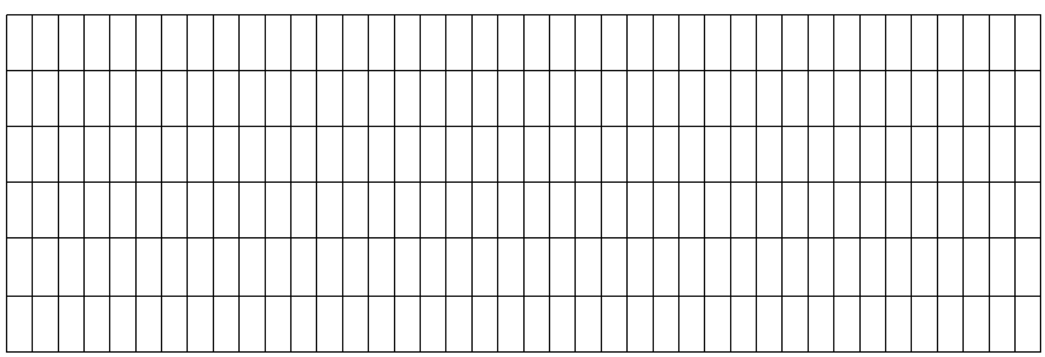
Figure 24E:
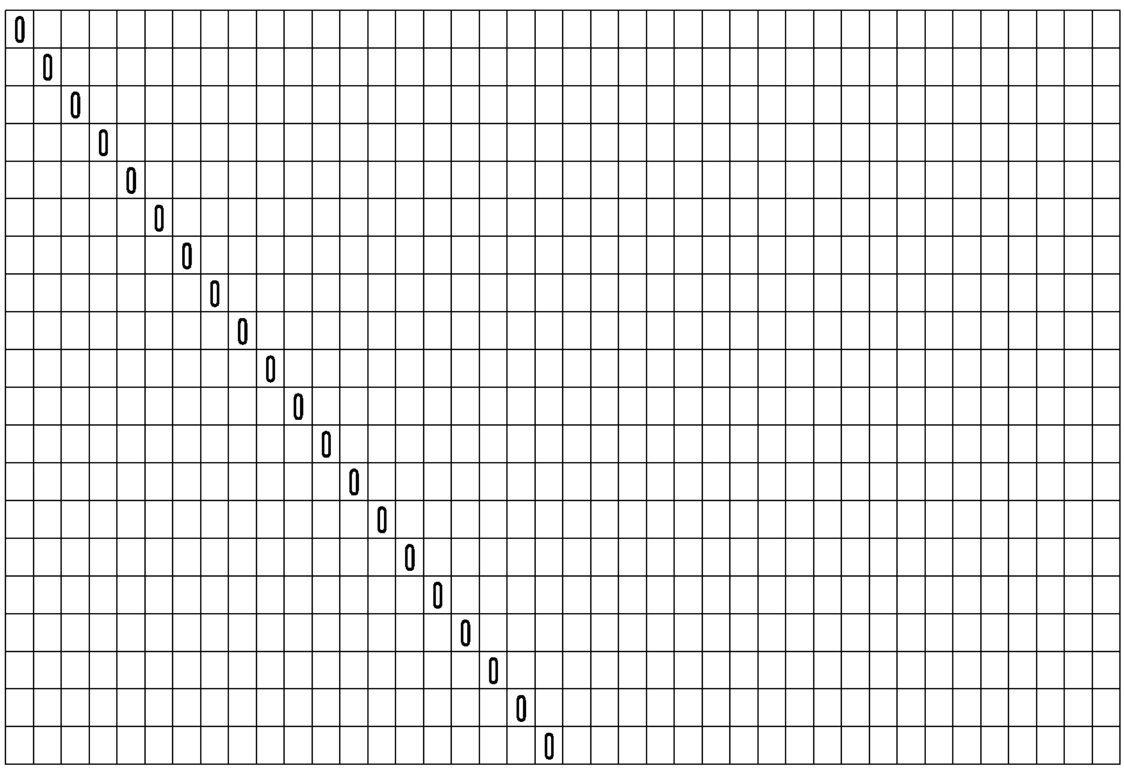
Figure 24G:
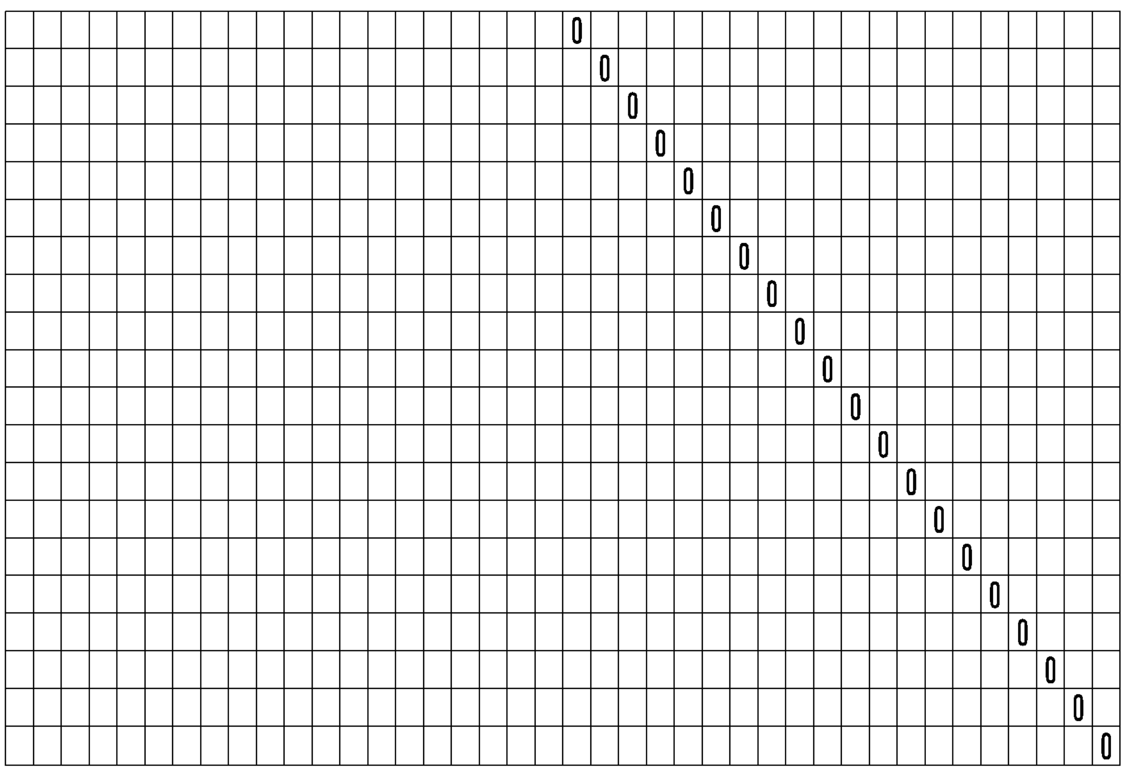
Figure 25C:
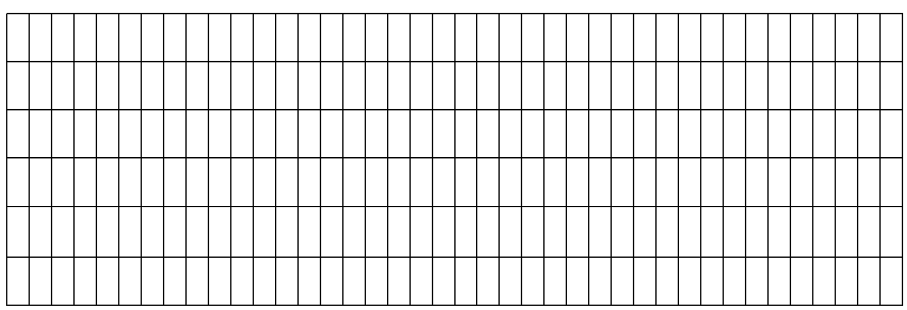
Figure 25E:
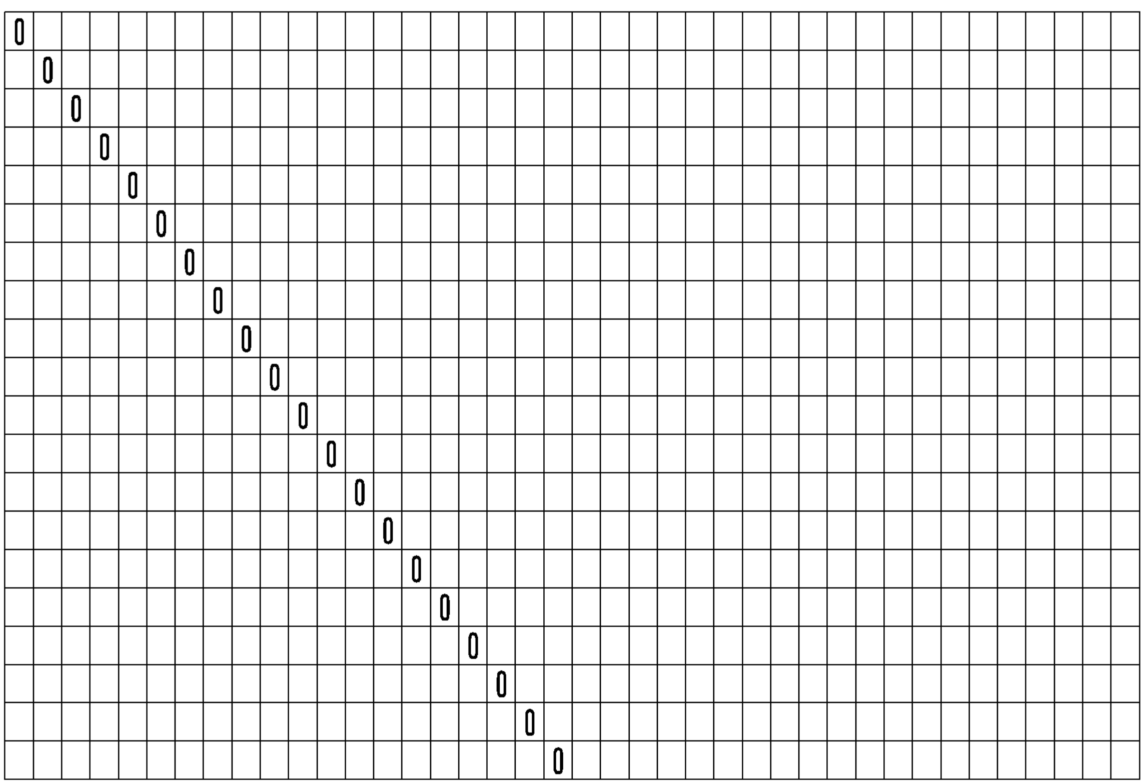
Figure 25G:
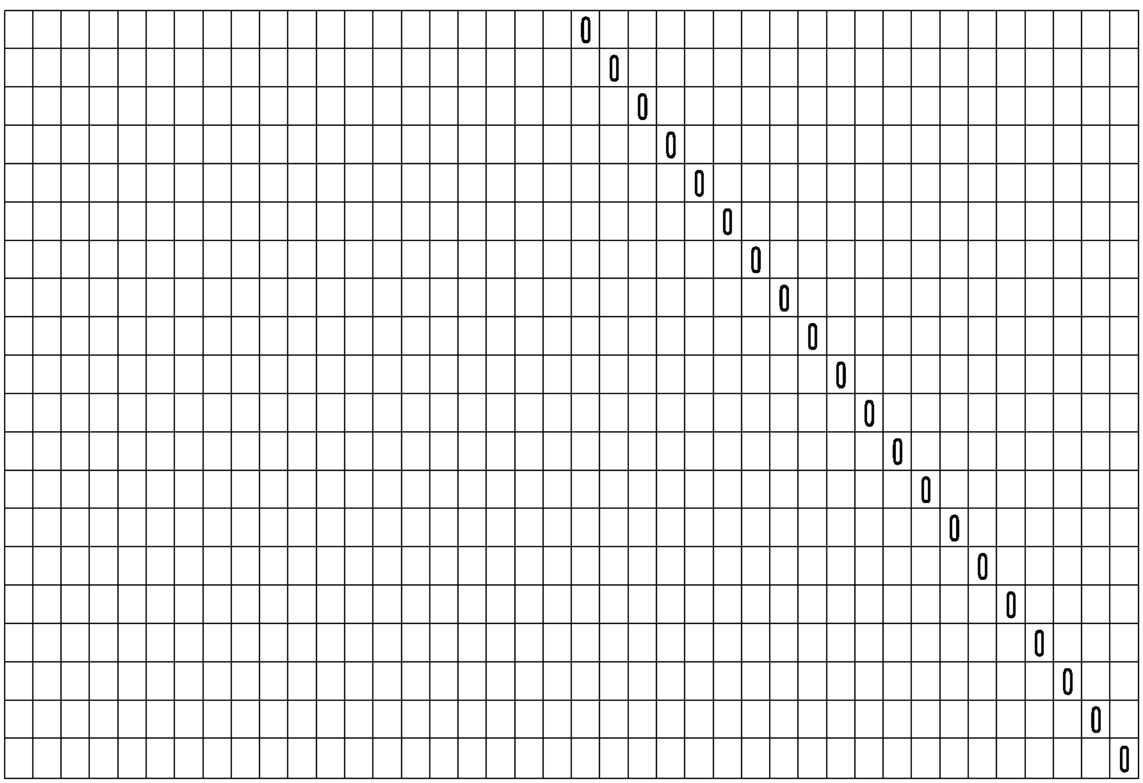
Figure 26C:
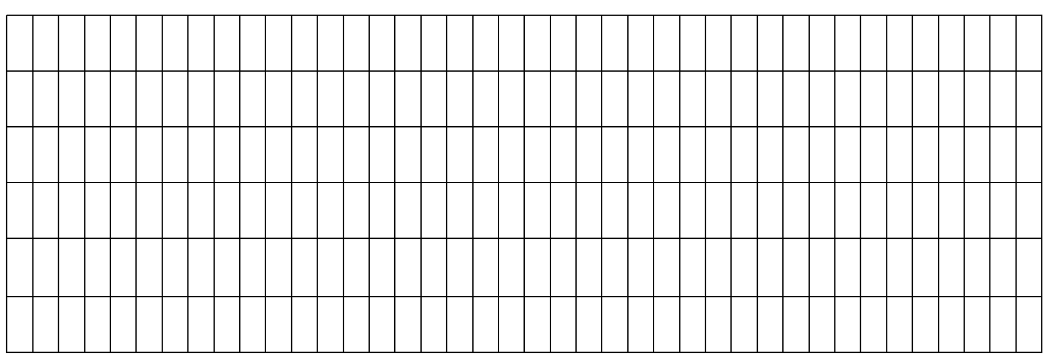
Figure 26E:
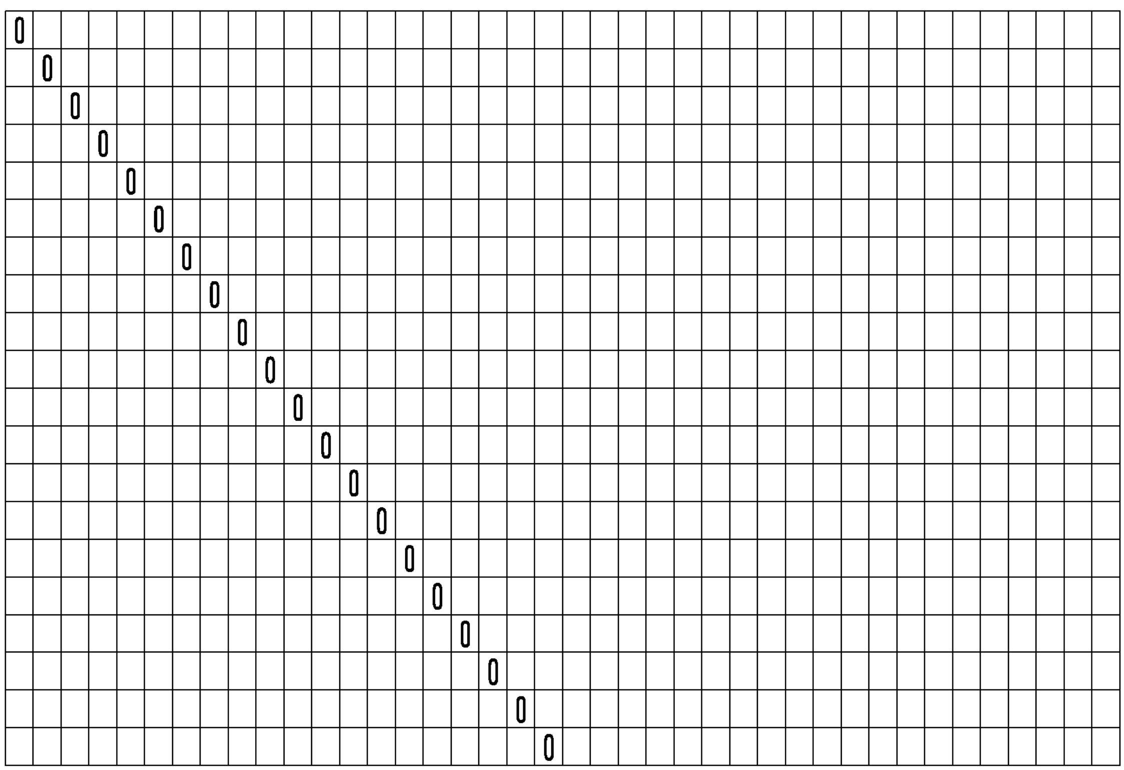

First of all, the transport block size TBS to be transmitted is determined as in operation 1510 of FIG. 22A. In operation 1520, after it is determined in operation 1530 whether the TBS is greater than or equal to the max CBS, if the TBS is greater than the max CBS, the transport block is segmented to determine a new CBS in operation 1530, and if the TBS is smaller than or equal to the max CBS, the segmentation operation is omitted. After the TBS is determined as the CBS, in operation 1540, the block size Z value to be applied to the LDPC encoding is determined based on the CBS. In operation 1550, the LDPC exponent matrix or the sequence is appropriately determined according to the TBS or CBS or the block size Z value. Next, in operation 1560, the LDPC encoding is performed based on the determined block size, exponent matrix or sequence. For reference, the operation 1550 may include the process of transforming the determined LDPC exponent matrix or sequence based on the determined block size in some cases.

FIG. 16 is another exemplified diagram of the flowchart of the LDPC encoding process according to an embodiment of the present disclosure.

The LDPC decoding process may be similarly as illustrated in FIG. 16. If the TBS is determined in operation 1610, it is determined in operation 1620 whether the TBS is greater than or equal to the max CBS, and then if the TBS is greater than the max CBS, in operation 1630, the size of CBS to which the segmentation is applied is determined. If it is determined in operation 1620 that the TBS is smaller than or equal to the max CBS, the TBS is determined to be the same as the CBS. In operation 1640, the block size Z value to be applied to LDPC decoding is determined, and then in operation 1650, the LDPC exponent matrix or the sequence is appropriately determined for the TBS, the CBS, or the block size Z. Next, in operation 1660, the LDPC decoding may be performed using the determined block size and exponent matrix or sequence.

For reference, the operation 1650 may include the process of transforming the determined LDPC exponent matrix or sequence based on the determined block size in some cases.

The embodiment describes that the process of determining the exponent matrix or the sequence of the LDPC code in operations 1120, 1220, 1340, 1440, 1550, and 1650 of FIGS. 11 to 16 is determined based on one of the TBS, the CBS or the block size Z, but there may be various other methods.

As another embodiment of the present disclosure, the block size group is divided into five groups as shown in the following Equation 23.

$$Z_1=\{1,2,3,\ldots,15\},\ Z_2=\{16,18,20,\ldots,30\},\ Z_3=\{32,36,40,\ldots,60\},\ Z_4=\{64,72,80,\ldots,120\},\ Z_5=\{128,144,160,\ldots,240,256\} \quad \text{Equation 23}$$

Representing the above Equation 23 by the method similar to the above Equation 10 is as shown in the following Equation 24.

$$Z_i=Z|Z=X_i+k\cdot D_i,\ k=0,1,\ldots,Y_i\},\ i=1,2,\ldots,A.\ A=5.\ X_1=1,\ X_2=16,\ X3_3=32,\ X_4=64, X_5=128.\ Y_1=15, Y_2=Y_3=Y_4=8,\ Y_5=9.\ D_1=1, D_2=2, D_3=4,\ D_4=8,\ D_5=16. \quad \text{Equation 24}$$

Referring to the block size group shown in the above Equations 23 and 24, since the maximum value of the increase rate of neighboring block sizes among the block sizes included in $Z_4$ is 72/64=1.125 and the minimum value of the increase rate for neighboring block sizes among the block size included in $Z_3$ is 60/56 to 1.071, it can be seen that the former value is greater than the latter value. Likewise, since the maximum value of the increase rate of neighboring block sizes among the block sizes included in $Z_5$ is 144/128=1.125, and the minimum value of the increase rate of neighboring block sizes among the block sizes included in $Z_4$ is 120/112 to 1.071, it can be seen that the former value is greater than the latter value.

As another embodiment of the present disclosure, the block size group is divided into seven groups as shown in the following Equation 25.

$$Z_1=\{2,3\},\ Z_2=\{4,5,6,7\},\ Z_3=\{8,10,12,14\},\ Z_4=\{16,20,24,28\},\ Z5=\{32,40,48,56\},\ Z_6=\{64,80,96,112\},\ Z_7=\{128,160,192,224,256\} \quad \text{Equation 25}$$

FIG. 17A is diagram illustrating a base matrix of an LDPC code according to an embodiment of the present embodiment. (All elements of an empty block in FIG. 17A correspond to 0, which is omitted for convenience). The matrix of FIG. 17A is diagram showing a base matrix having 66×98 size. Also, a partial matrix consisting of the above six rows and 38 columns from the head has no column having a degree of 1. That is, the parity-check matrix that can be generated by applying lifting from the partial matrix means that there is no column or column block having a degree of 1.

Figure 17D:
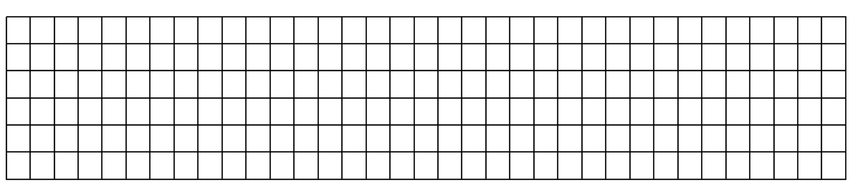

FIGS. 17B to 17G are enlarged views of each of divided exponent matrices shown in FIG. 17A. FIG. 17A corresponds to the matrix of the figure corresponding to reference numerals shown in the respective parts. Therefore, one-parity-check matrix may be configured by combining FIGS. 17B to 17G, and FIG. 17A may show a base matrix in the present disclosure.

As another embodiment of the present disclosure, the LDPC code exponent matrix for dividing the block size group by the following Equation 25 and applying the same lifting method is shown in FIG. 18A. The exponent matrix of the LDPC code illustrated in FIG. 18A has a size of 66×74, and a partial matrix excluding a total of 16 columns from a 9th column to a 24th column in the base matrix of FIG. 18A is provided as a base matrix. Also, a partial matrix consisting of the above six rows and 14 columns from the head in the above exponent matrix has no column having a degree of 1. That is, the parity-check matrix that can be generated by applying lifting from the partial matrix means that there is no column or column block having a degree of 1.

It can be seen from FIG. 17A that comparing with the size of the partial matrix excluding the column block and the row block corresponding to the column having a degree of 1 is 6×38, different code rates and information word lengths are supported for the same Z value.

In general, when the initial support code rate, the information word length or the like before applying the single check code extension in which a degree is 1 is different, the base matrix should be different from each other. In the case of FIGS. 17A and 18A, a method for using an exponent matrix corresponding to the given base matrix or a part of the base matrix according to an initial supporting code rate or an information word length from the base matrix of FIG. 17A is proposed.

For example, when the initial supporting code rate is a form of (38−6)/(38−a), the LDPC encoding and decoding are applied using the exponent matrix having the base matrix of FIG. 17A, and when the initial supporting code rate is a form of (14−6)/(14−b), LDPC coding and decoding are applied using the exponent matrix of FIG. 18A having a part of the base matrix of FIG. 17A as the base matrix. In this case, values a and b may be set to be the number of column blocks corresponding to the information word puncturing, and they may have different value. However, if (38−6)/(38−a) and (14−6)/(14−b) have different values or a maximum value for (38−6) Z and a maximum value for (14−6) Z have different values.

FIG. 18A is diagrams illustrating an example of an LDPC code exponent matrix having a part of the base matrix of FIG. 17A as a base matrix according to an embodiment of the present disclosure.

Figure 18D:
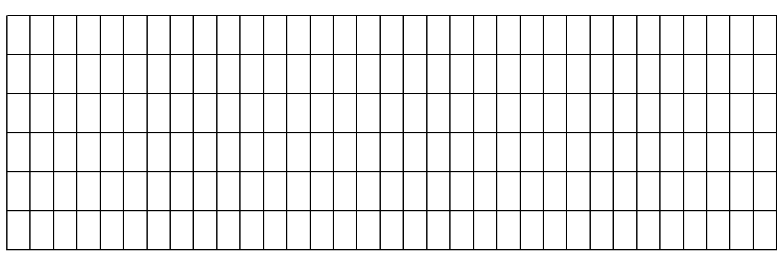
Figure 18G:
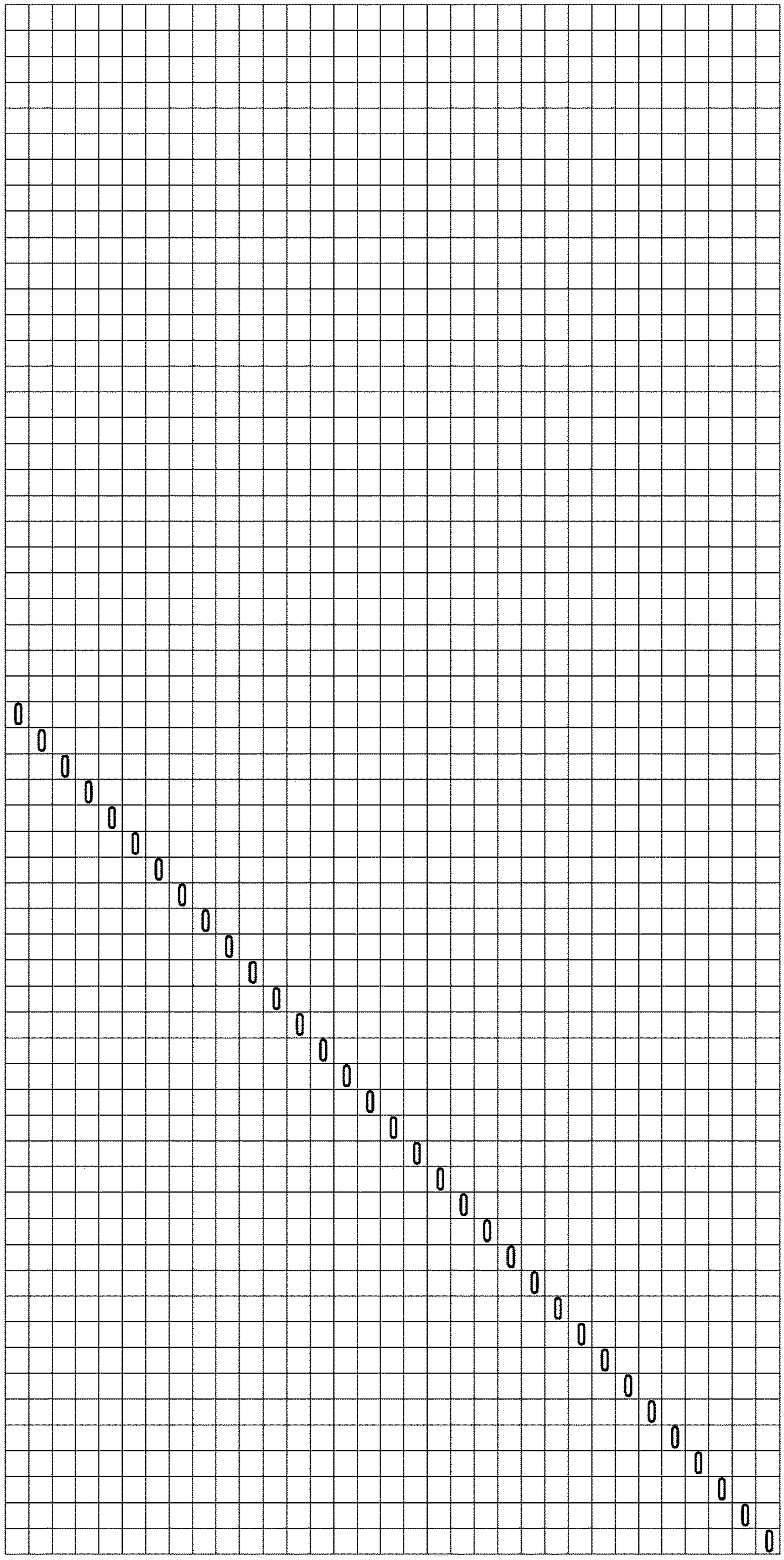

For reference, FIGS. 18B to 18G are enlarged views of each of divided exponent matrices shown in FIG. 18A. FIG. 18A corresponds to the matrix of the figure corresponding to reference numerals shown in the respective parts. Therefore, one parity-check matrix can be configured by combining FIGS. 18B to 18G.

In general, when designing the LDPC sequence or the exponent matrix well, the LDPC encoding having various lengths may be applied by one LDPC sequence or exponent matrix and one lifting function without differently applying the lifting function or the LDPC sequence or the exponent matrix according to the block size group having different granularity.

As another embodiment of the present disclosure, the block size group is divided into two groups as shown in the following Equation 26.

$$Z_1=\{2,4,5,8,9,10,11,16,18,20,22,32,36,40,44,64,72,80,88,128,144,160,176,256,288,320,352\}\ Z_2=\{3,6,7,12,13,14,15,24,26,28,30,48,52,56,60,96,104,112,120,192,208,224,240,384\} \quad \text{Equation 26}$$

The granularity for the block size included in the block size groups $Z_1$ and $Z_2$ shown in the above Equation 26 are not only different and the average granularities thereof each have different values as 13.46 and 16.67. Among the block size included in $Z_1$, the maximum value of the increase rate of respect to neighboring block sizes is 4/2=2, and the minimum value thereof is 11/10=22/20=44/40=88/80=176/160=352/320=1.1. Similarly, it can be seen that among the block size included in $Z_2$, the maximum value of the increase rate of neighboring block sizes is 6/3=2, and the minimum value thereof is 15/14=30/28=60/56=120/112=240/224 to 1.07143. That is, the maximum value of the block size increase rate of one group of the two block size groups in the above Equation 26 is always greater than the minimum value of the other groups.

At this time, the LDPC exponent matrix or the sequence is transformed based on the lifting function as in the following Equation 27, such that the LDPC exponent matrix or the sequence corresponding to each Z value may be determined.

$$Z\in Z_1, 2^k\le Z<2^{k+1}, e_{ij}(Z)=e_{ij}^{(1)}(\text{mod}\,2^k)\ \ Z\in Z_2, 3\cdot 2^{k-1}\le Z<2^{k+1}, e_{ij}(Z)=e_{ij}^{(2)}(\text{mod}\ 3\times 2^{k-1}) \quad \text{Equation 27}$$

The lifting shown in the above Equation 27 may be briefly expressed by the following Equation 28.

$$Z\in Z_1,\ e_{ij}(Z)=e_{i,j}^{(1)}\left(\text{mod}\ 2^{\lfloor \log_2 Z\rfloor}\right) \quad \text{Equation 28}$$

-continued $$Z\in Z_2,\ e_{ij}(Z)=e_{i,j}^{(2)}\left(\text{mod}\ 3\times 2^{\lfloor \log_2 \frac{Z}{3}\rfloor}\right)$$

This can be represented by various methods in which the same effect can be obtained in addition to the above Equations 27 and 28.

A process of performing LDPC encoding and decoding using the block size group and the lifting method shown in the above Equations 26 to 28 will be briefly described below.

If the block size Z value is determined in the transmitter, the LDPC exponent matrix or the sequence to be used for the encoding is determined according to the block size Z value (or the corresponding TBS or CBS size). In the next operation, the LDPC encoding is performed based on the determined block size, exponent matrix or sequence. For reference, before the LDPC encoding process, the process of transforming the determined LDPC exponent matrix or sequence based on the determined block size may be included. Also, in the process of transforming the LDPC exponent matrix or the sequence, different transformation methods may be applied according to the block size group including the block size as shown in the above Equation 27 or 28. When different transformation methods are applied according to the block size group in the LDPC encoding process, a process of determining a block size group including a predetermined block size in the encoding process may be included.

The LDPC decoding process can be similarly explained. The block size Z value to be applied to the LDPC decoding is determined, and then the LDPC exponent matrix or the sequence to be used for the decoding is determined according to the block size Z value (or the corresponding TBS or CBS size). In the next operation, the LDPC decoding is performed based on the determined block size, exponent matrix or sequence. For reference, before the LDPC decoding process, the process of transforming the determined LDPC exponent matrix or sequence based on the determined block size may be included. Also, in the process of transforming the LDPC exponent matrix or the sequence, different transformation methods may be applied according to the block size group including the block size as shown in the above Equation 27 or 28. When different transformation methods are applied according to the block size group in the LDPC decoding process, a process of determining a block size group including a predetermined block size in the encoding process may be included.

As another embodiment of the present disclosure, the block size group is divided into eight groups as shown in the following Equation 29.

$$Z_1=\{2, 4, 8, 16, 32, 64, 128, 256\}\ Z_2=\{3, 6, 12, 24, 48, 96, 192, 384\}\ Z_3=\{5, 10, 20, 40, 80, 160, 320\}\ Z_4=\{7, 14, 28, 56, 112, 224\}\ Z_5=\{9, 18, 36, 72, 144, 288\}\ Z_6=\{11, 22, 44, 88, 176, 352\}\ Z_7=\{13, 26, 52, 104, 208\}\ Z_8=\{15, 30, 60, 120, 240\} \quad \text{Equation 29}$$

The block size groups in the above Equation 29 are not only different granularities, but also have the feature that all the rates of neighboring block sizes have the same integer. In other words, each block size is a divisor or multiple relation to each other.

When each of the exponent matrices (or LDPC sequence) corresponding to the p (p=1, 2, . . . , 8)-th group is $E_p=(e_{i,j}^{(p)})$ and the exponent matrix (or LDPC sequence) corresponding to the Z value included in the p-th group is $E_p(Z)=(e_{i,j}(Z))$, the method for transforming the sequence as shown in the above Equation 19 is applied using $f_p(x,Z)=x\ (\text{mod}\ Z)$. That is, for example, when the block size Z is determined as Z=28, each element $e_{i,j}(28)$ of an exponent matrix (or LDPC sequence) $E_4(28)=(e_{i,j}(28))$ for Z=28 for an exponent matrix (or LDPC sequence) $E_4=(e_{(i,j)}^{(4)})$ corresponding to a fourth block size group including Z=28 can be obtained by the following Equation 30.

$$e_{i,j}(28) = \begin{cases} e_{i,j}^{(4)} & e_{i,j}^{(4)} \le 0 \\ e_{i,j}^{(4)} (\bmod 28) & e_{i,j}^{(4)} > 0 \end{cases}$$ Equation 30 or $$e_{i,j}(28) = \begin{cases} e_{i,j}^{(4)} & e_{i,j}^{(4)} < 0 \\ e_{i,j}^{(4)} (\bmod 28) & e_{i,j}^{(4)} \ge 0 \end{cases}$$

The transformation as in the above Equation 30 may be briefly expressed by the following Equation 31.

$$Z \in Z_p,\ E_p(Z)=E_p(\bmod 2)$$ Equation 31

The exponent matrix (LDPC sequence) of the LDPC code designed in consideration of the above Equations 29 to 31 is shown in FIGS. 19A to 26G.

For reference, in the above description, it is described that the lifting or the method for transforming the exponent matrix in Equation 19 is applied to the entire exponent matrix corresponding to the parity-check matrix, but the exponent matrix may be partially applied. For example, a partial matrix corresponding to a parity bit of the parity-check matrix usually has a special structure for efficient encoding. In this case, the encoding method or the complexity may change due to lifting. Therefore, in order to maintain the same encoding method or the complexity, a lifting method is not applied to a part of the exponent matrix corresponding to a parity in the parity-check matrix or may apply different lifting from the lifting method applied to the exponent matrix for the partial matrix corresponding to the information word bit. In other words, the lifting method applied to the sequence corresponding to the information word bits in the exponent matrix and the lifting method applied to the sequence corresponding to the parity bits can be set differently. In some cases, the lifting is not applied to a part or all of the sequence corresponding to the parity bit, such that the fixed value can be used without changing the sequence.

The embodiment of the exponent matrix or the LDPC sequence corresponding to the parity-check matrix of the LDPC code designed for the block size groups described in the embodiments based on the above Equations 29 to 31 is illustrated sequentially in FIGS. 19A to 26G. (It is to be noted that empty blocks in the exponent matrix shown in FIGS. 19A to 26G represent portions corresponding to the zero matrix of the Z×Z size. In some cases, the empty blocks may also be represented by a specified value such as −1.) The exponent matrices of the LDPC codes shown in FIGS. 19A, 20A, 21A, 22A, 23A, 24A, 25A and 26A have the same base matrix.

FIGS. 19A, 20A, 21A, 22A, 23A, 24A, 25A and 26A are diagrams illustrating an exponent matrix having 46×68 size or an LDPC sequence. Also, a partial matrix consisting of the above five rows and the 27 columns from the head has no column having a degree of 1. That is, the parity-check matrix that can be generated by applying lifting from the partial matrix means that there is no column or column block having a degree of 1.

FIG. 19A is diagram illustrating an LDPC code exponent matrix according to an embodiment of the present disclosure.

Figure 19C:
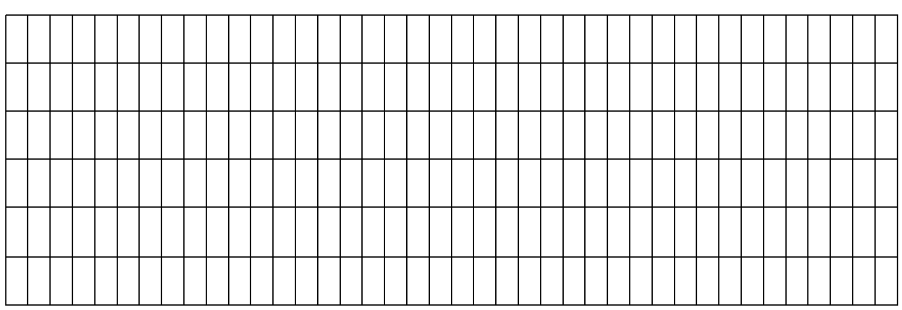
Figure 19G:
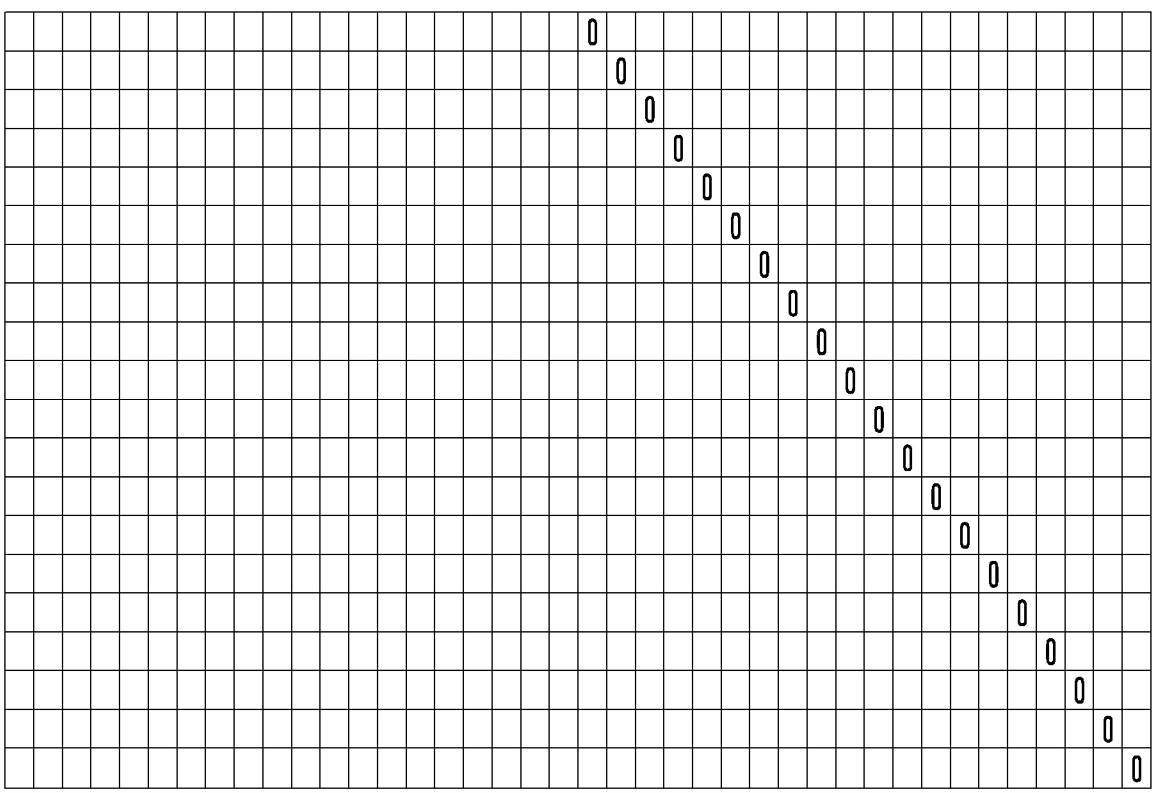
Figure 20C:
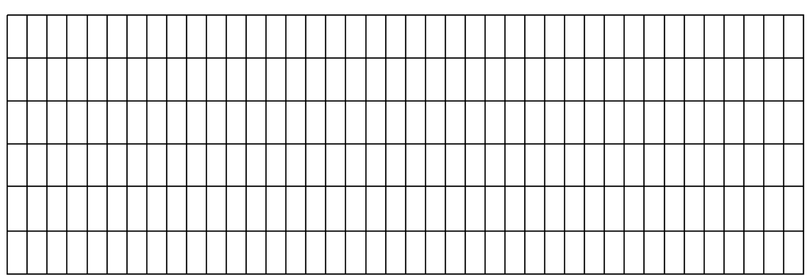
Figure 20E:
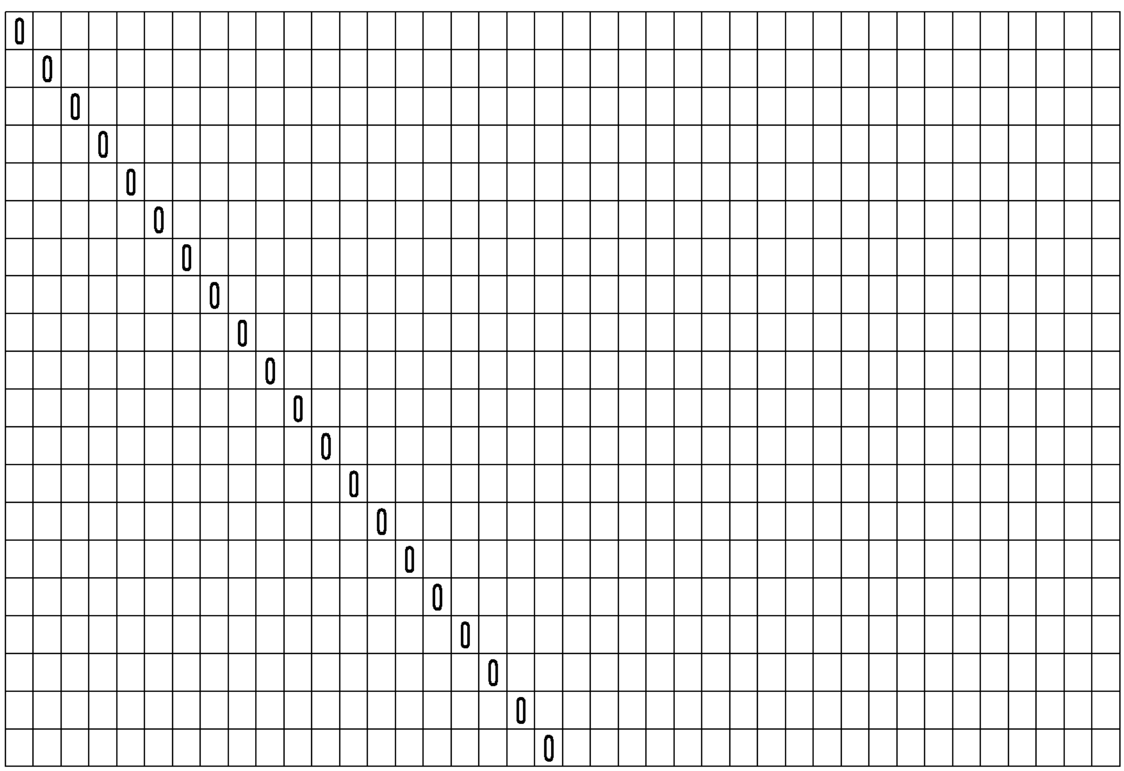
Figure 20G:
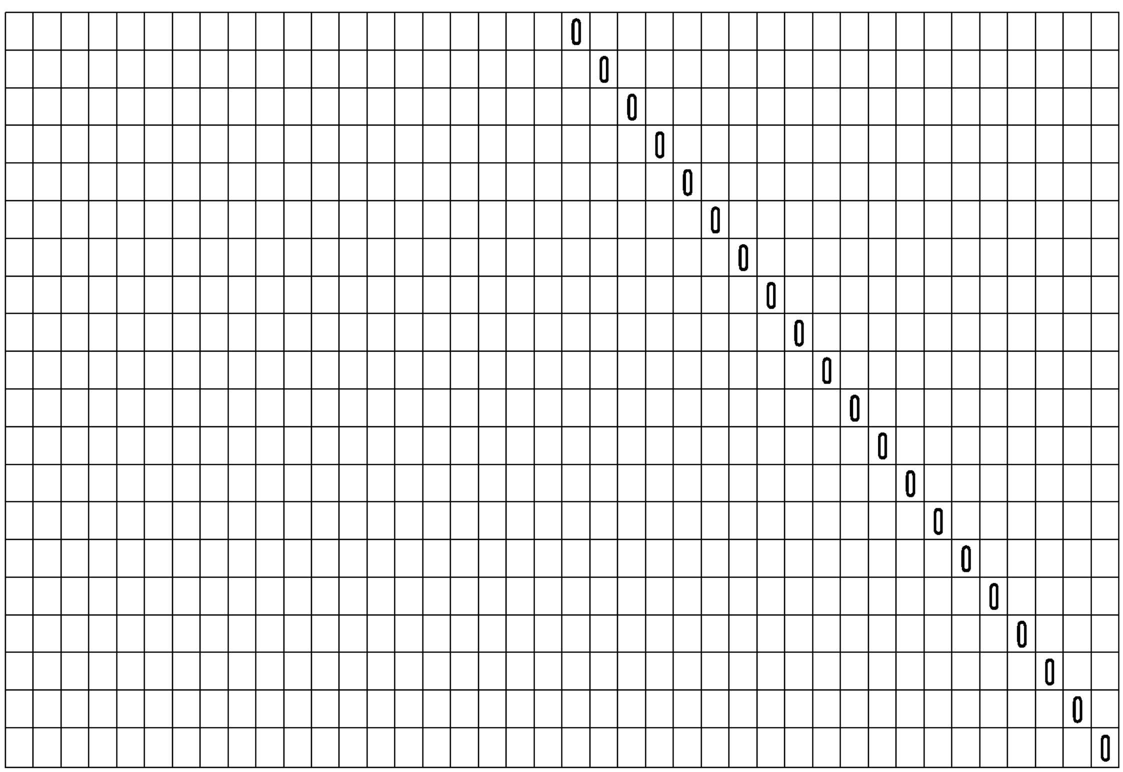
Figure 21C:
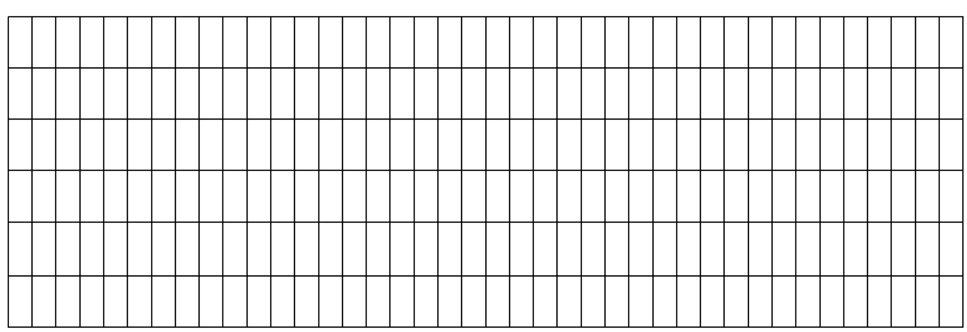
Figure 21E:
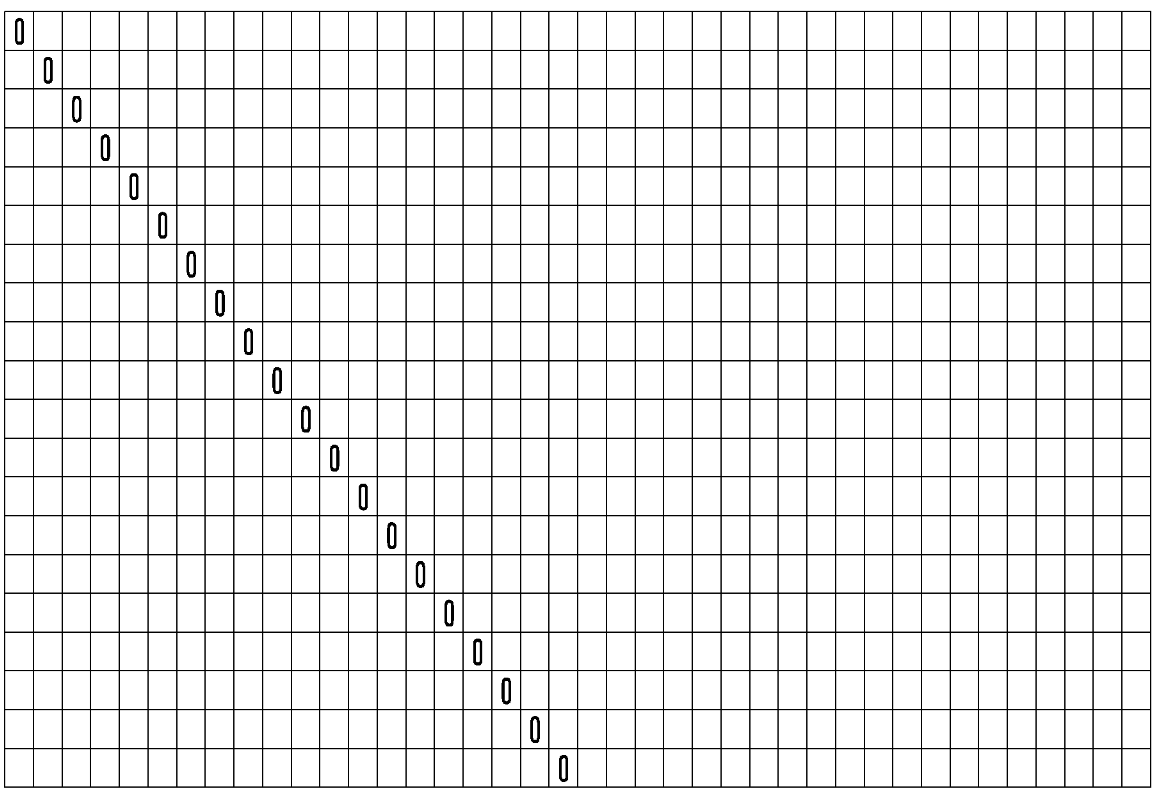
Figure 21G:
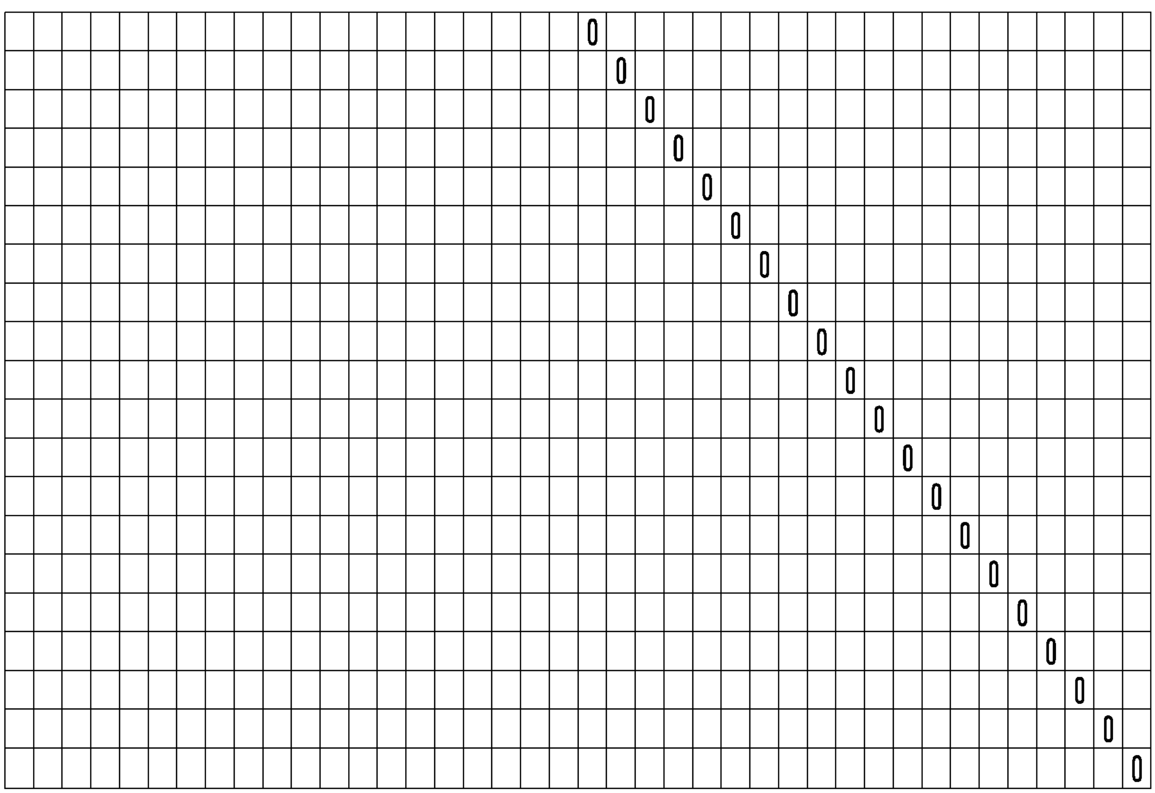

For reference, FIGS. 19B to 19G are enlarged views of each of divided exponent matrices shown in FIG. 19A. FIG. 19A corresponds to the matrix of the figure corresponding to reference numerals shown in the respective parts. Therefore, one exponent matrix or LDPC sequence can be configured by combining FIGS. 19B to 19F. Similarly, FIGS. 20B to 26G are enlarged views of each of the divided exponent matrices.

FIGS. 20A to 26G are diagrams illustrating an LDPC code exponent matrix according to an embodiment of the present disclosure.

Another feature of the exponent matrix shown in FIGS. 19A, 20A, 21A, 22A, 23A, 24A, 25A and 26A is that all the columns from the 28th column to the 68th column have a degree of 1. That is, the exponent matrix having a size of 41×68 consisting of the 6th to 46th rows of the exponent matrices corresponds to a single parity-check code.

Each of the exponent matrices shown in FIGS. 19A, 20A, 21A, 22A, 23A, 24A, 25A and 26A corresponds to the LDPC code designed considering the block size group defined in the above Equation 29. However, it is obvious that it is not necessary to support all the block sizes included in the block size group according to the requirements of the system. For example, if the minimum value of the information word (or code block) to be supported by the system is 100 or more, Z=2, 3, or 4 may not be used. As a result, each of the exponent matrices illustrated in FIGS. 19A, 20A, 21A, 22A, 23A, 24A, 25A and 26A may support the block size group (set) defined in the Equation 29 or a block size corresponding to a subset of each group.

In addition, the exponent matrix illustrated in FIGS. 19A, 20A, 21A, 22A, 23A, 24A, 25A and 26A may be used as it is, or only a part thereof may be used. For example, a new exponent matrix is used by concatenating part matrices consisting of the above five rows and 27 columns from the head of the respective exponent matrices with another exponent matrix having 41×68 size corresponding to the single parity-check code, such that the LDPC encoding and decoding may be applied.

Similarly, the exponent matrices illustrated in FIGS. 19A, 20A, 21A, 22A, 23A, 24A, 25A and 26A have the same base matrix as the partial matrix consisting of the above 5 rows and 27 columns from the head, but another LDPC encoding and decoding may also be applied by concatenating an exponent matrix which is different in the exponent value (or sequence value) and has 5×27 size with the exponent matrix part having 41×68 size corresponding to the single parity-check code in the exponent matrix of FIGS. 19A, 20A, 21A, 22A, 23A, 24A, 25A and 26A.

Generally, the LDPC code can adjust the code rate by applying parity puncturing according to the code rate. When the LDPC code based on the exponent matrix illustrated in FIGS. 19A to 26G punctures the parity bit corresponding to the column having a degree of 1, the LDPD decoder can perform the decoding without using the corresponding part in the parity-check matrix, thereby reducing the decoding complexity. However, when coding performance is considered, there is a method of improving the performance of the LDPC code by adjusting the puncturing order (or the transmission order of the generated LDPC codewords) of the parity bits.

For example, if the information bits corresponding to the first two columns among the exponent matrices corresponding to FIGS. 19A, 20A, 21A, 22A, 23A, 24A, 25A and 26A are punctured and the parity bits having the order of 1 are punctured, the LDPC codeword can be transmitted when the code rate is 22/25. However, if the information bits corresponding to the first two columns among the exponent matrices corresponding to FIGS. 19A, 20A, 21A, 22A, 23A, 24A, 25A and 26A are punctured and parity bits corresponding to a 28th column having the degree of the exponent matrices of 1 are not punctured. Even when the parity bits corresponding to a 26th column having a degree of 2 are punctured, if the puncturing is performed similarly, an LDPC codeword having a code rate of 22/25 can be transmitted. However, since the latter is generally better in terms of coding performance, the performance may be further improved by appropriately applying the rate matching after generating the LDPC codeword using the exponent matrices corresponding to FIGS. 19A, 20A, 21A, 22A, 23A, 24A, 25A and 26A. Of course, considering the rate matching, the order of the columns in the exponent matrix may be properly rearranged and applied to the LDPC encoding.

As the detailed example, when LDPC encoding and decoding are applied based on the exponent matrices corresponding to the FIGS. 19A, 20A, 21A, 22A, 23A, 24A, 25A and 26A, the following transmission order can be defined. (For convenience, the following patterns were derived by considering the first column as a 0th column and the last column as a 67th column).

Pattern 1:

2, 3, 4, . . . , 20, 21, 27, 22, 24, 26, 23, 25, 28, 29, 30, . . . , 67, 0, 1

Pattern 2:

2, 3, 4, . . . , 20, 21, 27, 22, 26, 24, 23, 25, 28, 29, 30, . . . , 67, 0, 1

Pattern 3:

2, 3, 4, . . . , 20, 21, 22, 27, 24, 26, 23, 25, 28, 29, 30, . . . , 67, 0, 1

Pattern 4:

2, 3, 4, . . . , 20, 21, 22, 27, 26, 24, 23, 25, 28, 29, 30, . . . , 67, 0, 1

The patterns 1 to 4 mean the transmission in order of codeword bits corresponding to columns corresponding to the pattern order. In other words, the puncturing is applied to codeword bits in reverse order of the pattern.

Describing the case of pattern 5 by way of example, when the puncturing is applied to a codeword for the rate matching, first of all, a puncture is applied by predetermined length in order, starting from a codeword bit having a Z size corresponding to the first column. (In the patterns 1 to 4, the order of 0 and 1 can be changed).

Such a rate matching method may be applied using the above pattern, or the sequential puncturing may be applied after performing an appropriate interleaving method.

In addition, the pattern or interleaving scheme may be applied differently according to the modulation order to improve the performance. That is, in the case of the higher order modulation scheme, performance may be improved by applying a pattern or interleaving scheme different from that of the QPSK scheme.

In addition, the pattern or interleaving scheme may be applied differently according to the modulation order to improve the performance. That is, in the case of the higher order modulation scheme, performance may be improved by applying a pattern or interleaving scheme different from that of the QPSK scheme.

In addition, the pattern or interleaving scheme may be applied differently according to the code rate (or actual transmission code rate) to improve the performance. That is, when the code rate is lower than a specific code rate R_th, a rate matching method corresponding to the pattern 1 to the pattern 4 is applied, and when the code rate is larger than R_th, a pattern different from the above patterns can be used (if the code rate is equal to R_th, the pattern can be selected according to the predefined method). For example, when the code rate is more than a certain degree and thus a large amount of parity is required, the pattern matching method can be changed by using the following pattern 5 or 6. (Any sequence may be applied after 23 of pattern 5 and after 26 of pattern 6.

Pattern 5:

2, 3, 4, . . . , 20, 21, 27, 22, 23, . . .

Pattern 6:

2, 3, 4, . . . , 20, 21, 27, 25, 26, . . .

For reference, the transmission in units of Z codeword bits corresponding to one column block means that while the codeword bits for one column block are sequentially transmitted, the codeword bits corresponding to the other column blocks are not transmitted.

Such a rate matching method may be applied using the above pattern, or a method for performing puncturing from the predetermined location in the system may also be applied after performing an appropriate interleaving method. For example, a redundancy version (RV) scheme may be used in the LTE system. An example of the RV technique will be briefly described as follows.

First, the patterns 5 and 6 are each changed to the following patterns 7 and 8.

Pattern 7:

0, 1, 2, 3, 4, . . . , 20, 21, 27, 22, 23, . . .

Pattern 8:

0, 1, 2, 3, 4, . . . , 20, 21, 27, 25, 26, . . .

Next, if the value of RV-0 indicating the transmission start position for the next codeword is set to be 2, it can be set to perform the puncturing from the codeword bits for 0th and 1st column blocks according to the code rate. Here, it can be applied to application technologies of the LDPC encoding and decoding such as HARQ by not only determining various initial transmission sequences according to the RV-0 values but also appropriately setting well RV-i values. For example, when additional parity bits are transmitted after all the codeword bits for the second to 67th column blocks are transmitted, it is also possible to repeatedly transmit additional codeword bits, starting from the 0th and the 1st, and to transmit additional codeword bits by various methods depending on the RV-i values.

In addition, the pattern or interleaving scheme may be applied differently according to the modulation order to improve the performance. That is, in the case of the higher order modulation scheme, performance may be improved by applying a pattern or interleaving scheme different from that of the QPSK scheme.

In addition, the pattern or interleaving scheme may be applied differently according to the code rate (or initial transmission code rate) to improve the performance. That is, when the code rate is lower than a specific code rate R_th, a rate matching method corresponding to the pattern 1 is applied, and when the code rate is larger than R_th, the pattern 2 different from the pattern 1 can be used (if the code rate is equal to R_th, the pattern can be selected according to the predefined method).

FIGS. 27A to 37D illustrate another embodiment of a method and an apparatus for LDPC encoding and decoding according to the present disclosure, in which the base matrices corresponding to the exponent matrices or the sequences of the plurality of different LDPC codes are the same. More specifically, the base matrixes for the LDPC exponent matrix of FIGS. 28A, 29A, 30A, 31A, 32A, 33A, 34A, 35A, 36A, and 37A are all the same as the matrices shown in FIG. 27A. Therefore, the following embodiments are directed to a method and apparatus for performing LDPC encoding and decoding according to the base matrix and exponent matrix of FIGS. 27A, 28A, 29A, 30A, 31A, 32A, 33A, 34A, 35A, 36A, and 37A. In the LDPC encoding and decoding process, the exponent matrix or the LDPC sequence corresponding thereto may be used as it is, or may be appropriately transformed according to the block size to be used for the LDPC encoding and decoding. At this time, the above-described transformation may be performed using the lifting method described in the above Equations 19 to 31, and in some case, various methods may be applied. For reference, since the exponent matrix or the LDPC sequence proposed by the present disclosure corresponds to a cyclic shift value of bits corresponding to the block size Z, it may be variously named a shift matrix or a shift value matrix or a shift sequence or a shift value sequence or the like.

The exponent matrices shown in FIGS. 28A, 29A, 30A, 31A, 32A, 33A, 34A, 35A, 36A, and 37A sequentially shows the exponent matrices of the LDPC codes designed for the block size groups described in the embodiments based on the above Equations 29 to 31. (It is to be noted that empty blocks in the exponent matrix shown in FIGS. 28A, 29A, 30A, 31A, 32A, 33A, 34A, 35A, 36A, and 37A represent portions corresponding to the zero matrix of the Z×Z size. In some cases, the empty blocks can be expressed by a specified value such as −1.

The above Equation 29 represents a plurality of block size groups having different granularity. The above Equation 29 is only an example, and all the block size Z values included in the block size group of the above Equation 29 may be used, the block size value included in an appropriate subset as shown in the following Equation 32 may be used, and a block size group (set) of the above Equation 29 or 32 to/from which appropriate values are added or excluded may be used.

$$Z1'=\{8, 16, 32, 64, 128, 256\}Z2'=\{12, 24, 48, 96, 192, 384\}Z3'=\{10, 20, 40, 80, 160, 320\}Z4'=\{14, 28, 56, 112, 224\}Z5'=\{9, 18, 36, 72, 144, 288\}Z6'=\{11, 22, 44, 88, 176, 352\}Z7'=\{13, 26, 52, 104, 208\}Z8'=\{15, 30, 60, 120, 240\} \quad \text{Equation 32}$$

The base matrix and the exponent matrix shown in FIGS. 27A, 28A, 29A, 30A, 31A, 32A, 33A, 34A, 35A, 36A, and 37A all have a size of 46×68.

FIG. 27A is diagram illustrating an LDPC code base matrix according to an embodiment of the present disclosure.

FIGS. 27B to 27J are enlarged views of each of divided base matrices shown in FIG. 27A. FIG. 27A corresponds to the matrix of the figure corresponding to reference numerals shown in the respective parts. Therefore, one base matrix can be configured by combining FIGS. 27B to 27J.

FIG. 28A is diagram illustrating an LDPC code exponent matrix according to an embodiment of the present disclosure.

Figure 28E:
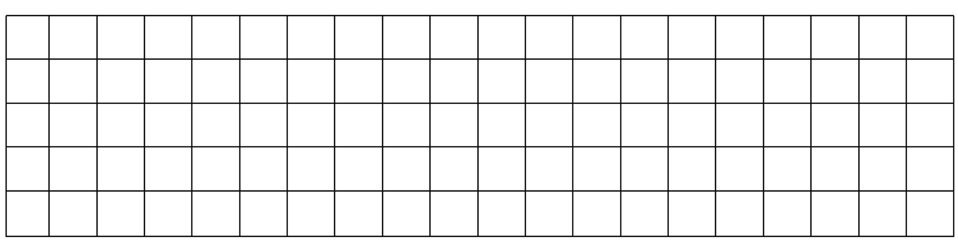
Figure 28G:
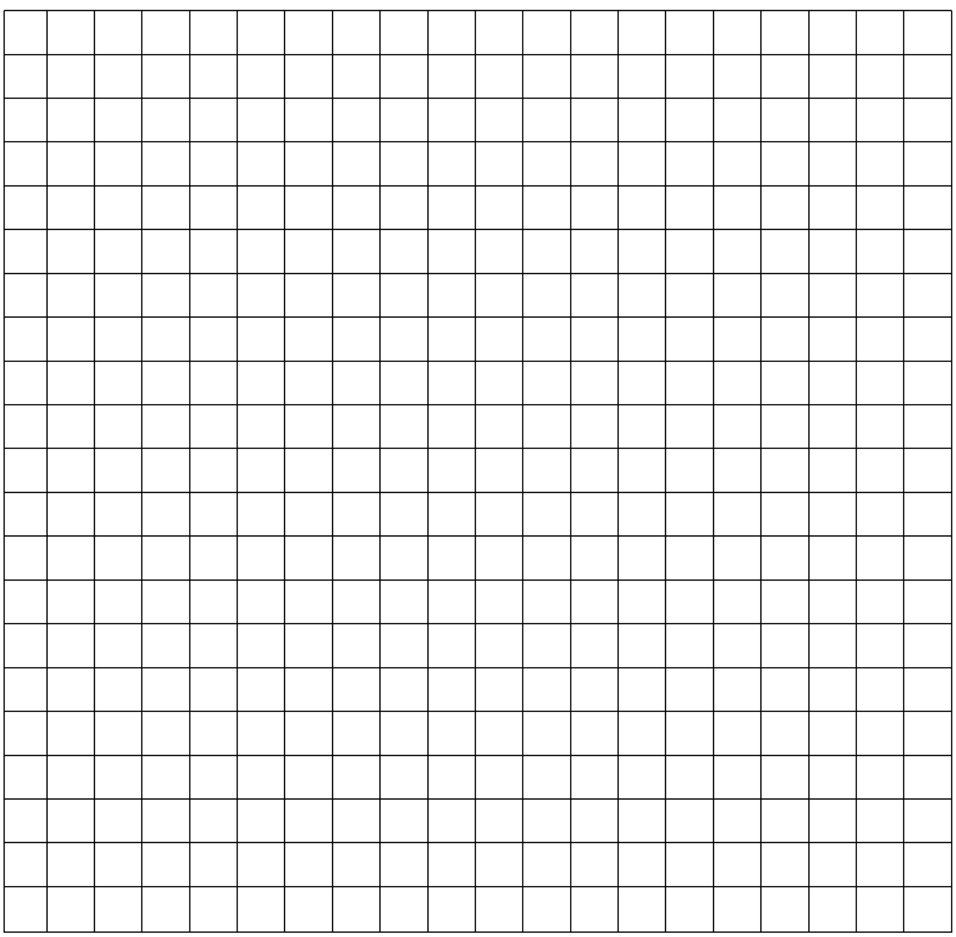
Figure 28H:
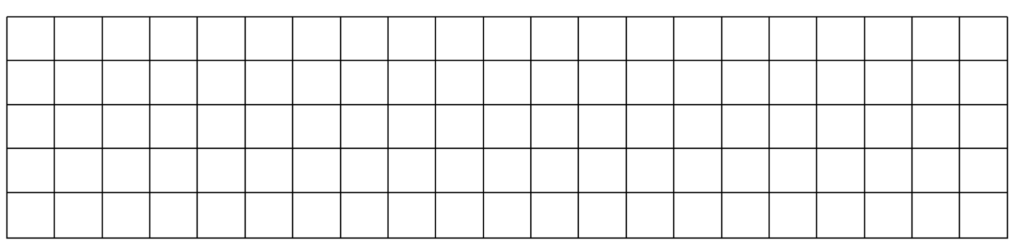
Figure 28I:
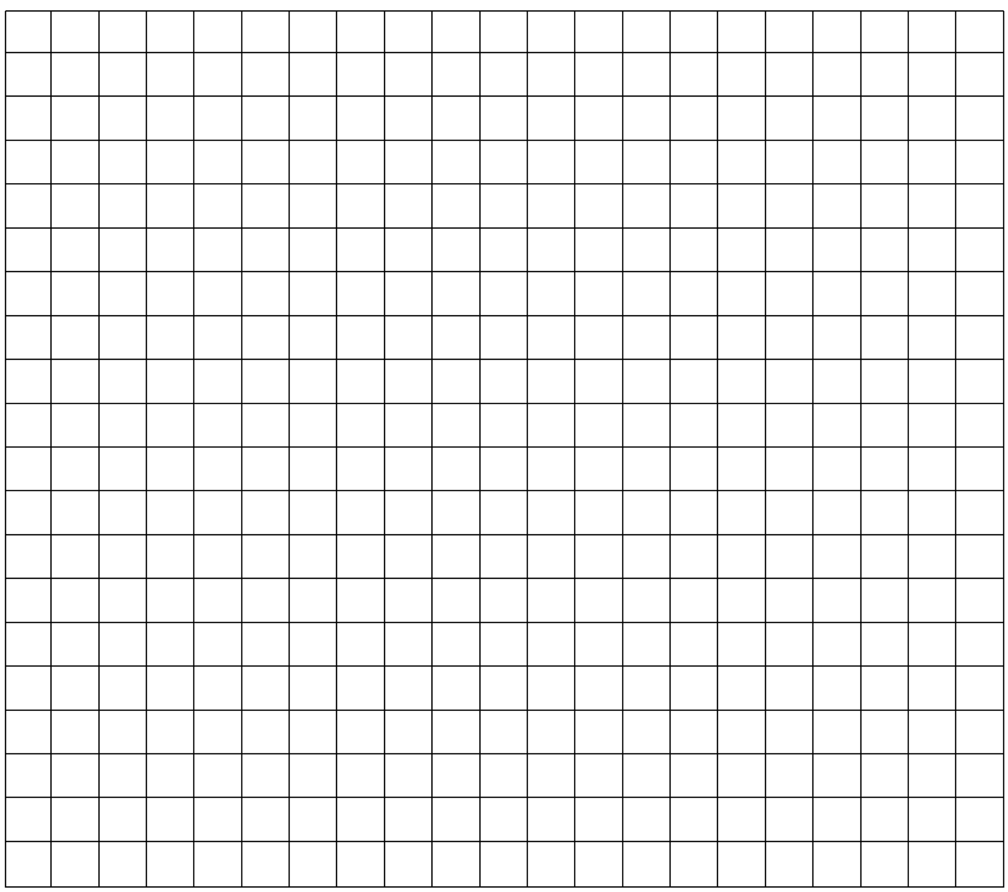

FIGS. 28B to 28J are enlarged views of each of divided LDPC exponent matrices shown in FIG. 28A. FIG. 28A corresponds to the matrix of the figure corresponding to reference numerals shown in the respective parts. Therefore, one exponent matrix or LDPC sequence can be configured by combining FIGS. 28B to 28J. Similarly, FIGS. 29B-29D, 30B-30D, 31B-31D, 32B-32D, 33B-33D, 34B-34D, 35B-35D, 36B-36D, and 37B-37D are enlarged views of each of the divided exponent matrices in FIGS. 29A, 30A, 31A, 32A, 33A, 34A, 35A, 36A, and 37A.

Another feature of the base matrix and the exponent matrix shown in FIGS. 27A, 28A, 29A, 30A, 31A, 32A, 33A, 34A, 35A, 36A, and 37A is that all the columns from the 28th column to the 68th column have a degree of 1. That is, the exponent matrix having a size of 41×68 consisting of the base matrix and the 6th to 46th rows of the exponent matrices corresponds to a single parity-check code.

The parts B, C and D of FIGS. 29A, 30A, 31A, 32A, 33A, 34A, 35A, 36A, and 37A show only parts B, C and D in FIG. 28A. Parts E, F, G, H, I and J in FIGS. 29A, 30A, 31A, 32A, 33A, 34A, 35A, 36A, and 37A are the same as parts E, F, G, H, I and J in FIGS. 28 (28E, 28F, 28G, 28H, 28I, 28J) respectively. That is, the parts E, F, G, H, I and J of FIGS. 29A, 30A, 31A, 32A, 33A, 34A, 35A, 36A, and 37A are the same as those shown in FIGS. 28E, 28F, 28G, 28H, 28I and 28J respectively. New exponent matrices can be configured by combining FIGS. 28E, 28F, 28G, 28H, 28I and 28J with the parts B, C and D of FIGS. 29A, 30A, 31A, 32A, 33A, 34A, 35A, 36A, and 37A, respectively.

The base matrix and exponent matrix shown in FIGS. 27A, 28A, 29A, 30A, 31A, 32A, 33A, 34A, 35A, 36A, and 37A can be applied to the method and apparatus for LDPC encoding and decoding by rearranging the order of columns, rearranging the order of rows, or rearranging the order of columns and rows in each matrix.

The base matrix and the exponent matrix shown in FIGS. 27A to 37D can be represented in various forms having the same meaning algebraically. For example, the base matrix and the exponent matrix may be expressed using sequences as shown in the following Equations 33 to 36.

The following Equation 33 represents a location of element I in each row in the base matrix of FIG. 27A. For example, second value 2 of a second sequence in the above Equation 33 means that there is element 1 in a second column of a second row in the base matrix. (In the above example, the starting order of the elements in the sequence and the matrix is regarded as starting from 0.)

01235691011 12 13 15 1618 1920212223
023457891112141516171921222324
01245678910 13 1415 17 18 19202425
0134678101112131416171820212225 0 1 26 0
1 3 12 16 21 22 27 0610111317182028 0 1 478
1429 0 1 3 12 16 1921 222430
0110111317182031 124781432 0 112 1621
2223 33 0 1 10 11 13 18 34 03 7 20 23 35 0
12 15 16 17 21 36 0 1 10 13 18 25 37 1 3 11
2022 38 0 14 16 17 21 39 1 12 13 18 1940
01781041 0 3 9 11 22 42 1 5 16 20 21 43 0 12
13 17 44 1 2 10 1845 034112246 1 67 1447
0241548 1 6 8 49 0 4 19 21 50 1 14182551 0
10 13 24 52 1 7 22 25 53 0 12 14 24 54
12112155 0 7 15 17 56 16122257 0 14 15 18
58 1 13 23 59 09 10 1260 1 3 7 1961 08 1762
1 3 9 1863 042464 1 16 18 25 65 0792266 1 6
10 67 Equation 33

The following Equation 34 represents each element value in each row in the base matrix of FIG. 28A. However, it is possible to exclude specific element values (e.g. −1) corresponding to the zero matrix of Z×Z size in the exponent matrix at that time. For reference, the sequence of FIG. 28A and the following Equation 34 means the exponent matrix corresponding to the block size group corresponding to the Z1 of the above Equation 29 or the Z1' of the above Equation 32.

250 69 226 159 100 10 59 229 110 191 9 195 23
190 35 239 31 10 2 239 117 124 71 222 104
173 220 102 109 132 142 155 255 28 0 0 0

106111 18563 1179322917795
3914222522524520525111700 121
898420150131 243
1368624621921124076244144 1210 157 1020
20523619423128 123 1150
183222867244111572110 2204415931 1671040
1124721110216410924 1900 103 182 109 21
142 14 61 216 0 98 149 167 160 49 58 0 77 41
83 182 78 252 22 0 16042213223470 177 248
151 185620 206 55 206 127 16 229 0
40966563 75 1790 64 49 49 51 154 0 7 164 59
1 144 0 42 233 8 155 147 0 60 73 72 127 224
0 151 18621747 1600 249 121 109 131 171 0
64 142 188 158 0 156 147 170 152 0 112
86236 116 222 0 23 136 116 182 0 195 243
215 61 0 25 104 194 0 128 165 181 63 0 86
236 84 6 0 216 73 120 9 0 95 177 172 61 0
221 112 199 121 0 2187412110 127 167 164
159 0 161 197 207 103 0 37 105 51 120 0 198
220 122 0 169 204 221 239 0 136 251 79 138
0 189 61 190 81 185 28 97 0 124 42 247 0 70
134 160 31 0 192 27 199 207 0 156 50 226 0 Equation 34

FIG. 29A is diagram illustrating an LDPC code exponent matrix according to an embodiment of the present disclosure.

The following Equation 35 represents each element value in each row in the base matrix of FIG. 29A. However, it is possible to exclude specific element values (e.g. −1) corresponding to the zero matrix of Z×Z size in the exponent matrix at that time. For reference, the sequence of FIG. 29A and the following Equation 35 means the exponent matrix corresponding to the block size group corresponding to the Z4 of the above Equation 29 or the Z4' of the above Equation 32.

205 72 103 204 141 157 170 26 166 48 181 10 166
64 177 205 36 10 94 40 217 158 41 139 87
119 60 50 172 170 173 160 89 222 0 0 0 182
114 77 181 46 204 180 109 73 158 208 1 110
59 185 157 13 0 0 47 219 199 148 66 212 183
1 59 110 199 142 20 184 83 147 23 1 0 16 206
0 43 183 50 84 113 152 184 0 39210214 197
185 183 192260 83802151111460 153 172 222
92 46 96 36 25 152 0 204153 143
30119205241050 39 14744 145 71 290
4013340200063810 131 295744 162 181 0 133
7 101 184 121 0 155 40 193 63 6 4 0 10103
163 105 186530 35 146 191 171 2120
185862081262150 104 201 41124 178 0 206 41
156 97 82 0 151 64 61 158 164 0 223 198 42
182 16 0 119 97 193 42 0 209 24 70 67 0
176291691121420 45 185 84 3 0 52 160 170
133 0 194 33 1180 142 13 64 143 0 122 147
164 66 0 60 133 55 89 0 122 131 174 167 0 22
129 183 78 0 188 206 206 54 0 129 188 184
46 0 111 150 20 24 0 181 179 27 128 0 57 130
218 0 80 12 104 96 0 185 159 206 93 0 205
118 200 0 27 193 119 150 0 96 192 65 0 138
1108 58 0 184 119 213 21 0 187 37 94 0 Equation 35

FIG. 30A is diagram illustrating an LDPC code exponent matrix according to an embodiment of the present disclosure.

The following Equation 36 represents each element value in each row in the base matrix of FIG. 30A. However, it is possible to exclude specific element values (e.g. −1) corresponding to the zero matrix of Z×Z size in the exponent matrix at that time. For reference, the sequence of FIG. 30A and the following Equation 36 means the exponent matrix corresponding to the block size group corresponding to the Z7 of the above Equation 29 or the Z7 of the above Equation 32.

134 50 169 114 189 0 196 45 79 101 109 101 163
54 166 132 173 1 0 27 190 60 33 155 40 25
100 60 50 100 141 114 199 27 37 0 0 0 128
131 174 149 127 99 153 45 185 153 85 93 144
155 24 179 86 0 0 202 48 97 115 176 63 151
107 146 38 34 53 9 19 66 61 96 10 160 17 0
205 123 71 56 5 155 106 0 1947 128 202 14
59205 1620 170 207 123 67 166 1680
2002516518824779928320 174 145 76 61 145
29 165 43 0 92 199 150 151 163 930 95 112
132 138 152 200 72 0 71 75 107 102 27 78 0
188 100 155 131 1980 15 100 198 18 109 1190
7 1 109 184 58 193 0 137 128 30 121 39 0 103
138 40 165 16 0 57 63 17 58 184 0 98 24 79
62 205 0 125 111 118 44 56 0 126 141 96 34 9
0 10352170470 49 114 46 126 0 84 110 158 86
87 0 41 50 87 1150 190 99 157 6 0 129 128
144 0 148 189 34 172 0 70 203 25 160 1887
104 37 0 179 192 136 17 0 99 1 66 8 0 179 57
64 105 0 124 112 80 71 0 33 167 109 160 0 98
31 48 56 0 33 206 120 0 84 125 61 81 0 204
145 83 46 0 77 35 1980 136 128 71 41 0
97891180 113 92 200 93 0 31 92 190 23 0 113
38 111 0 Equation 36

FIG. 31A is diagram illustrating an LDPC code exponent matrix according to an embodiment of the present disclosure.

The following Equation 37 represents each element value in each row in the base matrix of FIG. 31A. However, it is possible to exclude specific element values (e.g. −1) corresponding to the zero matrix of Z×Z size in the exponent matrix at that time. For reference, the sequence of FIG. 31A and the following Equation 37 means the exponent matrix corresponding to the block size group corresponding to the Z1 of the above Equation 29 or the Z1 of the above Equation 32.

106 43 185 109 230 209 30 185 143 130 154 241
80 121 246 235 124 1 0 77 142 7 1 153 163
44212 170 141 183 170 86227 68 56 000
2089524017415 1427 179 217 161 3624122753
7213014000
79244901712442091832218625234108206250106131871 0
66 118 0 163 14 10 130239 118 1520 179 150
50 5 158 196 83 234 0 11924081197105 1080
192913951 1142192261812160 163 34 157 162
90 211 197 141 0 70173 129113 100650 233
159 232 59 165 192 138 0 3972237113
1042100 170 161 233 64 119 0
142281675234330 64 181 61 195 123 117 0 28
85 102 202 71 0 242 91 28 248 87 0 73 123
237 193 1490 18 137 185 166 95 0 140 36 236
17 43 0 15 69 136 161 88 0 63 196 78 216 0
69 34 142 133 0 129 53 133 170 50 0 71 139
73 188 0 203 77 189 209 0 127 138 42 0 220
130 11 229 0 63 134 114 84 0 233 148 6 253 0
137 50 37 119 0 230 111 109 72 0 118 2 226
184 0 156 15 81 249 0 43 125 184 70 0 19 129
181 140 0 196 247 240 0 103 196 195 74 0 72
237 116 224 0 107 72 85 0 196 168 189 214 0
121 106 247 0 227 32 8 235 0 212 208 118
143 0 49 105 1690 Equation 37

FIG. 32A is diagram illustrating an LDPC code exponent matrix according to an embodiment of the present disclosure.

The following Equation 38 represents each element value in each row in the base matrix of FIG. 32A. However, it is possible to exclude specific element values (e.g. −1) corresponding to the zero matrix of Z×Z size in the exponent matrix at that time. For reference, the sequence of FIG. 32A and the following Equation 38 means the exponent matrix corresponding to the block size group corresponding to the Z2 of the above Equation 29 or the Z2' of the above Equation 32.

121 259 123 181 230 315 199 361 364 329 321
26265 185 290 271 43 10 124 162
19036027435789 158 375 258 320 351 33053
48261 000
3233601792596633084181280252225316331424311000
170 13 11 364 209 319 274 36 168 33 342 352
212 136 96 150 286 10 2 106 0 255 142 130

43 95 255 207 0 227 301 365 145 209 238
1562890 216 312 16226305 185 0
304314325373371147771562460 165 382 201
1484274248 180 105 351 6525 151 1050 333
375 289 347 116 142 172 0
76122307211522730 245 1693253142420 183
59354255 37 87 0 188 157 27 289 340 70 0 79
314 5 184 279 0 74 104 169 226 20 0 133 197
99 367 309 0 307 241 135 49 67 0 35246 143
2672470 238 322 63 187 46 0 222 1196 42 0 5
18 77 1900 266 305 373 99 44 0 226 95 201
122 0 275 151 308 264 0 41 160 343 0 182
110 341 9 0 132 207 305 312 0 301 183 12
292 0 177 329 378 316 0 29 379 223 230 0
376 45 71 151 0 82 195 24 300 0 124 329 145
54 0 109 366 151 0 63 144 110 342 0 52 182
198 344 0 76 338 298 0 325 334 57 47 0 77
339 225 0 90 8 203 274 0 38 365 302 369 0 88
30 161 0 Equation 38

FIG. 33A is diagram illustrating an LDPC code exponent matrix according to an embodiment of the present disclosure.

The following Equation 39 represents each element value in each row in the base matrix of FIG. 33A. However, it is possible to exclude specific element values (e.g. −1) corresponding to the zero matrix of Z×Z size in the exponent matrix at that time. For reference, the sequence of FIG. 33A and the following Equation 39 means the exponent matrix corresponding to the block size group corresponding to the Z3 of the above Equation 29 or the Z3' of the above Equation 32.

90 222 46 240 158 264 202 13 295 20 164 158 12
95 73 292 176 1 0 298 164 289 305 150 189
211 266 6 313 236 99 234 189 298 239 0 0 0
1452002532382421951481922114333 18128043
198 18124200 301 8431131187
13322631426430239158304102134305233 1 0
257 27 0 12 316 151 3 5 88 5 0 181
105282352169750 171 0 143 189 203 303 247
301 0 233 302 15 12970231 268 6270
512023151442761111522870
28696236264392750 2597010320349311240 21
58 62 262 1 223 0 154 222 133 46 151 0 188
65 298 285 294 94 0 6121211961232220 168
173 105 30 318 0 108 192 176 15 136 0 65
135 20 314 219 0 117 289 215 114 15 0 64 7
171 258 269 0 208 156 236 89 282 0 175 160
246 88 0 229 195 243 247 0 86 220 78 96 256
0 131 211 270 270 0 248 239 206 255 0 126
185 23 0 120 154 221 225 0 177 162 185 52 0
258 167 91 11 0 25 109 106 52 0 10 135 245
298 0 31 139 29 256 0 289 74 142 24 0 296
274 92 249 0 305 166 301 7 0 137 37 240 0
248 182 80 122 0 42 135 124 22 0 261 180 13
0 155 36 232 194 0 126 317 1950 313 278 85
205 0 93 2 216 232 0 247 124 68 0 Equation 39

FIG. 34A is diagram illustrating an LDPC code index matrix according to an embodiment of the present disclosure.

The following Equation 40 represents each element value in each row in the base matrix of FIG. 34A. However, it is possible to exclude specific element values (e.g. −1) corresponding to the zero matrix of Z×Z size in the exponent matrix at that time. For reference, the sequence of FIG. 34A and the following Equation 40 means the exponent matrix corresponding to the block size group corresponding to the Z4 of the above Equation 29 or the Z4' of the above Equation 32.

196155 155 13 98 15021728119197178 168205
120151199205 10 150 21 184 153 171 126 184
190 87 65 114 16 139 157 87 14 0 0 0 146 131
122 75 63 50 136 29 20 54 104 39 131 81 150
70 140 0 0 17 87 120 15 135 97 90 136 78 62
56 164 48 29 63 205 101 1 0 14 149 0 110 164
131 176 61 118 191 0
119201889710999198520 204 47 142 174 60
48 0 216 26 47 102 212 93 194 190 32 0
1619820026195 162221020 1792151218864770
20497562837181 880 6611389501991270 72
215 135 26 126 0 1657414116050 1000 186
1207087 17 153 0 62 137 90 111 194 0 30 61
35 141 63 0 166113652112220 223 209 54 90
86 0 87 15 109 84 197 0 31 116 3 65 192 0 28
210 24 150 0 176 101 160 180 0 23 219 210
43 120 0 9 131 89 89 0 212 36 170 95 0 163
184 85 0 159 49 0 158 0 155 9 3 92 0 55 72
60 36 0 213 7 8 170 0 198 45 73 187 0 64 140
119 75 0 91 58 122 0 0 44 147 72 79 0 182
104 162 197 0 24 122 150 0 75 32 84 163 0
102 150 147 163 0 43 174 206 0 39 18 39 206
0 11790390 194 140 46 206 0 72 68 96 197 0
118 157 73 0 Equation 40

FIG. 35A is diagram illustrating an LDPC code exponent matrix according to an embodiment of the present disclosure.

The following Equation 41 represents each element value in each row in the base matrix of FIG. 35A. However, it is possible to exclude specific element values (e.g. −1) corresponding to the zero matrix of Z×Z size in the exponent matrix at that time. For reference, the sequence of FIG. 35A and the following Equation 41 means the exponent matrix corresponding to the block size group corresponding to the Z5 of the above Equation 29 or the Z5' of the above Equation 32.

107 112 215 11 73 73 193 124 183 161 123 283
200 179 83 286 39 10 4 237 176 270 9 162
102 153 231 174 281 110 265 213 233 286 0 0
0
3919326920328725670872401912023115366242211400
53 70 40 138 14 21 264 143 242 3 179 236
113 64 205 224 110 10 97 58 0 204 155 103
104276271 1410 245 14 151 14036215 172100
16851156266881830 2151195987285
1132472191880 155 150 186 36 164 177 182
148 0 56145202751711960 9425595 190 150
260 1530 147 1 55 135 136 202 0 146 202 143
185 540 3428789264244181 0 63 242 31 229
190 115 0 18849 100 277 272 0 185 165 16 96
150 0 166 49 159 65 35 0 15 112 161 228 214
0 9 82 276 263 236 0 43 140 185 1082600 70
282 54 178 0 254 187 193 276 0 36206208188
1690 254 273 21 195 0 278 149 161 236 0 69
262 127 0 31 74 138 159 0 26 62 167 284 0
247 210 2 254 0 55 122 119 85 0 144 97 119
164 0 218 2112 192 0 207 135 286 249 0 32
49 165 233 0 40 124 73 83 0 154 260 9 0 185
255 31 247 0 77 285 181 199 0 240 247 99 0
221 163 220 190 0 210 186 20 0 64 212 246
190 0 111 245 283 250 0 197 100 14 0 Equation 41

FIG. 36A is diagram illustrating an LDPC code exponent matrix according to an embodiment of the present disclosure.

The following Equation 42 represents each element value in each row in the base matrix of FIG. 36A. However, it is possible to exclude specific element values (e.g. −1) corresponding to the zero matrix of Z×Z size in the exponent matrix at that time. For reference, the sequence of FIG. 36A and the following Equation 42 means the exponent matrix corresponding to the block size group corresponding to the Z6 of the above Equation 29 or the Z6' of the above Equation 32.

1673461485300 1888124353 11 94309921631
2376710
1311388927032039273109234116259273139218224000
28953 15016133625097258328241133
1153003211413032800 197 201 202 237 1 221
237 19 26 106 10 277 340 149 329 305 174 1
0 212 2 0 742883322161282901650 93 87 326
300 236 328 35 329 0 18461 248 157 101 1400
169 341 65 296 140 339 164 124 59 0

2472332123191382311773350 170 194 233 316
246 107 0 22079276325 2642982120
89328371142953480 18 268 110 178 94 0 309
133 203 77 142040 133 125 99 334 314 26 0
1192662671521150 80282 157 1972490 81 351
91 98 342 0 267 323 333 317 1420 54 75 42
342 324 0 244 1602582162060 100 163 185
345 0 203 163 293 253 0 220 348 159 334 161
0 132 169 99 28 0 104 225 30 241 0 162 291
232 0 261 206 264 310 0 48 20 187 296 0 69
136 146 59 0 28 309 269 273 0 254 344 255
182 0 77 173 293 132 0 217 294 246 107 0 77
148 238 311 0 132 305 206 60 0 245 351 313
0 188 221 212 235 0 235 100 334 256 0 250
33 97 0 221 32 128 320 0 174 140 346 0 237
318 148 109 0 334 14 313 20 0 315 230 319 0 Equation 42

FIG. 37A is diagram illustrating an LDPC code exponent matrix according to an embodiment of the present disclosure.

The following Equation 43 represents each element value in each row in the base matrix of FIG. 37A. However, it is possible to exclude specific element values (e.g. −1) corresponding to the zero matrix of Z×Z size in the exponent matrix at that time. For reference, the sequence of FIG. 37A and the following Equation 43 means the exponent matrix corresponding to the block size group corresponding to the Z8 of the above Equation 29 or the Z8' of the above Equation 32.

1352271261348483 53225205 12875
13521722090105 1371 0 96 236 136 221 128
92 172 56 11 189 95 85 153 87 163 216000
189 4 225 151 236 117 179 92 24 68 6 101 33
96 125 67 230 0 0 12823 16222043
18696121622241672003223517221910 64 211
0 2 171 47 143 210 180 1800 1992223
1009220752130 77 146 209 32 166 18 0 181
105 141 223 177 145 199153 380 169 12 206
221 17 212 92 205 0 116 151 70 230 115 84 0
45 115 134 1 152 165 107 0 186 215 124
18098 800 220 185 154 178 1500 124 144 182
95 72 76 0 39 138 220 173 142490 78 152 84
5 205 0 183 112 106 219 129 0 183 215 180
143 14 0 179 108 159 138 196 0
771872031671300 197 122 215 65 216 0 25 47
126 178 0 185 127 117 199 0 32 178 2 156 58
0 27 141 11 181 0 163 131 169 98 0 16523290
32 43 200 205 0 232 32 118 103 0 170 199 26
105 0 73 149 175 108 0 103 110 151 211 0
199 132 172 65 0 161 237 142 180 0 231 174
145 100 0 1207 42 100 0 59 204 161 0 121 90
26 140 0 115 188 168 52 0 4103300 53 189
215 24 0 222 170 71 0 22 127 49 125 0 191
211 187 148 0 177 114 93 0 Equation 43

The exponent matrices illustrated in FIG. 28A, 29A, 30A, 31A, 32A, 33A, 34A, 35A, 36A, and 37A and the corresponding LDPC sequences of Equations 34 to 43 all have the base matrix shown in FIG. 27A or the above Equation 33. The LDPC exponent matrix or the sequence having the same base matrix can be appropriately selected and applied to the method and apparatus for LDPC encoding and decoding.

In addition, it is obvious that all the exponent matrices of FIGS. 28A, 29A, 30A, 31A, 32A, 33A, 34A, 35A, 36A, and 37A and the corresponding LDPC sequences of the above Equations 34 to 43 may not be used. For example, one or more LDPC exponent matrices or sequences may be selected from the exponent matrices shown in FIGS. 28A, 29A, 30A, 31A, 32A, 33A, 34A, 35A, 36A, and 37A and the corresponding LDPC sequences of the above Equation 34 to 43, and may be applied to the method and apparatus for LDPC encoding and decoding along with other LDPC exponent matrices or LDPC sequences.

If a certain rule can be found for the base matrix or a part of the exponent matrices, the base matrix may be represented more simply. For example, if it is assumed that the transceiver knows rules for a partial matrix having a diagonal structure in the base matrix and the exponent matrix of FIGS. 27A, 28A, 29A, 30A, 31A, 32A, 33A, 34A, 35A, 36A, and 37A, the location of the element and a part of the element values thereof are omitted.

In addition, in the method of representing the base matrix or the exponent matrix, when the locations and values of the elements are shown, they may be represented in each row, but may be represented in each column order.

According to the system, the base matrix and the exponent matrix illustrated in FIGS. 27A, 28A, 29A, 30A, 31A, 32A, 33A, 34A, 35A, 36A, and 37A may be used as it is, or only a part thereof may be used. For example, the LDPC encoding and decoding may be applied by using new base matrix or exponent matrix obtained concatenating partial matrices of the above 25 rows of the each base matrix and exponent matrix with another base matrix or exponent matrix of 21×68 size corresponding to a single parity-check code. For reference, the partial matrices may be formed in one partial matrix as illustrated in FIGS. 27B, 27C, 27E, 27F, 27H and 271 and the partial matrix consisting of B, C, E, F, H and I in FIGS. 28A, 29A, 30A, 31A, 32A, 33A, 34A, 35A, 36A, and 37A, respectively, is described. However, it is obvious that the present disclosure is not limited thereto.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for channel encoding performed by an apparatus in a communication system, the method comprising:

identifying a first block size group based on a block size (Z);

identifying a first matrix corresponding to the first block size group, the first matrix being used for circularly shifting an identity matrix;

identifying a parity check matrix based on the block size (Z) and the first matrix;

encoding input bits based on at least part of the parity check matrix;

performing rate matching of the encoded input bits based on a redundancy version (RV) index; and transmitting at least part of the encoded input bits based on the rate matching, wherein an RV index 0 indicates a starting position corresponding to 2Z+lth bit of the input bits, wherein the first matrix is different from a second matrix corresponding to a second block size group, and wherein the first matrix and the second matrix correspond to a base matrix.

2. The method of claim 1, further comprising:

performing a hybrid automatic repeat request (HARQ) retransmission based on an RV index among a plurality of RV indices, wherein the plurality of RV indices indicate starting positions respectively in Z-bit unit.

3. The method of claim 1, wherein the performing of rate matching further comprises performing interleaving of at least part of the encoded input bits based on an interleaving pattern in Z-bit unit, and wherein the interleaving pattern is identified based on a modulation order.

4. The method of claim 1, wherein the first matrix is identified based on values, and wherein the values include:

250, 69, 226, 159, 100, 10, 59, 229, 110, 191,9, 195, 23, 190,35,239,31, 1, and 0 corresponding to at least part of columns associated with a row of the base matrix, 2, 239, 117, 124, 71, 222, 104, 173, 220, 102, 109, 132, 142, 155, 255, 28,0,0, and 0 corresponding to at least part of columns associated with a row of the base matrix, 106, 111, 185, 63, 117, 93, 229, 177, 95, 39, 142, 225, 225, 245, 205, 251, 117, 0, and 0 corresponding to at least part of columns associated with a row of the base matrix, and 121, 89, 84, 20, 150, 131, 243, 136, 86, 246, 219, 211, 240, 76, 244, 144, 12, 1, and 0 corresponding to at least part of columns associated with a row of the base matrix, 157, 102, and 0 corresponding to at least part of columns associated with a row of the base matrix, 205, 236, 194, 231, 28, 123, 115, and 0 corresponding to at least part of columns associated with a row of the base matrix, 183, 22, 28, 67, 244, 11, 157, 211, and 0 corresponding to at least part of columns associated with a row of the base matrix, 220, 44, 159, 31, 167, 104, and 0 corresponding to at least part of columns associated with a row of the base matrix, 112, 4, 7, 211, 102, 164, 109, 241, 90, and 0 corresponding to at least part of columns associated with a row of the base matrix, 103, 182, 109, 21, 142, 14, 61, 216, and 0 corresponding to at least part of columns associated with a row of the base matrix, 98, 149, 167, 160, 49, 58, and 0 corresponding to at least part of columns associated with a row of the base matrix, 77, 41, 83, 182, 78, 252, 22, and 0 corresponding to at least part of columns associated with a row of the base matrix, 160, 42, 21, 32, 234, 7, and 0 corresponding to at least part of columns associated with a row of the base matrix, 177, 248, 151, 185, 62, and 0 corresponding to at least part of columns associated with a row of the base matrix, 206, 55, 206, 127, 16, 229, and 0 corresponding to at least part of columns associated with a row of the base matrix, 40, 96, 65, 63, 75, 179, and 0 corresponding to at least part of columns associated with a row of the base matrix, 64, 49, 49, 51, 154, and 0 corresponding to at least part of columns associated with a row of the base matrix, 7, 164, 59, 1, 144, and 0 corresponding to at least part of columns associated with a row of the base matrix, 42, 233, 8, 155, 147, and 0 corresponding to at least part of columns associated with a row of the base matrix, 60, 73, 72, 127, 224, and 0 corresponding to at least part of columns associated with a row of the base matrix, 151, 186, 217, 47, 160, and 0 corresponding to at least part of columns associated with a row of the base matrix, 249, 121, 109, 131, 171, and 0 corresponding to at least part of columns associated with a row of the base matrix, 64, 142, 188, 158, and 0 corresponding to at least part of columns associated with a row of the base matrix, 156, 147, 170, 152, and 0 corresponding to at least part of columns associated with a row of the base matrix, 112, 86, 236, 116, 222, and 0 corresponding to at least part of columns associated with a row of the base matrix, 23, 136, 116, 182, and 0 corresponding to at least part of columns associated with a row of the base matrix, 195, 243, 215, 61, and 0 corresponding to at least part of columns associated with a row of the base matrix, 25, 104, 194, and 0 corresponding to at least part of columns associated with a row of the base matrix, 128, 165, 181, 63, and 0 corresponding to at least part of columns associated with a row of the base matrix, 86, 236, 84, 6, and 0 corresponding to at least part of columns associated with a row of the base matrix, 216, 73, 120, 9, and 0 corresponding to at least part of columns associated with a row of the base matrix, 95, 177, 172, 61, and 0 corresponding to at least part of columns associated with a row of the base matrix, 221, 112, 199, 121, and 0 corresponding to at least part of columns associated with a row of the base matrix, 2, 187, 41, 211, and 0 corresponding to at least part of columns associated with a row of the base matrix, 127, 167, 164, 159, and 0 corresponding to at least part of columns associated with a row of the base matrix, 161, 197, 207, 103, and 0 corresponding to at least part of columns associated with a row of the base matrix, 37, 105, 51, 120, and 0 corresponding to at least part of columns associated with a row of the base matrix, and 198, 220, 122, and 0 corresponding to at least part of columns associated with a row of the base matrix.

5. The method of claim 1, wherein the first matrix is identified based on values, and wherein the values include:

135, 227, 126, 134, 84, 83, 53, 225, 205, 128, 75, 135, 217, 220, 90, 105, 137, 1, and 0 corresponding to columns associated with a row of the base matrix, 96, 236, 136, 221, 128, 92, 172, 56, 11, 189, 95, 85, 153, 87, 163,216,0,0, and 0 corresponding to columns associated with a row of the base matrix, 189,4,225,151,236,117,179,92,24,68,6,101,33,96,125,67, 230,0, and 0 corresponding to columns associated with a row of the base matrix, 128, 23, 162, 220, 43, 186, 96, 1,216,22, 24, 167, 200, 32,235, 172, 219, 1, and 0 corresponding to columns associated with a row of the base matrix, 64, 211, and 0 corresponding to columns associated with a row of the base matrix, 2, 171, 47, 143, 210, 180, 180, and 0 corresponding to columns associated with a row of the base matrix, 199, 22, 23, 100, 92, 207, 52, 13, and 0 corresponding to columns associated with a row of the base matrix, 77, 146, 209, 32, 166, 18, and 0 corresponding to columns associated with a row of the base matrix, 181, 105, 141, 223, 177, 145, 199, 153, 38, and 0 corresponding to columns associated with a row of the base matrix, 169, 12, 206, 221, 17, 212, 92, 205, and 0 corresponding to columns associated with a row of the base matrix, 116, 151, 70, 230, 115, 84, and 0 corresponding to columns associated with a row of the base matrix, 45, 115, 134, 1, 152, 165, 107, and 0 corresponding to columns associated with a row of the base matrix, 186, 215, 124, 180, 98, 80, and 0 corresponding to columns associated with a row of the base matrix, 220, 185, 154, 178, 150, and 0 corresponding to columns associated with a row of the base matrix, 124, 144, 182, 95, 72, 76, and 0 corresponding to columns associated with a row of the base matrix, 39, 138, 220, 173, 142, 49, and 0 corresponding to columns associated with a row of the base matrix, 78, 152, 84, 5, 205, and 0 corresponding to columns associated with a row of the base matrix, 183, 112, 106, 219, 129, and 0 corresponding to columns associated with a row of the base matrix, 183, 215, 180, 143, 14, and 0 corresponding to columns associated with a row of the base matrix, 179, 108, 159, 138, 196, and 0 corresponding to columns associated with a row of the base matrix, 77, 187, 203, 167, 130, and 0 corresponding to columns associated with a row of the base matrix, 197, 122, 215 65 216, and 0 corresponding to columns associated with a row of the base matrix, 25, 47, 126, 178, and 0 corresponding to columns associated with a row of the base matrix, 185, 127, 117, 199, and 0 corresponding to columns associated with a row of the base matrix, 32, 178, 2, 156, 58, and 0 corresponding to columns associated with a row of the base matrix, 27, 141, 11, 181, and 0} corresponding to columns associated with a row of the base matrix, 163, 131, 169, 98, and 0 corresponding to columns associated with a row of the base matrix, 165, 232, 9, and 0 corresponding to columns associated with a row of the base matrix, 32, 43, 200, 205, and 0 corresponding to columns associated with a row of the base matrix, 232, 32, 118, 103, and 0 corresponding to columns associated with a row of the base matrix, 170, 199, 26, 105, and 0 corresponding to columns associated with a row of the base matrix, 73, 149, 175, 108, and 0 corresponding to columns associated with a row of the base matrix, 103, 110, 151, 211, and 0 corresponding to columns associated with a row of the base matrix, 199, 132, 172, 65, and 0 corresponding to columns associated with a row of the base matrix, 161, 237, 142, 180, and 0 corresponding to columns associated with a row of the base matrix, 231, 174, 145, 100, and 0 corresponding to columns associated with a row of the base matrix, 11, 207, 42, 100, and 0 corresponding to columns associated with a row of the base matrix, 59, 204, 161, and 0 corresponding to columns associated with a row of the base matrix, 121, 90, 26, 140, and 0 corresponding to columns associated with a row of the base matrix, 115, 188, 168, 52, and 0 corresponding to columns associated with a row of the base matrix, 4, 103, 30, and 0 corresponding to columns associated with a row of the base matrix, 53, 189, 215, 24, and 0 corresponding to columns associated with a row of the base matrix, 222, 170, 71, and 0 corresponding to columns associated with a row of the base matrix, 22, 127, 49, 125, and 0 corresponding to columns associated with a row of the base matrix, 191, 211, 187, 148, and 0 corresponding to columns associated with a row of the base matrix, and 177, 114, 93, and 0 corresponding to columns associated with a row of the base matrix.

6. A method for channel decoding performed by an apparatus in a communication system, the method comprising:

identifying a first block size group based on a block size (Z);

identifying a first matrix corresponding to the first block size group, the first matrix being used for circularly shifting an identity matrix;

identifying a parity check matrix based on the block size (Z) and the first matrix; and decoding a received signal based on at least part of the parity check matrix, wherein the received signal corresponds to bits where input bits are rate matched based on a redundancy version (RV) index, wherein an RV index 0 indicates a starting position corresponding to 2Z+lth bit of the input bits, wherein the first matrix is different from a second matrix corresponding to a second block size group, and wherein the first matrix and the second matrix correspond to a base matrix.

7. The method of claim 6, wherein a hybrid automatic repeat request (HARQ) retransmission is performed based on an RV index among a plurality of RV indices, wherein the plurality of RV indices indicate starting positions respectively in Z-bit unit.

8. The method of claim 6, wherein at least part of the input bits is interleaved based on an interleaving pattern in Z-bit unit, and wherein the interleaving pattern is identified based on a modulation order.

9. The method of claim 6, wherein the first matrix is identified based on values, and wherein the values include:

250, 69, 226, 159, 100, 10, 59, 229, 110, 191,9, 195, 23, 190,35,239,31, 1, and 0 corresponding to at least part of columns associated with a row of the base matrix, 2, 239, 117, 124, 71, 222, 104, 173, 220, 102, 109, 132, 142, 155, 255, 28,0,0, and 0 corresponding to at least part of columns associated with a row of the base matrix, 106, 111, 185, 63, 117, 93, 229, 177, 95, 39, 142, 225, 225, 245, 205, 251, 117, 0, and 0 corresponding to at least part of columns associated with a row of the base matrix, and 121, 89, 84, 20, 150, 131, 243, 136, 86, 246, 219, 211, 240, 76, 244, 144, 12, 1, and 0 corresponding to at least part of columns associated with a row of the base matrix, 157, 102, and 0 corresponding to at least part of columns associated with a row of the base matrix, 205, 236, 194, 231, 28, 123, 115, and 0 corresponding to at least part of columns associated with a row of the base matrix, 183, 22, 28, 67, 244, 11, 157, 211, and 0 corresponding to at least part of columns associated with a row of the base matrix, 220, 44, 159, 31, 167, 104, and 0 corresponding to at least part of columns associated with a row of the base matrix, 112, 4, 7, 211, 102, 164, 109, 241, 90, and 0 corresponding to at least part of columns associated with a row of the base matrix, 103, 182, 109, 21, 142, 14, 61, 216, and 0 corresponding to at least part of columns associated with a row of the base matrix, 98, 149, 167, 160, 49, 58, and 0 corresponding to at least part of columns associated with a row of the base matrix, 77, 41, 83, 182, 78, 252, 22, and 0 corresponding to at least part of columns associated with a row of the base matrix, 160, 42, 21, 32, 234, 7, and 0 corresponding to at least part of columns associated with a row of the base matrix,
177, 248, 151, 185, 62, and 0 corresponding to at least part of columns associated with a row of the base matrix,
206, 55, 206, 127, 16, 229, and 0 corresponding to at least part of columns associated with a row of the base matrix,
40, 96, 65, 63, 75, 179, and 0 corresponding to at least part of columns associated with a row of the base matrix,
64, 49, 49, 51, 154, and 0 corresponding to at least part of columns associated with a row of the base matrix,
7, 164, 59, 1, 144, and 0 corresponding to at least part of columns associated with a row of the base matrix,
42, 233, 8, 155, 147, and 0 corresponding to at least part of columns associated with a row of the base matrix,
60, 73, 72, 127, 224, and 0 corresponding to at least part of columns associated with a row of the base matrix,
151, 186, 217, 47, 160, and 0 corresponding to at least part of columns associated with a row of the base matrix,
249, 121, 109, 131, 171, and 0 corresponding to at least part of columns associated with a row of the base matrix,
64, 142, 188, 158, and 0 corresponding to at least part of columns associated with a row of the base matrix,
156, 147, 170, 152, and 0 corresponding to at least part of columns associated with a row of the base matrix,
112, 86, 236, 116, 222, and 0 corresponding to at least part of columns associated with a row of the base matrix,
23, 136, 116, 182, and 0 corresponding to at least part of columns associated with a row of the base matrix,
195, 243, 215, 61, and 0 corresponding to at least part of columns associated with a row of the base matrix,
25, 104, 194, and 0 corresponding to at least part of columns associated with a row of the base matrix,
128, 165, 181, 63, and 0 corresponding to at least part of columns associated with a row of the base matrix,
86, 236, 84, 6, and 0 corresponding to at least part of columns associated with a row of the base matrix,
216, 73, 120, 9, and 0 corresponding to at least part of columns associated with a row of the base matrix,
95, 177, 172, 61, and 0 corresponding to at least part of columns associated with a row of the base matrix,
221, 112, 199, 121, and 0 corresponding to at least part of columns associated with a row of the base matrix,
2, 187, 41, 211, and 0 corresponding to at least part of columns associated with a row of the base matrix,
127, 167, 164, 159, and 0 corresponding to at least part of columns associated with a row of the base matrix,
161, 197, 207, 103, and 0 corresponding to at least part of columns associated with a row of the base matrix,
37, 105, 51, 120, and 0 corresponding to at least part of columns associated with a row of the base matrix, and
198, 220, 122, and 0 corresponding to at least part of columns associated with a row of the base matrix.

10. The method of claim 6,
wherein the first matrix is identified based on values, and wherein the values include:
135, 227, 126, 134, 84, 83, 53, 225, 205, 128, 75, 135, 217, 220, 90, 105, 137, 1, and 0 corresponding to columns associated with a row of the base matrix,
96, 236, 136, 221, 128, 92, 172, 56, 11, 189, 95, 85, 153, 87, 163, 216,0,0, and 0 corresponding to columns associated with a row of the base matrix,
189, 4, 225, 151,236, 117, 179, 92,24,68,6,101,33,96, 125,67,230,0, and 0 corresponding to columns associated with a row of the base matrix,
128, 23, 162, 220, 43, 186, 96, 1,216, 22, 24, 167, 200,32, 235, 172, 219, 1, and 0 corresponding to columns associated with a row of the base matrix,
64, 211, and 0 corresponding to columns associated with a row of the base matrix,
2, 171, 47, 143, 210, 180, 180, and 0 corresponding to columns associated with a row of the base matrix,
199, 22, 23, 100, 92, 207, 52, 13, and 0 corresponding to columns associated with a row of the base matrix,
77, 146, 209, 32, 166, 18, and 0 corresponding to columns associated with a row of the base matrix,
181, 105, 141, 223, 177, 145, 199, 153, 38, and 0 corresponding to columns associated with a row of the base matrix,
169, 12, 206, 221, 17, 212, 92, 205, and 0 corresponding to columns associated with a row of the base matrix,
116, 151, 70, 230, 115, 84, and 0 corresponding to columns associated with a row of the base matrix,
45, 115, 134, 1, 152, 165, 107, and 0 corresponding to columns associated with a row of the base matrix,
186, 215, 124, 180, 98, 80, and 0 corresponding to columns associated with a row of the base matrix,
220, 185, 154, 178, 150, and 0 corresponding to columns associated with a row of the base matrix,
124, 144, 182, 95, 72, 76, and 0 corresponding to columns associated with a row of the base matrix,
39, 138, 220, 173, 142, 49, and 0 corresponding to columns associated with a row of the base matrix,
78, 152, 84, 5, 205, and 0 corresponding to columns associated with a row of the base matrix,
183, 112, 106, 219, 129, and 0 corresponding to columns associated with a row of the base matrix,
183, 215, 180, 143, 14, and 0 corresponding to columns associated with a row of the base matrix,
179, 108, 159, 138, 196, and 0 corresponding to columns associated with a row of the base matrix,
77, 187, 203, 167, 130, and 0 corresponding to columns associated with a row of the base matrix,
197, 122, 215 65 216, and 0 corresponding to columns associated with a row of the base matrix,
25, 47, 126, 178, and 0 corresponding to columns associated with a row of the base matrix,
185, 127, 117, 199, and 0 corresponding to columns associated with a row of the base matrix,
32, 178, 2, 156, 58, and 0 corresponding to columns associated with a row of the base matrix,
27, 141, 11, 181, and 0} corresponding to columns associated with a row of the base matrix,
163, 131, 169, 98, and 0 corresponding to columns associated with a row of the base matrix,
165, 232, 9, and 0 corresponding to columns associated with a row of the base matrix,
32, 43, 200, 205, and 0 corresponding to columns associated with a row of the base matrix,
232, 32, 118, 103, and 0 corresponding to columns associated with a row of the base matrix,
170, 199, 26, 105, and 0 corresponding to columns associated with a row of the base matrix,
73, 149, 175, 108, and 0 corresponding to columns associated with a row of the base matrix,
103, 110, 151, 211, and 0 corresponding to columns associated with a row of the base matrix,
199, 132, 172, 65, and 0 corresponding to columns associated with a row of the base matrix,
161, 237, 142, 180, and 0 corresponding to columns associated with a row of the base matrix, 231, 174, 145, 100, and 0 corresponding to columns associated with a row of the base matrix, 11, 207, 42, 100, and 0 corresponding to columns associated with a row of the base matrix, 59, 204, 161, and 0 corresponding to columns associated with a row of the base matrix, 121, 90, 26, 140, and 0 corresponding to columns associated with a row of the base matrix, 115, 188, 168, 52, and 0 corresponding to columns associated with a row of the base matrix, 4, 103, 30, and 0 corresponding to columns associated with a row of the base matrix, 53, 189, 215, 24, and 0 corresponding to columns associated with a row of the base matrix, 222, 170, 71, and 0 corresponding to columns associated with a row of the base matrix, 22, 127, 49, 125, and 0 corresponding to columns associated with a row of the base matrix, 191, 211, 187, 148, and 0 corresponding to columns associated with a row of the base matrix, and 177, 114, 93, and 0 corresponding to columns associated with a row of the base matrix.

11. An apparatus for channel encoding in a communication system, the apparatus comprising:

a transceiver; and at least one processor coupled with the transceiver and configured to:

identify a first block size group based on a block size (Z), identify a first matrix corresponding to the first block size group, the first matrix being used for circularly shifting an identity matrix, identify a parity check matrix based on the block size (Z) and the first matrix, encode input bits based on at least part of the parity check matrix, perform rate matching of the encoded input bits based on a redundancy version (RV) index, and transmit at least part of the encoded input bits based on the rate matching, wherein an RV index 0 indicates a starting position corresponding to 2Z+lth bit of the input bits, wherein the first matrix is different from a second matrix corresponding to a second block size group, and wherein the first matrix and the second matrix correspond to a base matrix.

12. The apparatus of claim 11, wherein the at least one processor is configured to perform a hybrid automatic repeat request (HARQ) retransmission based on an RV index among a plurality of RV indices, and wherein the plurality of RV indices indicate starting positions respectively in Z-bit unit.

13. The apparatus of claim 11, wherein the at least one process is configured to perform interleaving of at least part of the encoded input bits based on an interleaving pattern in Z-bit unit, and wherein the interleaving pattern is identified based on a modulation order.

14. The apparatus of claim 11, wherein the first matrix is identified based on values, and wherein the values include:

250, 69, 226, 159, 100, 10,59,229, 110, 191,9, 195, 23, 190,35,239,31, 1, and 0 corresponding to at least part of columns associated with a row of the base matrix, 2, 239, 117, 124, 71, 222, 104, 173, 220, 102, 109, 132, 142, 155, 255, 28,0,0, and 0 corresponding to at least part of columns associated with a row of the base matrix, 106, 111, 185, 63, 117, 93, 229, 177, 95, 39, 142, 225, 225, 245, 205, 251, 117, 0, and 0 corresponding to at least part of columns associated with a row of the base matrix, and 121, 89, 84, 20, 150, 131, 243, 136, 86, 246, 219, 211, 240, 76, 244, 144, 12, 1, and 0 corresponding to at least part of columns associated with a row of the base matrix, 157, 102, and 0 corresponding to at least part of columns associated with a row of the base matrix, 205, 236, 194, 231, 28, 123, 115, and 0 corresponding to at least part of columns associated with a row of the base matrix, 183, 22, 28, 67, 244, 11, 157, 211, and 0 corresponding to at least part of columns associated with a row of the base matrix, 220, 44, 159, 31, 167, 104, and 0 corresponding to at least part of columns associated with a row of the base matrix, 112, 4, 7, 211, 102, 164, 109, 241, 90, and 0 corresponding to at least part of columns associated with a row of the base matrix, 103, 182, 109, 21, 142, 14, 61, 216, and 0 corresponding to at least part of columns associated with a row of the base matrix, 98, 149, 167, 160, 49, 58, and 0 corresponding to at least part of columns associated with a row of the base matrix, 77, 41, 83, 182, 78, 252, 22, and 0 corresponding to at least part of columns associated with a row of the base matrix, 160, 42, 21, 32, 234, 7, and 0 corresponding to at least part of columns associated with a row of the base matrix, 177, 248, 151, 185, 62, and 0 corresponding to at least part of columns associated with a row of the base matrix, 206, 55, 206, 127, 16, 229, and 0 corresponding to at least part of columns associated with a row of the base matrix, 40, 96, 65, 63, 75, 179, and 0 corresponding to at least part of columns associated with a row of the base matrix, 64, 49, 49, 51, 154, and 0 corresponding to at least part of columns associated with a row of the base matrix, 7, 164, 59, 1, 144, and 0 corresponding to at least part of columns associated with a row of the base matrix, 42, 233, 8, 155, 147, and 0 corresponding to at least part of columns associated with a row of the base matrix, 60, 73, 72, 127, 224, and 0 corresponding to at least part of columns associated with a row of the base matrix, 151, 186, 217, 47, 160, and 0 corresponding to at least part of columns associated with a row of the base matrix, 249, 121, 109, 131, 171, and 0 corresponding to at least part of columns associated with a row of the base matrix, 64, 142, 188, 158, and 0 corresponding to at least part of columns associated with a row of the base matrix, 156, 147, 170, 152, and 0 corresponding to at least part of columns associated with a row of the base matrix, 112, 86, 236, 116, 222, and 0 corresponding to at least part of columns associated with a row of the base matrix, 23, 136, 116, 182, and 0 corresponding to at least part of columns associated with a row of the base matrix, 195, 243, 215, 61, and 0 corresponding to at least part of columns associated with a row of the base matrix, 25, 104, 194, and 0 corresponding to at least part of columns associated with a row of the base matrix, 128, 165, 181, 63, and 0 corresponding to at least part of columns associated with a row of the base matrix, 86, 236, 84, 6, and 0 corresponding to at least part of columns associated with a row of the base matrix, 216, 73, 120, 9, and 0 corresponding to at least part of columns associated with a row of the base matrix, 95, 177, 172, 61, and 0 corresponding to at least part of columns associated with a row of the base matrix, 221, 112, 199, 121, and 0 corresponding to at least part of columns associated with a row of the base matrix, 2, 187, 41, 211, and 0 corresponding to at least part of columns associated with a row of the base matrix, 127, 167, 164, 159, and 0 corresponding to at least part of columns associated with a row of the base matrix, 161, 197, 207, 103, and 0 corresponding to at least part of columns associated with a row of the base matrix, 37, 105, 51, 120, and 0 corresponding to at least part of columns associated with a row of the base matrix, and 198, 220, 122, and 0 corresponding to at least part of columns associated with a row of the base matrix.

15. The apparatus of claim 11, wherein the first matrix is identified based on values, and wherein the values include:

135, 227, 126, 134, 84, 83, 53, 225, 205, 128, 75, 135, 217, 220, 90, 105, 137, 1, and 0 corresponding to columns associated with a row of the base matrix, 96, 236, 136, 221, 128, 92, 172, 56, 11, 189, 95, 85, 153, 87, 163,216,0,0, and 0 corresponding to columns associated with a row of the base matrix, 189,4,225,151,236,117,179,92,24,68,6,101,33,96,125,67, 230,0, and 0 corresponding to columns associated with a row of the base matrix, 128, 23, 162, 220, 43, 186, 96, 1,216,22, 24, 167, 200, 32, 235, 172, 219, 1, and 0 corresponding to columns associated with a row of the base matrix, 64, 211, and 0 corresponding to columns associated with a row of the base matrix, 2, 171, 47, 143, 210, 180, 180, and 0 corresponding to columns associated with a row of the base matrix, 199, 22, 23, 100, 92, 207, 52, 13, and 0 corresponding to columns associated with a row of the base matrix, 77, 146, 209, 32, 166, 18, and 0 corresponding to columns associated with a row of the base matrix, 181, 105, 141, 223, 177, 145, 199, 153, 38, and 0 corresponding to columns associated with a row of the base matrix, 169, 12, 206, 221, 17, 212, 92, 205, and 0 corresponding to columns associated with a row of the base matrix, 116, 151, 70, 230, 115, 84, and 0 corresponding to columns associated with a row of the base matrix, 45, 115, 134, 1, 152, 165, 107, and 0 corresponding to columns associated with a row of the base matrix, 186, 215, 124, 180, 98, 80, and 0 corresponding to columns associated with a row of the base matrix, 220, 185, 154, 178, 150, and 0 corresponding to columns associated with a row of the base matrix, 124, 144, 182, 95, 72, 76, and 0 corresponding to columns associated with a row of the base matrix, 39, 138, 220, 173, 142, 49, and 0 corresponding to columns associated with a row of the base matrix, 78, 152, 84, 5, 205, and 0 corresponding to columns associated with a row of the base matrix, 183, 112, 106, 219, 129, and 0 corresponding to columns associated with a row of the base matrix, 183, 215, 180, 143, 14, and 0 corresponding to columns associated with a row of the base matrix, 179, 108, 159, 138, 196, and 0 corresponding to columns associated with a row of the base matrix, 77, 187, 203, 167, 130, and 0 corresponding to columns associated with a row of the base matrix, 197, 122, 215 65 216, and 0 corresponding to columns associated with a row of the base matrix, 25, 47, 126, 178, and 0 corresponding to columns associated with a row of the base matrix, 185, 127, 117, 199, and 0 corresponding to columns associated with a row of the base matrix, 32, 178, 2, 156, 58, and 0 corresponding to columns associated with a row of the base matrix, 27, 141, 11, 181, and 0} corresponding to columns associated with a row of the base matrix, 163, 131, 169, 98, and 0 corresponding to columns associated with a row of the base matrix, 165, 232, 9, and 0 corresponding to columns associated with a row of the base matrix, 32, 43, 200, 205, and 0 corresponding to columns associated with a row of the base matrix, 232, 32, 118, 103, and 0 corresponding to columns associated with a row of the base matrix, 170, 199, 26, 105, and 0 corresponding to columns associated with a row of the base matrix, 73, 149, 175, 108, and 0 corresponding to columns associated with a row of the base matrix, 103, 110, 151, 211, and 0 corresponding to columns associated with a row of the base matrix, 199, 132, 172, 65, and 0 corresponding to columns associated with a row of the base matrix, 161, 237, 142, 180, and 0 corresponding to columns associated with a row of the base matrix, 231, 174, 145, 100, and 0 corresponding to columns associated with a row of the base matrix, 11, 207, 42, 100, and 0 corresponding to columns associated with a row of the base matrix, 59, 204, 161, and 0 corresponding to columns associated with a row of the base matrix, 121, 90, 26, 140, and 0 corresponding to columns associated with a row of the base matrix, 115, 188, 168, 52, and 0 corresponding to columns associated with a row of the base matrix, 4, 103, 30, and 0 corresponding to columns associated with a row of the base matrix, 53, 189, 215, 24, and 0 corresponding to columns associated with a row of the base matrix, 222, 170, 71, and 0 corresponding to columns associated with a row of the base matrix, 22, 127, 49, 125, and 0 corresponding to columns associated with a row of the base matrix, 191, 211, 187, 148, and 0 corresponding to columns associated with a row of the base matrix, and 177, 114, 93, and 0 corresponding to columns associated with a row of the base matrix.

16. An apparatus for channel decoding performed by an apparatus in a communication system, the apparatus comprising:

a transceiver; and at least one processor coupled with the transceiver and configured to:

identify a first block size group based on a block size (Z), identify a first matrix corresponding to the first block size group, the first matrix being used for circularly shifting an identity matrix, identify a parity check matrix based on the block size (Z) and the first matrix, and decode a received signal based on at least part of the parity check matrix, wherein the received signal corresponds to bits where input bits are rate matched based on a redundancy version (RV) index, wherein an RV index 0 indicates a starting position corresponding to 2Z+lth bit of the input bits, wherein the first matrix is different from a second matrix corresponding to a second block size group, and wherein the first matrix and the second matrix correspond to a base matrix.

17. The apparatus of claim 16, wherein a hybrid automatic repeat request (HARQ) retransmission is performed based on an RV index among a plurality of RV indices, wherein the plurality of RV indices indicate starting positions respectively in Z-bit unit.

18. The apparatus of claim 16, wherein at least part of the input bits is interleaved based on an interleaving pattern in Z-bit unit, and wherein the interleaving pattern is identified based on a modulation order.

19. The apparatus of claim 16, wherein the first matrix is identified based on values, and wherein the values include:

250, 69, 226, 159, 100, 10, 59, 229, 110, 191,9, 195, 23, 190,35,239,31, 1, and 0 corresponding to at least part of columns associated with a row of the base matrix, 2, 239, 117, 124, 71, 222, 104, 173, 220, 102, 109, 132, 142, 155, 255, 28,0,0, and 0 corresponding to at least part of columns associated with a row of the base matrix, 106, 111, 185, 63, 117, 93, 229, 177, 95, 39, 142, 225, 225, 245, 205, 251, 117, 0, and 0 corresponding to at least part of columns associated with a row of the base matrix, and 121, 89, 84, 20, 150, 131, 243, 136, 86, 246, 219, 211, 240, 76, 244, 144, 12, 1, and 0 corresponding to at least part of columns associated with a row of the base matrix, 157, 102, and 0 corresponding to at least part of columns associated with a row of the base matrix, 205, 236, 194, 231, 28, 123, 115, and 0 corresponding to at least part of columns associated with a row of the base matrix, 183, 22, 28, 67, 244, 11, 157, 211, and 0 corresponding to at least part of columns associated with a row of the base matrix, 220, 44, 159, 31, 167, 104, and 0 corresponding to at least part of columns associated with a row of the base matrix, 112, 4, 7, 211, 102, 164, 109, 241, 90, and 0 corresponding to at least part of columns associated with a row of the base matrix, 103, 182, 109, 21, 142, 14, 61, 216, and 0 corresponding to at least part of columns associated with a row of the base matrix, 98, 149, 167, 160, 49, 58, and 0 corresponding to at least part of columns associated with a row of the base matrix, 77, 41, 83, 182, 78, 252, 22, and 0 corresponding to at least part of columns associated with a row of the base matrix, 160, 42, 21, 32, 234, 7, and 0 corresponding to at least part of columns associated with a row of the base matrix, 177, 248, 151, 185, 62, and 0 corresponding to at least part of columns associated with a row of the base matrix, 206, 55, 206, 127, 16, 229, and 0 corresponding to at least part of columns associated with a row of the base matrix, 40, 96, 65, 63, 75, 179, and 0 corresponding to at least part of columns associated with a row of the base matrix, 64, 49, 49, 51, 154, and 0 corresponding to at least part of columns associated with a row of the base matrix, 7, 164, 59, 1, 144, and 0 corresponding to at least part of columns associated with a row of the base matrix, 42, 233, 8, 155, 147, and 0 corresponding to at least part of columns associated with a row of the base matrix, 60, 73, 72, 127, 224, and 0 corresponding to at least part of columns associated with a row of the base matrix, 151, 186, 217, 47, 160, and 0 corresponding to at least part of columns associated with a row of the base matrix, 249, 121, 109, 131, 171, and 0 corresponding to at least part of columns associated with a row of the base matrix, 64, 142, 188, 158, and 0 corresponding to at least part of columns associated with a row of the base matrix, 156, 147, 170, 152, and 0 corresponding to at least part of columns associated with a row of the base matrix, 112, 86, 236, 116, 222, and 0 corresponding to at least part of columns associated with a row of the base matrix, 23, 136, 116, 182, and 0 corresponding to at least part of columns associated with a row of the base matrix, 195, 243, 215, 61, and 0 corresponding to at least part of columns associated with a row of the base matrix, 25, 104, 194, and 0 corresponding to at least part of columns associated with a row of the base matrix, 128, 165, 181, 63, and 0 corresponding to at least part of columns associated with a row of the base matrix, 86, 236, 84, 6, and 0 corresponding to at least part of columns associated with a row of the base matrix, 216, 73, 120, 9, and 0 corresponding to at least part of columns associated with a row of the base matrix, 95, 177, 172, 61, and 0 corresponding to at least part of columns associated with a row of the base matrix, 221, 112, 199, 121, and 0 corresponding to at least part of columns associated with a row of the base matrix, 2, 187, 41, 211, and 0 corresponding to at least part of columns associated with a row of the base matrix, 127, 167, 164, 159, and 0 corresponding to at least part of columns associated with a row of the base matrix, 161, 197, 207, 103, and 0 corresponding to at least part of columns associated with a row of the base matrix, 37, 105, 51, 120, and 0 corresponding to at least part of columns associated with a row of the base matrix, and 198, 220, 122, and 0 corresponding to at least part of columns associated with a row of the base matrix.

20. The apparatus of claim 16, wherein the first matrix is identified based on values, and wherein the values include:

135, 227, 126, 134, 84, 83, 53, 225, 205, 128, 75, 135, 217, 220, 90, 105, 137, 1, and 0 corresponding to columns associated with a row of the base matrix, 96, 236, 136, 221, 128, 92, 172, 56, 11, 189, 95, 85, 153, 87, 163,216,0,0, and 0 corresponding to columns associated with a row of the base matrix, 189,4,225,151,236,117,179,92,24,68,6,101,33,96,125,67, 230,0, and 0 corresponding to columns associated with a row of the base matrix, 128, 23, 162, 220, 43, 186, 96, 1,216, 22, 24, 167, 200, 32, 235, 172, 219, 1, and 0 corresponding to columns associated with a row of the base matrix, 64, 211, and 0 corresponding to columns associated with a row of the base matrix, 2, 171, 47, 143, 210, 180, 180, and 0 corresponding to columns associated with a row of the base matrix, 199, 22, 23, 100, 92, 207, 52, 13, and 0 corresponding to columns associated with a row of the base matrix, 77, 146, 209, 32, 166, 18, and 0 corresponding to columns associated with a row of the base matrix, 181, 105, 141, 223, 177, 145, 199, 153, 38, and 0 corresponding to columns associated with a row of the base matrix, 169, 12, 206, 221, 17, 212, 92, 205, and 0 corresponding to columns associated with a row of the base matrix, 116, 151, 70, 230, 115, 84, and 0 corresponding to columns associated with a row of the base matrix, 45, 115, 134, 1, 152, 165, 107, and 0 corresponding to columns associated with a row of the base matrix, 186, 215, 124, 180, 98, 80, and 0 corresponding to columns associated with a row of the base matrix, 220, 185, 154, 178, 150, and 0 corresponding to columns associated with a row of the base matrix, 124, 144, 182, 95, 72, 76, and 0 corresponding to columns associated with a row of the base matrix, 39, 138, 220, 173, 142, 49, and 0 corresponding to columns associated with a row of the base matrix, 78, 152, 84, 5, 205, and 0 corresponding to columns associated with a row of the base matrix, 183, 112, 106, 219, 129, and 0 corresponding to columns associated with a row of the base matrix, 183, 215, 180, 143, 14, and 0 corresponding to columns associated with a row of the base matrix, 179, 108, 159, 138, 196, and 0 corresponding to columns associated with a row of the base matrix, 77, 187, 203, 167, 130, and 0 corresponding to columns associated with a row of the base matrix, 197, 122, 215 65 216, and 0 corresponding to columns associated with a row of the base matrix, 25, 47, 126, 178, and 0 corresponding to columns associated with a row of the base matrix, 185, 127, 117, 199, and 0 corresponding to columns associated with a row of the base matrix, 32, 178, 2, 156, 58, and 0 corresponding to columns associated with a row of the base matrix, 27, 141, 11, 181, and 0} corresponding to columns associated with a row of the base matrix, 163, 131, 169, 98, and 0 corresponding to columns associated with a row of the base matrix, 165, 232, 9, and 0 corresponding to columns associated with a row of the base matrix, 32, 43, 200, 205, and 0 corresponding to columns associated with a row of the base matrix, 232, 32, 118, 103, and 0 corresponding to columns associated with a row of the base matrix, 170, 199, 26, 105, and 0 corresponding to columns associated with a row of the base matrix, 73, 149, 175, 108, and 0 corresponding to columns associated with a row of the base matrix, 103, 110, 151, 211, and 0 corresponding to columns associated with a row of the base matrix, 199, 132, 172, 65, and 0 corresponding to columns associated with a row of the base matrix, 161, 237, 142, 180, and 0 corresponding to columns associated with a row of the base matrix, 231, 174, 145, 100, and 0 corresponding to columns associated with a row of the base matrix, 11, 207, 42, 100, and 0 corresponding to columns associated with a row of the base matrix, 59, 204, 161, and 0 corresponding to columns associated with a row of the base matrix, 121, 90, 26, 140, and 0 corresponding to columns associated with a row of the base matrix, 115, 188, 168, 52, and 0 corresponding to columns associated with a row of the base matrix, 4, 103, 30, and 0 corresponding to columns associated with a row of the base matrix, 53, 189, 215, 24, and 0 corresponding to columns associated with a row of the base matrix, 222, 170, 71, and 0 corresponding to columns associated with a row of the base matrix, 22, 127, 49, 125, and 0 corresponding to columns associated with a row of the base matrix, 191, 211, 187, 148, and 0 corresponding to columns associated with a row of the base matrix, and 177, 114, 93, and 0 corresponding to columns associated with a row of the base matrix.

* * * * *